US012698439B2

(12) United States Patent
Kim et al.

(10) Patent No.: US 12,698,439 B2
(45) Date of Patent: Aug. 4, 2026

(54) ORGANIC LIGHT-EMITTING DEVICE AND ELECTRONIC APPARATUS INCLUDING THE SAME

(71) Applicant: Samsung Display Co., Ltd., Yongin-si (KR)

(72) Inventors: Jongwoo Kim, Yongin-si (KR); Jangyeol Baek, Yongin-si (KR); Eunjae Jeong, Yongin-si (KR); Sanghyun Han, Yongin-si (KR); Youngkook Kim, Yongin-si (KR); Seokhwan Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 18/110,331

(22) Filed: Feb. 15, 2023

(65) Prior Publication Data

US 2023/0209862 A1 Jun. 29, 2023

Related U.S. Application Data

(63) Continuation of application No. 15/908,542, filed on Feb. 28, 2018, now Pat. No. 11,641,754.

(30) Foreign Application Priority Data

Aug. 9, 2017 (KR) ........................ 10-2017-0101344

(51) Int. Cl.
*C09K 11/06* (2006.01)
*H10K 50/11* (2023.01)
(Continued)

(52) U.S. Cl.
CPC .............. *C09K 11/06* (2013.01); *H10K 50/15* (2023.02); *H10K 50/171* (2023.02);
(Continued)

(58) Field of Classification Search
CPC ...... H10K 50/11; H10K 50/15; H10K 50/171; H10K 50/18; H10K 50/181; H10K 50/80;
(Continued)

(56) References Cited

U.S. PATENT DOCUMENTS

| | | | |
|---|---|---|---|
| 3,340,225 A | 9/1967 | Dressler et al. | |
| 5,093,691 A | 3/1992 | Utsugi et al. | |

(Continued)

FOREIGN PATENT DOCUMENTS

| | | |
|---|---|---|
| CN | 101519555 A | 9/2009 |
| CN | 105917487 A | 8/2016 |

(Continued)

OTHER PUBLICATIONS

English translation of WO 2015/093093 A1 and the original WO 2015/093093 A1, Matsuki Yuichi (Year: 2015).*

(Continued)

*Primary Examiner* — Seokmin Jeon
(74) *Attorney, Agent, or Firm* — Womble Bond Dickinson (US) LLP

(57) ABSTRACT

An organic light-emitting device includes a first electrode, a second electrode facing the first electrode, an organic layer between the first electrode and the second electrode and including an emission layer, and at least one of a first layer and a second layer, wherein the first layer is positioned in a path where light generated in the emission layer is transmitted to the outside through the first electrode and the second layer is positioned in a path where the light generated in the emission layer is transmitted to the outside through the second electrode. The first layer and the second layer each include a compound having a certain formula.

18 Claims, 1 Drawing Sheet

(51) Int. Cl.

| | |
|---|---|
| ***H10K 50/15*** | (2023.01) |
| ***H10K 50/17*** | (2023.01) |
| ***H10K 50/18*** | (2023.01) |
| ***H10K 50/844*** | (2023.01) |
| ***H10K 85/30*** | (2023.01) |
| ***H10K 85/60*** | (2023.01) |

(52) U.S. Cl.
CPC ......... *H10K 50/844* (2023.02); *H10K 85/615* (2023.02); *H10K 85/621* (2023.02); *H10K 85/654* (2023.02); *H10K 85/6572* (2023.02); *H10K 85/6574* (2023.02); *C09K 2211/1033* (2013.01); *C09K 2211/1059* (2013.01); *H10K 50/11* (2023.02); *H10K 50/181* (2023.02); *H10K 85/324* (2023.02); *H10K 85/633* (2023.02)

(58) Field of Classification Search
CPC .. H10K 50/805; H10K 50/844; H10K 85/324; H10K 85/615; H10K 85/621; H10K 85/633; H10K 85/654; H10K 85/6572; H10K 85/6574; H10K 59/873; C09K 11/06; C09K 2211/1033; C09K 2211/1059
See application file for complete search history.

(56) References Cited

U.S. PATENT DOCUMENTS

| | | | | |
|---|---|---|---|---|
| 5,312,851 | A | 5/1994 | Matsuki et al. | |
| 8,685,542 | B2 | 4/2014 | Kim et al. | |
| 9,368,731 | B2 | 6/2016 | Saito et al. | |
| 9,461,272 | B2 | 10/2016 | Yang | |
| 10,351,718 | B2 | 7/2019 | Shiono et al. | |
| 11,114,648 | B2 | 9/2021 | Pudleiner et al. | |
| 11,641,754 | B2 * | 5/2023 | Kim | H01L 51/5203 |
| 2001/0000005 | A1 | 3/2001 | Forrest et al. | |
| 2009/0214797 | A1 | 8/2009 | Kasai | |
| 2016/0104860 | A1 | 4/2016 | Yasukawa et al. | |
| 2016/0190516 | A1 | 6/2016 | Yang | |
| 2016/0329526 | A1 | 11/2016 | Pudleiner et al. | |

FOREIGN PATENT DOCUMENTS

| | | | |
|---|---|---|---|
| CN | 106104319 | A | 11/2016 |
| JP | 6-96860 | A | 4/1994 |
| JP | 3082284 | | 8/2000 |
| JP | 2001-223081 | | 8/2001 |
| JP | 2009-197171 | A | 9/2009 |
| JP | 2016-76441 | A | 5/2016 |
| KR | 10-2011-0110591 | | 10/2011 |
| KR | 10-2016-0081105 | A | 7/2016 |
| KR | 10-2016-0100908 | A | 8/2016 |
| KR | 10-2016-0102986 | A | 8/2016 |
| KR | 10-2017-0007236 | A | 1/2017 |
| WO | WO 2015093093 | A1 | 6/2015 |
| WO | WO 2015098549 | A1 | 7/2015 |

OTHER PUBLICATIONS

English translation of JP 2004/204140 A and the original JP 2004/204140 A, Seichiro Murase, Jul. 22, 2004 (Year: 2004).*
Extended European Search Report dated Dec. 11, 2018, for corresponding European Patent Application No. 18187869.5, 9 pages.
U.S. Ex parte Quayle Action dated Jan. 24, 2019, issued in U.S. Appl. No. 15/973,289 (5 pages).
Chinese Office Action dated Aug. 4, 2022, and Search Report dated Jul. 27, 2022, for Application No. 201810542001.7, 6 pages.
Korean Notice of Allowance dated Dec. 9, 2021, issued in Korean Patent Application No. 10-2017-0101347 (6 pages).
Machine translated English version of JP 2014/047192 A, Hirotaka et al., Mar. 17, 2014 (Year: 2014).
Shou-Cheng Dong et al. "New dibenzofuran/spirobifluorene hybrids as thermally stable host materials for efficient phosphorescent organic light-emitting diodes with low efficiency roll-off" Phys. Chem. Chem. Phys. 2012, vol. 14, p. 14224-14228 (Year: 2012).
Wandong Chai et al. "Theoretical investigations into optical and charge transfer properties of donor-acceptor 1,8-naphthalimide derivatives as possible organic light-emitting materials" J. Mol. Structure 2016, vol. 1103, p. 177-182, Oct. 3, 2015 (Year: 2015).
Park et al., Thin film encapsulation for flexible AM-OLEO: a review, Semicond. Sci. Technol. 2011, vol. 26, p. 034001 (Year: 2011).
Wang et al., Synthesis and luminescence properties of triad compounds with a disulfide bridge, Dyes and Pigments, 2002, vol. 54, p. 265-274 (Year: 2002).
Feng et al. "Synthesis and optical properties of novel compounds containing carbazole and 1, 8-naphthalimide groups", Journal of Chemical Research 2008, vol. 2008, p. 137-140, Mar. 1, 2008 (Year: 2008).
English translation of JP 1994/06096860 A and the original JP 1994/06096860 A, Naito et al. Apr. 8, 1994 (Year: 1994).
Gu et al., Transparent organic light emitting devices, Appl. Phys. Lett., 1996, vol. 68, p. 2606-2608, (Jun. 4, 1998) (Year: 1998).
Pang et al, A full-color, low-power, wearable display for mobile applications, SPIE, (Mar. 29, 2012), web page address: https://spie.org/news/4167-a-full--color-low--power-wearable-display-for-mobile-applications?SSO=1 (Year: 2012).

* cited by examiner

ORGANIC LIGHT-EMITTING DEVICE AND ELECTRONIC APPARATUS INCLUDING THE SAME

CROSS-REFERENCE TO RELATED APPLICATION

This application is a continuation of, and claims priority to, and the benefit of U.S. patent application Ser. No. 15/908,542, filed on Feb. 28, 2018, which claims priority to, and the benefit of Korean Patent Application No. 10-2017-0101344, filed on Aug. 9, 2017, the entire contents of all of which are incorporated herein by reference.

BACKGROUND

1. Field

Aspects of one or more embodiments of the present disclosure relate to an organic light-emitting device and an electronic apparatus including the same.

2. Description of the Related Art

Organic light-emitting devices are self-emission devices that have wide viewing angles, high contrast ratios, short response times, and excellent characteristics in terms of brightness, driving voltage, and response speed, compared to other devices in the art.

An example organic light-emitting device may include a first electrode on a substrate, and a hole transport region, an emission layer, an electron transport region, and a second electrode sequentially positioned on the first electrode. Holes provided from the first electrode may move toward the emission layer through the hole transport region, and electrons provided from the second electrode may move toward the emission layer through the electron transport region. Carriers (such as holes and electrons) may recombine in the emission layer to produce excitons. These excitons may transition from an excited state to the ground state to thereby generate light.

The light efficiency of an organic light-emitting device may be measured with respect to an internal luminescent efficiency or an external luminescent efficiency. The internal luminescent efficiency indicates how efficiently excitons are generated and light conversion occurs in an organic layer positioned between a first electrode and a second electrode, (e.g., between an anode and a cathode), wherein the organic layer includes a hole transport layer, an emission layer, and an electron transport layer. The external luminescent efficiency (also called "light coupling efficiency") indicates how efficiently light generated in the organic layer is emitted toward the outside of the organic light-emitting device. Although light conversion efficiency may be high in an organic layer (e.g., even when internal luminescent efficiency is high), when the external luminescent efficiency is low, the overall light efficiency of the organic light-emitting device may be low.

On the other hand, if ultraviolet rays (UV) are allowed to freely transmit through the organic light-emitting device (for example, when light transmission through the organic light-emitting device is high), the emission layer and organic material may be seriously damaged. As the outdoor use of information devices including organic light-emitting devices increases, sunlight and UV exposure of such devices is also increasing. Also, there are many cases in which an operation of irradiating ultraviolet rays is required in the process of manufacturing an organic light-emitting device.

SUMMARY

Aspects of one of more embodiments of the present disclosure are directed toward an organic light-emitting device capable of reducing a transmitting amount (e.g., transmission) of ultraviolet rays from the outside while having a high light extraction rate (e.g., external luminescent efficiency), and an electric apparatus including the same.

Additional aspects will be set forth in part in the description which follows and, in part, will be apparent from the description, or may be learned by practice of the presented embodiments.

Aspects of one of more embodiments of the present disclosure provide an organic light-emitting device including:

a first electrode;

a second electrode facing the first electrode;

an organic layer between the first electrode and the second electrode and including an emission layer; and at least one selected from a first layer and a second layer, wherein the first layer may be positioned in a path in which light generated in the emission layer is transmitted to the outside through the first electrode, and the second layer may be positioned in a path where light generated in the emission layer is transmitted to the outside through the second electrode, wherein the first layer and the second layer each include a condensed cyclic compound represented by Formula 1:

Formula 1

$$[R_1\text{-}(L_1)_{a1}]_{b1}\text{-}(Ar_1)_{c1}\text{-}[(L_2)_{a2}\text{-}R_2]_{b2}$$

Formula 2-1

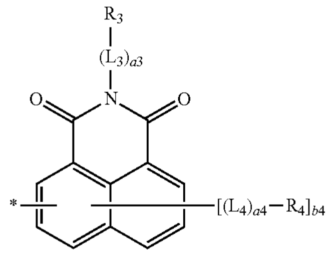

Formula 2-2

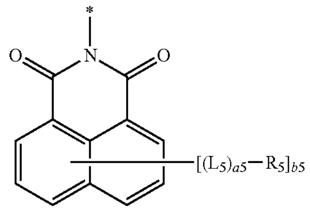

Formula 2-3

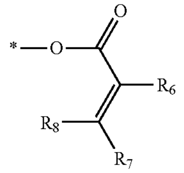

Formula 2-4

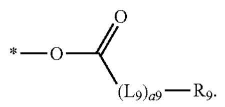

In Formulae 1 and 2-1 to 2-4, $Ar_1$ may be a $C_5$-$C_{60}$ carbocyclic group or a $C_2$-$C_{30}$ heterocyclic group, c1 may be 0 or 1, $L_1$ to $L_5$ and $L_9$ may each independently be selected from *—N($R_{11}$)—*', *—B($R_{11}$)—*', *—P($R_{11}$)—*', *—Si($R_{11}$)($R_{12}$)—*', *—S—*', *—Se—*', *—O—*', *—C(=O)—*', *—S(=O)—*', *—S(=O)$_2$—*', *—C($R_{11}$)=*', *—C(=S)—*', a substituted or unsubstituted $C_1$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, a1 to a5 and a9 may each independently be an integer from 0 to 10, $R_1$ may be a group represented by Formula 2-1 or a group represented by Formula 2-2, $R_2$ to $R_5$ may each independently be selected from a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), and —P(=O)($Q_1$)($Q_2$), $R_6$ to $R_9$, $R_{11}$, and $R_{12}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_4$)($Q_5$)($Q_6$), —N($Q_4$)($Q_5$), —B($Q_4$)($Q_5$), —C(=O)($Q_4$), —S(=O)$_2$ ($Q_4$), and —P(=O)($Q_4$)($Q_5$), b1 may be an integer from 1 to 10, wherein, when b1 is two or more, two or more *-$(L_1)_{a1}$-$R_1$(s) may be identical to or different from each other, b2 may be an integer from 1 to 10, wherein, when b2 is two or more, two or more *-$(L_2)_{a2}$-$R_2$(s) may be identical to or different from each other, b4 may be an integer from 0 to 5, wherein, when b4 is two or more, two or more *-$(L_4)_{a4}$-$R_4$(s) may be identical to or different from each other, b5 may be an integer from 0 to 6, wherein, when b5 is two or more, two or more *-$(L_5)_{a5}$-$R_5$(s) may be identical to or different from each other, at least one substituent of the substituted $C_1$-$C_{60}$ alkylene group, the substituted $C_2$-$C_{60}$ alkenylene group, the substituted $C_2$-$C_{60}$ alkynylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{60}$ cycloalkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_3$-$C_{60}$ cycloalkoxy group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_3$-$C_{60}$ cycloalkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, a biphenyl group, and a terphenyl group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_6$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, a monovalent non-aromatic condensed polycyclic group, a monovalent non-aromatic condensed heteropolycyclic group, a biphenyl group, and a terphenyl group, and

* and *' each indicate a binding site to a neighboring atom.

Aspects of one of more embodiments of the present disclosure provide an electronic apparatus including the organic light-emitting device described above and a thin film transistor, wherein the first electrode of the organic light-emitting device electrically contacts one selected from a source electrode and a drain electrode of the thin film transistor.

BRIEF DESCRIPTION OF THE DRAWINGS

These and/or other aspects will become apparent and more readily appreciated from the following description of the example embodiments, taken in conjunction with the accompanying drawings, in which.

DETAILED DESCRIPTION

Figure 1:
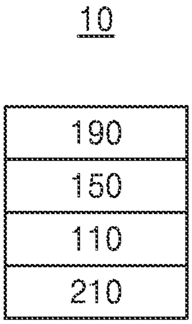
FIG. 1 is a schematic cross-sectional view of an organic light-emitting device according to an embodiment of the present disclosure.

Reference will now be made in more detail to example embodiments illustrated in the accompanying drawings, wherein like reference numerals refer to like elements throughout and duplicative descriptions thereof may not be provided. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Effects, features, and how to achieve them with respect to the present disclosure will become apparent by reference to the embodiment that will be described in detail, together with the accompanying drawings. The present disclosure may, however, be embodied in many different forms and should not be limited to the embodiments herein.

Expressions such as "at least one of", "one of", "selected from", "at least one selected from", and "one selected from", when preceding a list of elements, modify the entire list of elements and do not modify the individual elements of the list. The use of "may" when describing embodiments of the present invention refers to "one or more embodiments of the present invention."

It will be understood that when a layer, film, region, or plate is referred to as being "on" another layer, film, region, or plate, the first layer, film, region, or plate can be directly or indirectly formed on the other layer, film, region, or plate. For example, intervening layers, films, regions, or plates may be present. In contrast, when an element is referred to as being "directly on" another element, no intervening elements are present. In addition, sizes of components in the drawings may be exaggerated for convenience of explanation. In other words, since sizes and thicknesses of components in the drawings are arbitrarily illustrated for convenience of explanation, the following embodiments of the present disclosure are not limited thereto.

Hereinafter, the terms "first, second, etc." are used only for the purpose of distinguishing one element from another.

The term "organic layer" as used herein refers to a single layer and/or a plurality of layers positioned between the first electrode and the second electrode of the organic light-emitting device. Materials included in the "organic layer" are not limited to being organic materials.

The term "transmissive electrode or semi-transmissive electrode" as used herein may refer to an electrode that transmits 50% or more, or 70% or more, or 90% or more of the flux of light having a visible wavelength (for example, a wavelength between about 380 nm to about 780 nm), as may be understood by one of ordinary skill in the art.

The term "first layer (and/or second layer)-R" as used herein indicates a first layer (and/or a second layer) formed in a region corresponding to an R pixel.

The term "first layer (and/or second layer)-G" as used herein indicates a first layer (and/or a second layer) formed in a region corresponding to a G pixel.

The term "first layer (and/or second layer)-B" as used herein indicates a first layer (and/or a second layer) formed in a region corresponding to a B pixel.

FIG. 1 is a schematic view of an organic light-emitting device 10 according to an embodiment of the present disclosure.

The organic light-emitting device 10 includes a first layer 210, a first electrode 110, an organic layer 150, and a second electrode 190, which are sequentially stacked. The first electrode 110 may be a transmissive or semi-transmissive electrode, and light that has been generated in the organic layer 150 may pass through the first electrode 110 and the first layer 210 toward the outside of the organic light-emitting device 10. The second electrode 190 may be a reflective electrode. The first layer 210 may include a condensed cyclic compound represented by Formula 1.

Figure 2:
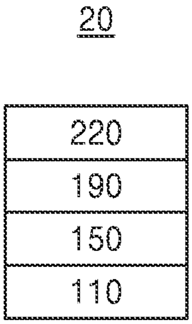
FIG. 2 is a schematic cross-sectional view of an organic light-emitting device according to an embodiment of the present disclosure.

FIG. 2 is a schematic view of an organic light-emitting device 20 according to an embodiment of the present disclosure.

The organic light-emitting device 20 includes a first electrode 110, an organic layer 150, a second electrode 190, and a second layer 220, which are sequentially stacked. The second electrode 190 may be a transmissive or semi-transmissive electrode, and light that has been generated in the organic layer 150 may pass through the second electrode 190 and the second layer 220 toward the outside of the organic light-emitting device 20. The first electrode 110 may be a reflective electrode. The second layer 220 may include a condensed cyclic compound represented by Formula 1.

Figure 3:
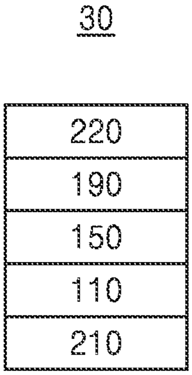
FIG. 3 is a schematic view of an organic light-emitting device according to an embodiment of the present disclosure.

FIG. 3 is a schematic view of an organic light-emitting device 30 according to an embodiment of the present disclosure.

The organic light-emitting device 30 includes a first layer 210, a first electrode 110, an organic layer 150, a second electrode 190, and a second layer 220, which are sequentially stacked. The first electrode 110 and the second electrode 190 may each independently be a transmissive or semi-transmissive electrode. At least one selected from the first layer 210 and the second layer 220 may include the condensed cyclic compound represented by Formula 1.

A substrate may be additionally positioned under the first layer 210 or the first electrode 110, or above the second electrode 190 or the second layer 220. The substrate may be a glass substrate and/or a plastic substrate having excellent mechanical strength, thermal stability, transparency, surface smoothness, ease of handling, and/or water resistance.

The first electrode 110 may be formed by, for example, depositing or sputtering a material for forming the first electrode 110 on the first layer 210. When the first electrode 110 is an anode, the material for a first electrode may be selected from materials with a high work function to facilitate hole injection.

The first electrode 110 may be a reflective electrode, a semi-transmissive electrode, or a transmissive electrode. When the first electrode 110 is a transmissive electrode, the material for forming the first electrode may be selected from indium tin oxide (ITO), indium zinc oxide (IZO), tin oxide ($SnO_2$), zinc oxide (ZnO), and combinations thereof, but embodiments of the present disclosure are not limited thereto. In one or more embodiments, when the first electrode 110 is a semi-transmissive electrode or a reflective electrode, the material for forming the first electrode may be selected from magnesium (Mg), silver (Ag), aluminum (Al), aluminum-lithium (Al—Li), calcium (Ca), magnesium-indium (Mg—In), magnesium-silver (Mg—Ag), and combinations thereof, but embodiments of the present disclosure are not limited thereto.

The first electrode 110 may have a single-layered structure, or a multi-layered structure including two or more layers. For example, the first electrode 110 may have a three-layered structure of ITO/Ag/ITO, but the structure of the first electrode 110 is not limited thereto.

The organic layer 150 is on the first electrode 110. The organic layer 150 may include an emission layer.

The organic layer 150 may further include a hole transport region between the first electrode 110 and the emission layer, and an electron transport region between the emission layer and the second electrode 190.

The layers constituting the hole transport region, the emission layer, and the layers constituting the electron transport region may be formed in their positions using one or more suitable methods selected from vacuum deposition, spin coating, casting, Langmuir-Blodgett (LB) deposition, ink-jet printing, laser-printing, and laser-induced thermal imaging.

When the layers constituting the hole transport region, the emission layer, and the layers constituting the electron transport region are formed by vacuum deposition, the deposition may be performed, for example, at a deposition temperature of about 100° C. to about 500° C., a vacuum degree of about $10^{-8}$ torr to about $10^{-3}$ torr, and a deposition rate of about 100 Å/sec, depending on the material to be included in the layer, and the structure of the layer.

When the layers constituting the hole transport region, the emission layer, and the layers constituting the electron transport region are formed by spin coating, the spin coating may be performed, for example, at a coating speed of about 2,000 rpm to about 5,000 rpm and at a heat treatment temperature of about 80° C. to about 200° C., depending on the material to be included in the layer, and the structure of the layer.

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

The hole transport region may include, for example, at least one compound selected from m-MTDATA, TDATA, 2-TNATA, NPB (NPD), p-NPB, TPD, Spiro-TPD, Spiro-NPB, methylated-NPB, TAPC, HMTPD, 4,4',4"-tris(N-carbazolyl)triphenylamine (TCT), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and Compounds HT1 to HT39, but embodiments of the present disclosure are not limited thereto:

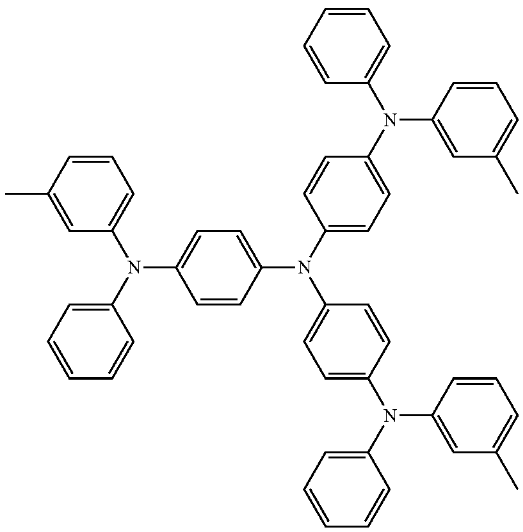
m-MTDATA
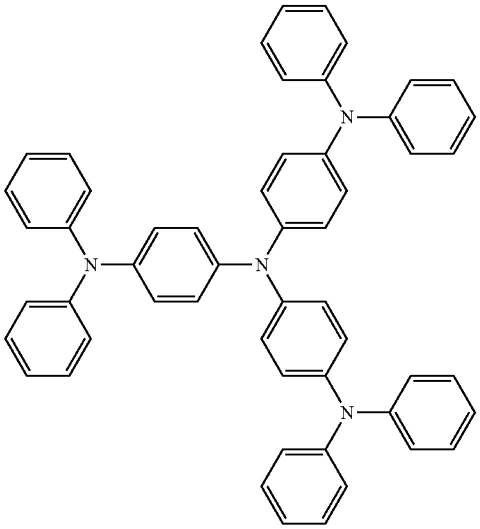
TDATA
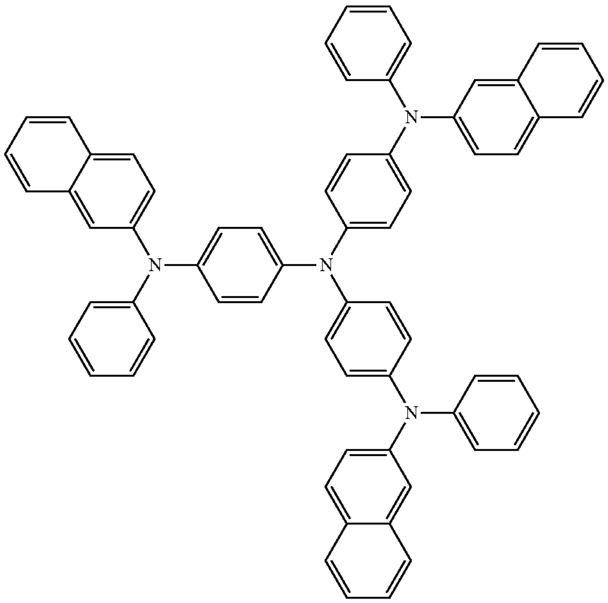
2-TNATA
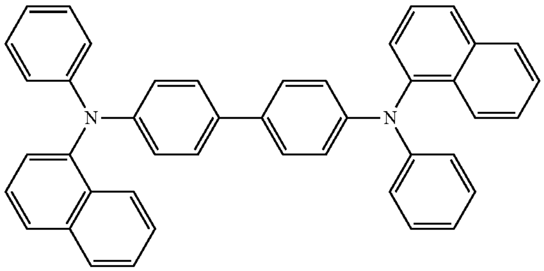
NPB
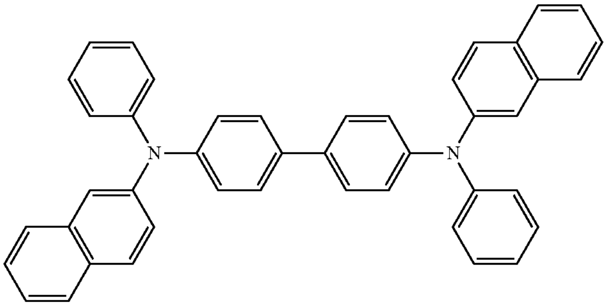
β-NPB
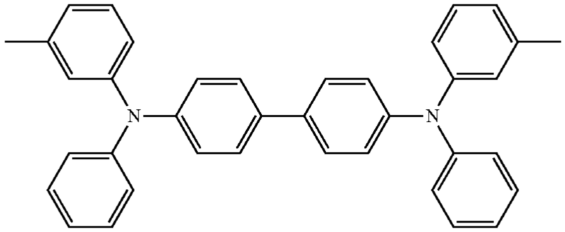
TPD -continued
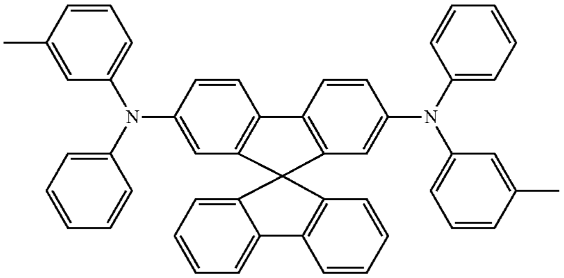
Spiro-TPD
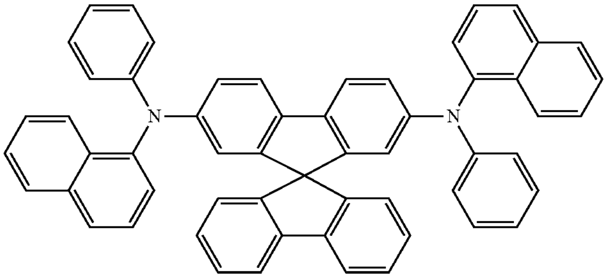
Spiro-NPB
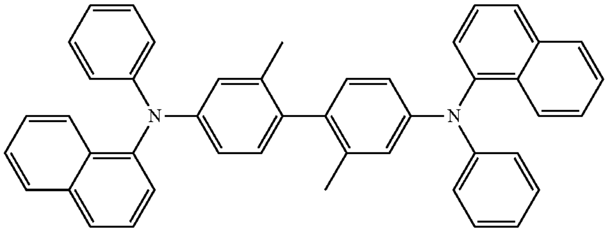
methylated NPB
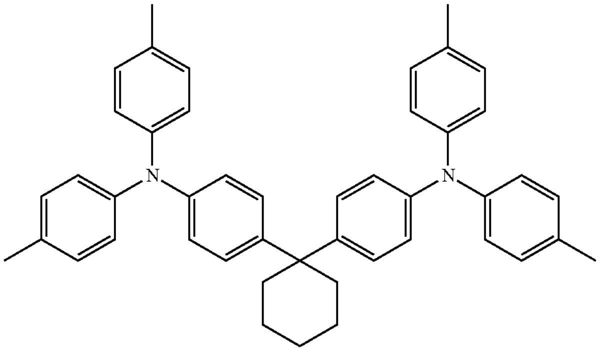
TAPC
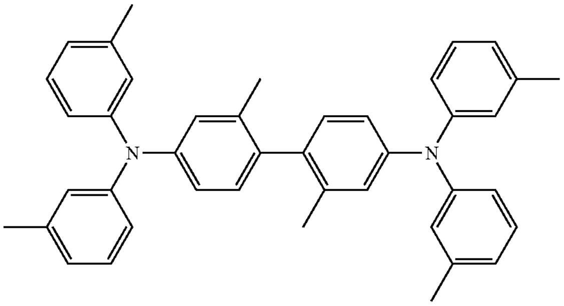
HMTPD
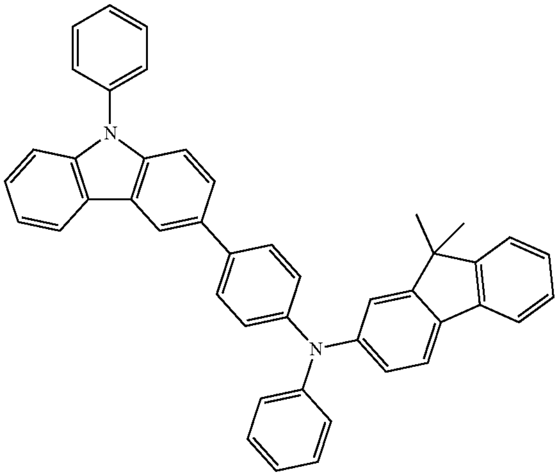
HT1
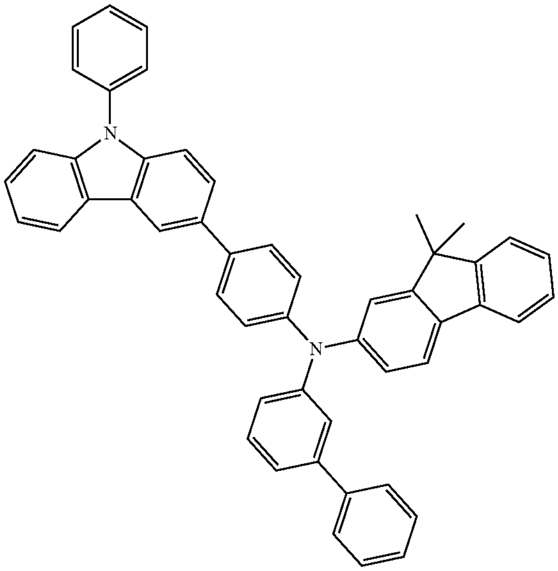
HT2

-continued
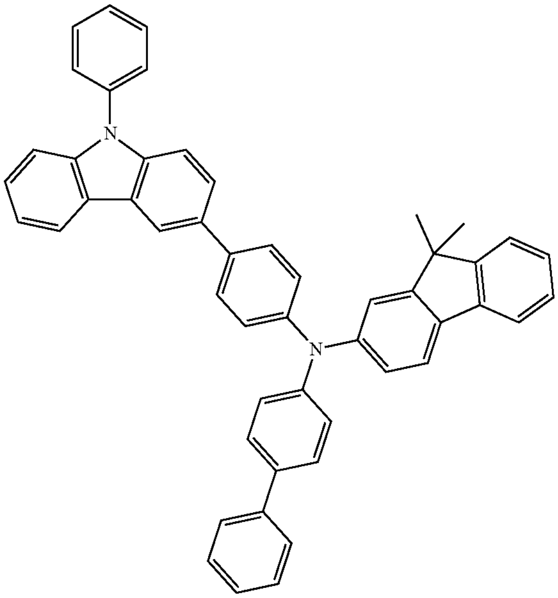
HT3
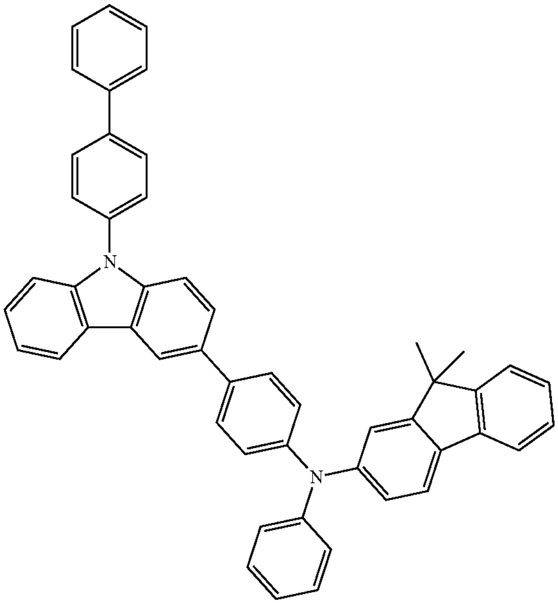
HT4
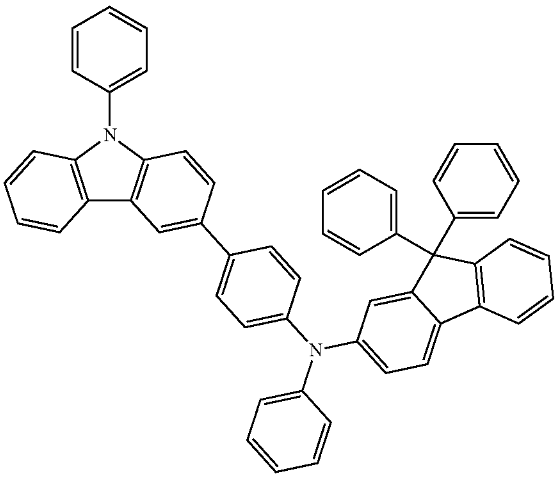
HT5
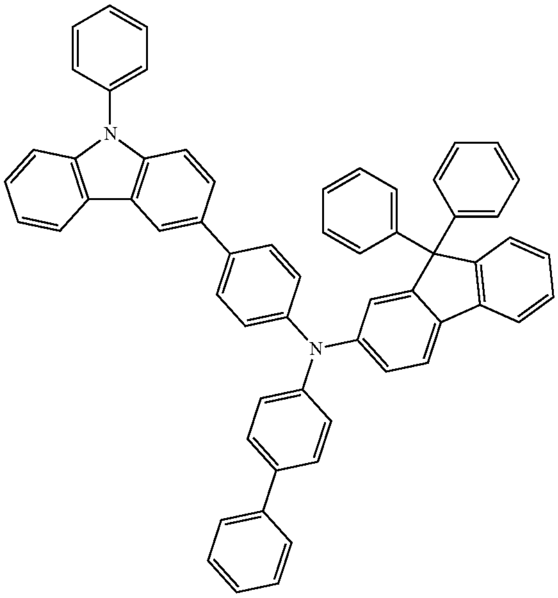
HT6

-continued
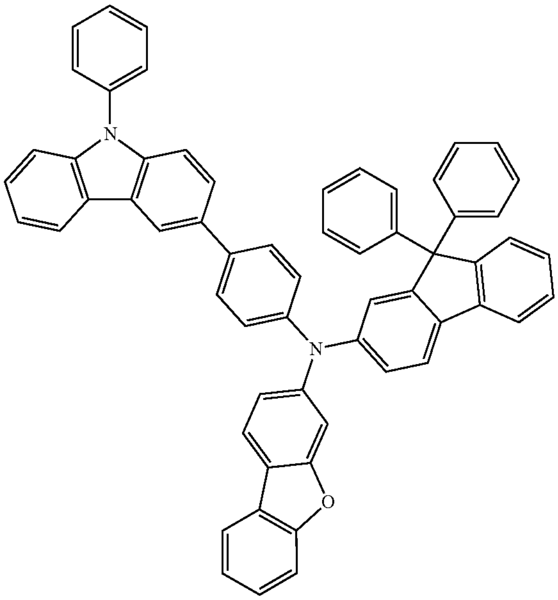
HT7
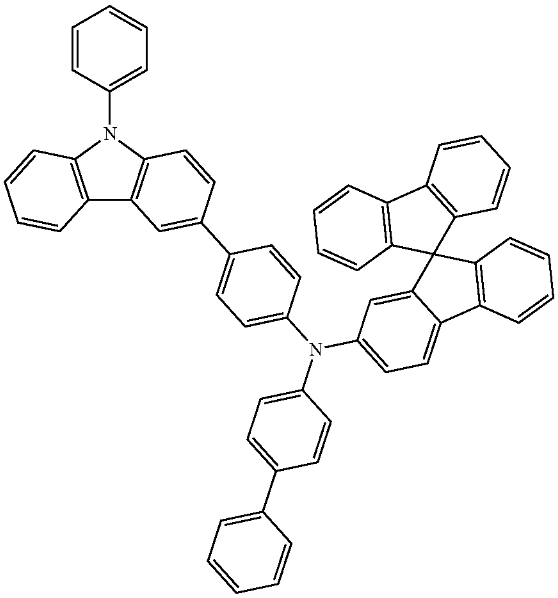
HT8
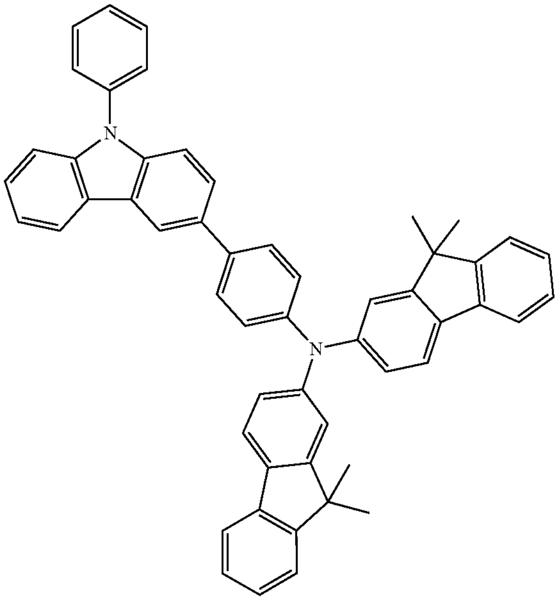
HT9
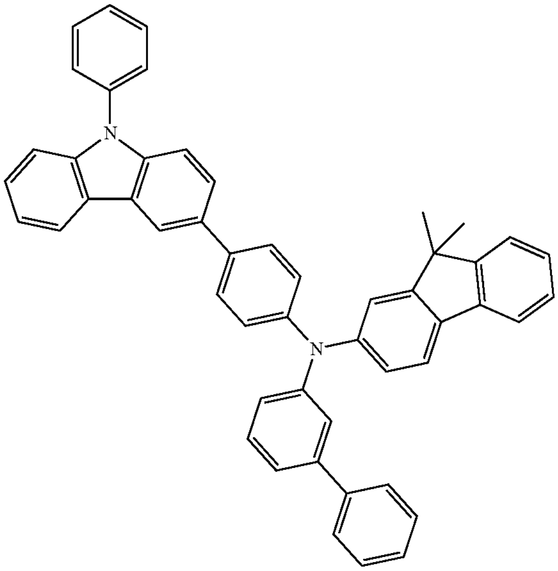
HT10

-continued
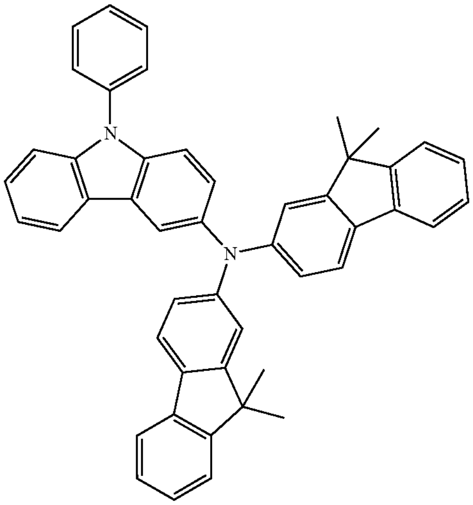
HT11
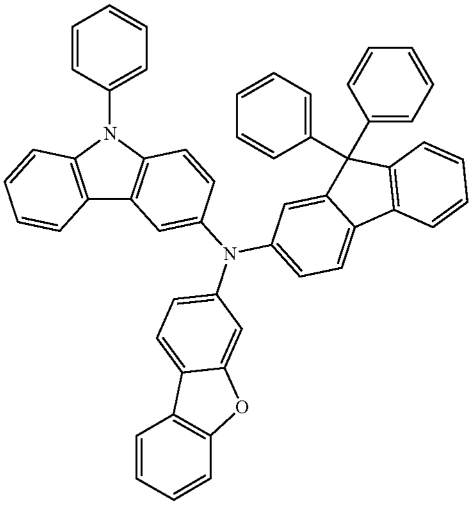
HT12
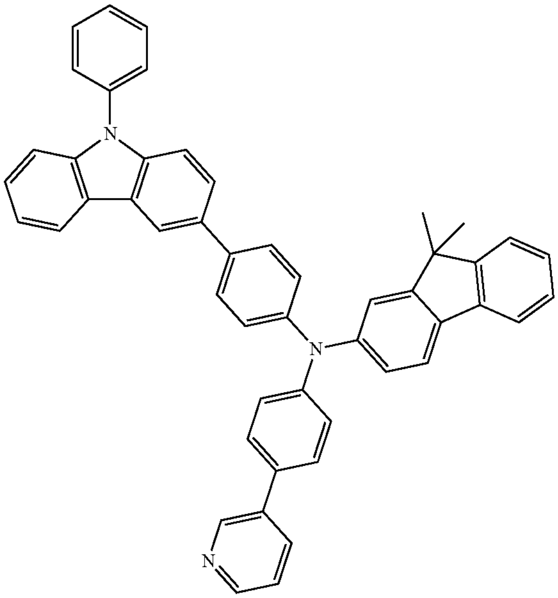
HT13
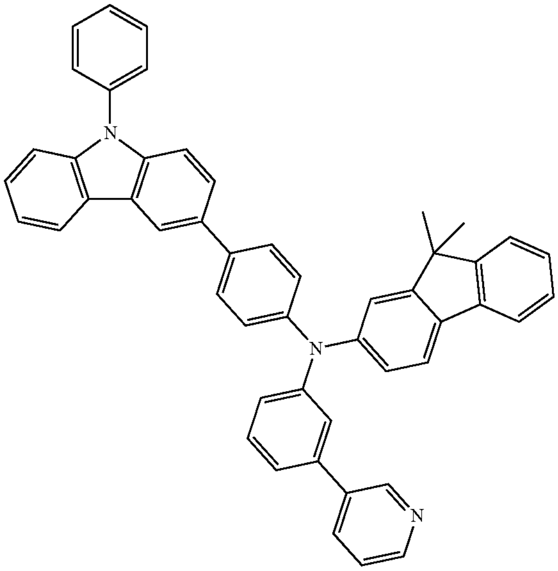
HT14
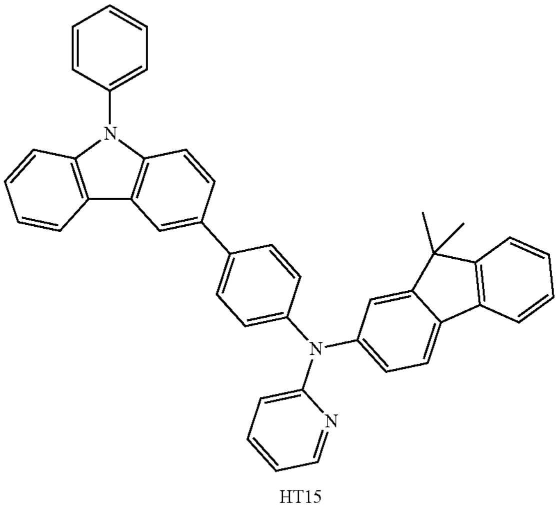
HT15
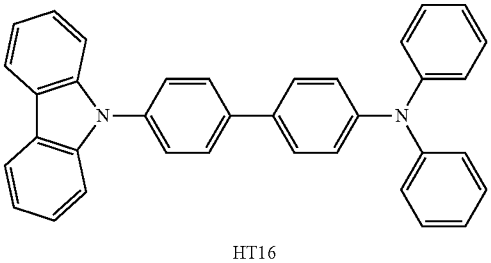
HT16

-continued
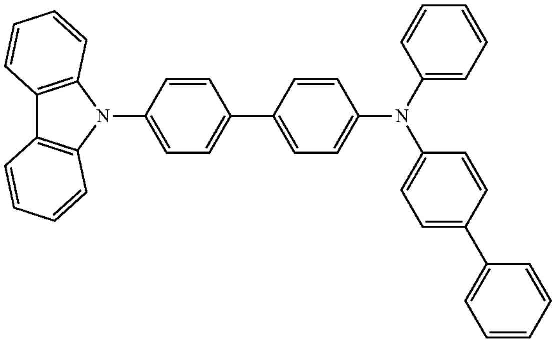
HT17
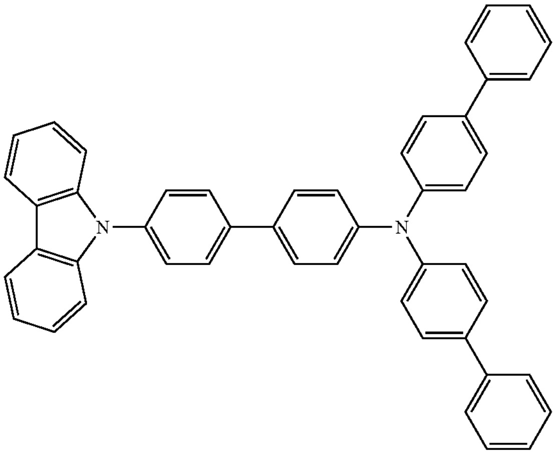
HT18
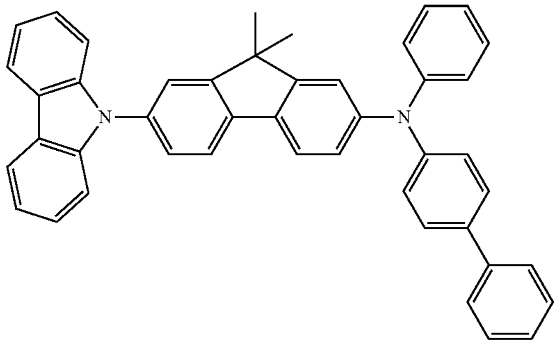
HT19
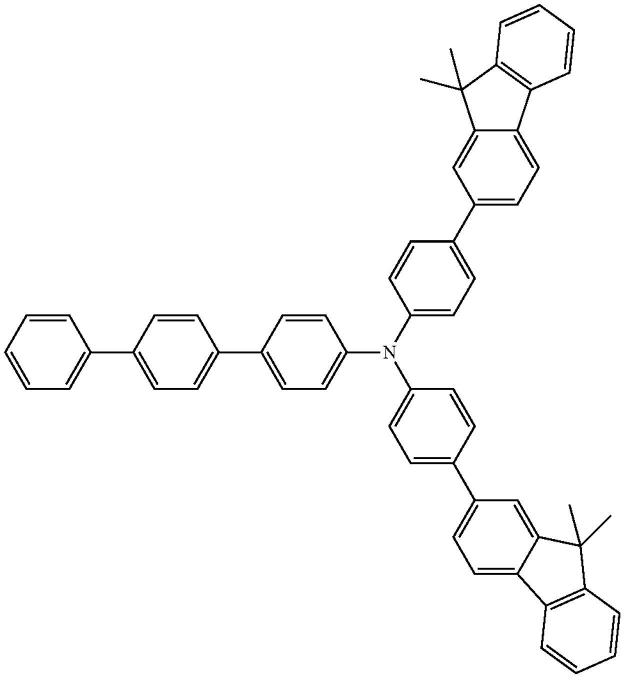
HT20

-continued
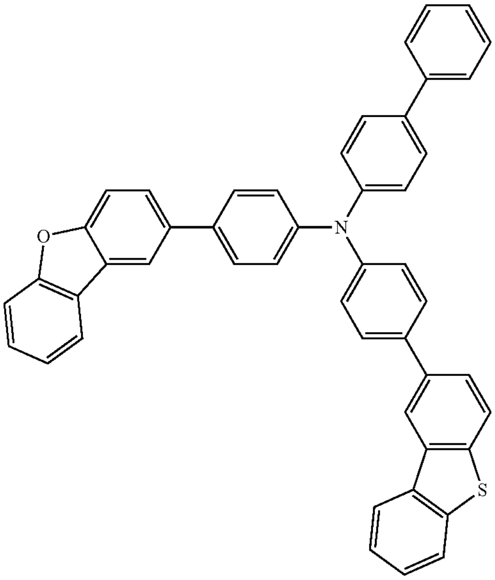
HT21
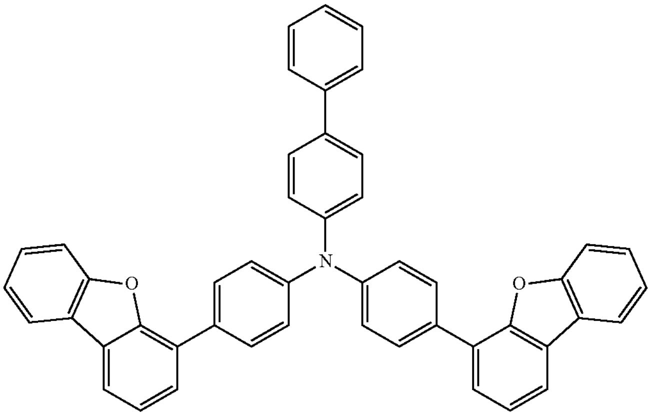
HT22
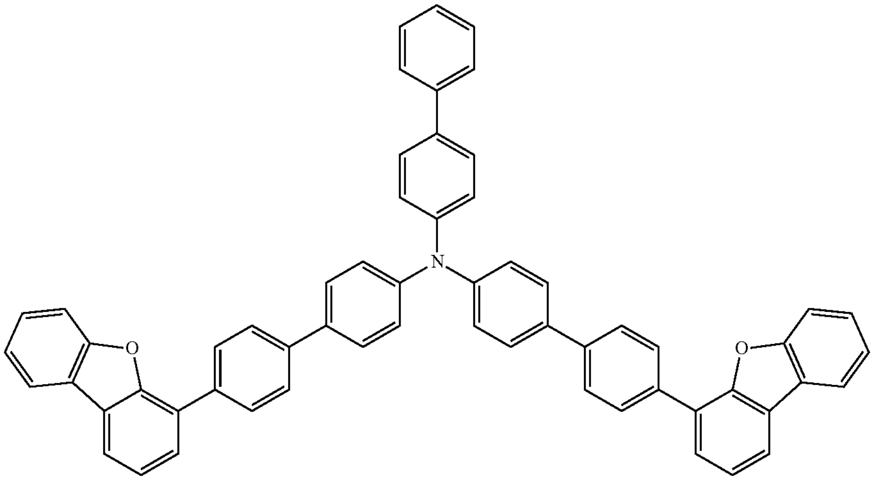
HT23
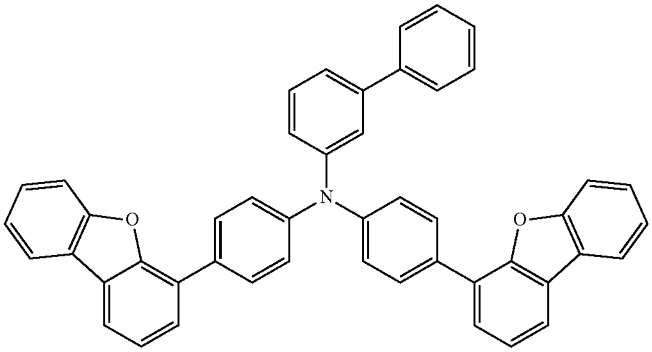
HT24

-continued
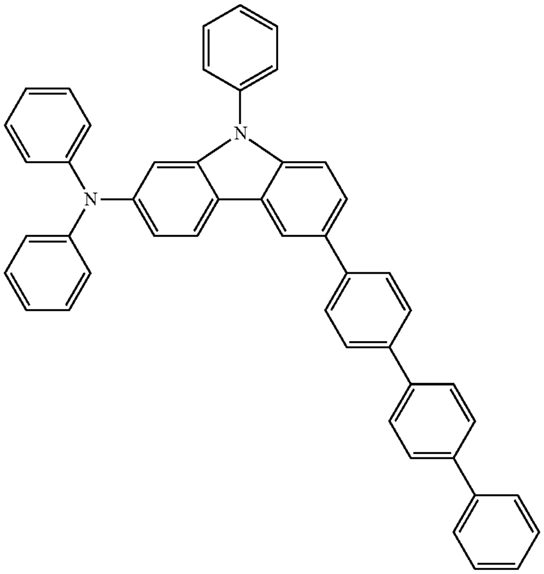
HT25
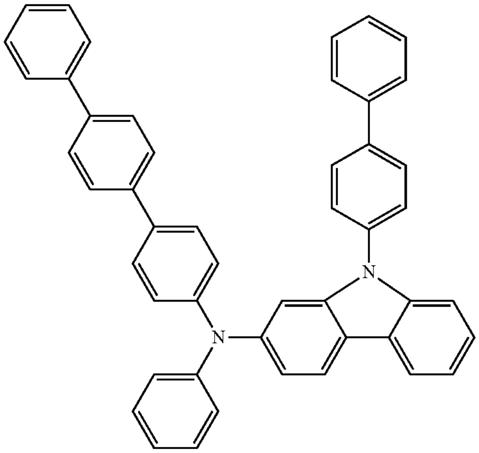
HT26
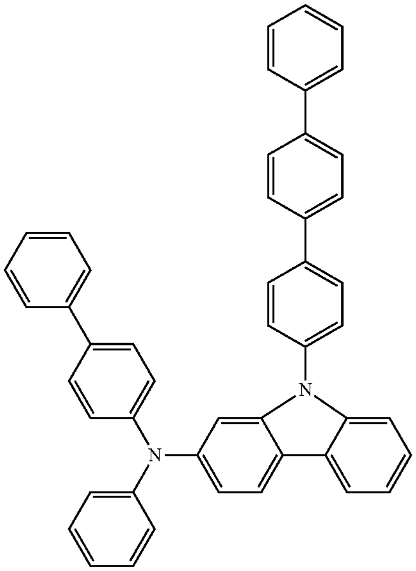
HT27
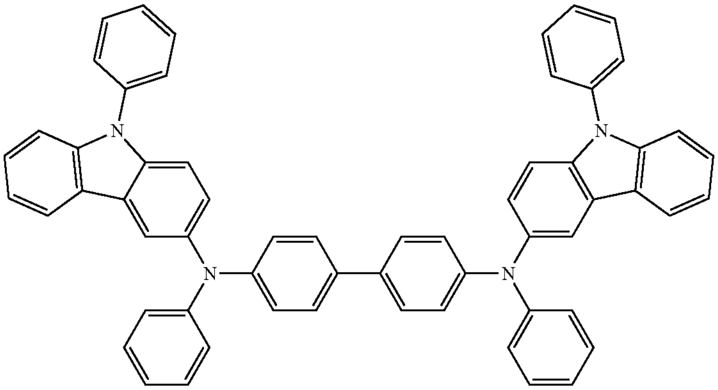
HT28
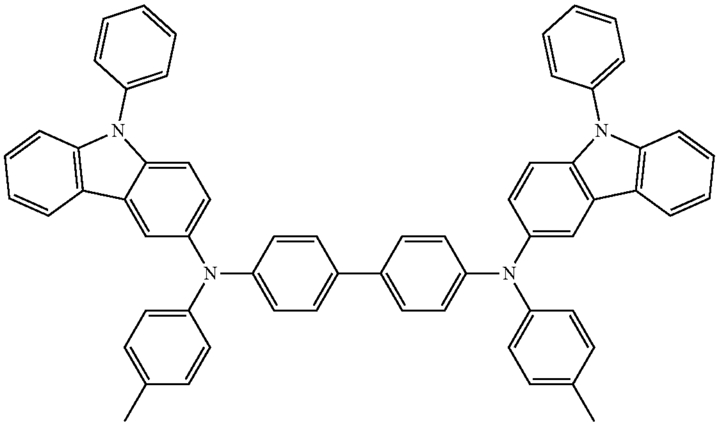
HT29

-continued
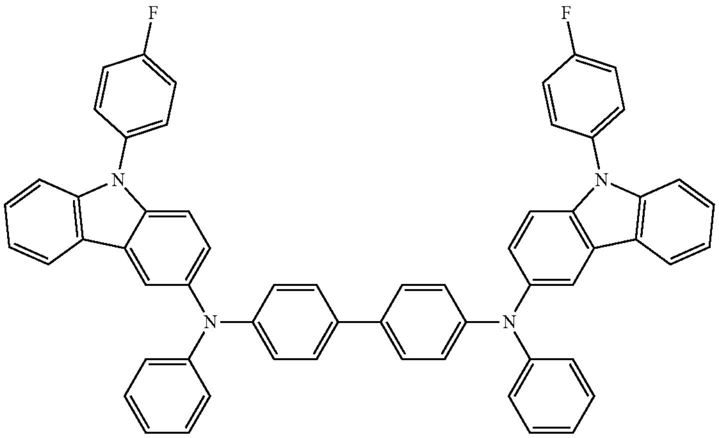
HT30
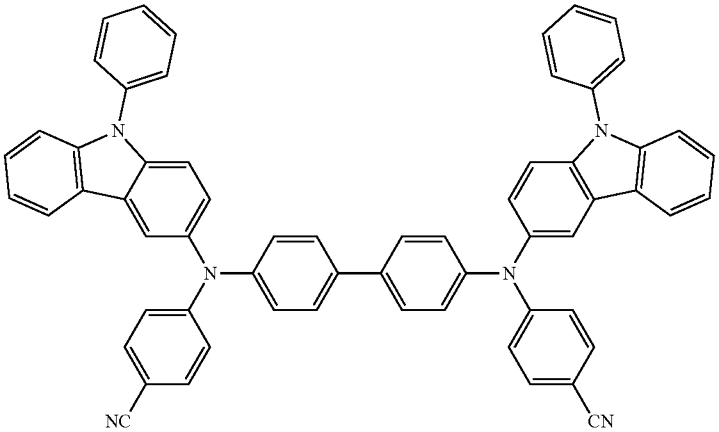
HT31
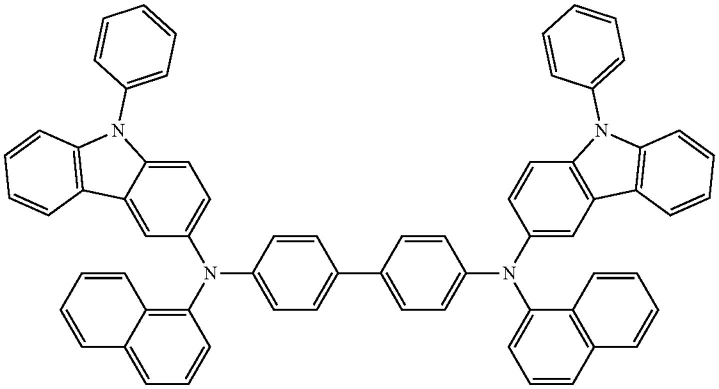
HT32

-continued
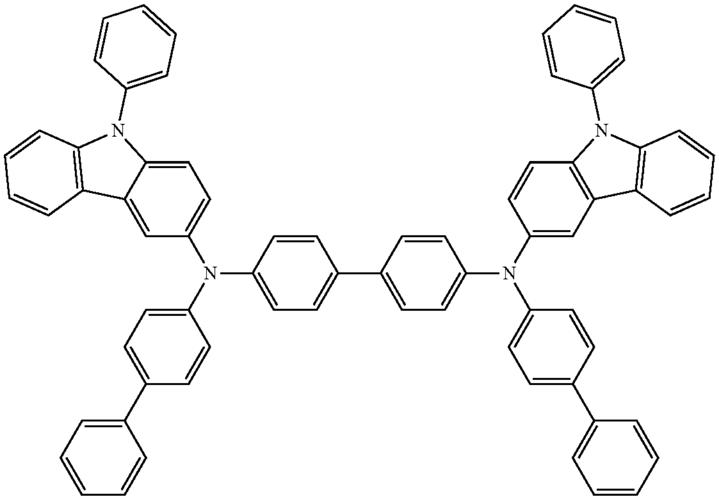
HT33
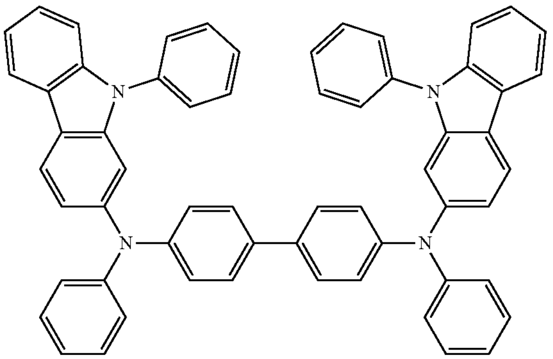
HT34
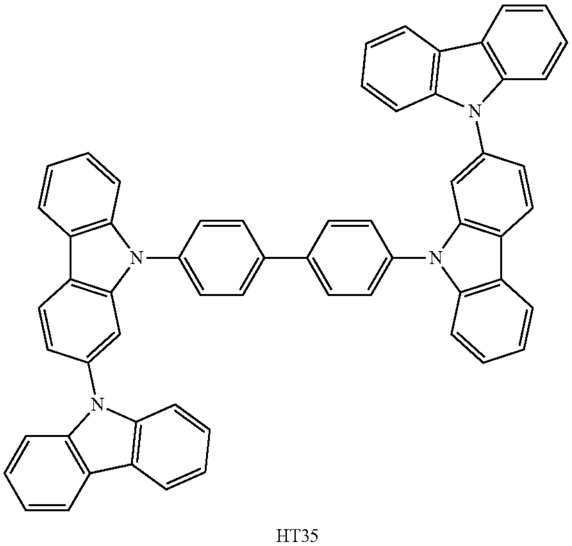
HT35

-continued
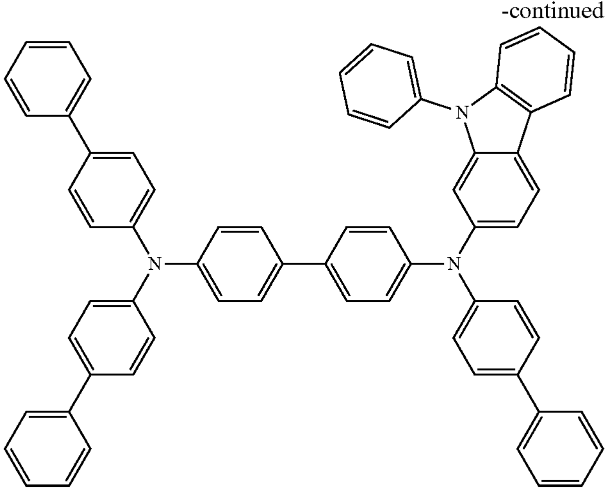
HT36
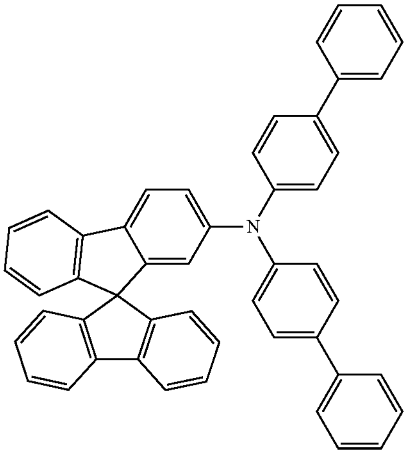
HT37
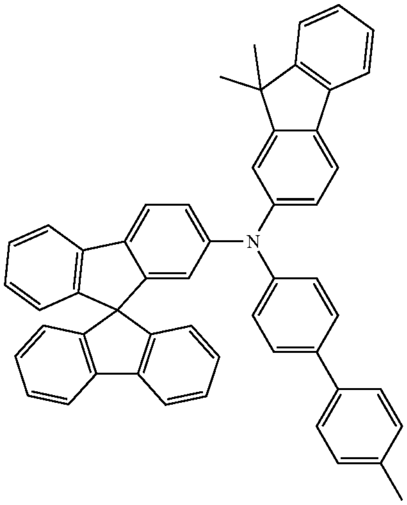
HT38
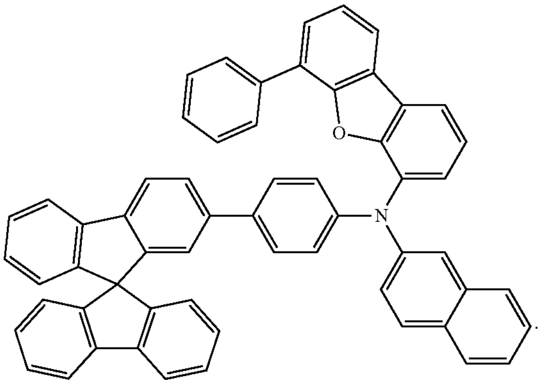
HT39

HT1
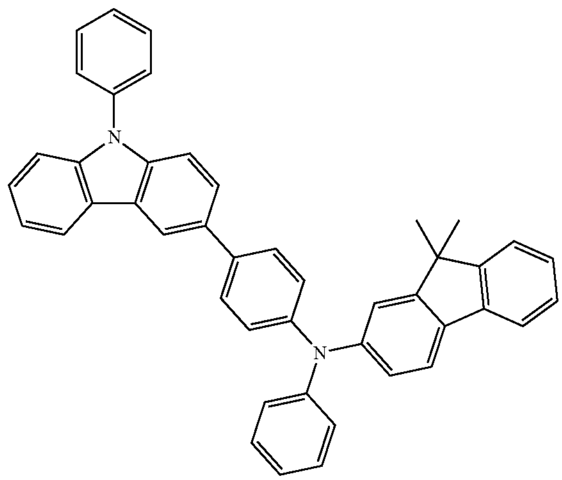
HT2
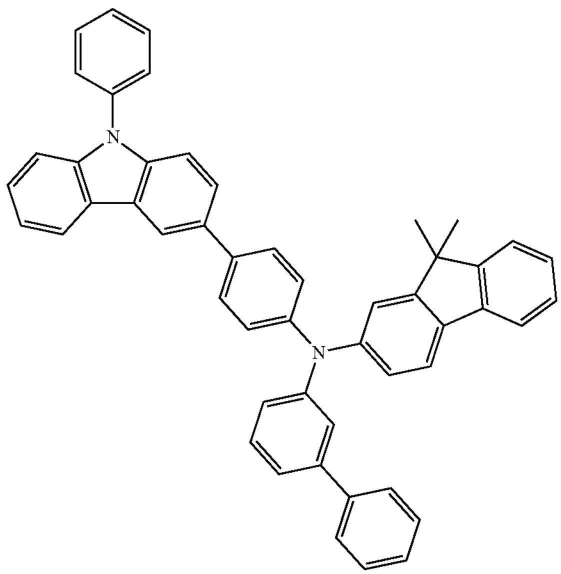
HT3
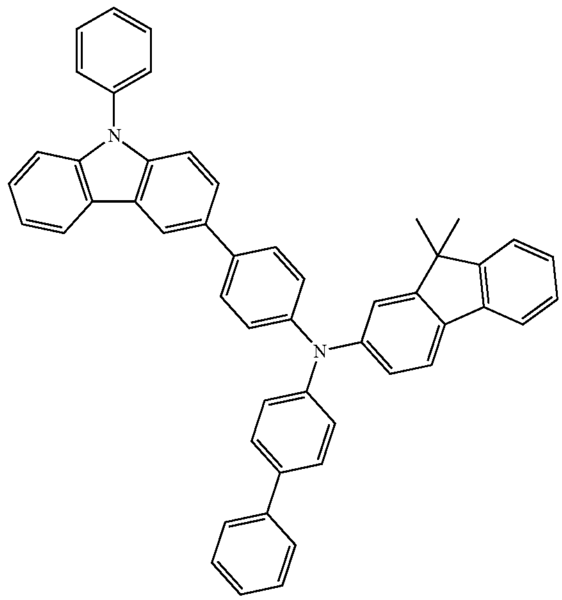
HT4
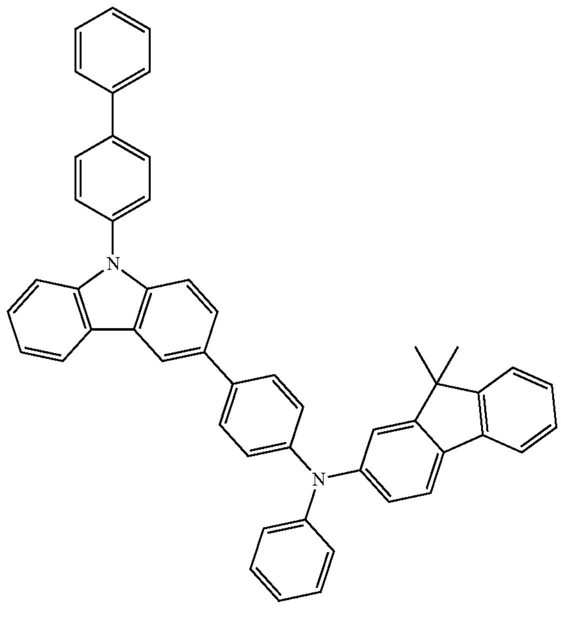

-continued
HT5
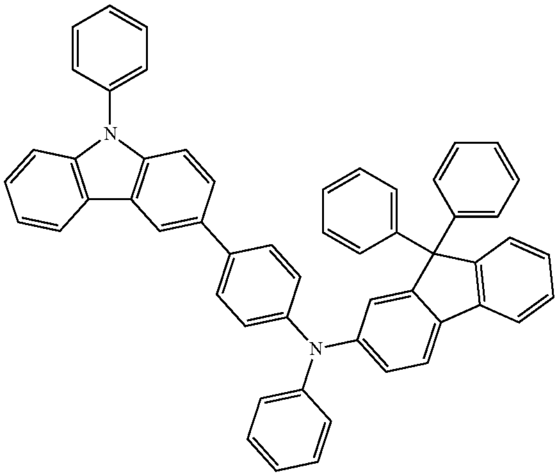
HT6
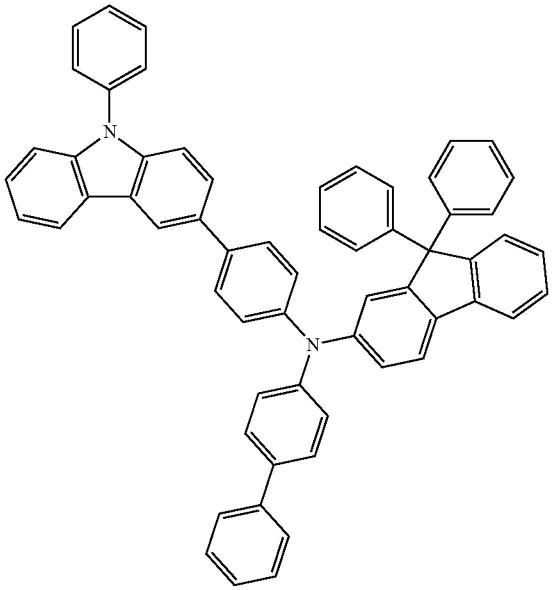
HT7
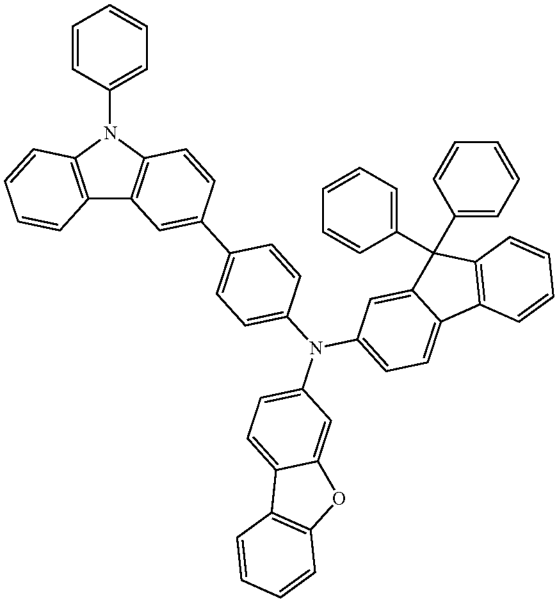
HT8
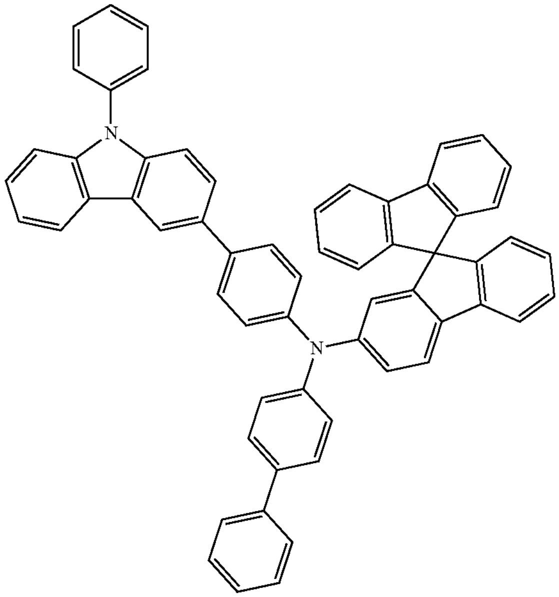

-continued
HT9
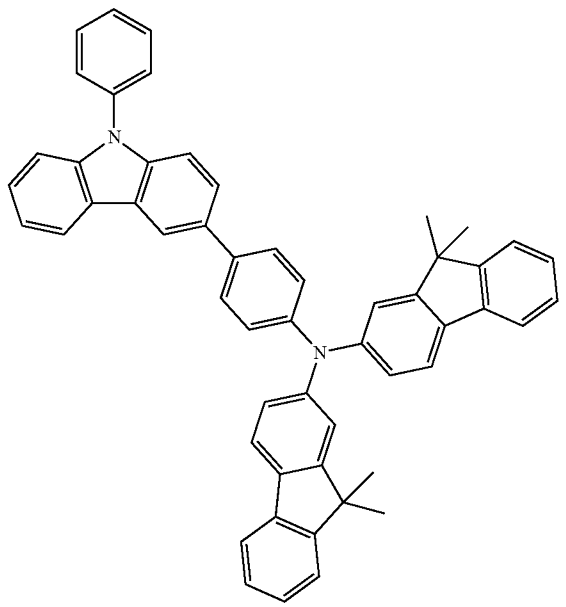
HT10
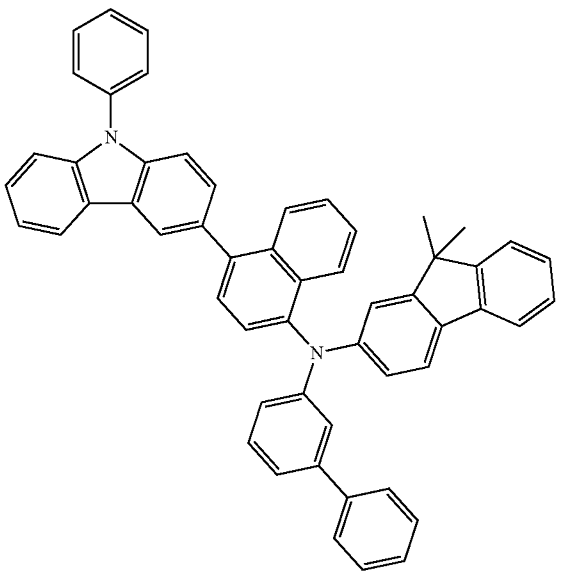
HT11
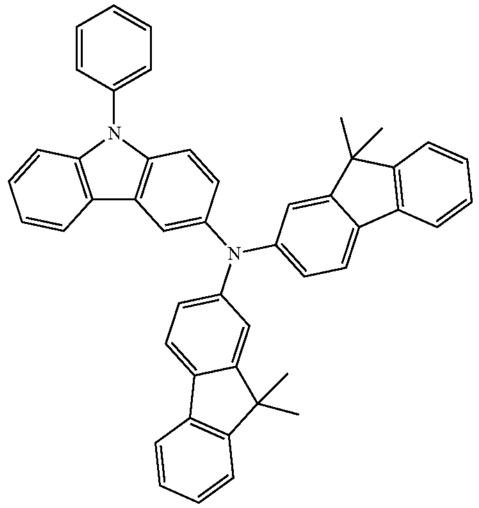
HT12
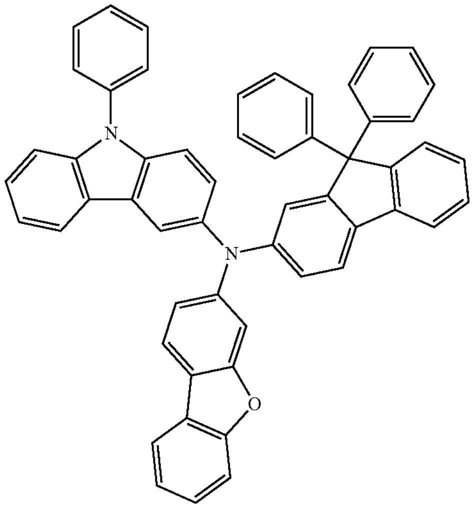

-continued
HT13
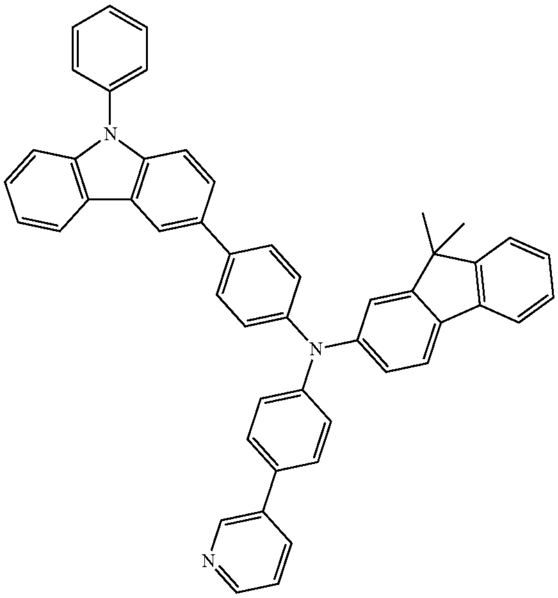
HT14
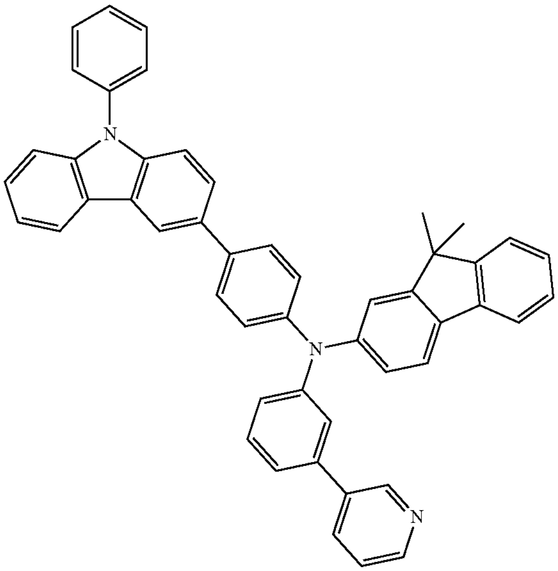
HT15
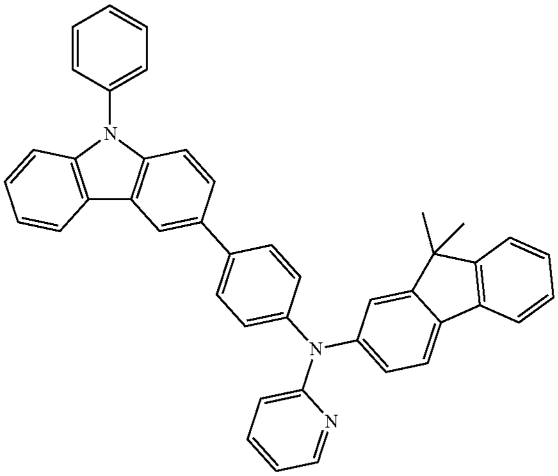
HT16
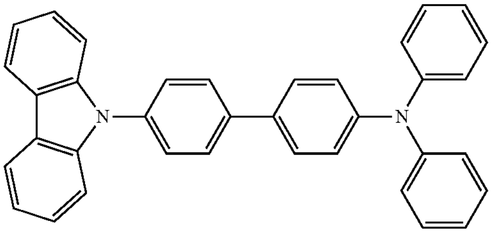
HT17
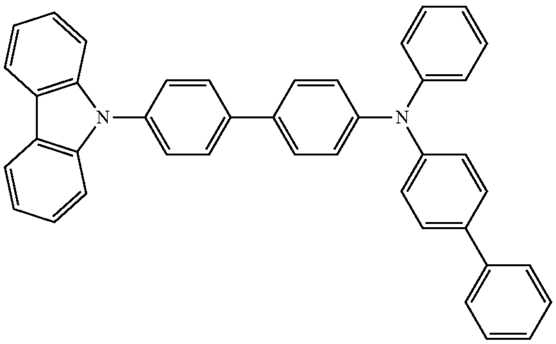
HT18
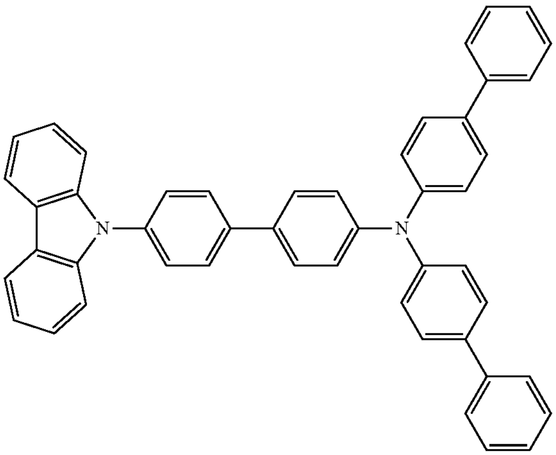

-continued
HT19
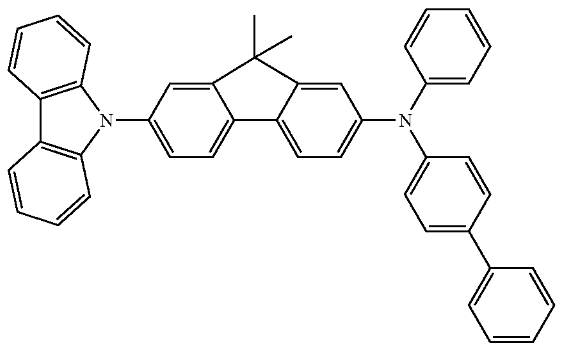
HT20
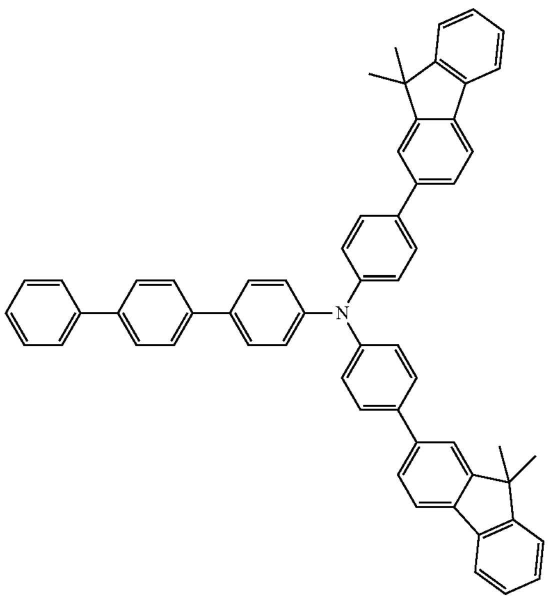
HT21
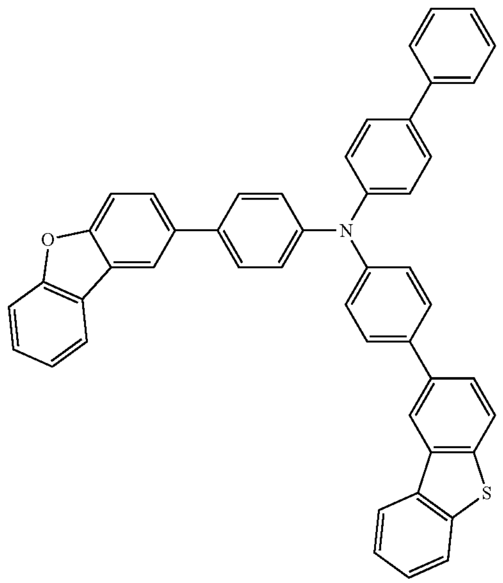
HT22
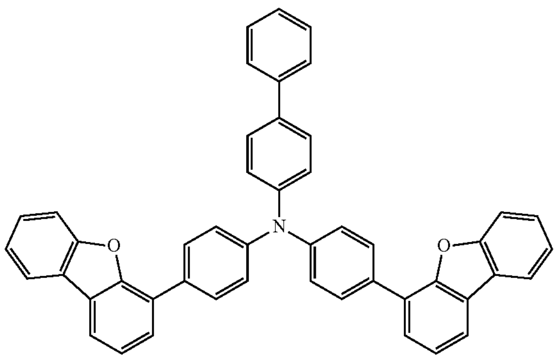

-continued
HT23
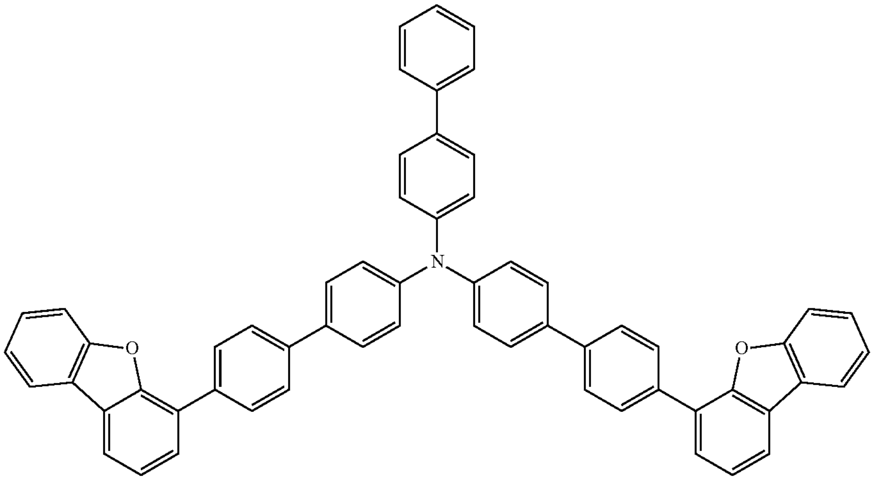
HT24
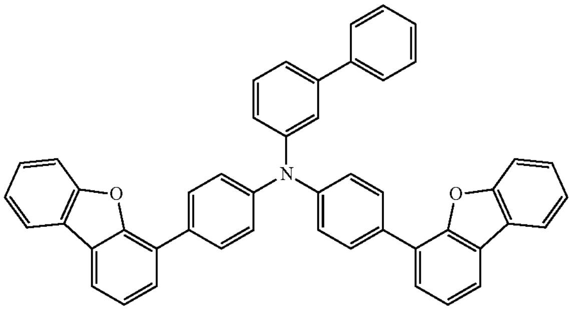
HT25
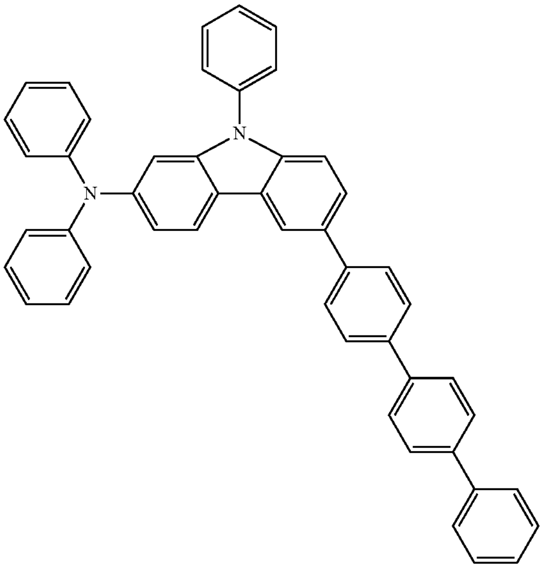
HT26
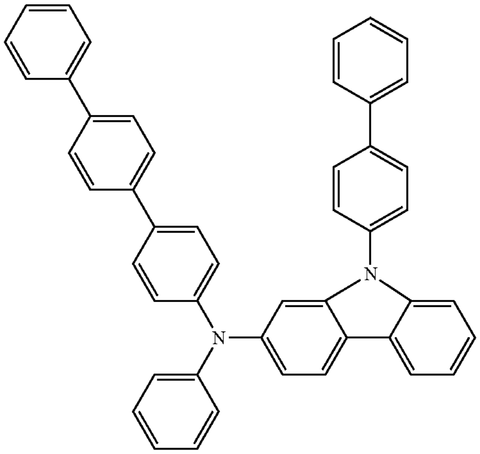
HT27
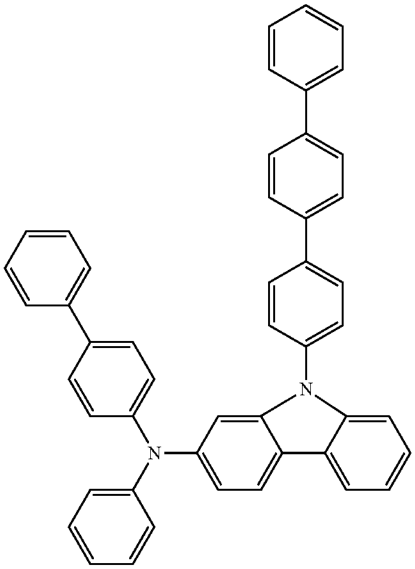

-continued
HT28
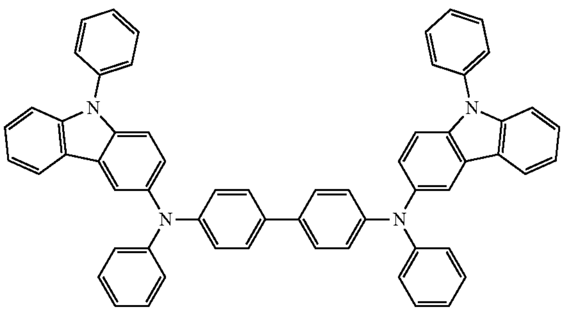
HT29
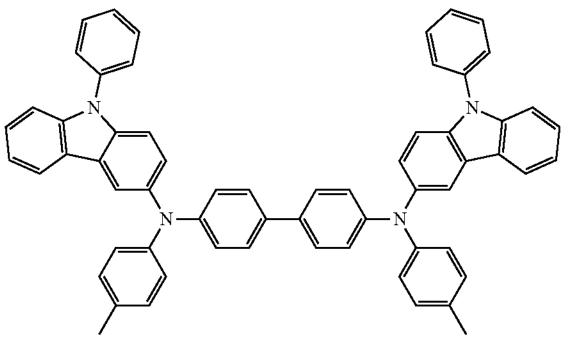
HT30
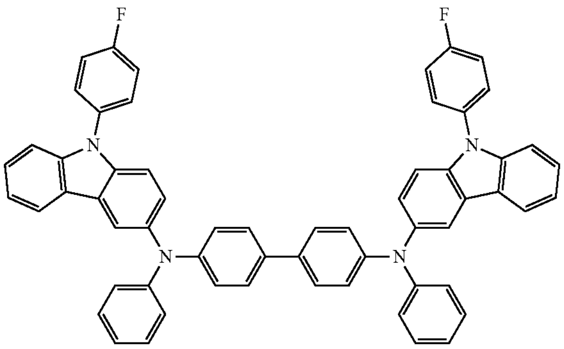
HT31
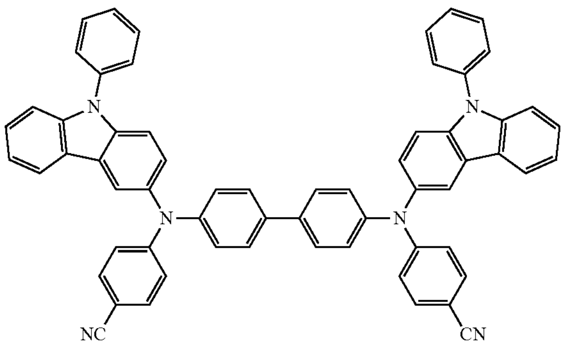
HT32
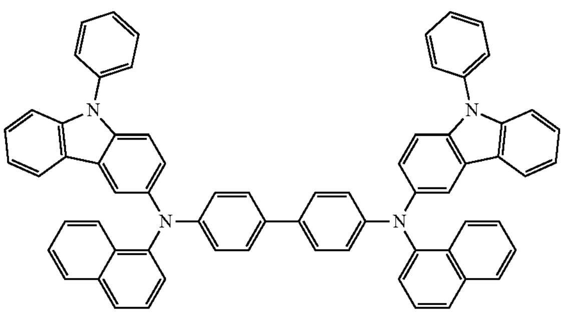
HT33
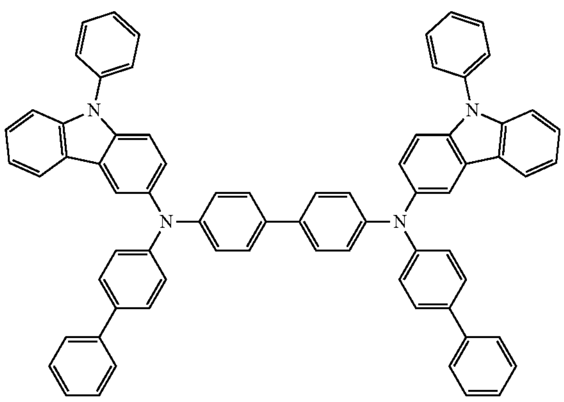

-continued
HT34
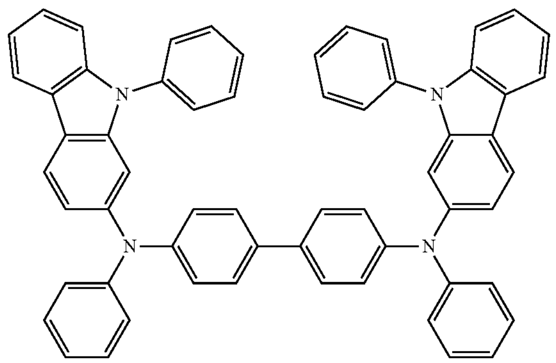
HT35
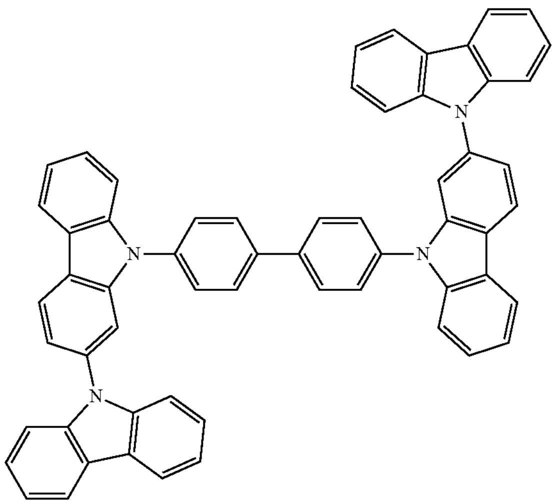
HT36
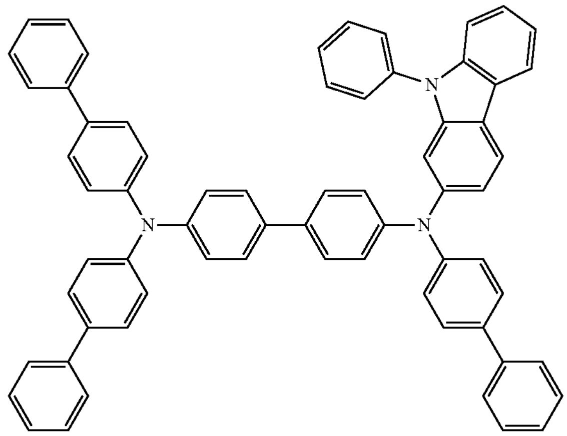
HT37
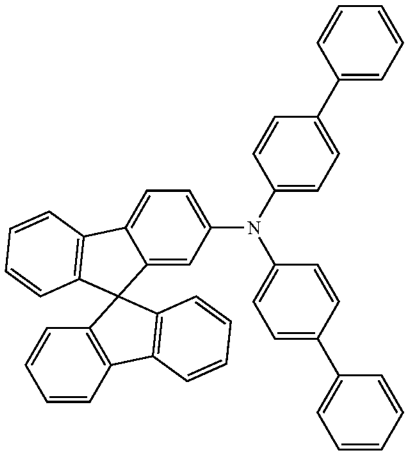
HT38
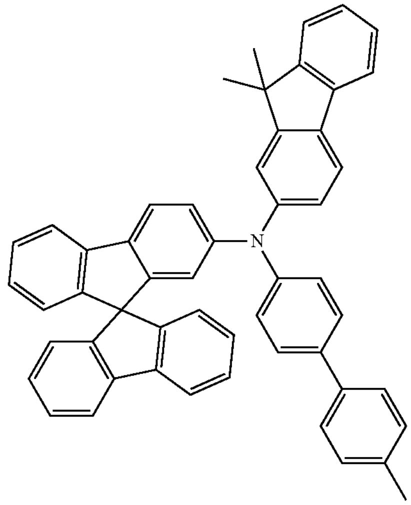
HT39
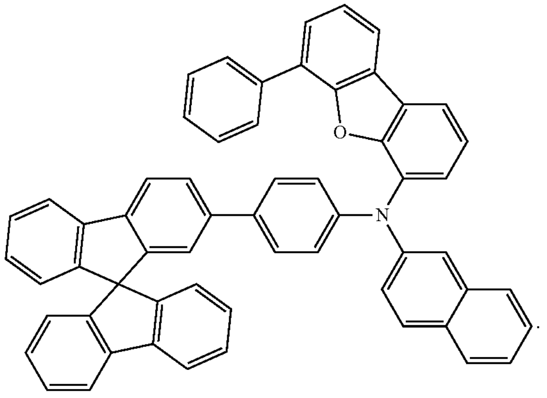

The thickness of the hole transport region may be about 100 Å to about 10,000 Å, for example, about 100 Å to about 1,000 Å. When the hole transport region includes at least one selected from a hole injection layer and a hole transport layer, the thickness of the hole injection layer may be about 100 Å to about 9,000 Å, and for example, about 100 Å to about 1,000 Å, and the thickness of the hole transport layer may be about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer (e.g., by adjusting the optical resonance distance to match the wavelength of light emitted from the emission layer, resulting in constructive interference), and the electron blocking layer may block or reduce the flow of electrons from an electron transport region. The emission auxiliary layer and the electron blocking layer may each include the materials described above.

When the organic light-emitting device 10, 20, or 30 is a full-color organic light-emitting device, the emission layer may be patterned into a red emission layer, a green emission layer, or a blue emission layer, according to a sub-pixel. In one or more embodiments, the emission layer may have a stacked structure including two or more layers selected from a red emission layer, a green emission layer, and a blue emission layer, in which the two or more layers may contact each other or may be separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and/or a dopant. The dopant may include at least one selected from a phosphorescent dopant and a fluorescent dopant.

The amount of the dopant in the emission layer may be about 0.01 parts by weight to about 15 parts by weight based on 100 parts by weight of the host, but embodiments of the present disclosure are not limited thereto.

The thickness of the emission layer may be about 100 Å to about 1,000 Å, for example, about 200 Å to about 600 Å. When the thickness of the emission layer is within this range, excellent light-emission characteristics may be obtained without a substantial increase in driving voltage.

The host may include, for example, at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but embodiments of the present disclosure are not limited thereto:

H1

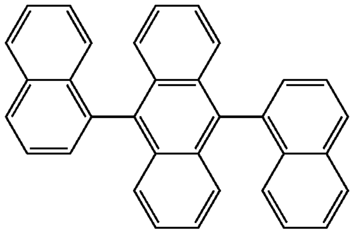

-continued

H2

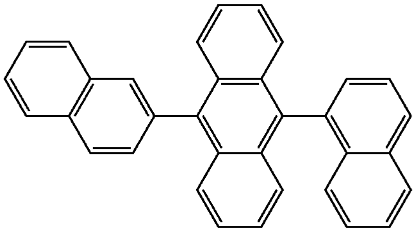

H3

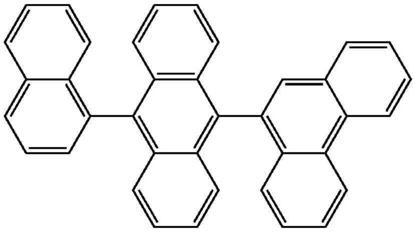

H4

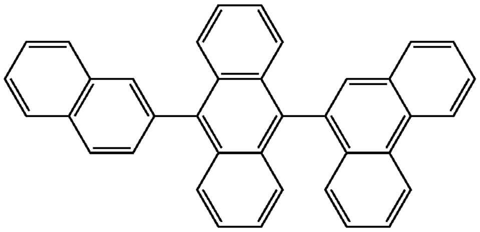

H5

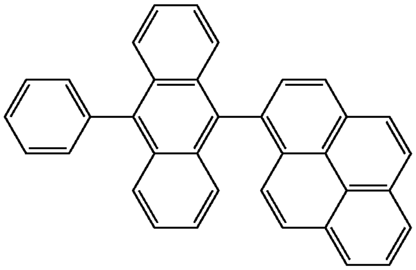

H6

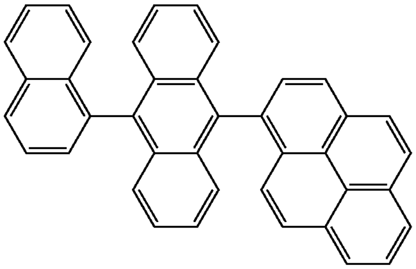

H7

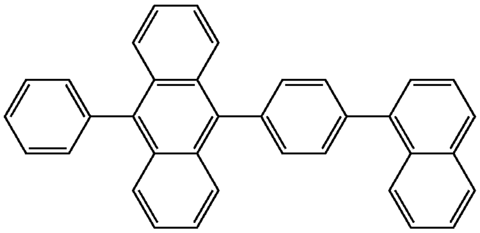

-continued
H8
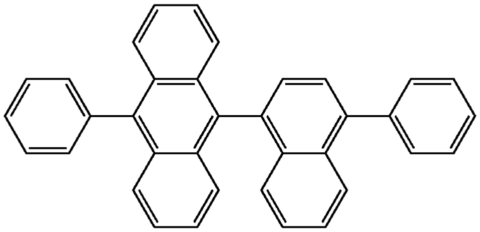
H9
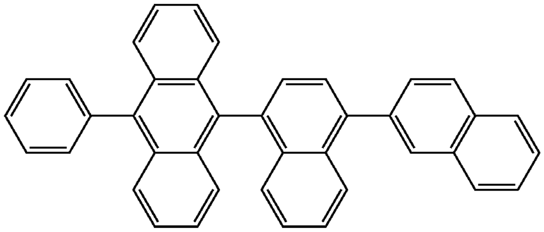
H10
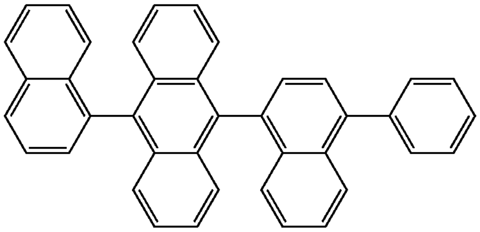
H11
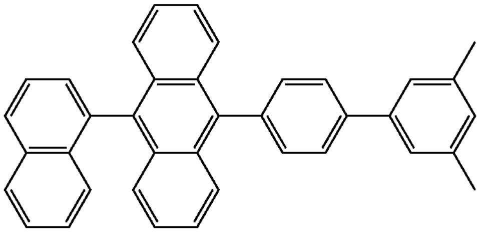
H12
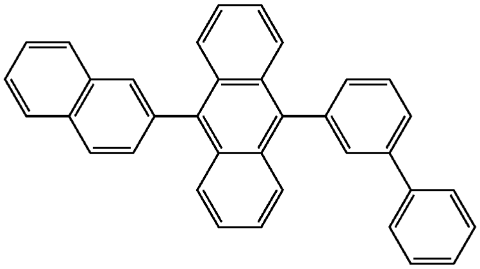
H13
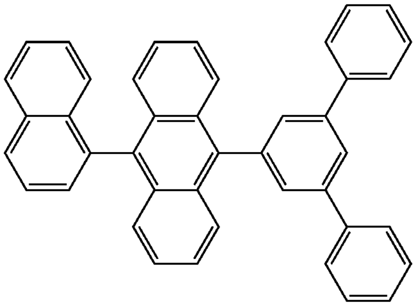
-continued
H14
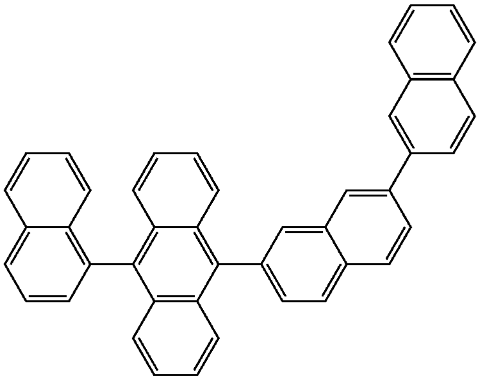
H15
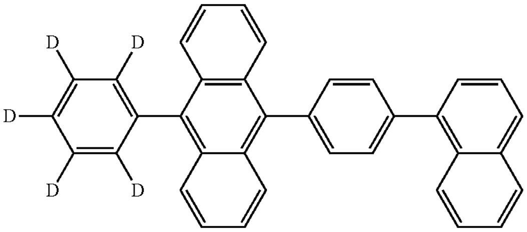
H16
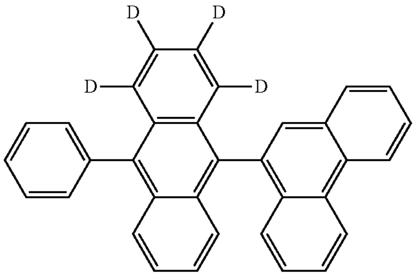
H17
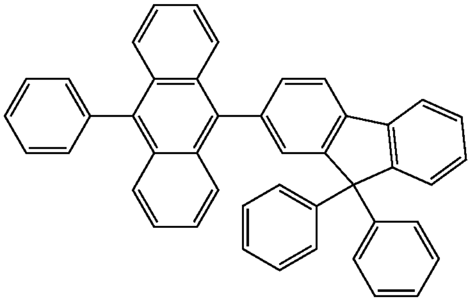
H18
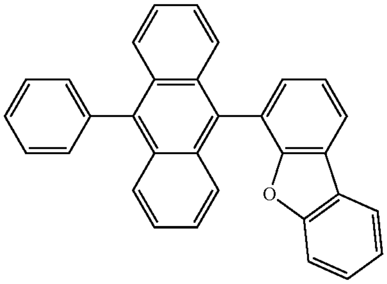

-continued
H19
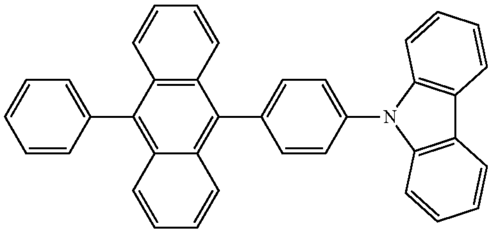
H20
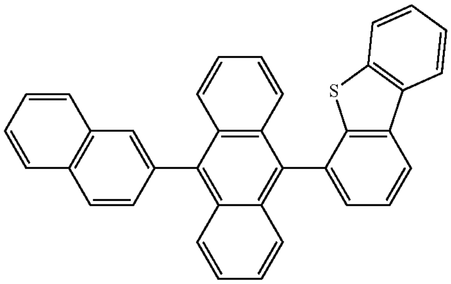
H21
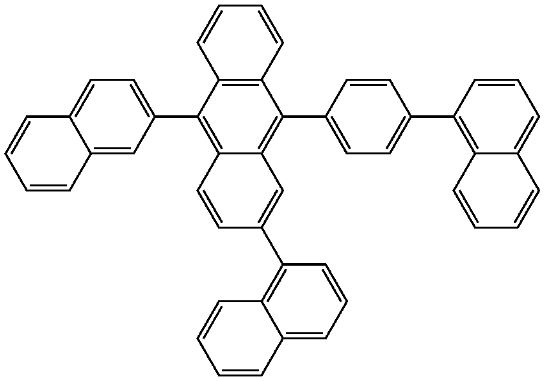
H22
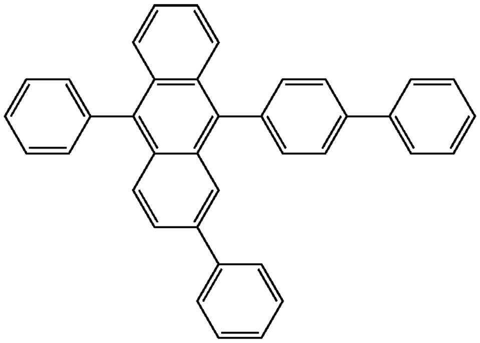
-continued
H213
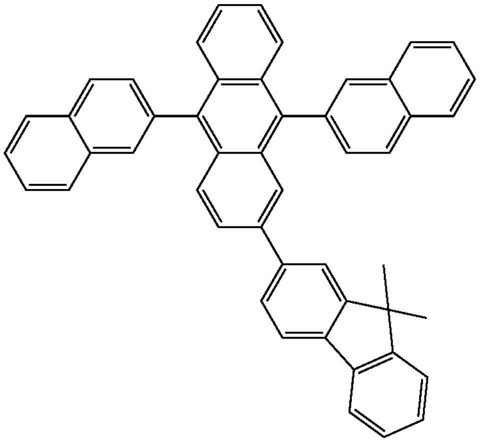
H24
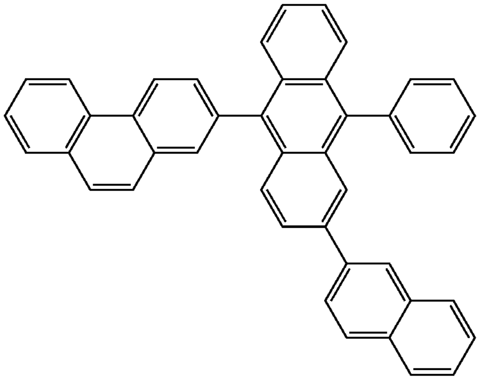
H25
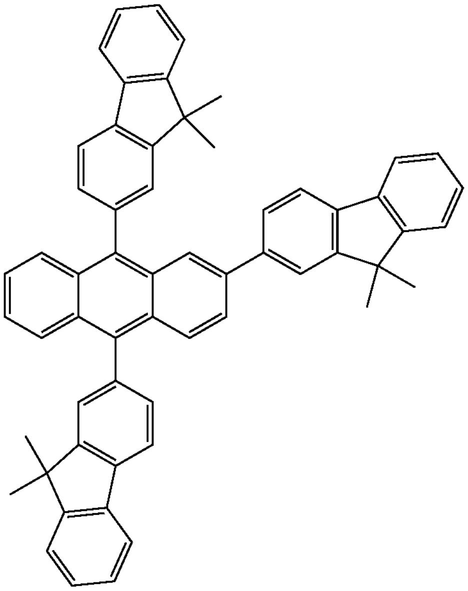

-continued
H26
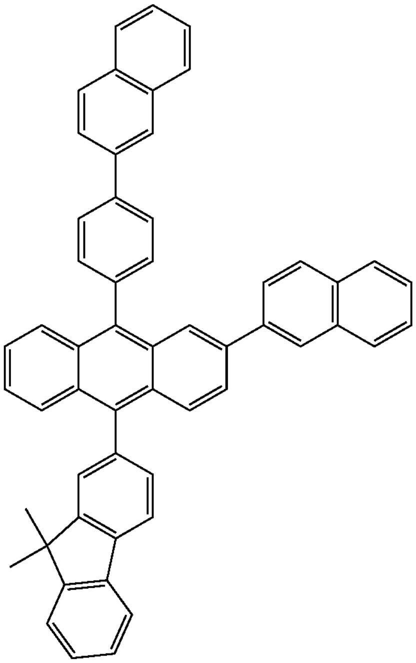
H27
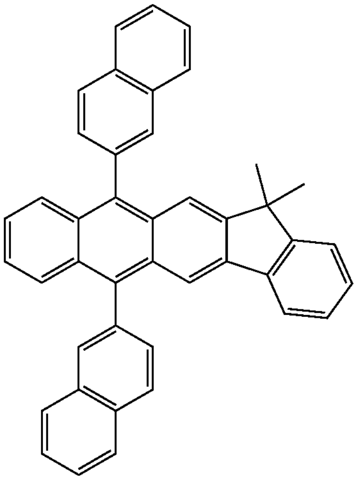
H28
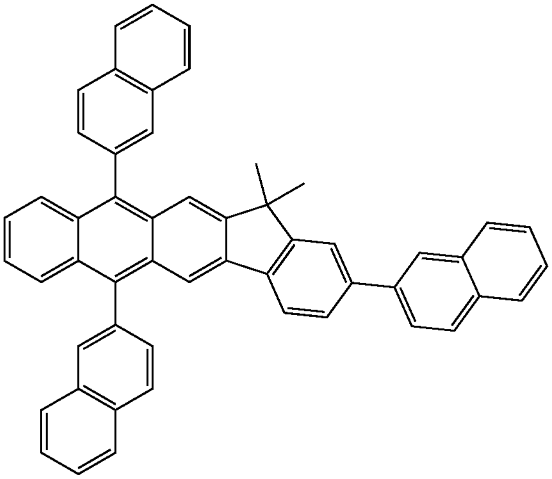
-continued
H29
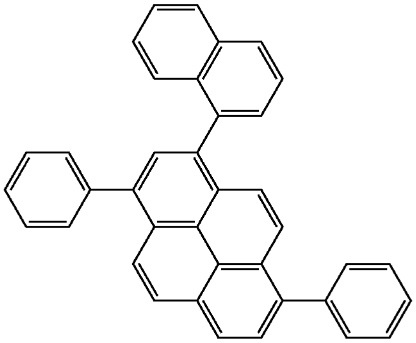
H30
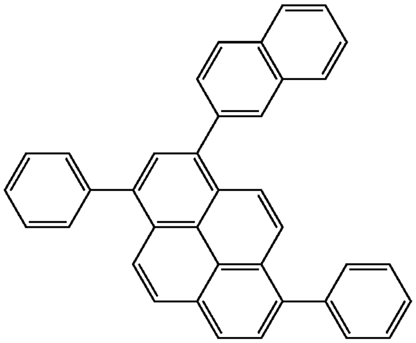
H31
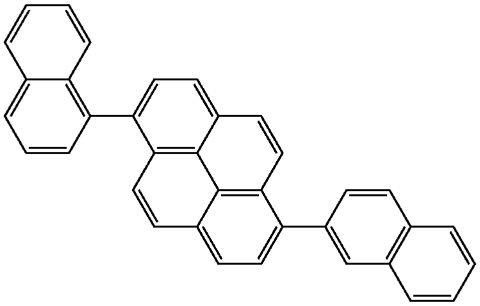
H32
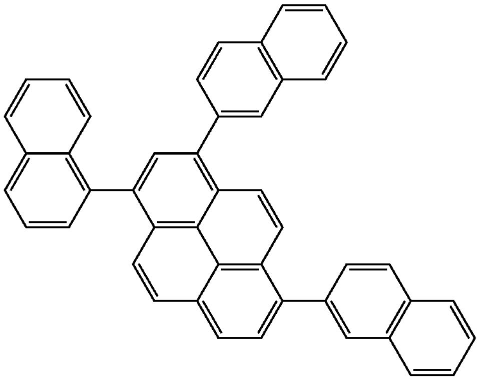
H33
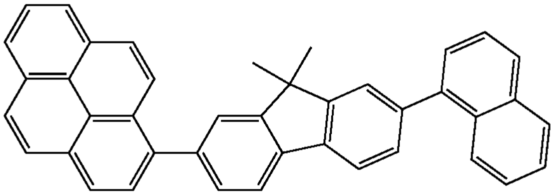

-continued
H34
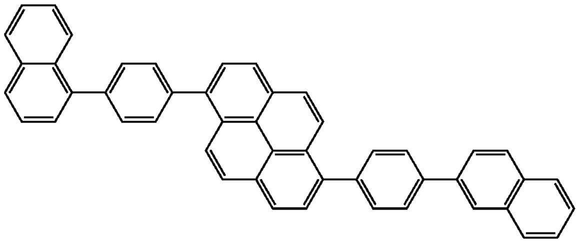
H35
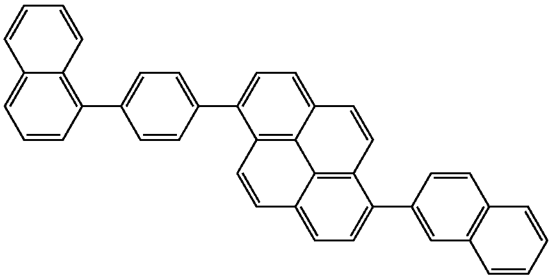
H36
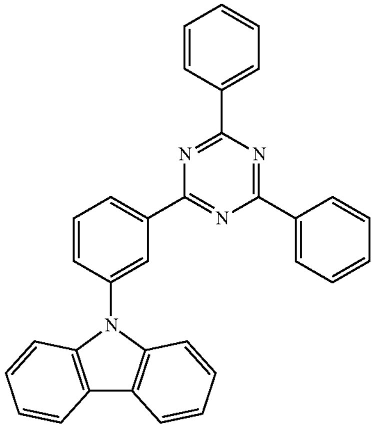
H37
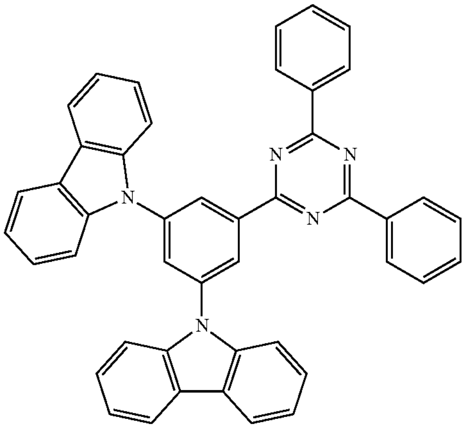
-continued
H38
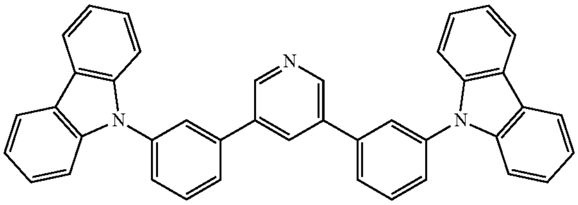
H39
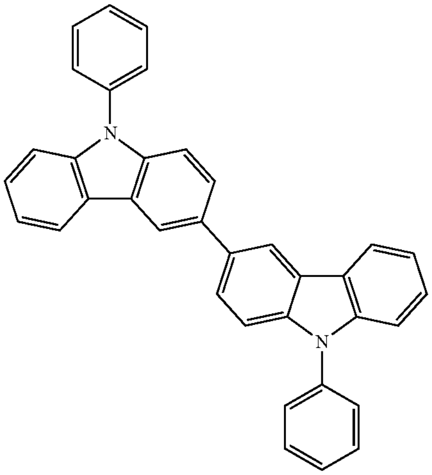
H40
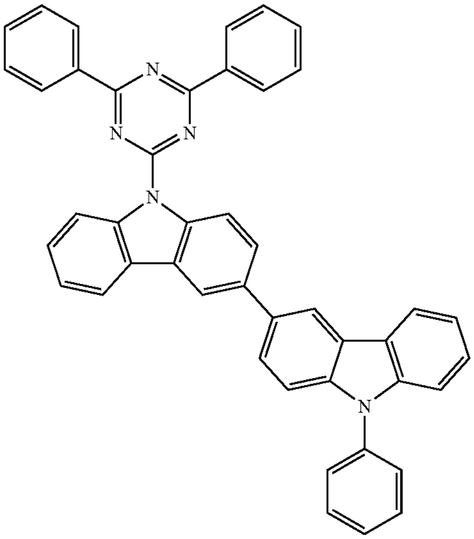

-continued
H41
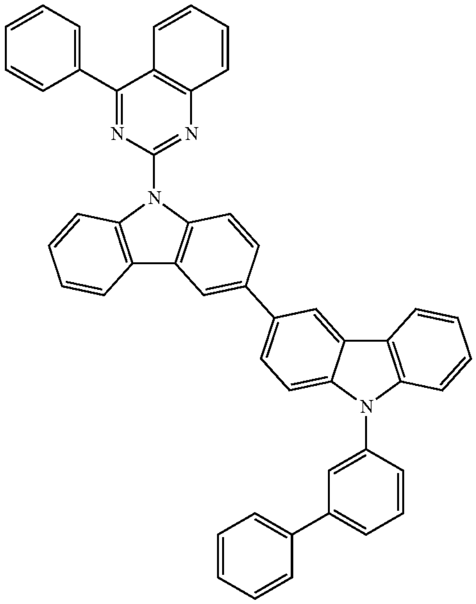
H42
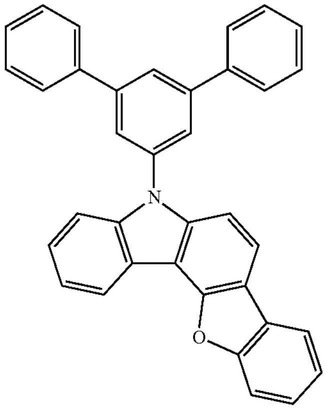
H43
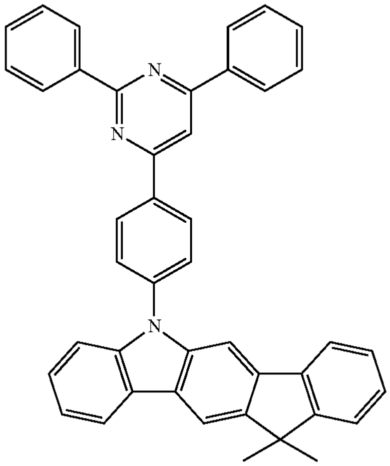
-continued
H44
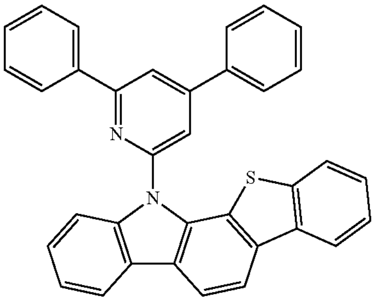
H45
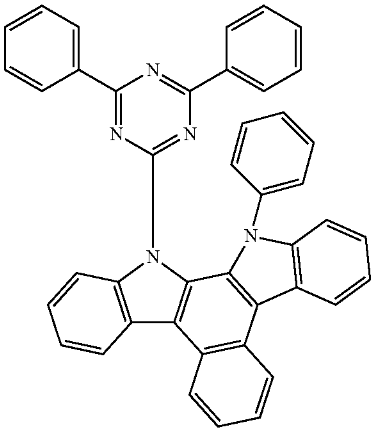
H46
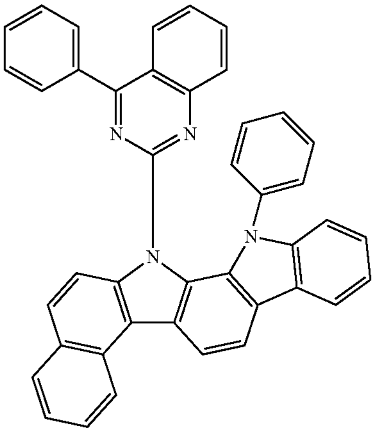
H47
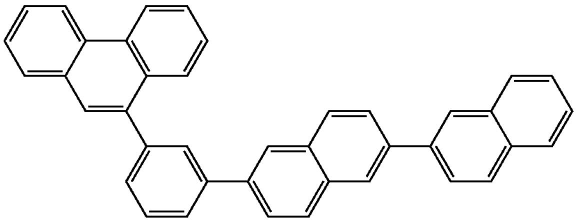
H48
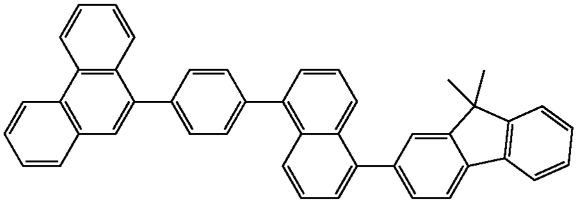

-continued
H49
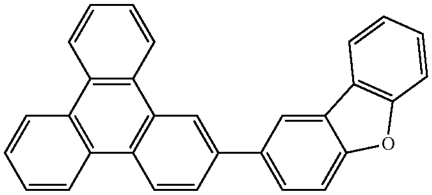
H50
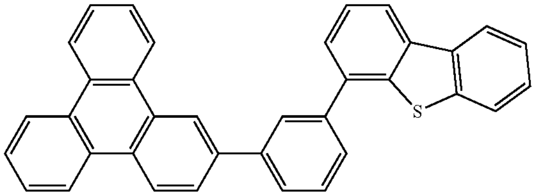
H51
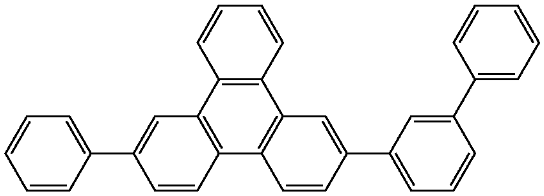
H52
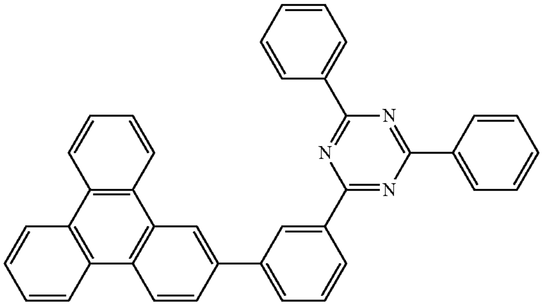
H53
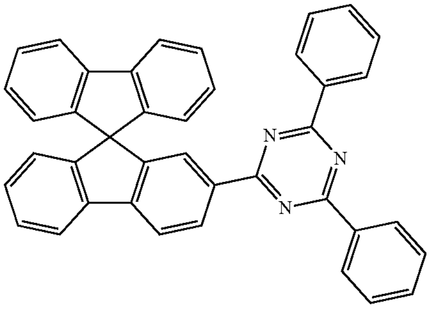
-continued
H54
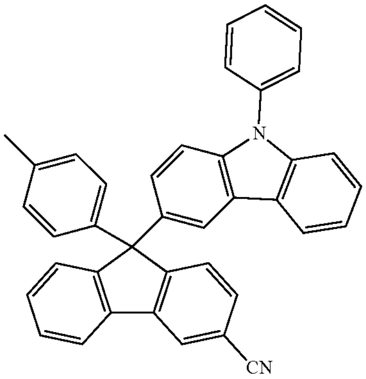
H55
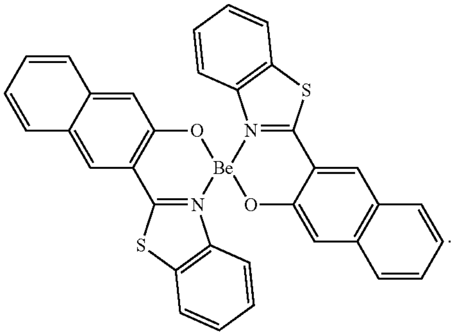
.
The phosphorescent dopant may be, for example, selected from Compounds PD1 to PD25, but embodiments of the present disclosure are not limited thereto:
PD1
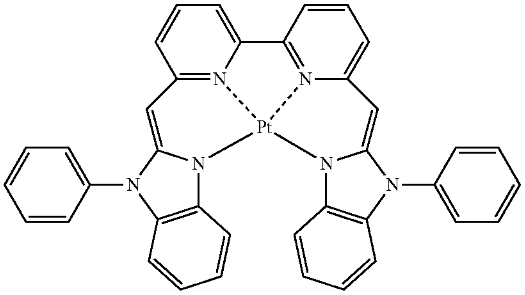
PD2
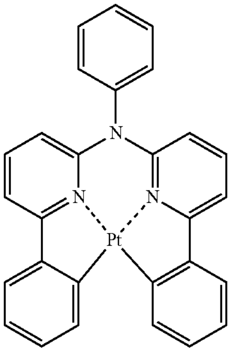

-continued
PD3
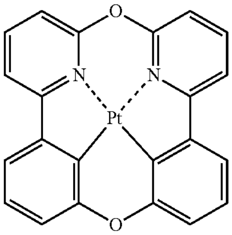
PD4
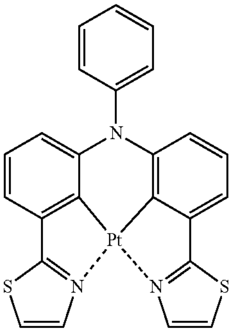
PD5
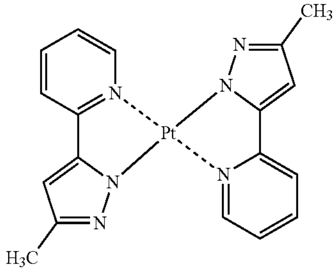
PD6
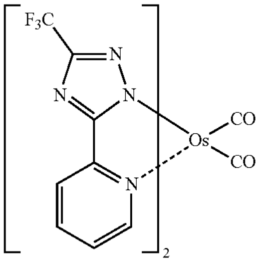
PD7
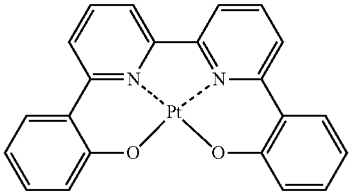
PD8
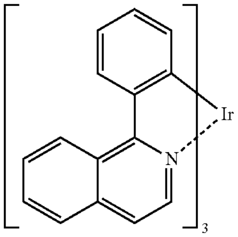
-continued
PD9
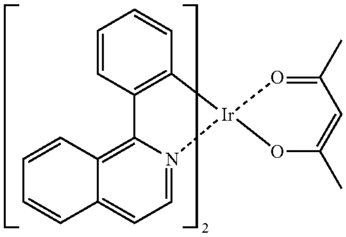
PD10
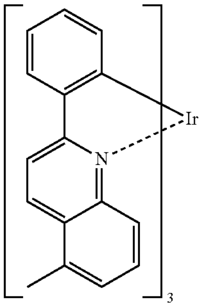
PD11
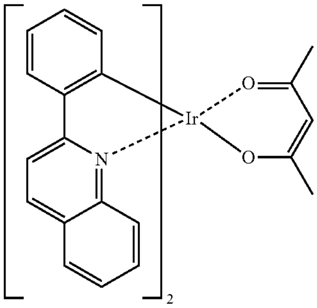
PD12
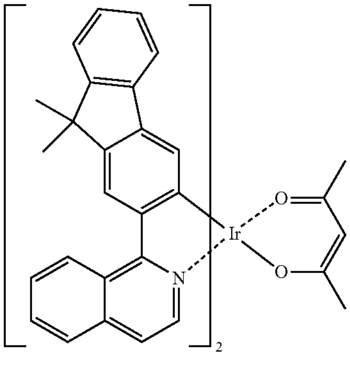
PD13
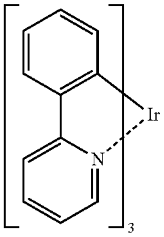

PD14
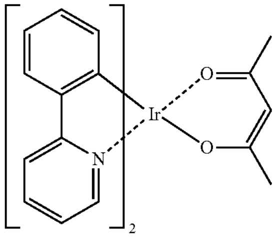
PD15
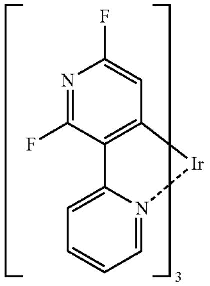
PD16
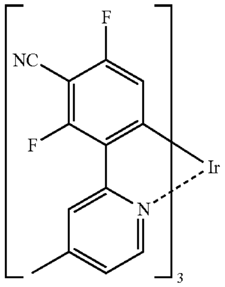
PD17
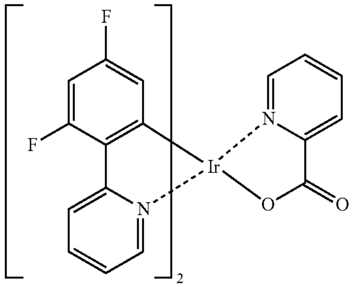
PD18
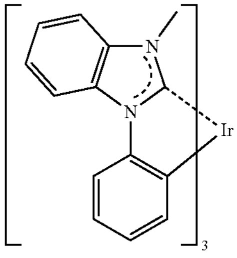
PD19
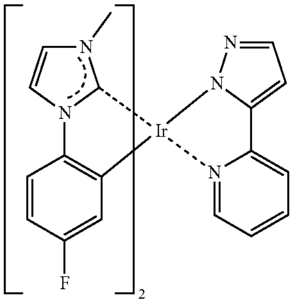
PD20
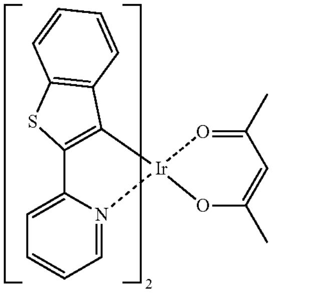
PD21
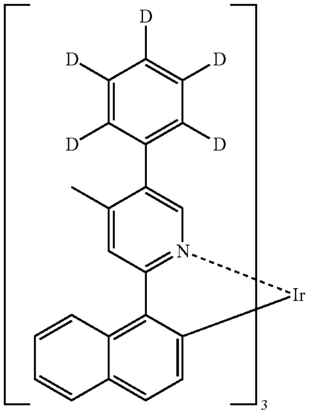
PD22
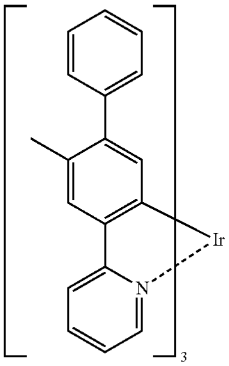

-continued
PD23
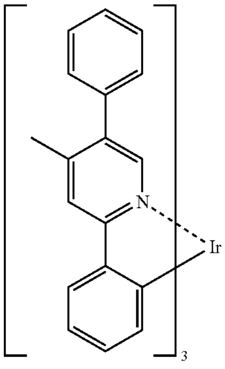
PD24
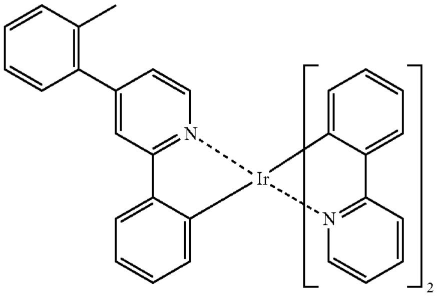
PD25
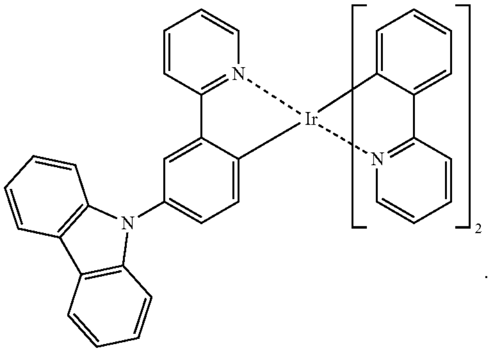
.
The fluorescent dopant may be, for example, selected from Compounds FD1 to FD22:
FD1
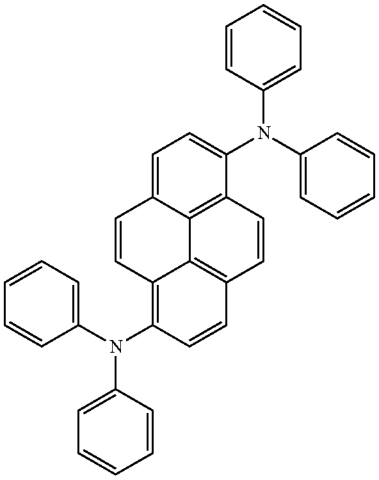
FD2
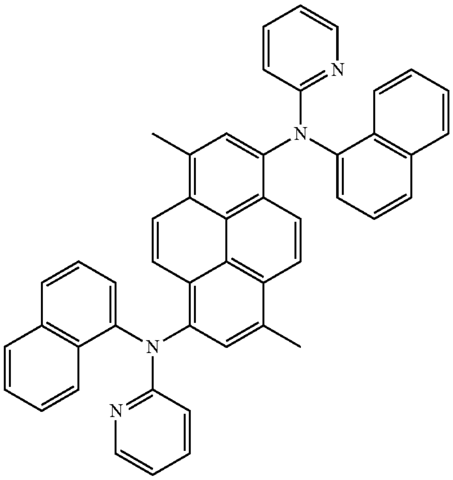
FD3
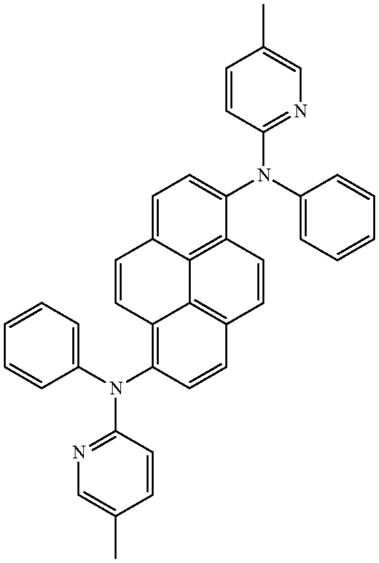

-continued
FD4
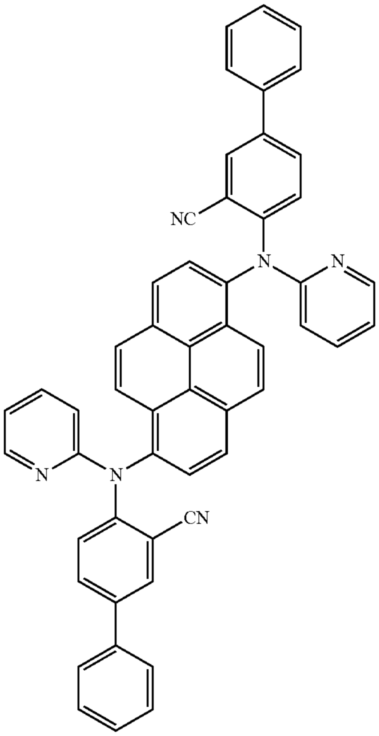
FD5
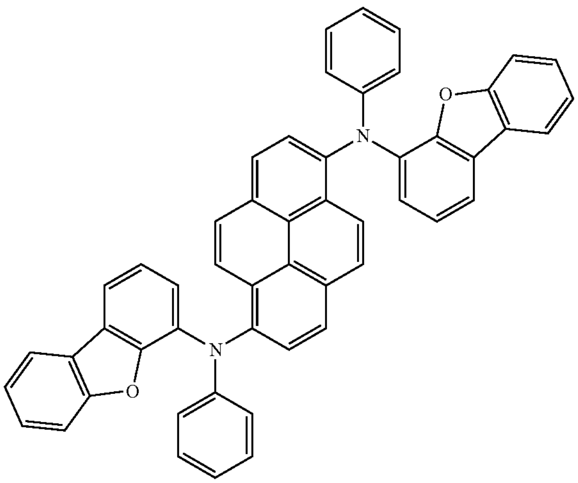
-continued
FD6
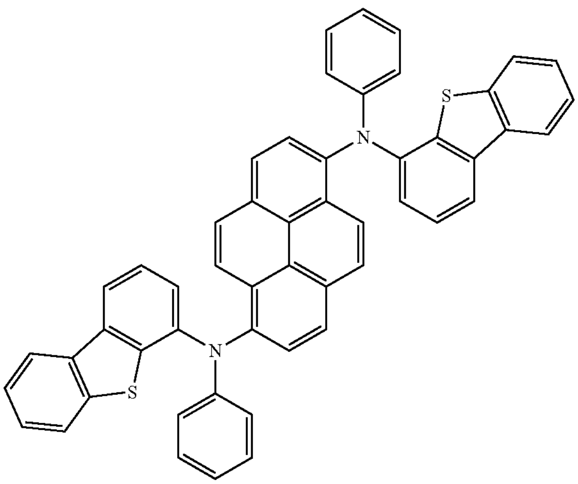
FD7
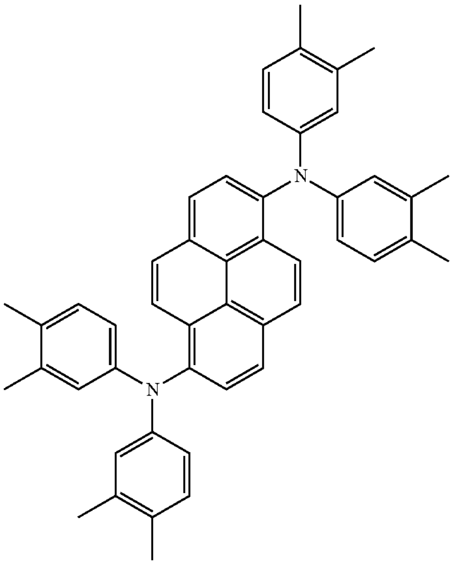
FD8
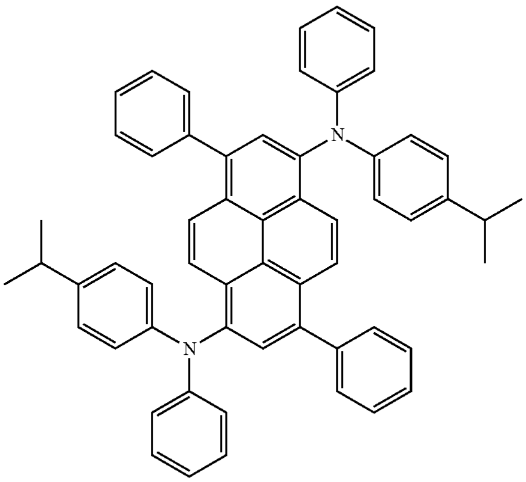

-continued
FD9
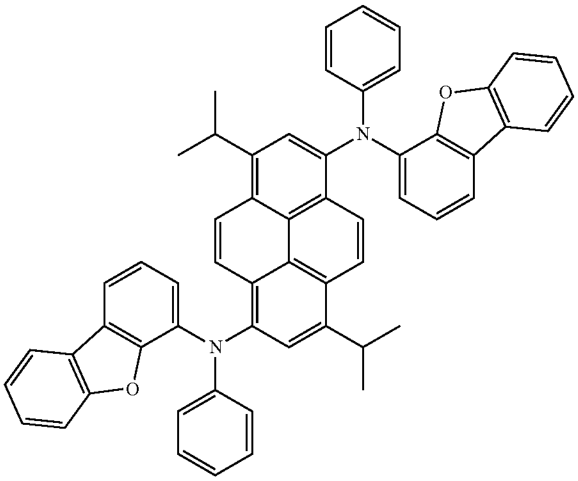
FD10
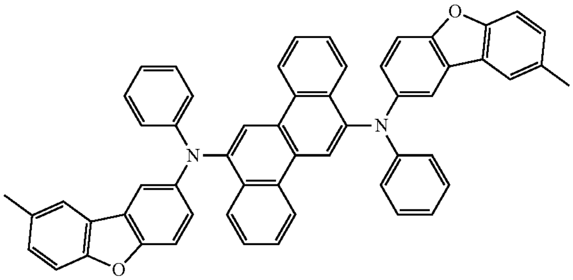
FD11
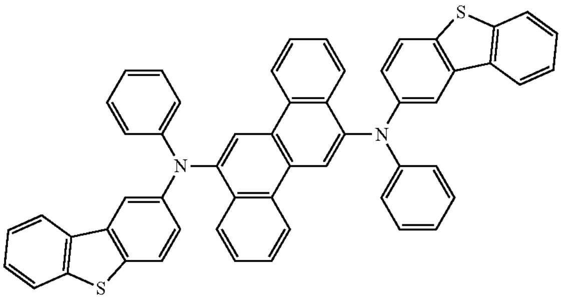
FD11
FD12
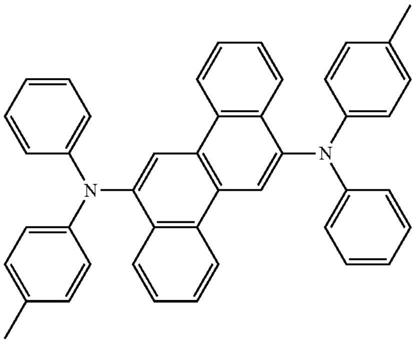
-continued
FD13
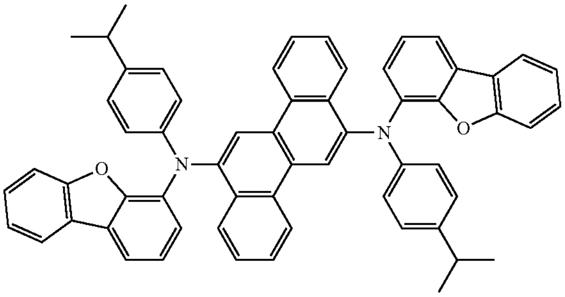
FD14
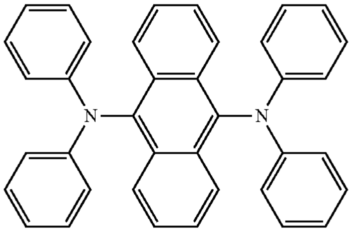
FD15
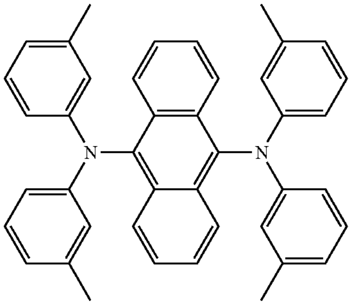
FD16
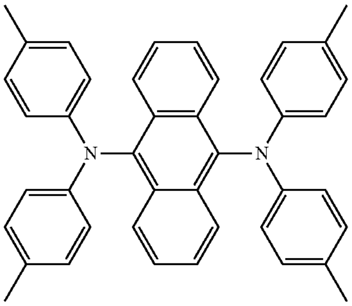
FD17
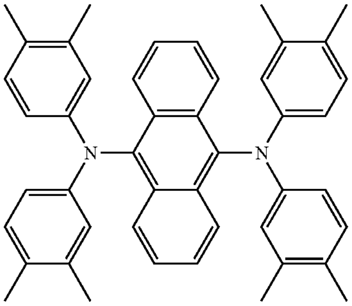

-continued
FD18
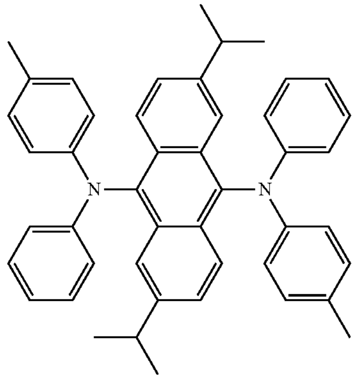
FD19
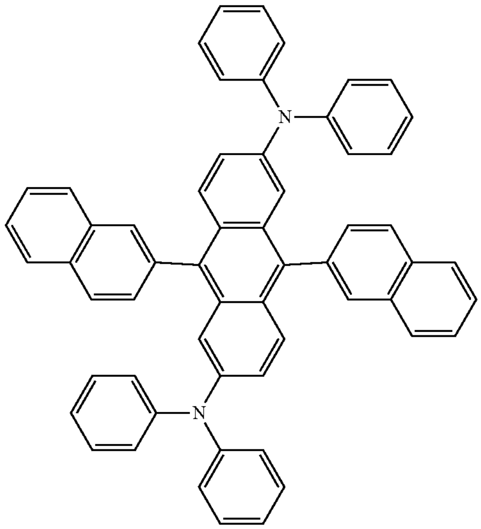
-continued
FD20
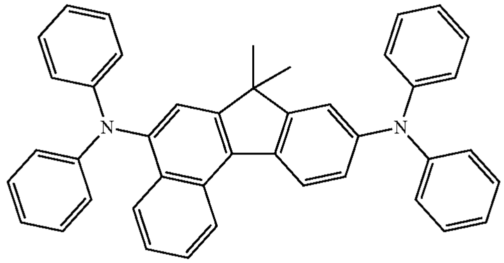
FD21
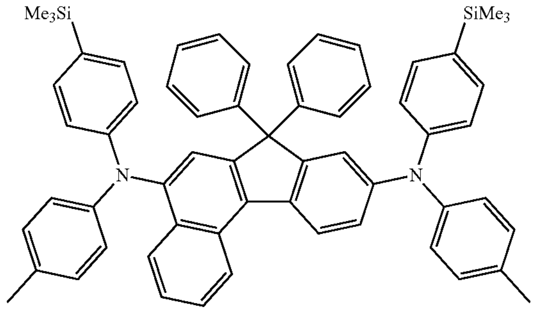
FD22
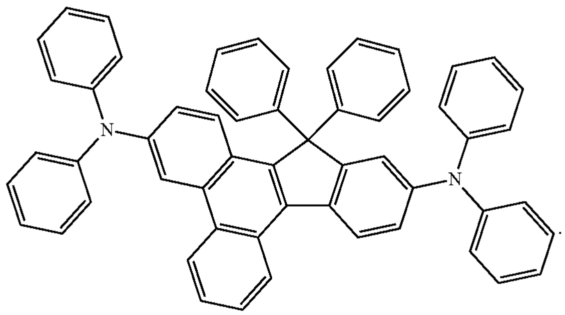
In one or more embodiments, the fluorescent dopant may be selected from the following compounds, but embodiments of the present disclosure are not limited thereto:
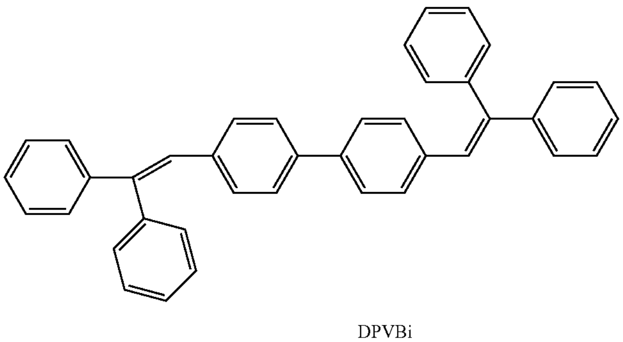
DPVBi -continued
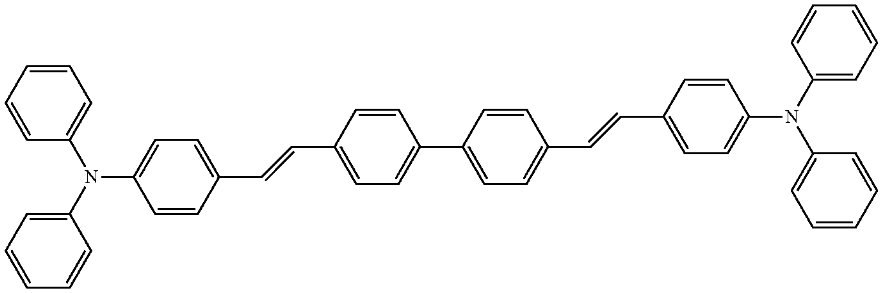
DPAVBi
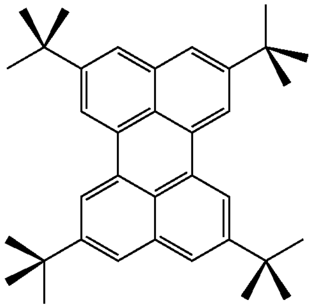
TBPe
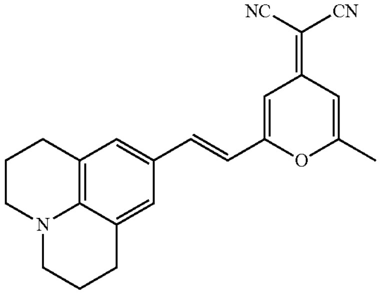
DCM
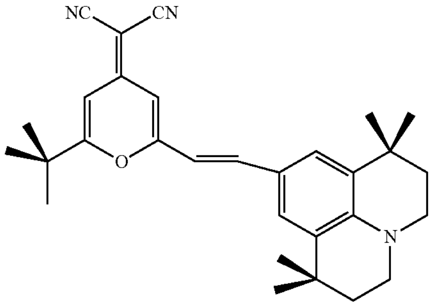
DCJTB
Coumarin 6
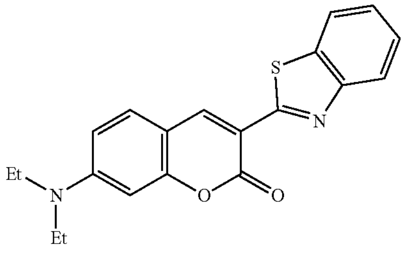

-continued

C545T

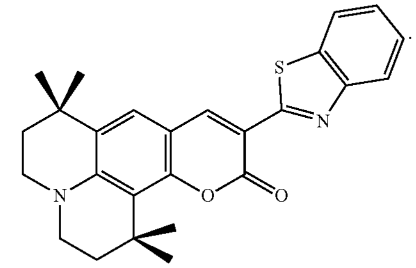

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

The electron transport region may include at least one compound selected from Compounds ET1 to ET36, but embodiments of the present disclosure are not limited thereto:

ET1

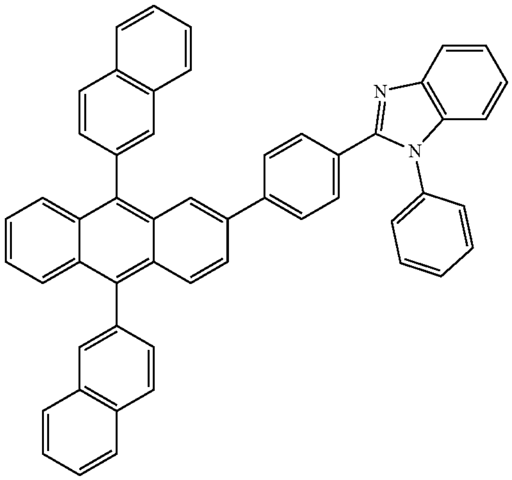

-continued

ET2

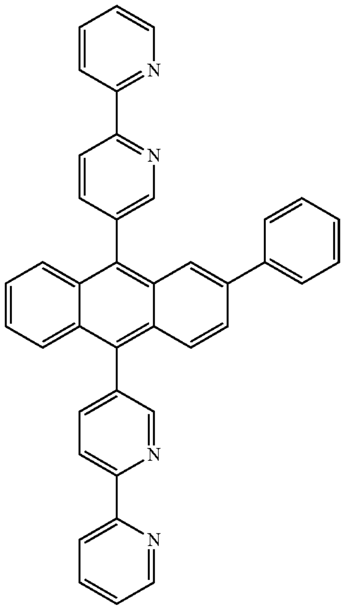

ET3

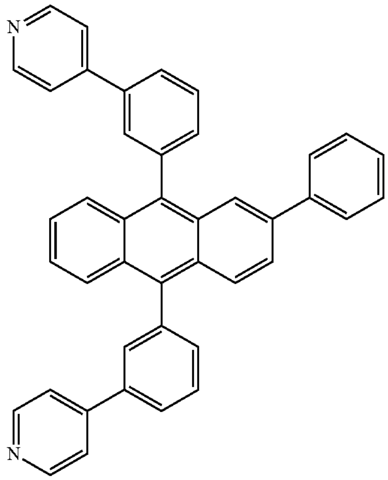

-continued
ET4
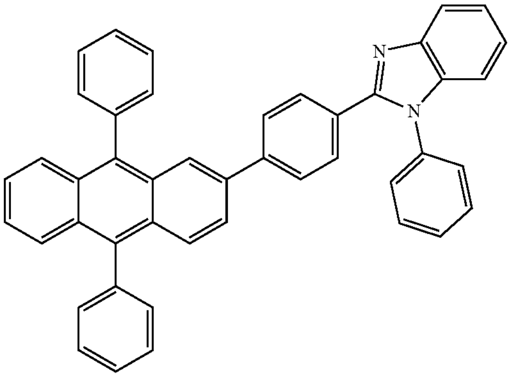
ET5
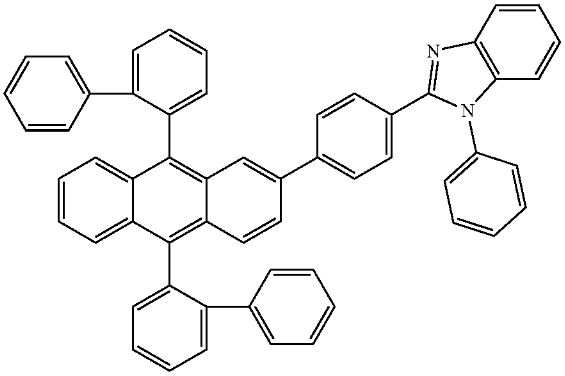
ET6
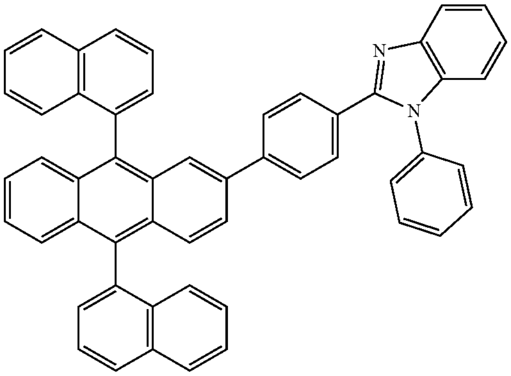
-continued
ET7
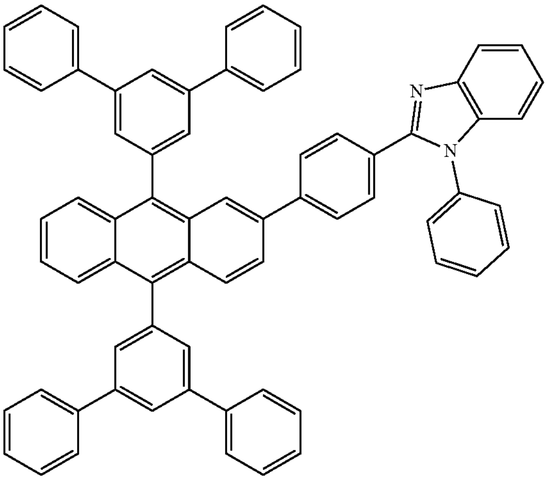
ET8
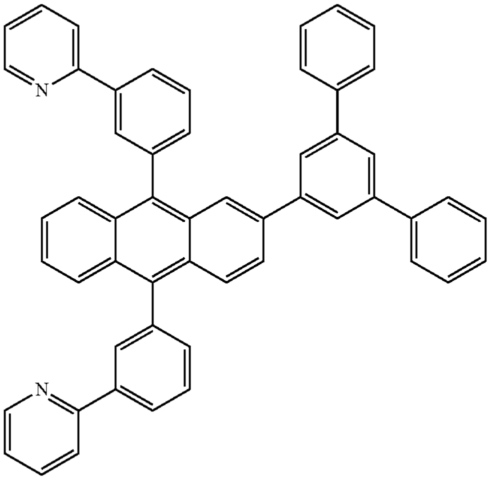
ET9
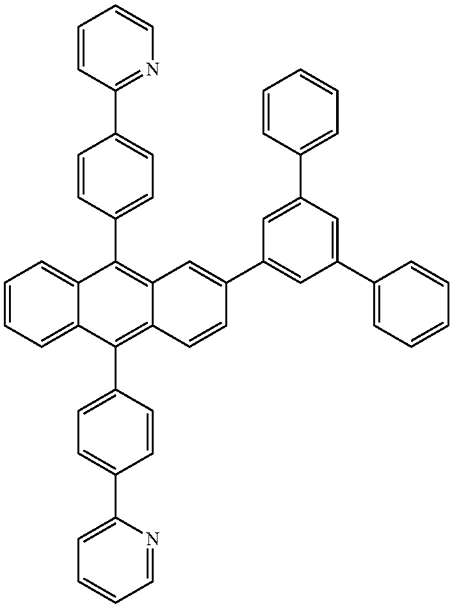

-continued
ET10
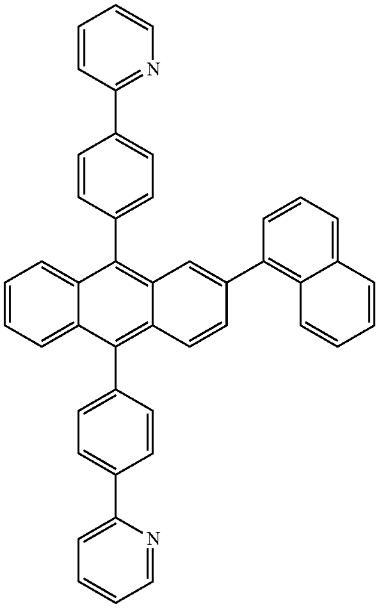
ET11
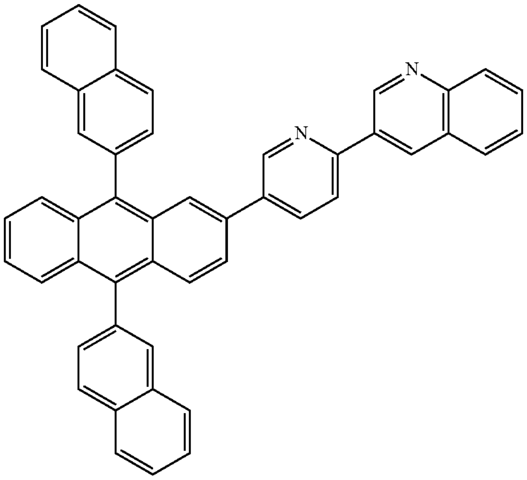
ET12
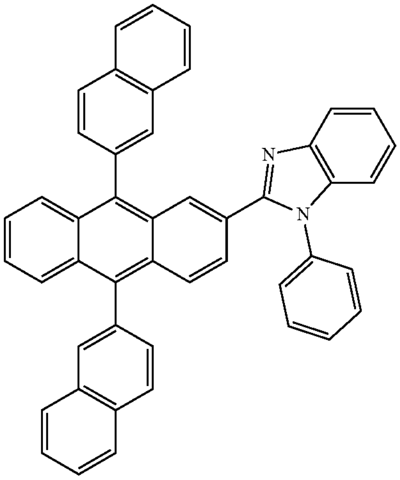
-continued
ET13
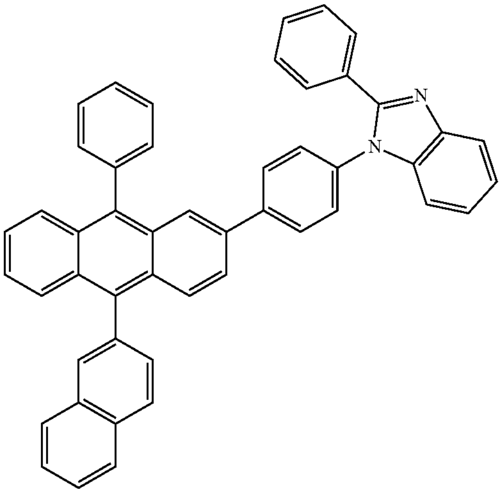
ET14
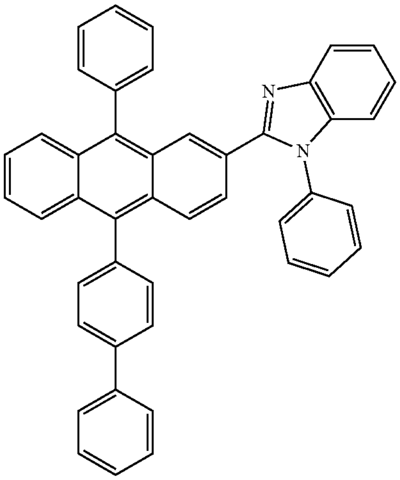
ET15
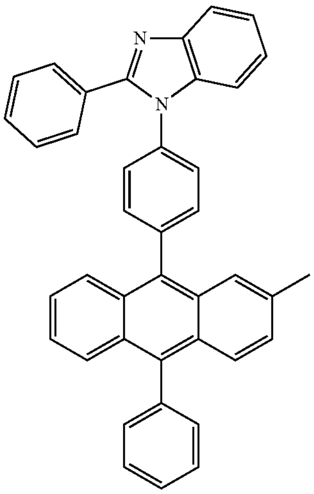

-continued
ET16
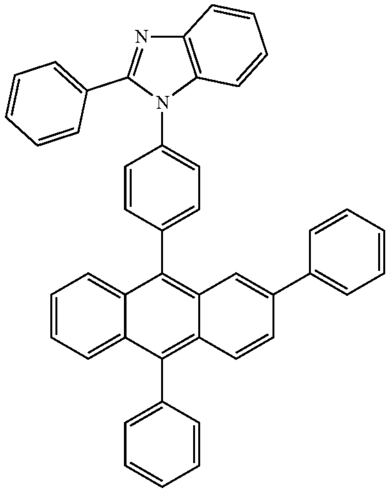
ET17
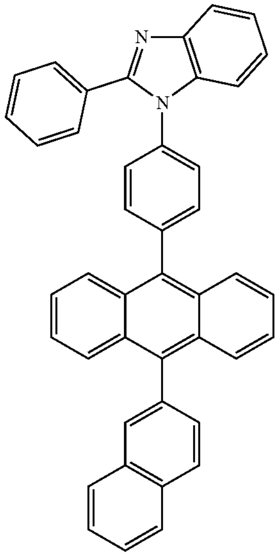
ET18
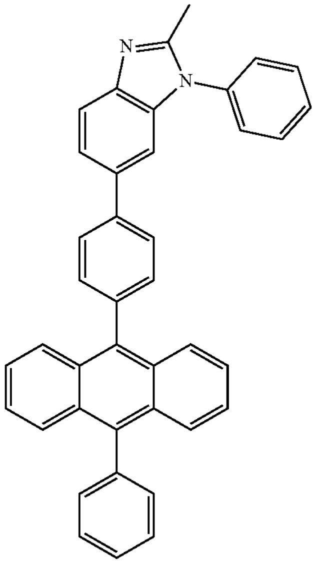
-continued
ET19
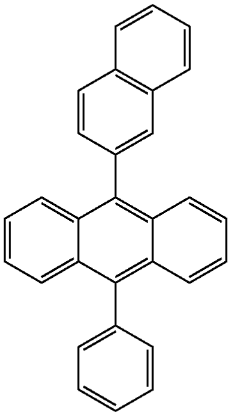
ET20
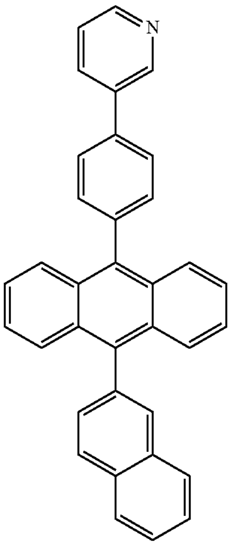
ET21
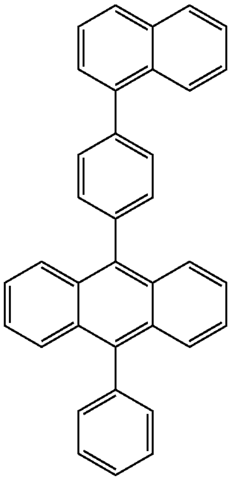

-continued
ET22
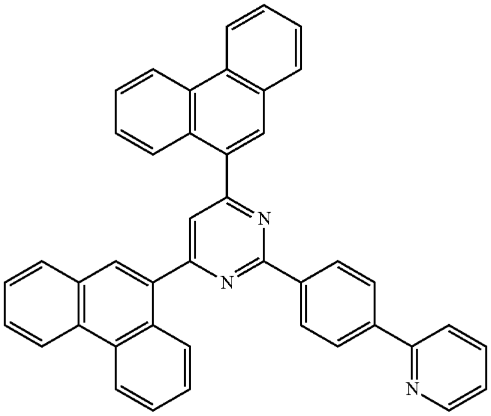
ET23
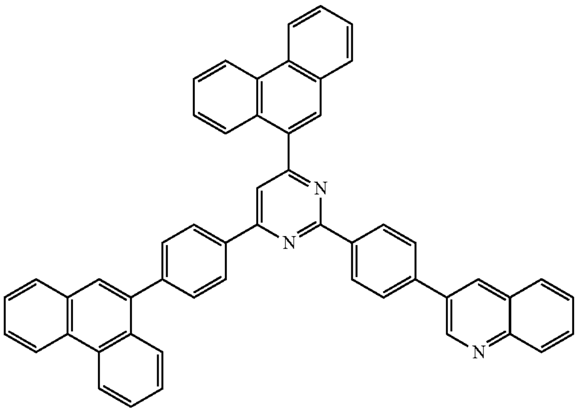
ET24
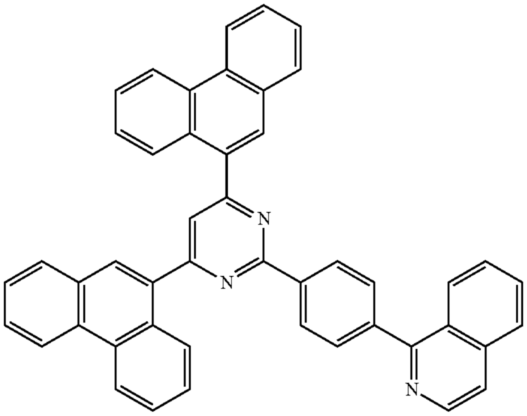
-continued
ET25
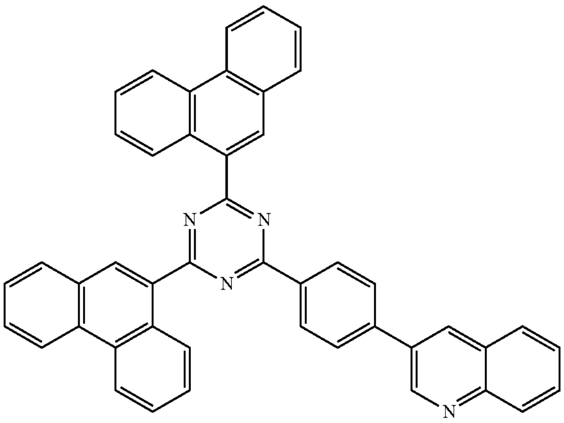
ET26
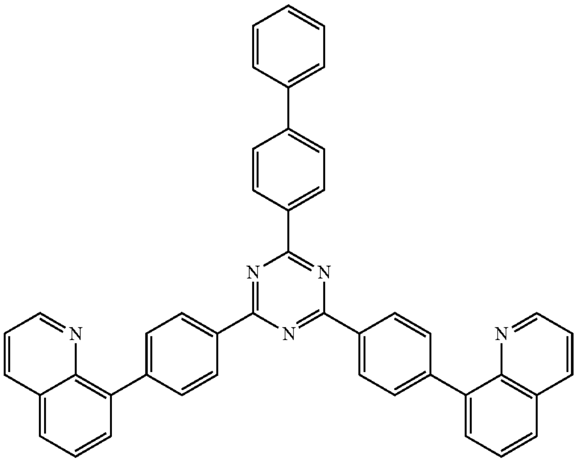
ET27
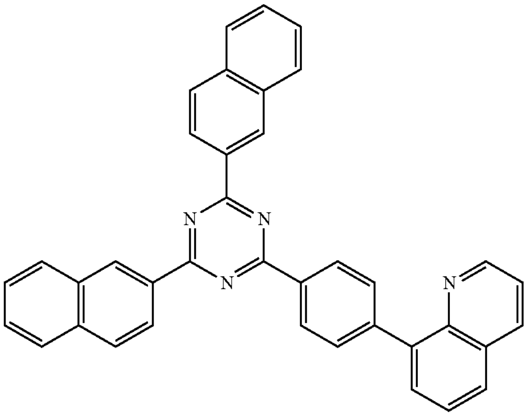

-continued
ET28
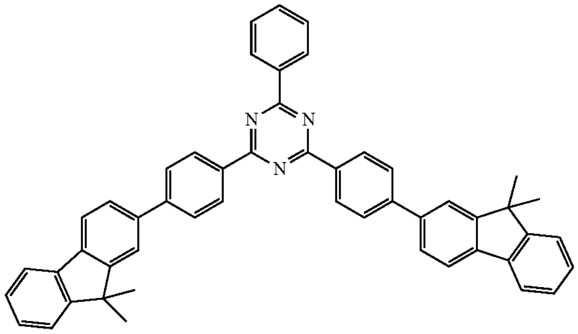
ET29
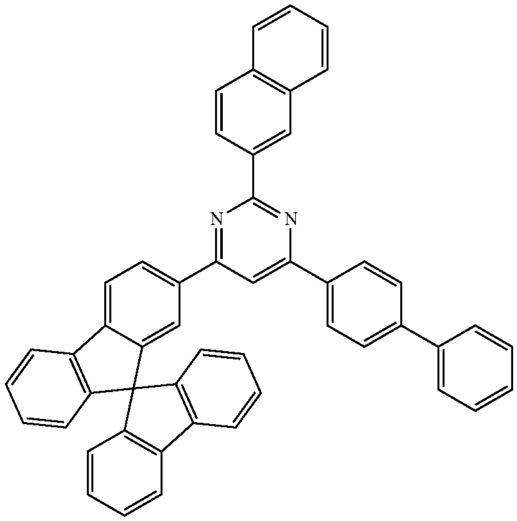
ET30
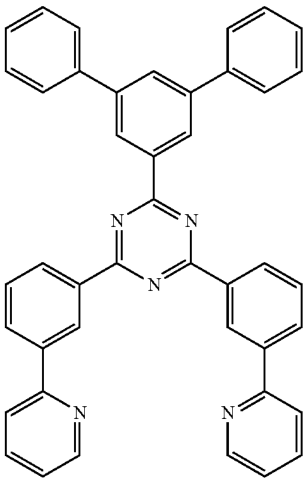
-continued
ET31
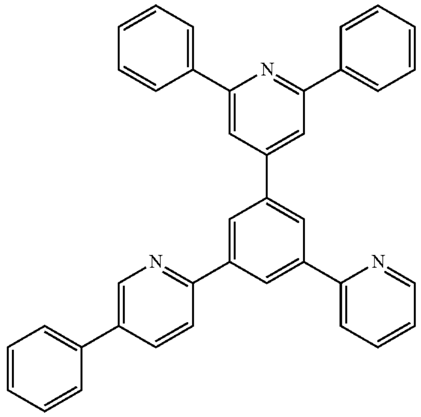
ET32
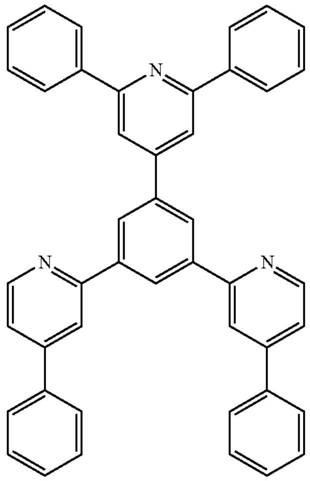
ET33
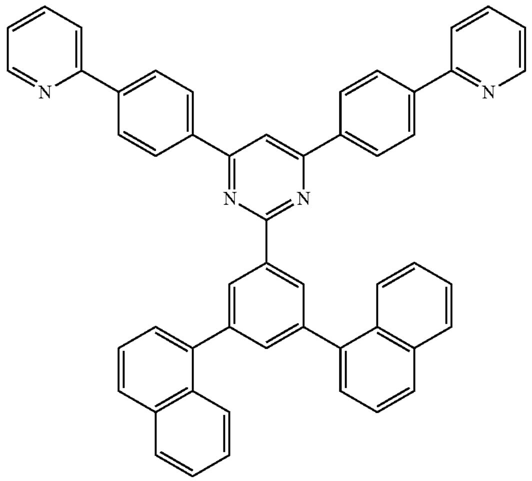

-continued

ET34

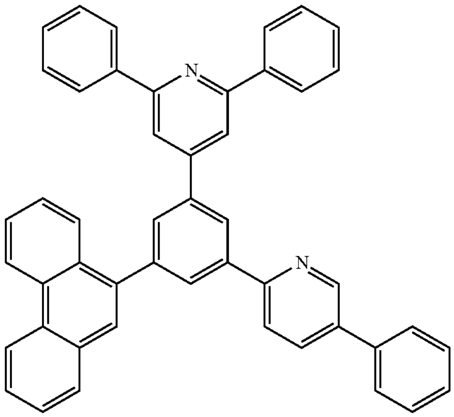

ET35

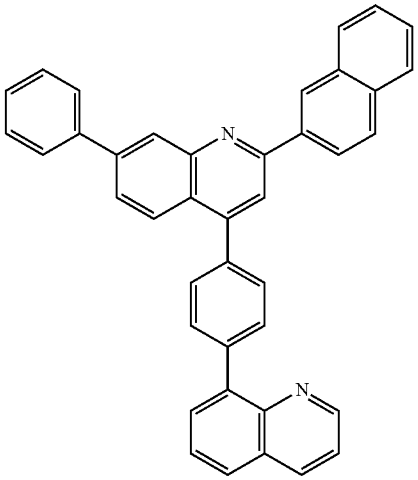

ET36

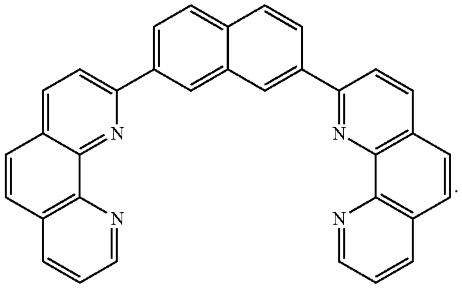

In one or more embodiments, the electron transport region may include at least one compound selected from 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), and NTAZ:

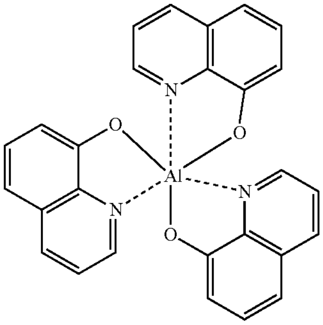

$Alq_3$

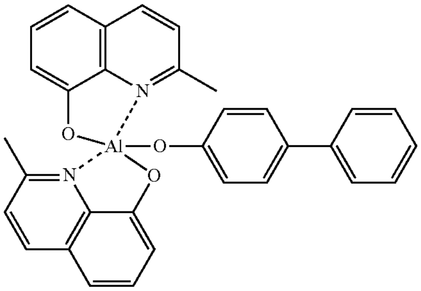

BAlq

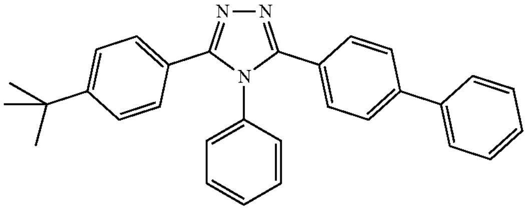

TAZ

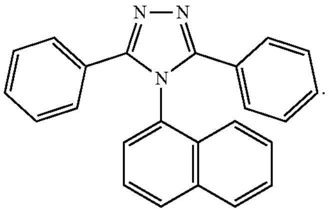

NTAZ

The thicknesses of the buffer layer, the hole blocking layer, and the electron control layer may each be about 20 Å to about 1,000 Å, for example, about 30 Å to about 300 Å. When the thicknesses of the buffer layer, the hole blocking layer, and the electron control layer are within these ranges, the electron blocking layer may have excellent electron blocking characteristics and/or electron control characteristics without a substantial increase in driving voltage.

The thickness of the electron transport layer may be about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region (for example, the electron transport layer in the electron transport region) may further include, in addition to the materials described above, a metal-containing material. The $L_1$ complex may include, for example, Compound ET-D1 (lithium quinolate, LiQ) or ET-D2:

ET-D1

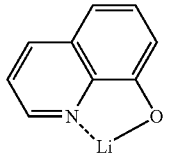

ET-D2

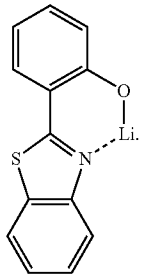

The electron transport region may include an electron injection layer that facilitates injection of electrons from the second electrode 190. The electron injection layer may directly contact the second electrode 190.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or combinations thereof.

The thickness of the electron injection layer may be about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 190 may be on the organic layer 150 having the above-described structure. The second electrode 190 may be a cathode (e.g., an electron injection electrode), and in this regard, the material for forming the second electrode 190 may be selected from a metal, an alloy, an electrically conductive compound, and combinations thereof, each having a relatively low work function.

The second electrode 190 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ITO, and IZO, but embodiments of the present disclosure are not limited thereto. The second electrode 190 may be a transmissive electrode, a semi-transmissive electrode, or a reflective electrode.

The second electrode 190 may have a single-layered structure, or a multi-layered structure including two or more layers.

The first layer 210 and the second layer 220 may each include a condensed cyclic compound represented by Formula 1:

$$[R_1\text{-}(L_1)_{a1}]_{b1}\text{-}(Ar_1)_{c1}\text{-}[(L_2)_{a2}\text{-}R_2]_{b2}. \qquad \text{Formula 1}$$

In one or more embodiments, $Ar_1$ in Formula 1 may be a $C_5$-$C_{60}$ carbocyclic group or a $C_2$-$C_{30}$ heterocyclic group.

For example, $Ar_1$ may be selected from a benzene group, a naphthalene group, an anthracene group, a phenanthrene group, a pyrene group, a chrysene group, a triphenylene group, an indene group, a fluorene group, a benzofluorene group, a spiro-bifluorene group, a carbazole group, a dibenzofuran group, a dibenzothiophene group, a pyridine group, a pyrazine group, a pyrimidine group, a pyridazine group, a pyrrole group, an imidazole group, a quinoline group, an isoquinoline group, a quinoxaline group, a quinazoline group, a triazine group, an indeno pyrazine group, an indeno pyridine group, a phenanthroline group, and a phenanthridine group.

In one or more embodiments, $Ar_1$ may be selected from a benzene group, a naphthalene group, an anthracene group, a fluorene group, a spiro-bifluorene group, a carbazole group, a dibenzofuran group, a dibenzothiophene group, a pyridine group, a pyrazine group, a pyrimidine group, a pyridazine group, and a triazine group.

In one or more embodiments, $Ar_1$ may be selected from a benzene group, a naphthalene group, an anthracene group, a dibenzofuran group, a dibenzothiophene group, a pyridine group, and a triazine group, but embodiments of the present disclosure are not limited thereto.

In one or more embodiments, c1 in Formula 1 may be 0 or 1. c1 indicates the number of $*—Ar_1—*'$(s), wherein, when c1 is 0, $*—Ar_1—*'$ may be a single bond.

In one or more embodiments, $R_1$ in Formula 1 may be a group represented by Formula 2-1 or a group represented by Formula 2-2:

Formula 2-1

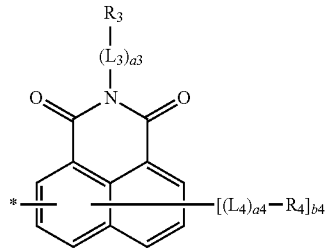

Formula 2-2

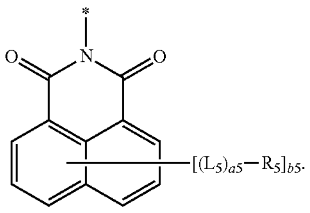

$L_3$ to $L_5$, a3 to a5, $R_3$ to $R_5$, b4, and b5 in Formulae 2-1 and 2-2 may each independently be the same as described herein, and * indicates a binding site to a neighboring atom.

In one or more embodiments, $R_2$ to $R_5$ in Formulae 1, 2-1, and 2-2 may each independently be selected from a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), and —P(=O)($Q_1$)($Q_2$):

Formula 2-3

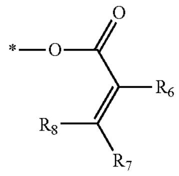

Formula 2-4

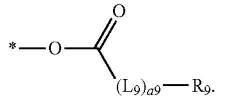

$Q_1$ to $Q_3$, $L_9$, a9, and $R_6$ to $R_9$ in Formulae 2-3 and 2-4 may each independently be the same as described herein, and * indicates a binding site to a neighboring atom.

In one or more embodiments, $L_1$ to $L_5$ and $L_9$ in Formulae 1, 2-1, 2-2, and 2-4 may each independently be selected from *—N($R_{11}$)—*', *—B($R_{11}$)—*', *—P($R_{11}$)—*', *—Si($R_{11}$)($R_{12}$)—*', *—S—*', *—Se—*', *—O—*', *—C(=O)—*', *—S(=O)—*', *—S(=O)$_2$—*', *—C($R_{11}$)=*', *—C(=S)—*', a substituted or unsubstituted $C_1$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

For example, $L_1$ to $L_5$ and $L_9$ may each independently be selected from the group consisting of:

*—S—*', *—O—*', *—C(=O)—*', *—S(=O)—*', *—S(=O)$_2$—*', a $C_1$-$C_{20}$ alkylene group, a $C_2$-$C_{20}$ alkenylene group, a $C_2$-$C_{20}$ alkynylene group, a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a $C_1$-$C_{20}$ alkylene group, a $C_2$-$C_{20}$ alkenylene group, a $C_2$-$C_{20}$ alkynylene group, a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{31}$)($Q_{32}$)($Q_{33}$), $Q_{31}$ to $Q_{33}$ may each independently be selected from the group consisting of:

a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, and

* and *' each indicate a binding site to a neighboring atom.

In one or more embodiments, $L_1$ to $L_5$ and $L_9$ may each independently be selected from *—S—*', *—O—*', *—C(═O)—*', *—S(═O)—*', *—S(═O)$_2$—*', *—[C($Z_1$)($Z_2$)]$_{n1}$—*', and groups represented by Formulae 3-1 to 3-75, but embodiments of the present disclosure are not limited thereto:

Formula 3-1

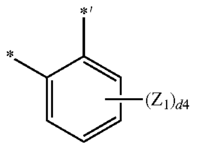

Formula 3-2

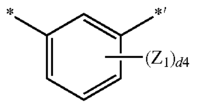

Formula 3-3

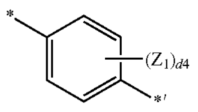

Formula 3-4

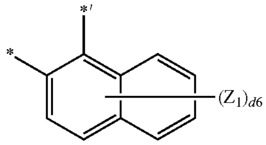

-continued

Formula 3-5

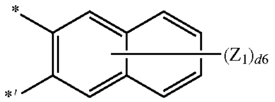

Formula 3-6

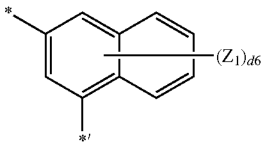

Formula 3-7

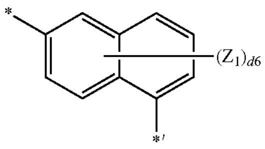

Formula 3-8

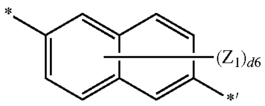

Formula 3-9

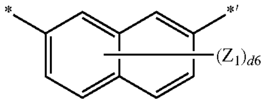

Formula 3-10

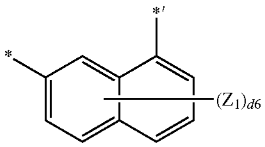

Formula 3-11

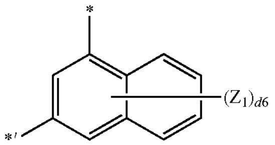

Formula 3-12

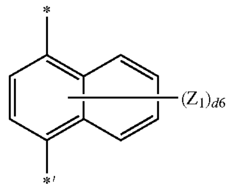

Formula 3-13

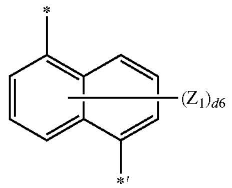

Formula 3-14

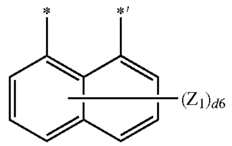

-continued
Formula 3-15
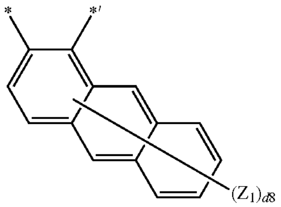
Formula 3-16
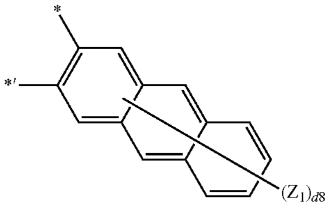
Formula 3-17
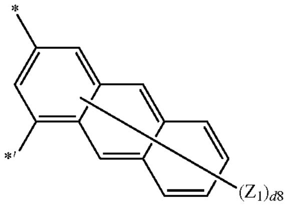
Formula 3-18
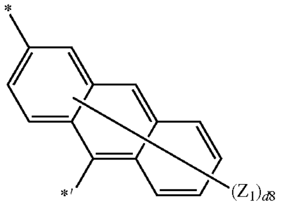
Formula 3-19
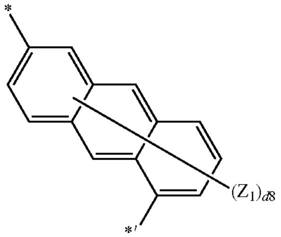
Formula 3-20
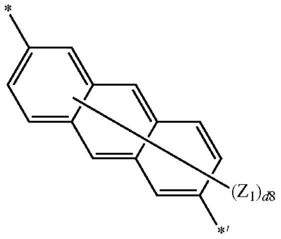
Formula 3-21
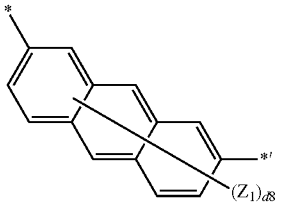
-continued
Formula 3-22
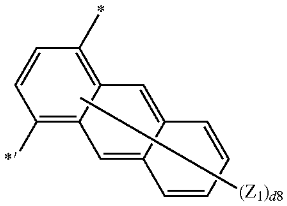
Formula 3-23
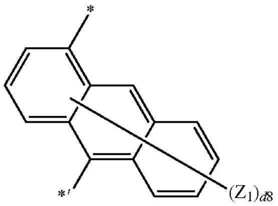
Formula 3-24
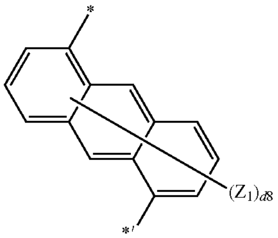
Formula 3-25
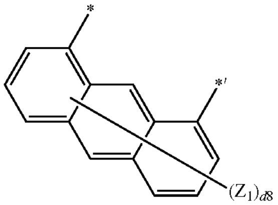
Formula 3-26
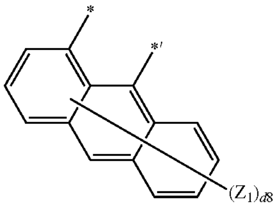
Formula 3-27
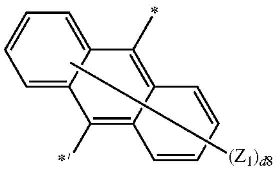
Formula 3-28
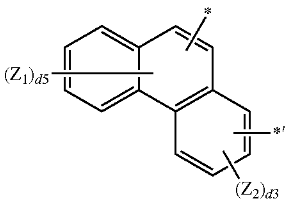

-continued
Formula 3-29
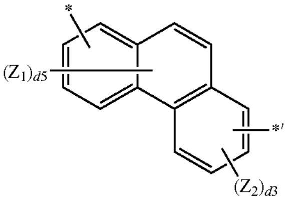
Formula 3-30
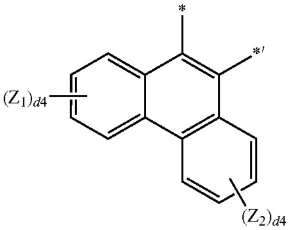
Formula 3-31
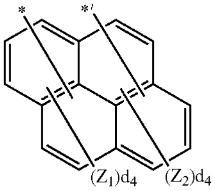
Formula 3-32
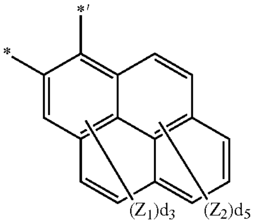
Formula 3-33
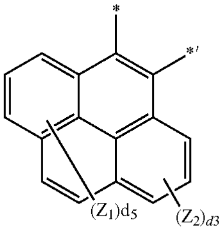
Formula 3-34
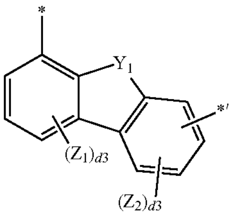
Formula 3-35
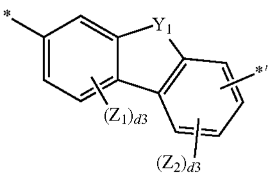
-continued
Formula 3-36
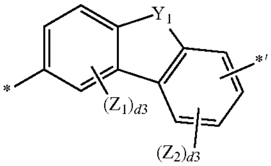
Formula 3-37
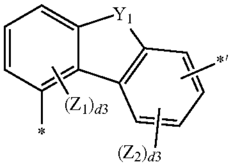
Formula 3-38
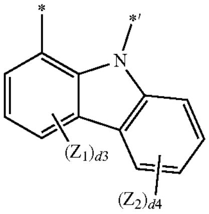
Formula 3-39
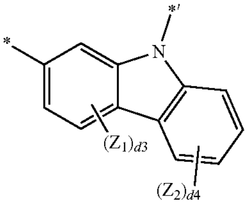
Formula 3-40
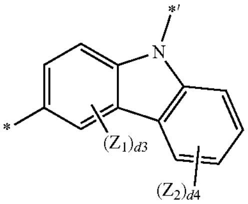
Formula 3-41
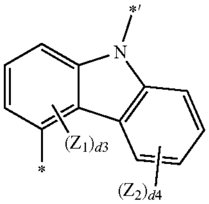
Formula 3-42
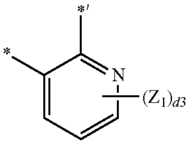
Formula 3-43
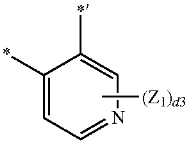

-continued
Formula 3-44
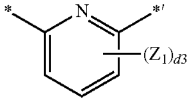
Formula 3-45
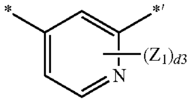
Formula 3-46
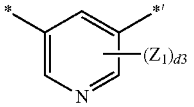
Formula 3-47
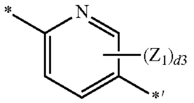
Formula 3-48
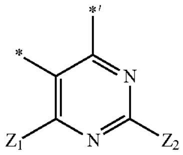
Formula 3-49
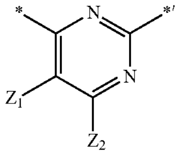
Formula 3-50
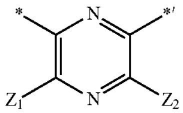
Formula 3-51
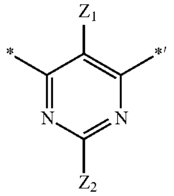
Formula 3-52
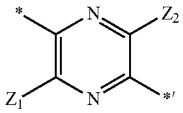
Formula 3-53
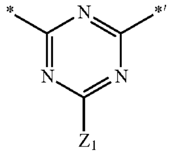
Formula 3-54
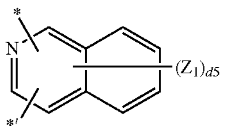
-continued
Formula 3-55
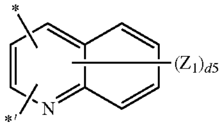
Formula 3-56
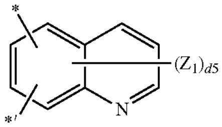
Formula 3-57
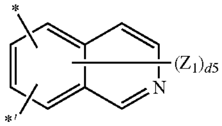
Formula 3-58
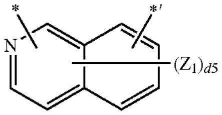
Formula 3-59
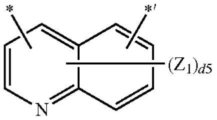
Formula 3-60
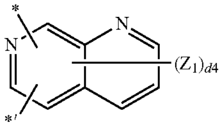
Formula 3-61
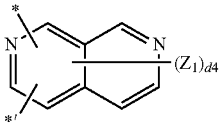
Formula 3-62
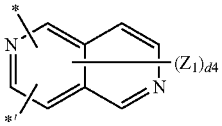
Formula 3-63
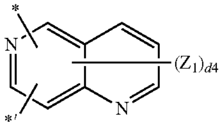
Formula 3-64
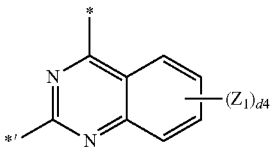
Formula 3-65
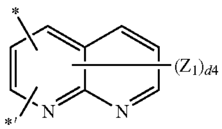

-continued

Formula 3-66

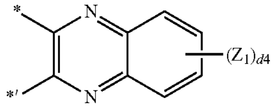

Formula 3-67

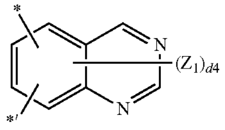

Formula 3-68

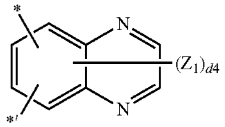

Formula 3-69

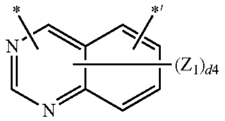

Formula 3-70

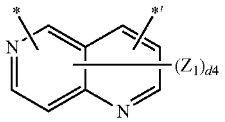

Formula 3-71

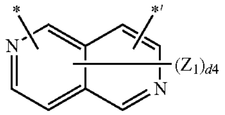

Formula 3-72

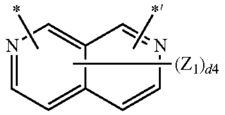

Formula 3-73

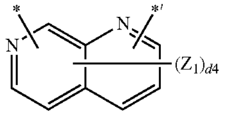

Formula 3-74

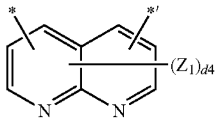

Formula 3-75

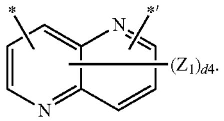

In Formulae 3-1 to 3-75, $Y_1$ may be O, S, $C(Z_3)(Z_4)$, $N(Z_3)$, or $Si(Z_3)(Z_4)$, $Z_1$ to $Z_4$ may each independently be selected from hydrogen, deuterium, —F, —$CF_3$, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyridinyl group, a pyrazinyl group, a pyrimidinyl group, a pyridazinyl group, a triazinyl group, and —$Si(Q_{31})(Q_{32})(Q_{33})$, $Q_{31}$ to $Q_{33}$ may each independently be selected from a $C_1$-$C_{10}$ alkyl group, a $C_1$-$C_{10}$ alkoxy group, a $C_3$-$C_{20}$ cycloalkoxy group, a phenyl group, a biphenyl group, a terphenyl group, and a naphthyl group, d3 may be an integer from 1 to 3, d4 may be an integer from 1 to 4, d5 may be an integer from 1 to 5, d6 may be an integer from 1 to 6, d8 may be an integer from 1 to 8, n1 may be an integer from 1 to 20, and

* and *' each indicate a binding site to a neighboring atom.

In one or more embodiments, a1 to a5 and a9 in Formulae 1, 2-1, 2-2, and 2-4 may each independently be an integer from 0 to 10. a1 indicates the number of *-$L_1$-*'(s), wherein, when a1 is zero, *-$L_1$-*' may be a single bond, and when a1 is two or more, two or more *-$L_1$-*'(s) may be identical to or different from each other.

For example, a1 to a5 and a9 may each independently be an integer from 0 to 6.

In one or more embodiments, a1 to a5 and a9 may each independently be an integer from 0 to 3.

In one or more embodiments, a1 to a5 and a9 may each independently be 0, 1, or 2, but embodiments of the present disclosure are not limited thereto.

In one or more embodiments, $Ar_1$ in Formula 1 may be selected from groups represented by Formulae 4-1 to 4-59, and $L_1$ to $L_5$ and $L_9$ in Formulae 1, 2-1, 2-2, and 2-4 may each independently be selected from *—O—*', *—C(═O)—*', *—$CH_2$—*', *—$(CH_2)_2$—*', *—$(CH_2)_3$—*', *—$(CH_2)_4$—*', *—$(CH_2)_5$—*', and groups represented by Formulae 4-1 to 4-58 and 4-60, but embodiments of the present disclosure are not limited thereto:

Formula 4-1

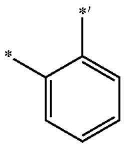

Formula 4-2

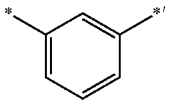

Formula 4-3

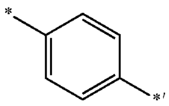

Formula 4-4

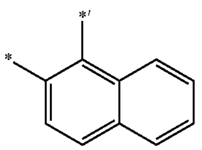

Formula 4-5

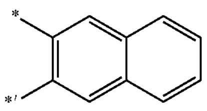

-continued
Formula 4-6
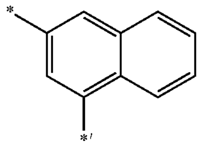
Formula 4-7
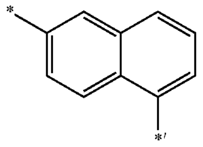
Formula 4-8
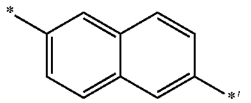
Formula 4-9
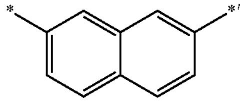
Formula 4-10
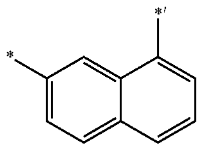
Formula 4-11
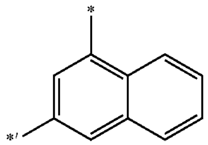
Formula 4-12
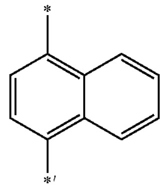
Formula 4-13
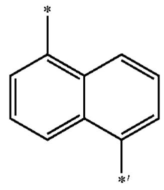
Formula 4-14
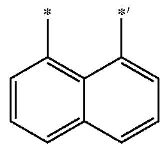
Formula 4-15
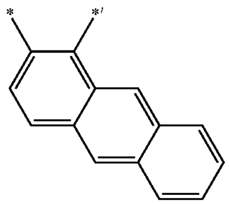
-continued
Formula 4-16
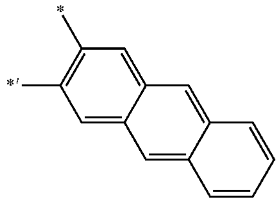
Formula 4-17
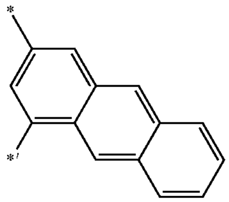
Formula 4-18
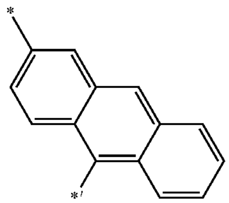
Formula 4-19
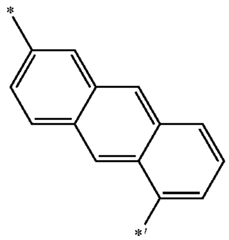
Formula 4-20
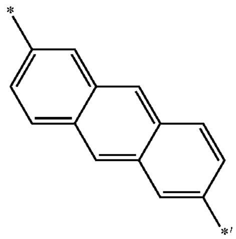
Formula 4-21
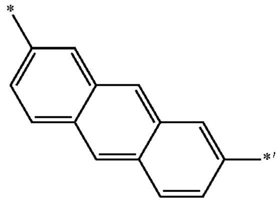
Formula 4-22
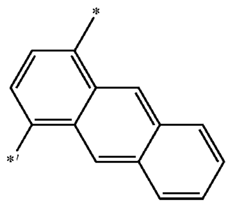

-continued
Formula 4-23
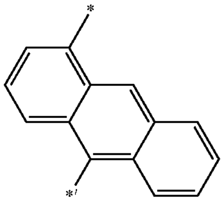
Formula 4-24
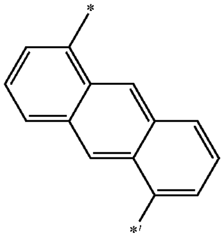
Formula 4-25
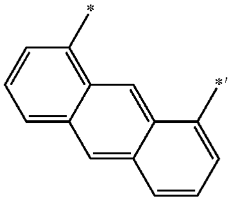
Formula 4-26
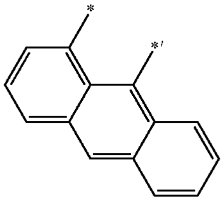
Formula 4-27
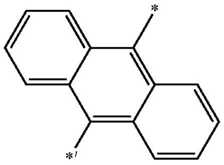
Formula 4-28
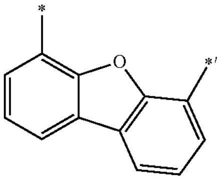
Formula 4-29
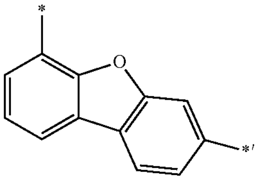
-continued
Formula 4-30
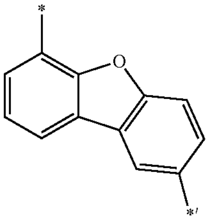
Formula 4-31
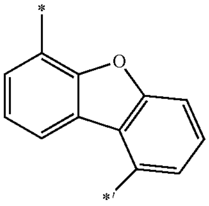
Formula 4-32
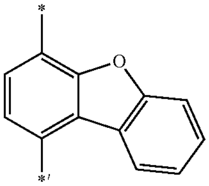
Formula 4-33
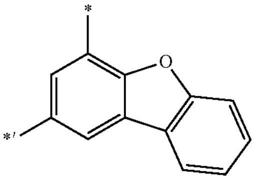
Formula 4-34
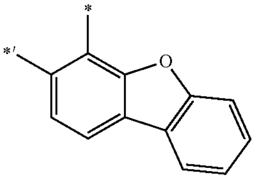
Formula 4-35
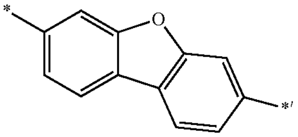
Formula 4-36
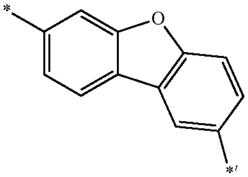
Formula 4-37
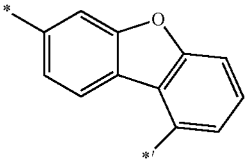

-continued
Formula 4-38
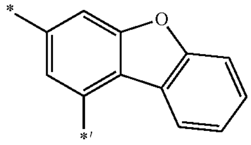
Formula 4-39
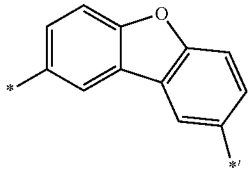
Formula 4-40
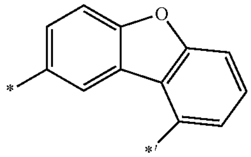
Formula 4-41
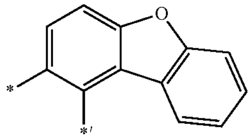
Formula 4-42
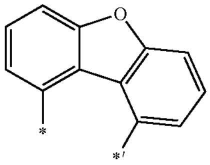
Formula 4-43
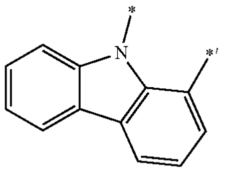
Formula 4-44
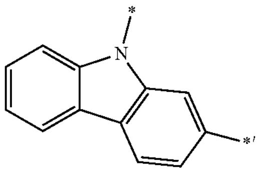
Formula 4-45
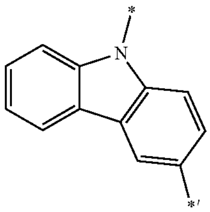
Formula 4-46
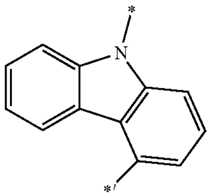
-continued
Formula 4-47
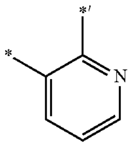
Formula 4-48
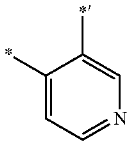
Formula 4-49
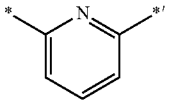
Formula 4-50
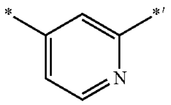
Formula 4-51
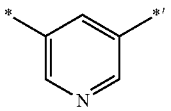
Formula 4-52
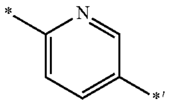
Formula 4-53
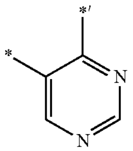
Formula 4-54
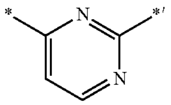
Formula 4-55
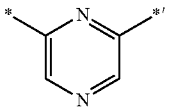
Formula 4-56
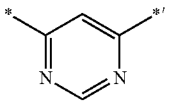
Formula 4-57
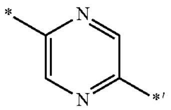
Formula 4-58
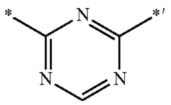

-continued

Formula 4-59

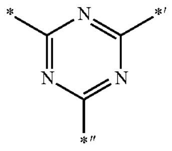

Formula 4-60

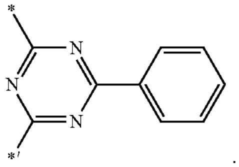

In Formulae 4-1 to 4-60, *, *', and *" each indicate a binding site to a neighboring atom.

In one or more embodiments, in Formula 1, $R_1$ may be a group represented by Formula 2-1 or a group represented by Formula 2-2.

In one or more embodiments, for example, the group represented by Formula 2-1 may be represented by Formula 2-1A, but embodiments of the present disclosure are not limited thereto:

Formula 2-1A

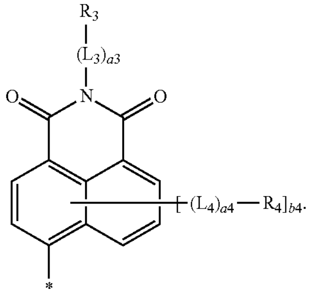

In Formula 2-1A, $L_3$, $L_4$, a3, a4, $R_3$, $R_4$, and b4 are the same as described above, and * indicates a binding site to a neighboring atom.

In one or more embodiments, in Formulae 1, 2-1, and 2-2, $R_2$ to $R_5$ may each independently be selected from the group consisting of:

a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, —$Si(Q_1)(Q_2)(Q_3)$, a $C_1$-$C_{20}$ alkyl group, a $C_3$-$C_{10}$ cycloalkyl group, a $C_1$-$C_{10}$ heterocycloalkyl group, a $C_1$-$C_{20}$ alkoxy group, and a $C_3$-$C_{20}$ cycloalkoxy group;

a $C_1$-$C_{20}$ alkyl group, a $C_3$-$C_{10}$ cycloalkyl group, a $C_1$-$C_{10}$ heterocycloalkyl group, a $C_1$-$C_{20}$ alkoxy group, and a $C_3$-$C_{20}$ cycloalkoxy group, each substituted with at least one selected from deuterium, —F, —Cl, —Br, —I, a hydroxyl group, a cyano group, a nitro group, an amidino group, a hydrazino group, and a hydrazono group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group and —Si($Q_{31}$)($Q_{32}$)($Q_{33}$), and $Q_1$ to $Q_3$ and $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

In one or more embodiments, $R_2$ to $R_5$ may each independently be selected from the group consisting of:

a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_1$)($Q_2$)($Q_3$); and a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, $R_2$ to $R_5$ may each independently be selected from the group consisting of:

a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, a triazinyl group, and —Si($Q_1$)($Q_2$)($Q_3$); and a $C_1$-$C_{20}$ alkyl group, a $C_3$-$C_{10}$ cycloalkyl group, a $C_1$-$C_{20}$ alkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, in Formulae 1, 2-3, and 2-4, $R_6$ to $R_9$, $R_{11}$, and $R_{12}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $Si(Q_4)(Q_5)(Q_6)$, —$N(Q_4)(Q_5)$, —$B(Q_4)(Q_5)$, —$C(=O)(Q_4)$, —$S(=O)_2$ $(Q_4)$, and —$P(=O)(Q_4)(Q_5)$, wherein $Q_4$ to $Q_6$ are the same as described above.

In one or more embodiments, for example, $R_6$ to $R_9$, $R_{11}$, and $R_{12}$ may each independently be selected from the group consisting of:

hydrogen, deuterium, —F, —Cl, —Br, —I, a hydroxyl group, a cyano group, a nitro group, an amidino group, a hydrazino group, a hydrazono group, $Si(Q_4)(Q_5)(Q_6)$, $C_1$-$C_{20}$ alkyl group, a $C_3$-$C_{10}$ cycloalkyl group, a $C_1$-$C_{10}$ heterocycloalkyl group, a $C_1$-$C_{20}$ alkoxy group, and a $C_3$-$C_{20}$ cycloalkoxy group;

a $C_1$-$C_{20}$ alkyl group, a $C_3$-$C_{10}$ cycloalkyl group, a $C_1$-$C_{10}$ heterocycloalkyl group, a $C_1$-$C_{20}$ alkoxy group, and a $C_3$-$C_{20}$ cycloalkoxy group, each substituted with at least one selected from deuterium, —F, —Cl, —Br, —I, a hydroxyl group, a cyano group, a nitro group, an amidino group, a hydrazino group, and a hydrazono group;

a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group; and a cyclopentyl group, a cyclohexyl group, a cycloheptyl group, a cyclopentenyl group, a cyclohexenyl group, a phenyl group, a biphenyl group, a terphenyl group, a pentalenyl group, an indenyl group, a naphthyl group, an azulenyl group, an indacenyl group, an acenaphthyl group, a fluorenyl group, a spiro-bifluorenyl group, a spiro-benzofluorene-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a pyrrolyl group, a thiophenyl group, a furanyl group, a silolyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indolyl group, an isoindolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a carbazolyl group, a benzocarbazolyl group, a dibenzocarbazolyl group, a thiadiazolyl group, an imidazopyridinyl group, an imidazopyrimidinyl group, an oxazolopyridinyl group, a thiazolopyridinyl group, a benzonaphthyridinyl group, an azafluorenyl group, an azaspiro-bifluorenyl group, an azacarbazolyl group, an azadibenzofuranyl group, an azadibenzothiophenyl group, and an azadibenzosilolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, and —$Si(Q_{31})(Q_{32})(Q_{33})$, and $Q_4$ to $Q_6$ and $Q_{31}$ to $Q_{33}$ may each independently be selected from the group consisting of:

a $C_1$-$C_{10}$ alkyl group, a $C_1$-$C_{10}$ alkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, and a phenyl group.

In one or more embodiments, $R_6$ to $R_9$, $R_{11}$, and $R_{12}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_4$)($Q_5$)($Q_6$); and a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_4$ to $Q_6$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more embodiments, $R_6$ to $R_9$, $R_{11}$, and $R_{12}$ may each independently be selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, a triazinyl group, and —Si($Q_4$)($Q_5$)($Q_6$); and a $C_1$-$C_{20}$ alkyl group, a $C_3$-$C_{10}$ cycloalkyl group, a $C_1$-$C_{20}$ alkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, an anthracenyl group, a carbazolyl group, a dibenzofuranyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_4$ to $Q_6$ and $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but embodiments of the present disclosure are not limited thereto.

In one or more embodiments, b1 in Formula 1 may be an integer from 1 to 10. b1 indicates the number of *-$(L_1)_{a1}$-$R_1$(s), wherein, when b1 is two or more, two or more *-$(L_1)_{a1}$-$R_1$(s) may be identical to or different from each other.

In one or more embodiments, b1 may be an integer from 1 to 5.

In one or more embodiments, b1 may be 1, 2, or 3.

In one or more embodiments, b1 may be 1 or 2, but embodiments of the present disclosure are not limited thereto.

In one or more embodiments, b2 in Formula 1 may be an integer from 1 to 10. b2 indicates the number of *-$(L_2)_{a2}$-$R_2$(s), wherein, when b2 is two or more, two or more *-$(L_2)_{a2}$-$R_2$(s) may be identical to or different from each other.

In one or more embodiments, b2 may be an integer from 1 to 5.

In one or more embodiments, b2 may be 1, 2, or 3.

In one or more embodiments, b2 may be 1 or 2, but embodiments of the present disclosure are not limited thereto.

In one or more embodiments, b4 in Formula 2-1 may be an integer from 0 to 5. b4 indicates the number of *-$(L_4)_{a4}$-$R_4$(s), wherein when b4 is two or more, two or more *-$(L_4)_{a4}$-$R_4$(s) may be identical to or different from each other.

In one or more embodiments, b4 may be 0, 1, or 2.

In one or more embodiments, b4 may be 0 or 1, but embodiments of the present disclosure are not limited thereto.

In one or more embodiments, b5 in Formula 2-2 may be an integer from 0 to 6. b5 indicates the number of *-$(L_5)_{a5}$-$R_5$(s), wherein, when b5 is two or more, two or more -$(L_5)_{a5}$-$R_5$(s) may be identical to or different from each other.

In one or more embodiments, b5 may be 0, 1, 2, or 3.

In one or more embodiments, b5 may be 0, 1, or 2, but embodiments of the present disclosure are not limited thereto.

In one or more embodiments, the condensed cyclic compound may be represented by one of Formulae 1A to 1P:

Formula 1A

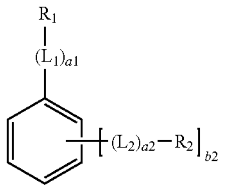

-continued
Formula 1B
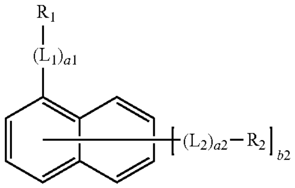
Formula 1C
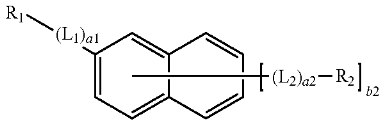
Formula 1D
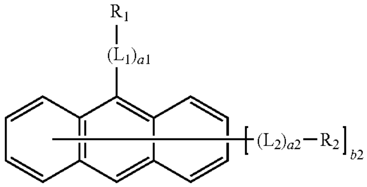
Formula 1E
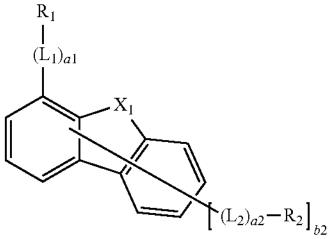
Formula 1F
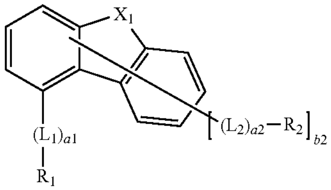
Formula 1G
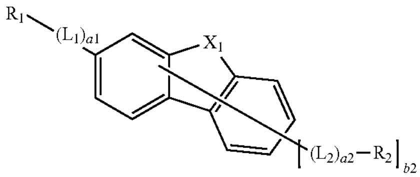
Formula 1H
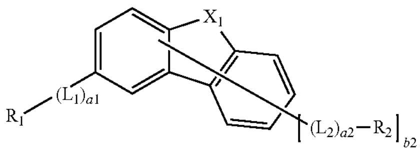
Formula 1I
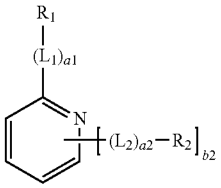
-continued
Formula 1J
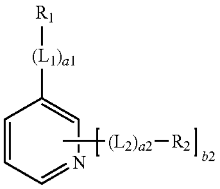
Formula 1K
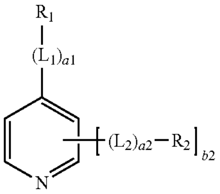
Formula 1L
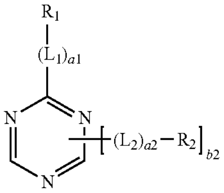
Formula 1M
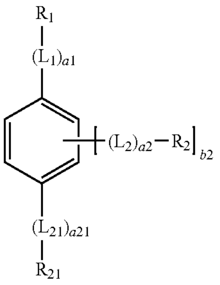
Formula 1N
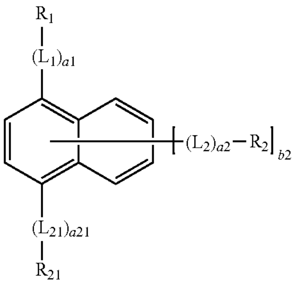
Formula 1O
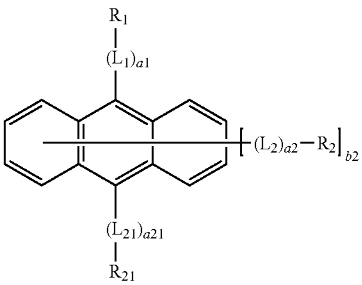
Formula 1P
$$R_1-(L_1)_{a1}-(L_2)_{a2}-R_2$$
In Formulae 1A to 1P, $L_1$, $L_2$, a1, a2, $R_1$, $R_2$, and b2 may each independently be the same as described herein in connection with Formula 1, and $L_{21}$, a21, and $R_{21}$ may each independently be the same as described herein in connection with $L_1$, a1, and $R_1$.

In one or more embodiments, for example, $L_1$, $L_2$, and $L_{21}$ in Formula 1A to 1P may each independently be selected from *—S—*', *—O—*', *—C(=O)—*', *—S(=O)—*', *—S(=O)$_2$—*', *—[C($Z_1$)($Z_2$)]$_{n1}$—*', and a group represented by any of Formulae 3-1 to 3-75.

In one or more embodiments, $L_1$, $L_2$, and $L_{21}$ in Formulae 1A to 1P may each independently be selected from *—O—*', *—C(=O)—*', *—$CH_2$—*', *—$(CH_2)_2$—*', *—$(CH_2)_3$—*', *—$(CH_2)_4$—*', *—$(CH_2)_5$—*', and a group represented by any of Formulae 4-1 to 4-58 and 4-60.

In one or more embodiments, $R_1$ and $R_{21}$ in Formulae 1A to 1P may each independently be a group represented by Formula 2-1A or a group represented by Formula 2-2.

In one or more embodiments, $X_1$ in each of Formulae 1E to 1H may be selected from O, S, C($Z_3$)($Z_4$), N($Z_3$), and Si($Z_3$)($Z_4$), wherein $Z_1$ to $Z_4$ may each independently be selected from hydrogen, deuterium, —F, —$CF_3$, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyridinyl group, a pyrazinyl group, a pyrimidinyl group, a pyridazinyl group, and a triazinyl group.

In one or more embodiments, $R_1$ and $R_{21}$ in Formulae 1M to 1O may each be a group represented by Formula 2-1. For example, $R_1$ and $R_{11}$ in Formulae 1M to 1O may each be a group represented by Formula 2-1A.

In one or more embodiments, $R_1$ and $R_{21}$ in Formulae 1M to 1O may each be a group represented by Formula 2-2.

In one or more embodiments, the condensed cyclic compound may be one of Compounds 1 to 205, but embodiments of the present disclosure are not limited thereto:

1

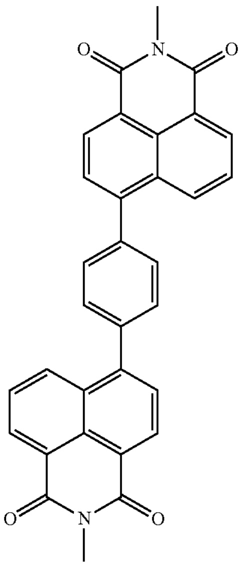

-continued

2

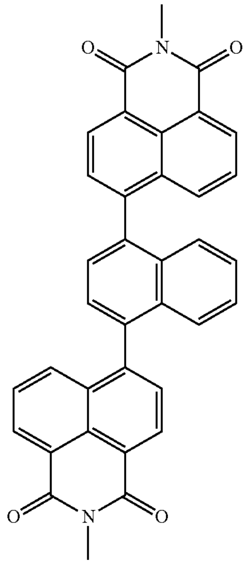

3

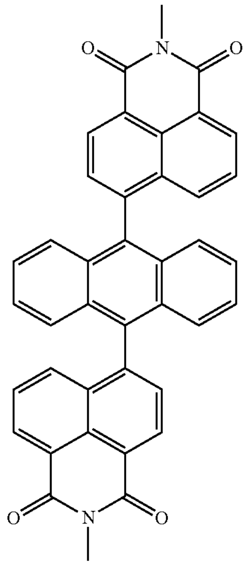

-continued
4
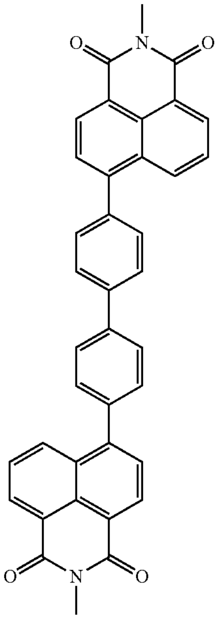
5
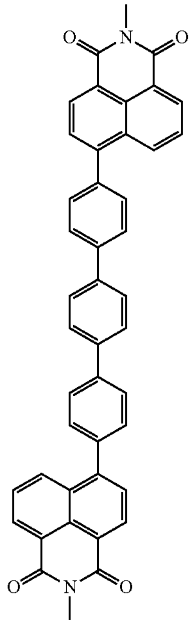
-continued
6
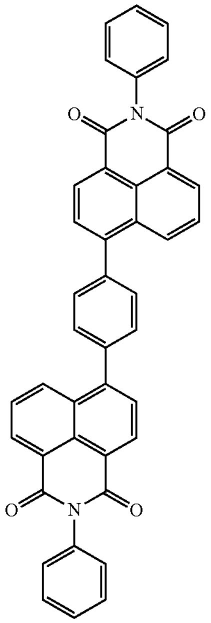
7
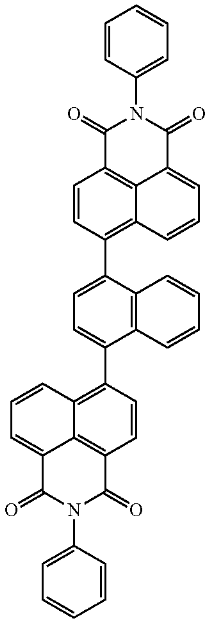

-continued
8
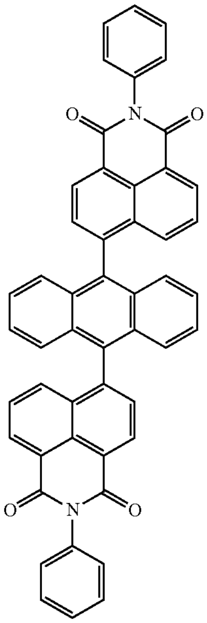
9
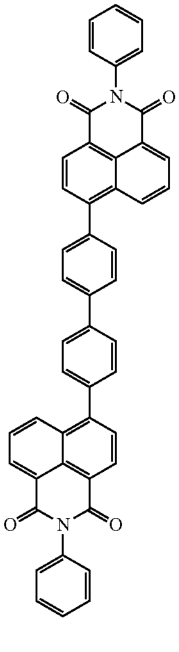
-continued
10
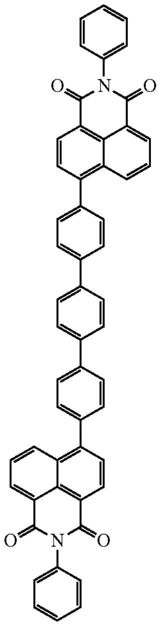
11
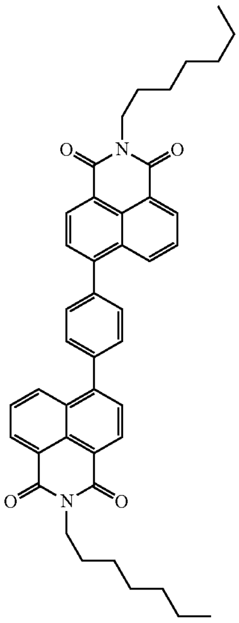

-continued
12
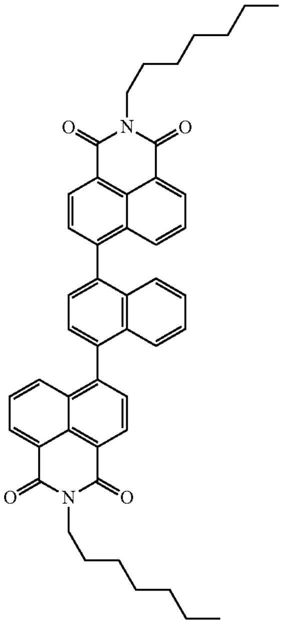
13
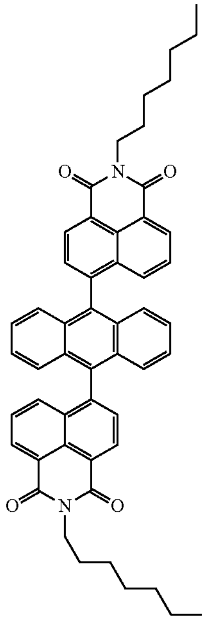
-continued
14
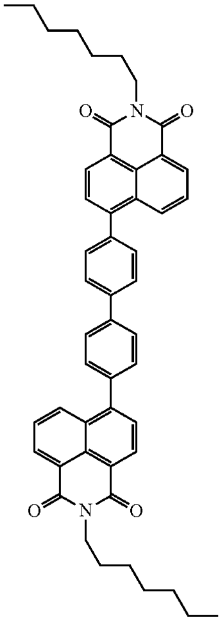
15
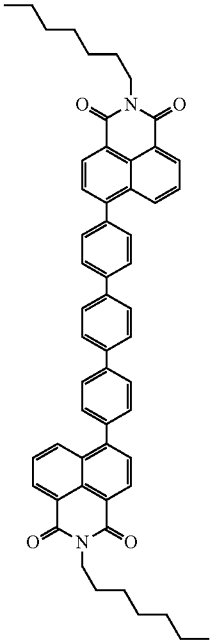

-continued
16
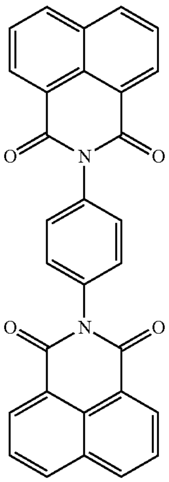
17
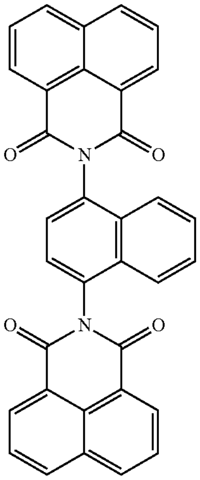
18
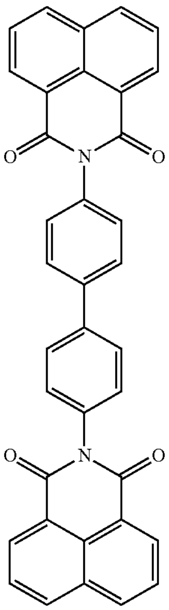
-continued
19
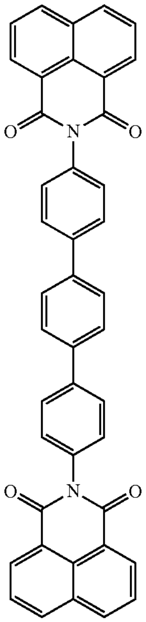
20
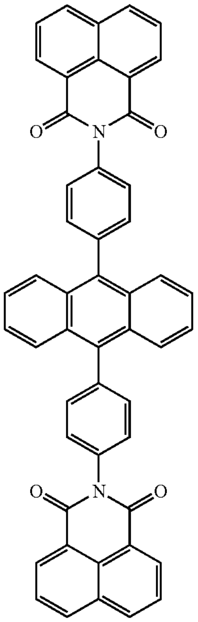

-continued
21
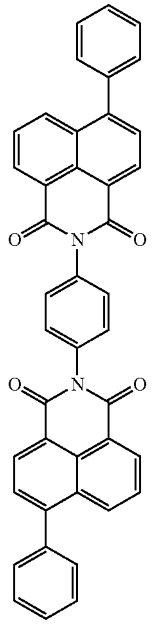
22
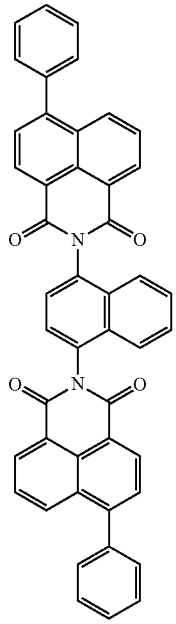
-continued
23
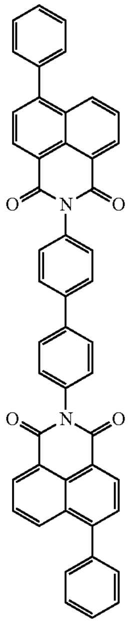
24
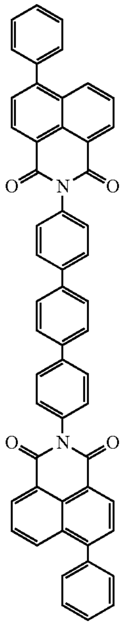

-continued
25
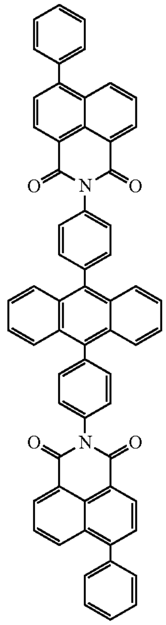
27
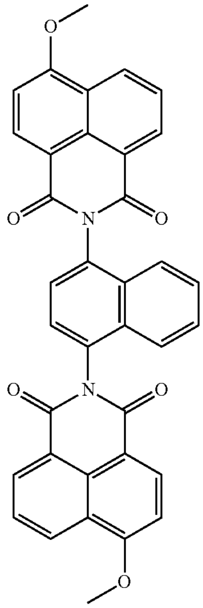
26
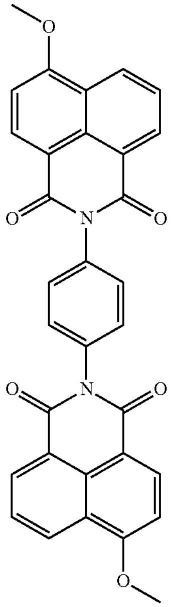
28
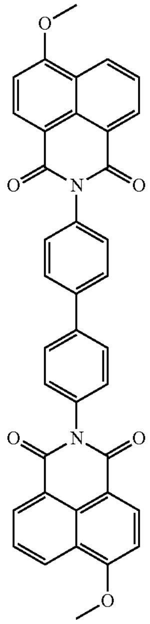

-continued
29
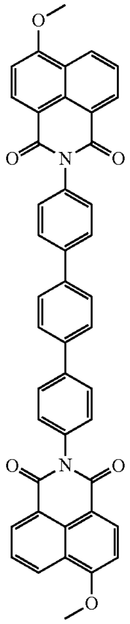
-continued
31
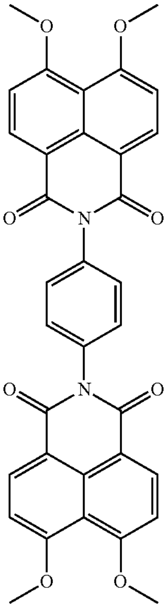
30
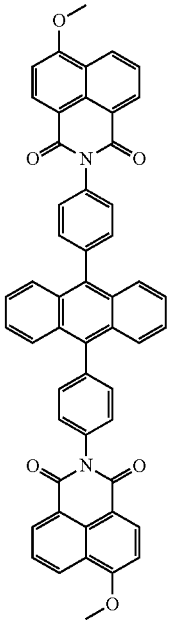
32
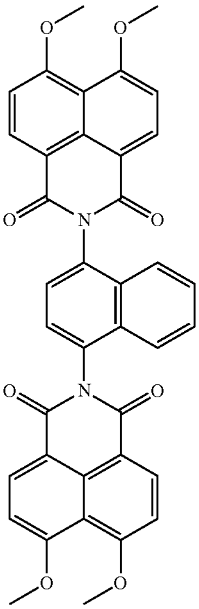

-continued
33
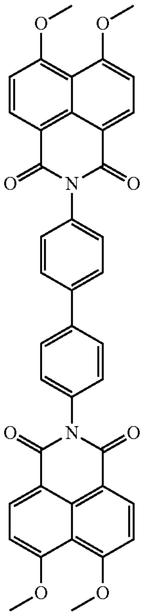
34
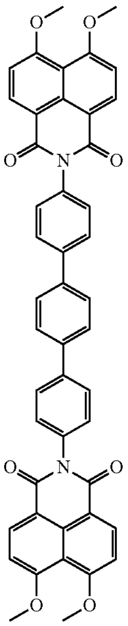
-continued
35
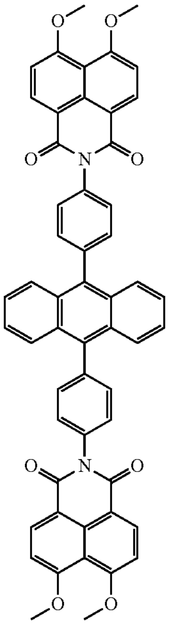
36
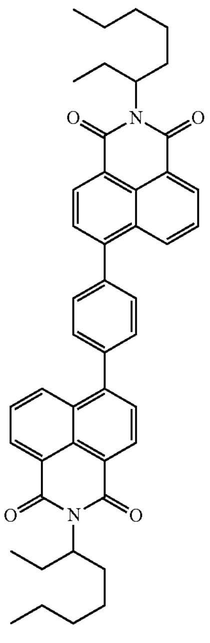

37
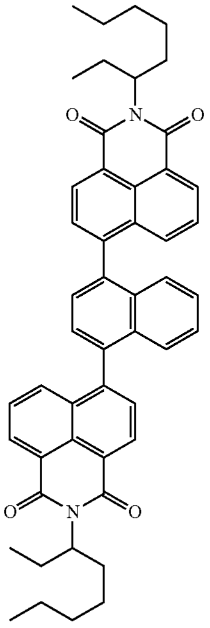
38
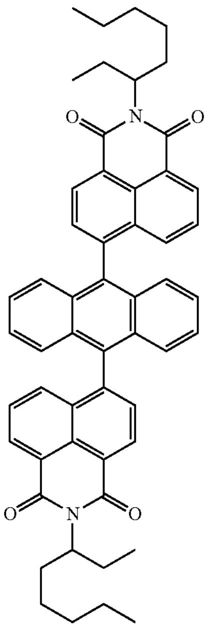
39
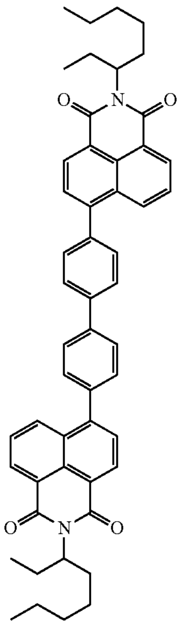
40
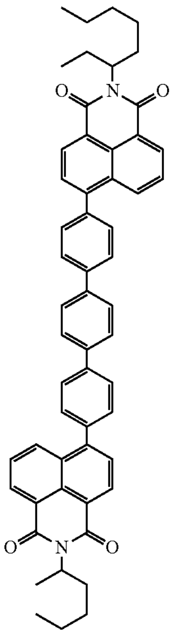

41
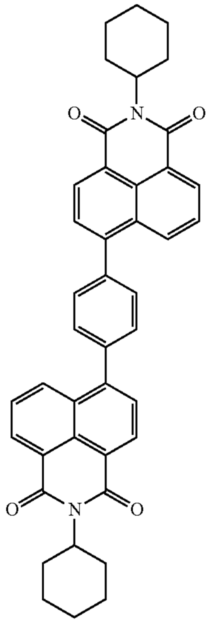
43
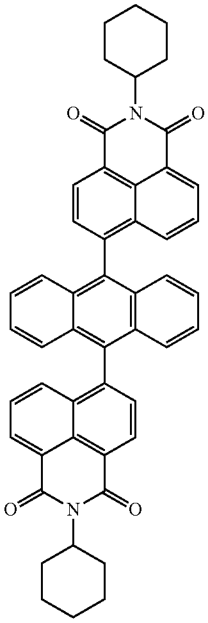
42
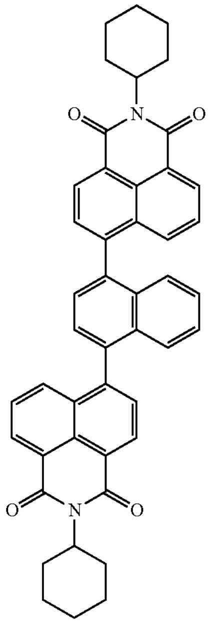
44
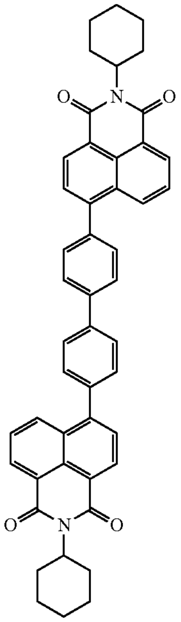

-continued
45
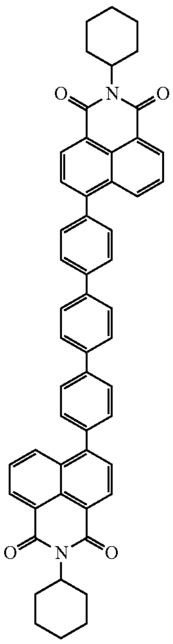
46
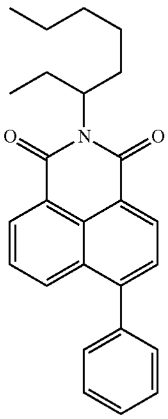
47
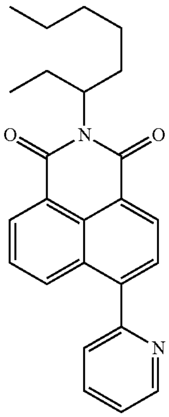
-continued
48
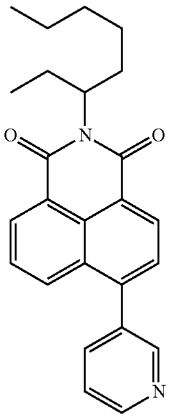
49
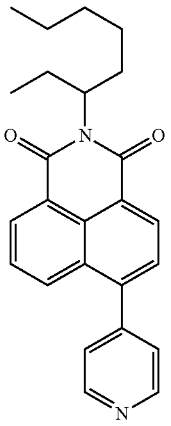
50
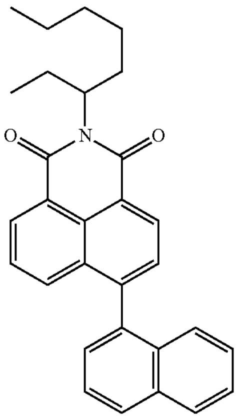

-continued
51
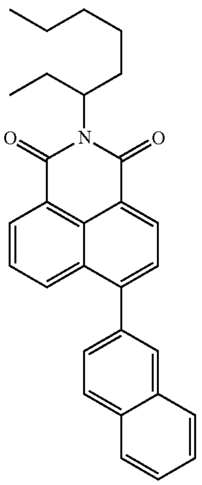
52
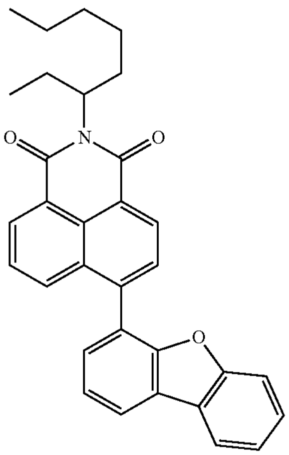
53
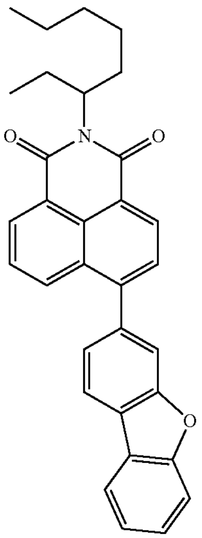
-continued
54
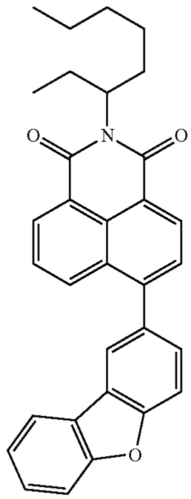
55
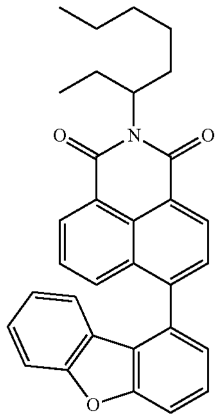
56
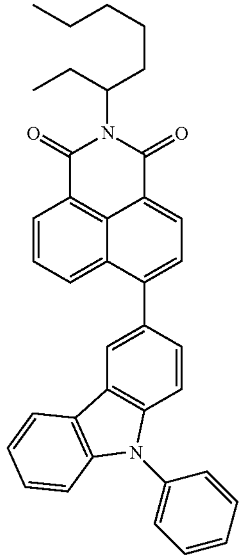

-continued
57
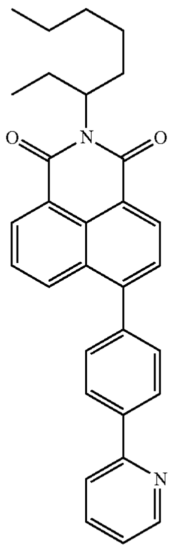
58
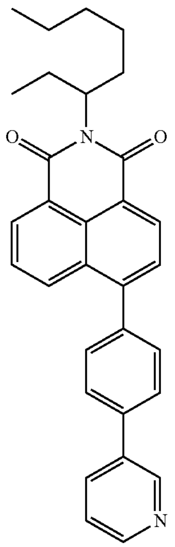
59
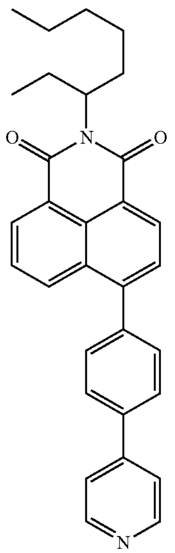
-continued
60
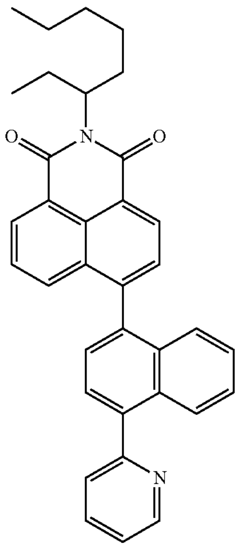
61
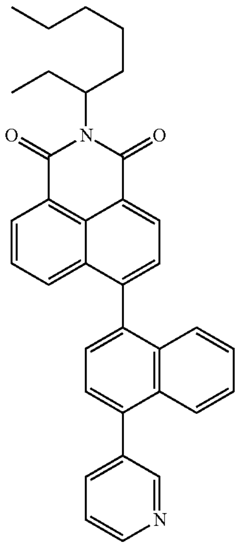
62
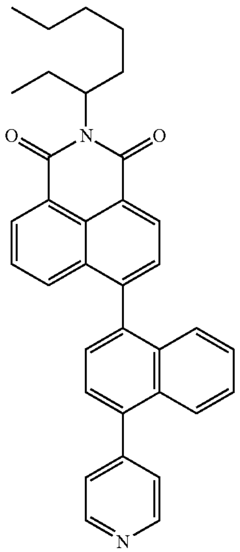

-continued
63
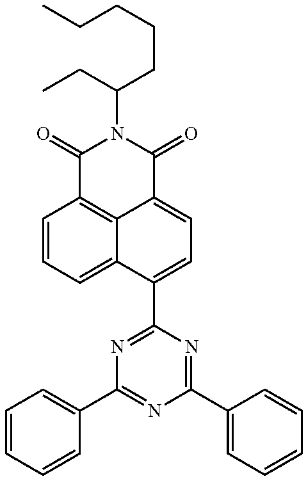
64
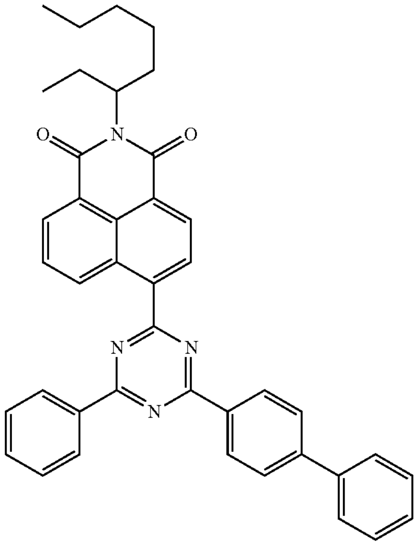
65
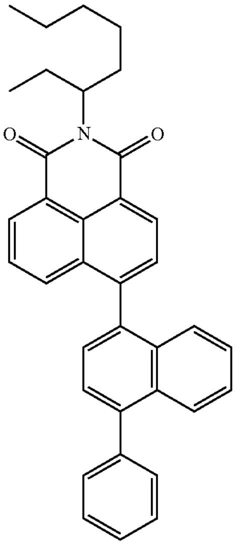
-continued
66
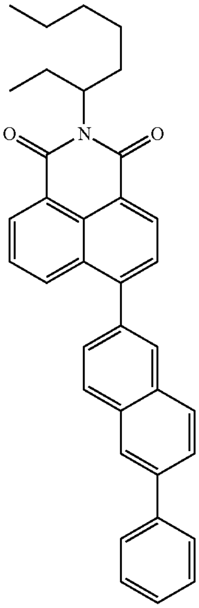
67
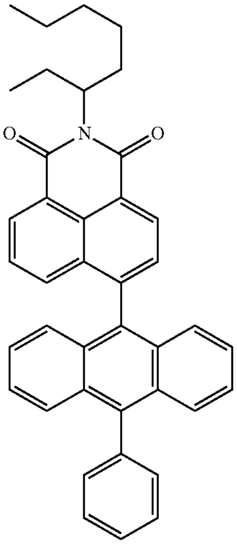
68
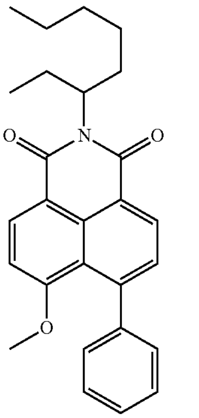

-continued
69
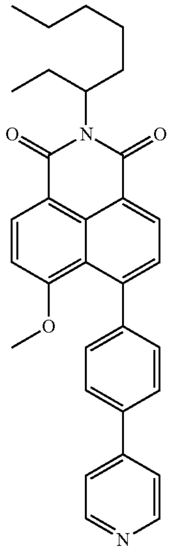
70
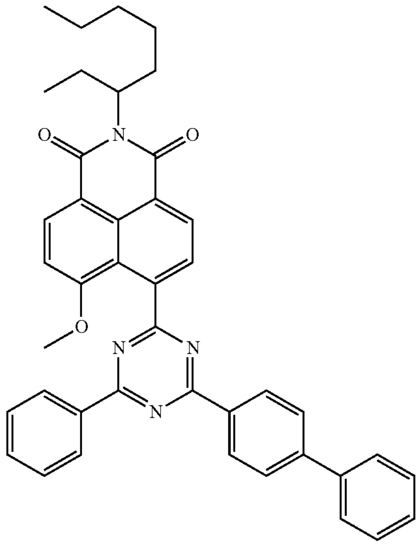
71
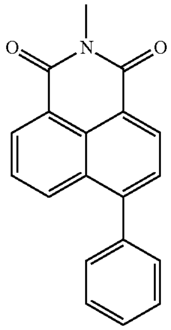
-continued
72
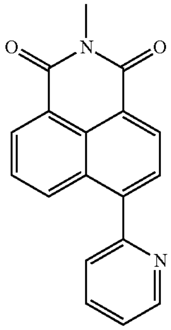
73
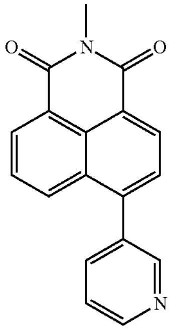
74
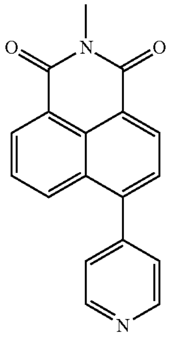
75
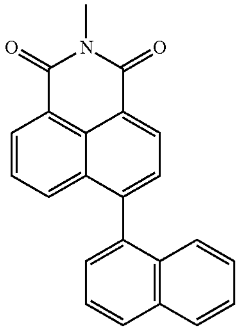

-continued
76
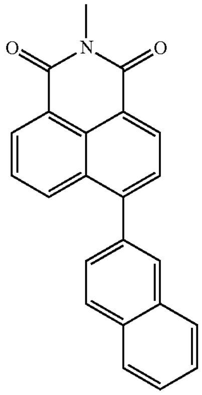
77
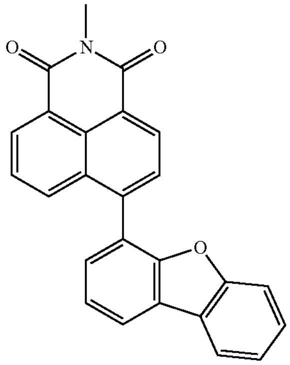
78
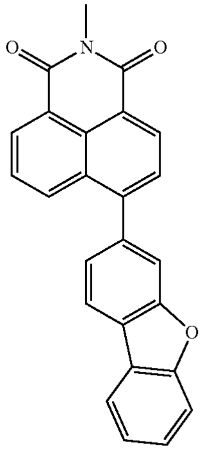
79
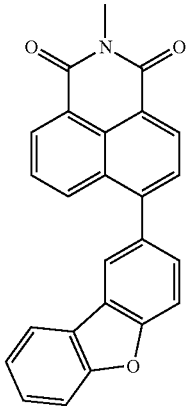
-continued
80
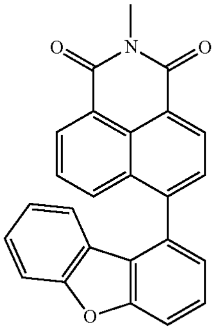
81
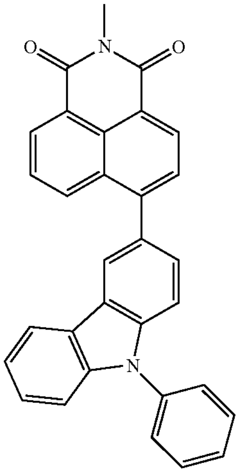
82
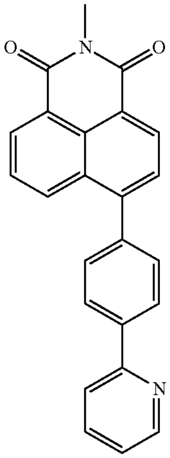

-continued
83
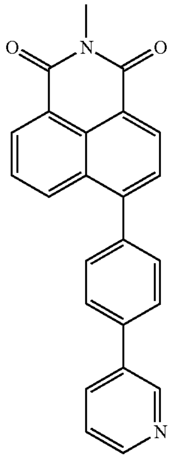
84
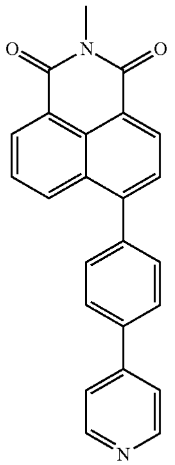
85
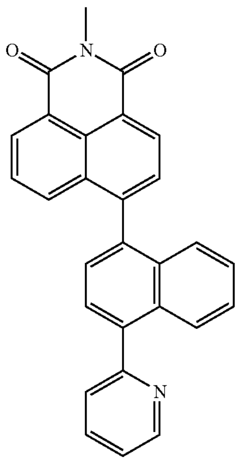
-continued
86
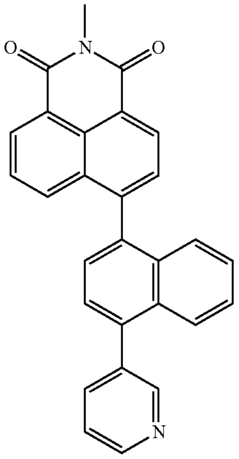
87
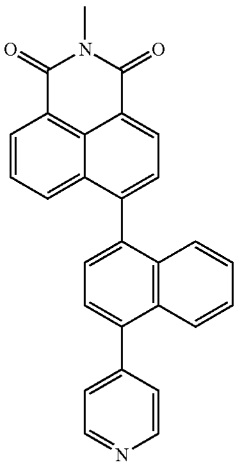
88
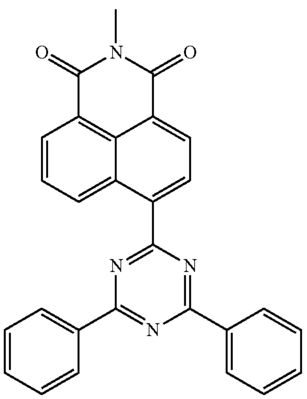

-continued
89
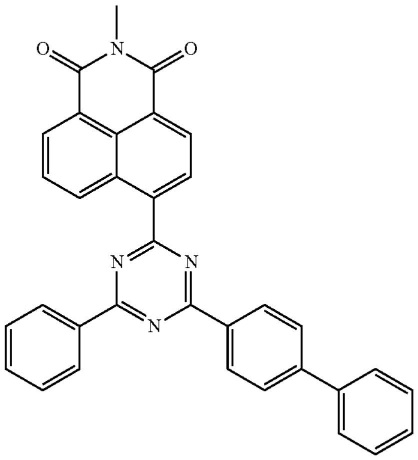
90
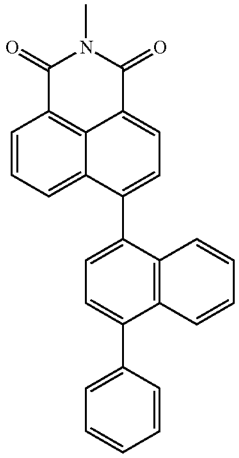
91
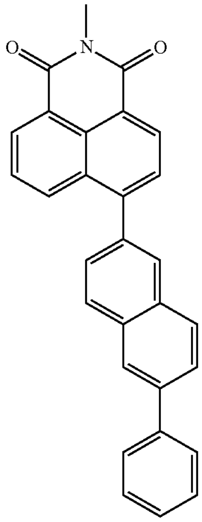
-continued
92
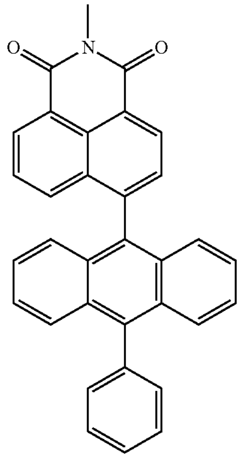
93
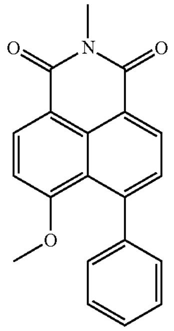
94
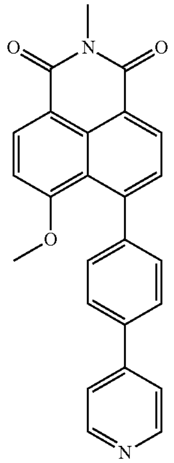

-continued
95
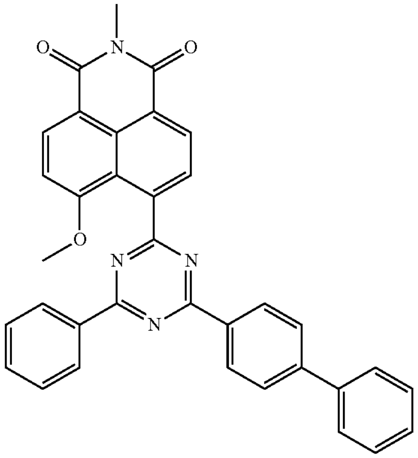
96
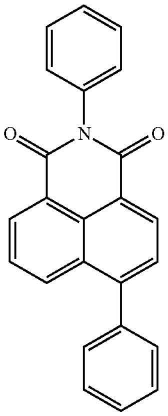
97
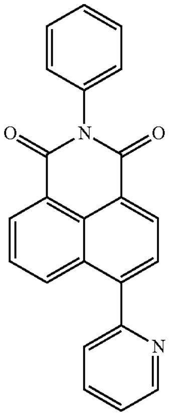
-continued
98
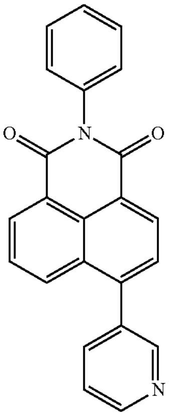
99
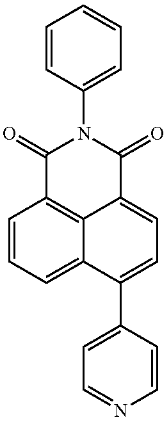
100
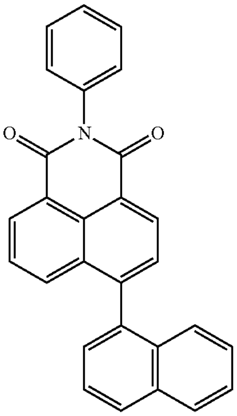

-continued
101
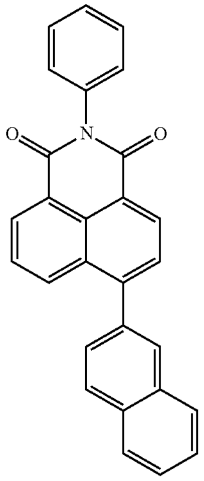
102
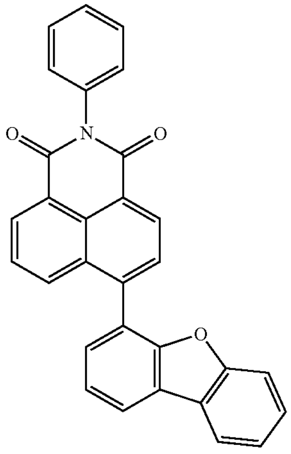
103
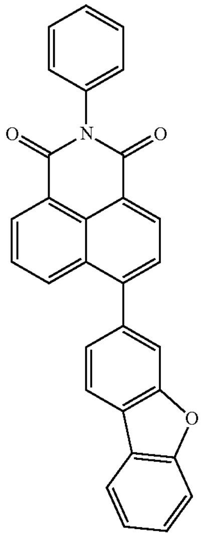
-continued
104
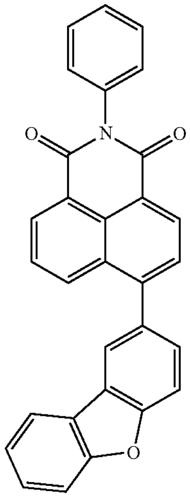
105
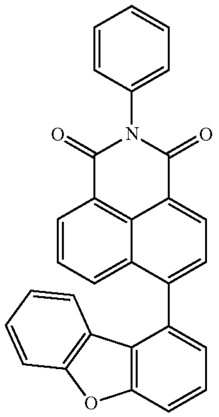
106
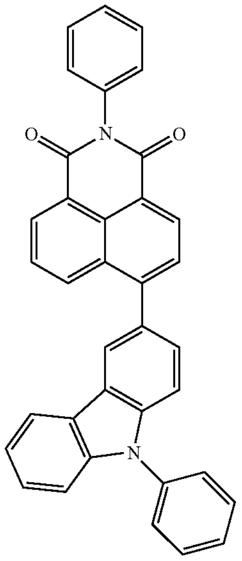

-continued
107
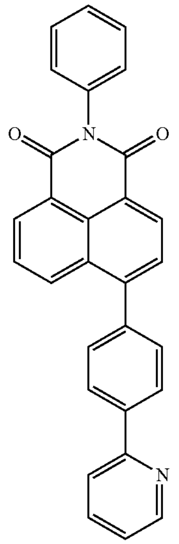
108
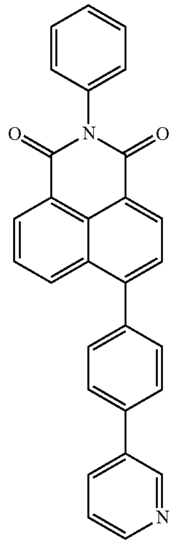
109
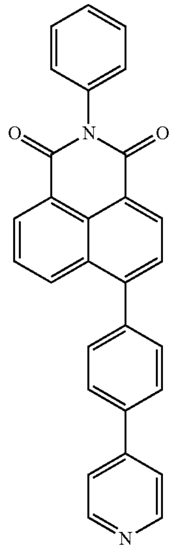
-continued
110
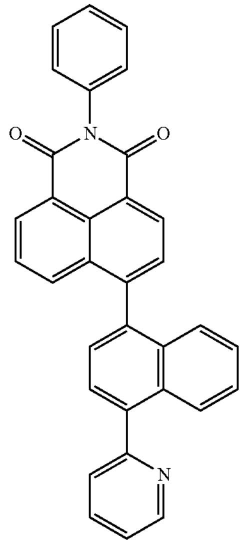
111
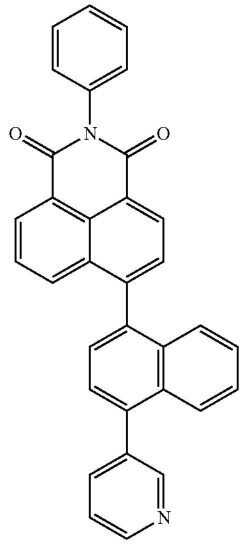
112
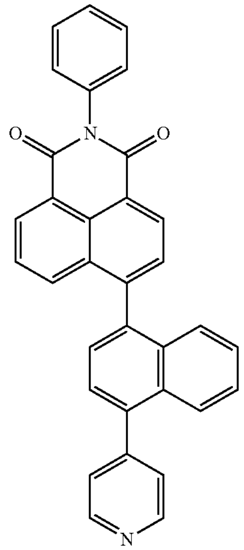

-continued
113
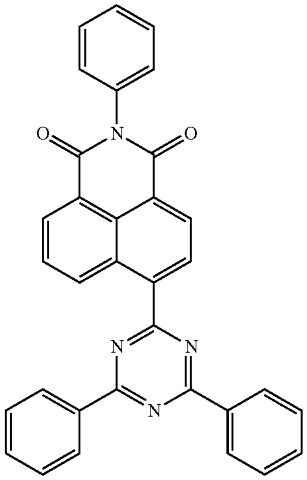
114
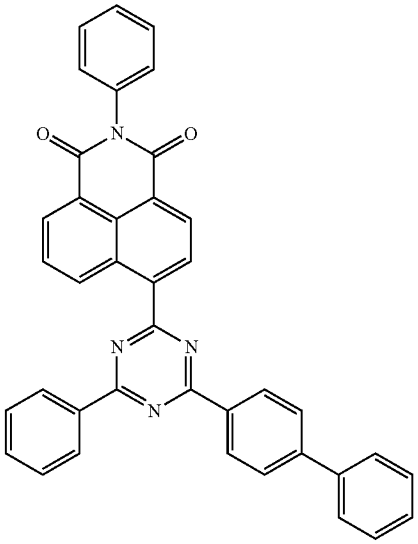
115
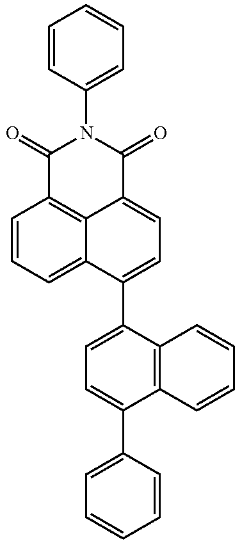
-continued
116
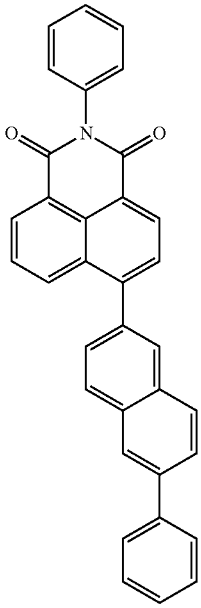
117
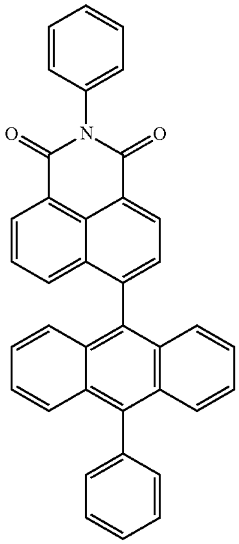
118
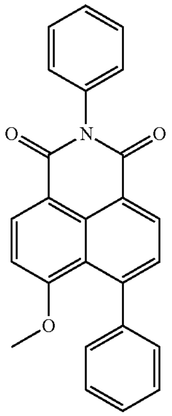

-continued
119
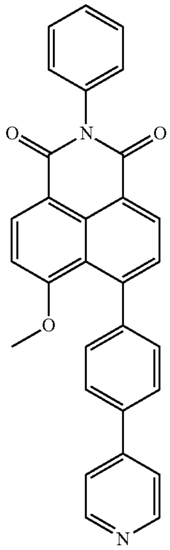
120
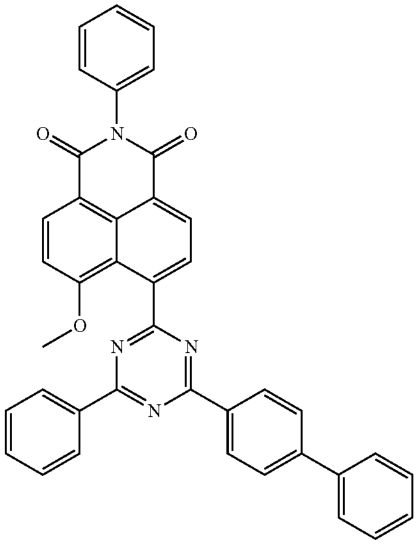
121
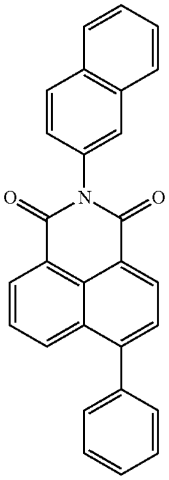
-continued
122
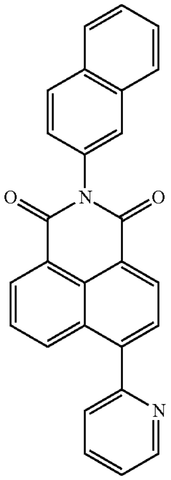
123
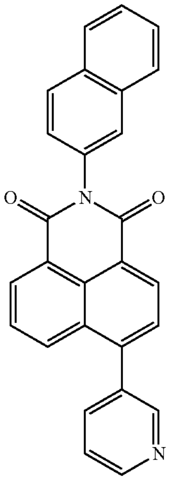
124
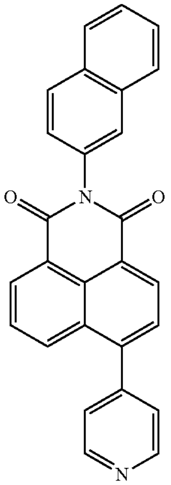

-continued
125
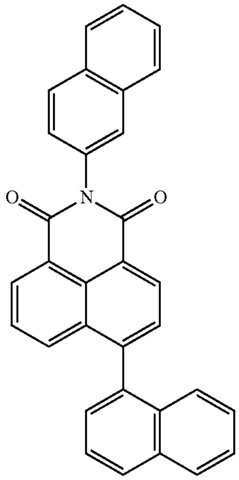
126
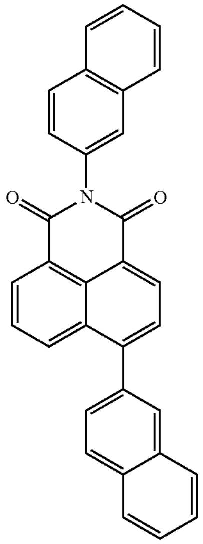
127
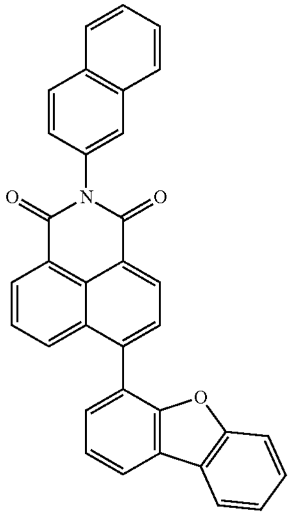
-continued
128
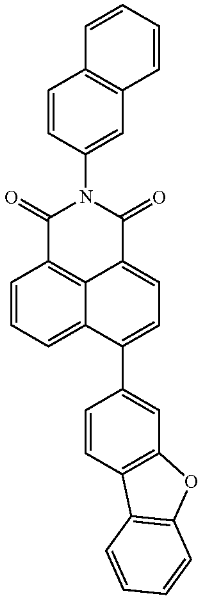
129
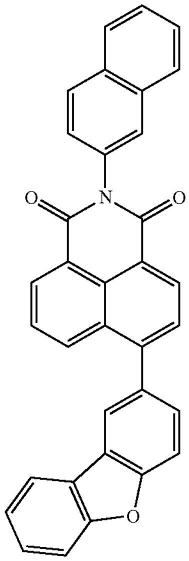
130
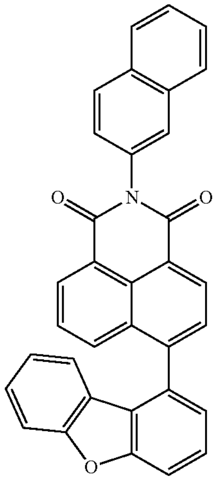

-continued
131
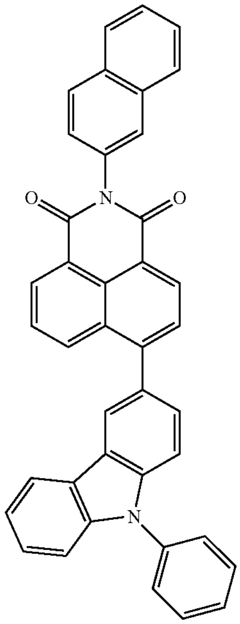
133
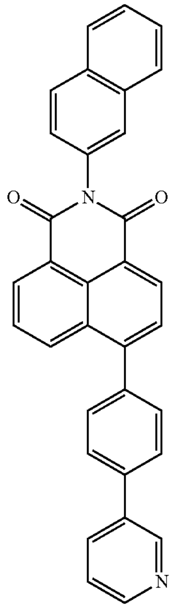
132
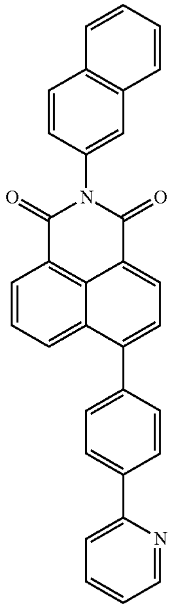
134
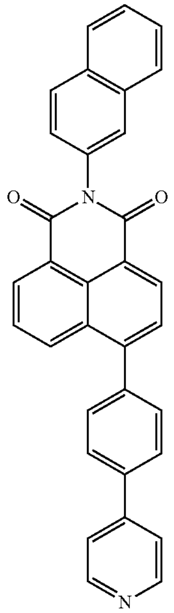

-continued
135
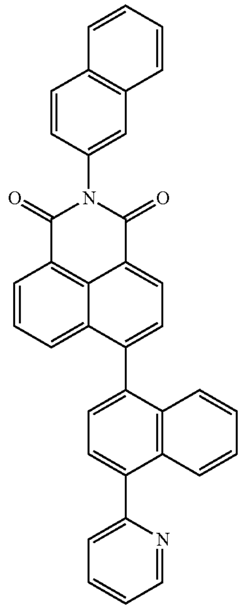
136
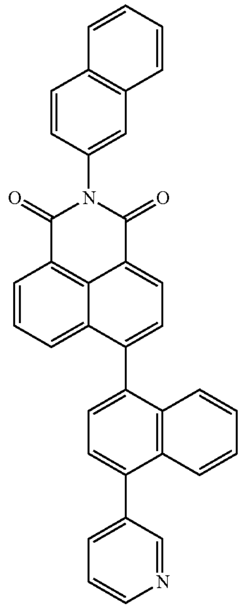
-continued
137
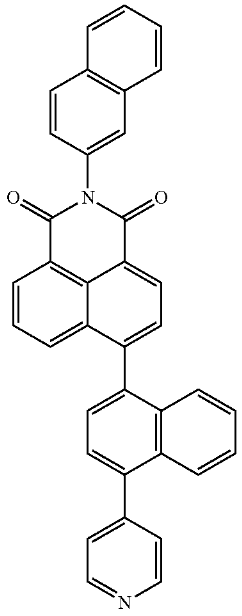
138
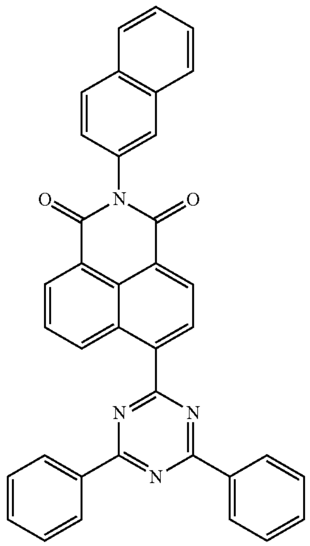

-continued
139
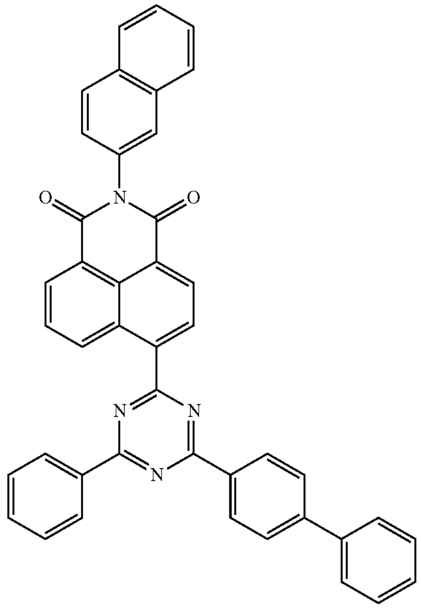
140
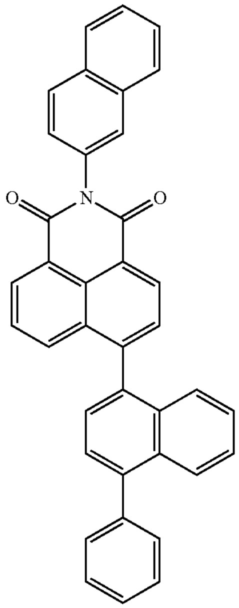
-continued
141
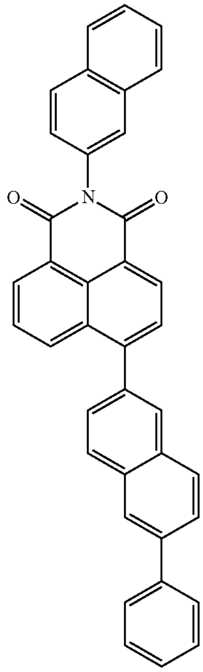
142
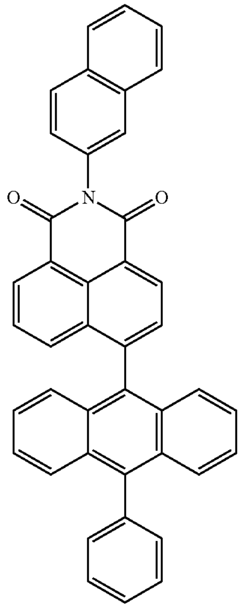

-continued
143
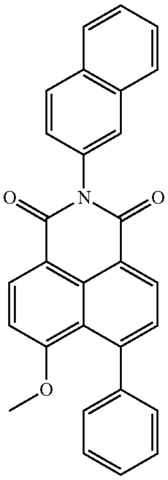
144
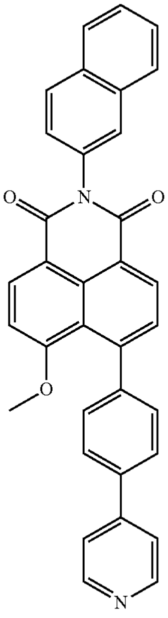
-continued
145
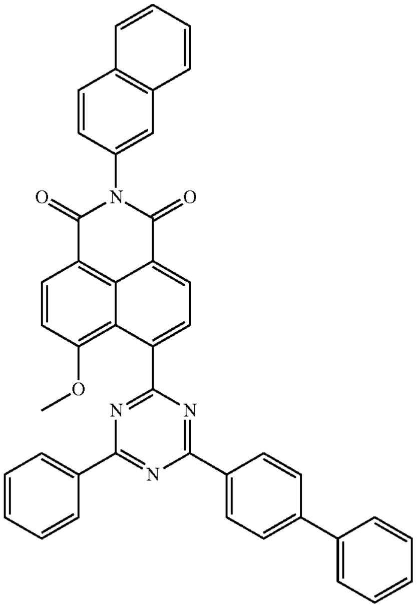
146
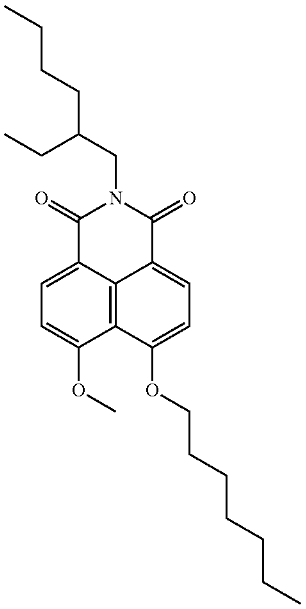

-continued
147
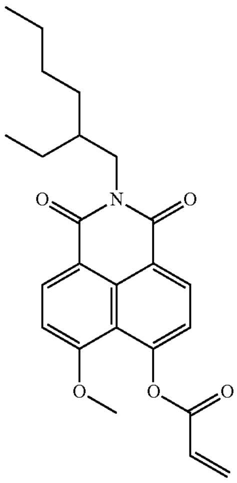
148
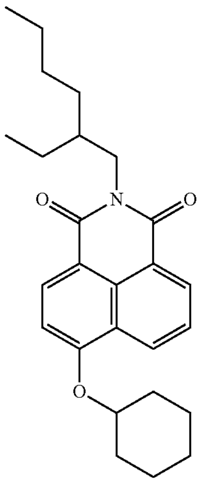
149
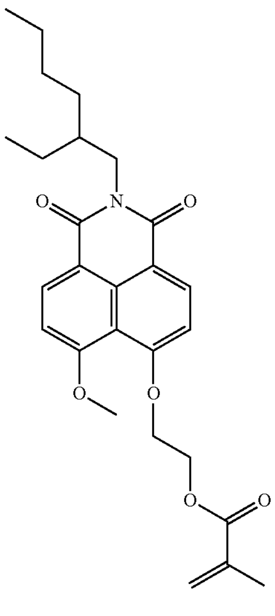
-continued
150
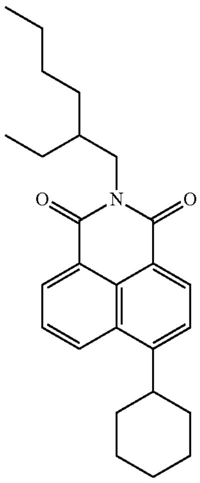
151
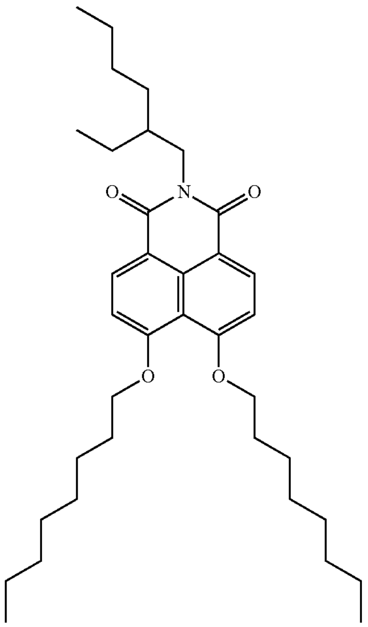
152
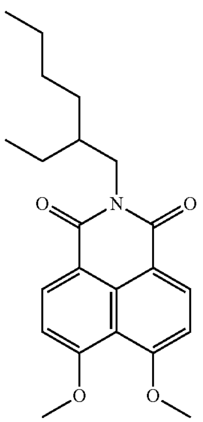

153
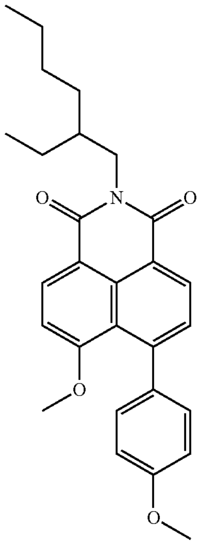
154
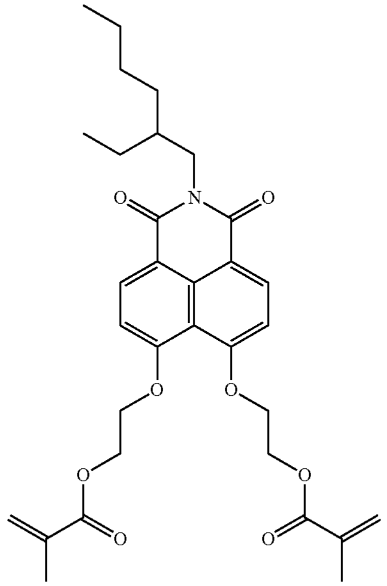
155
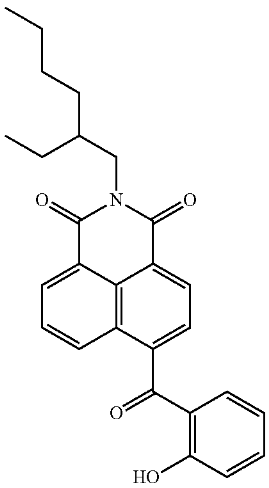
156
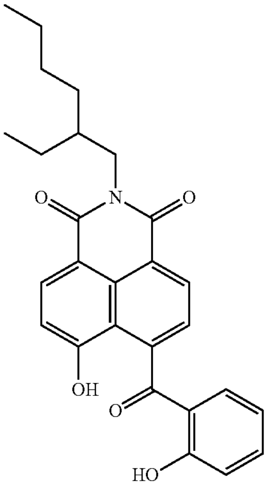
157
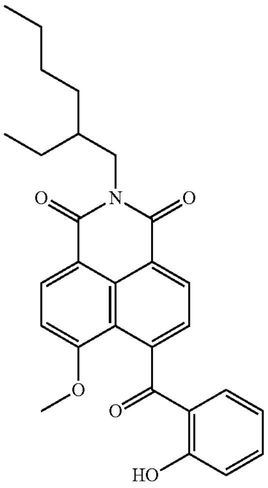
158
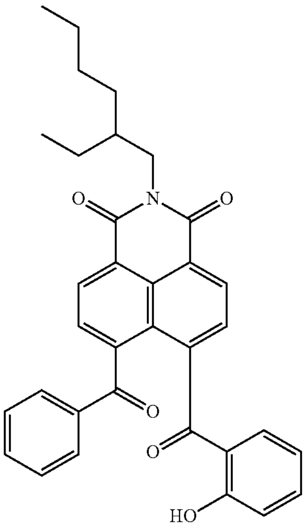

-continued
159
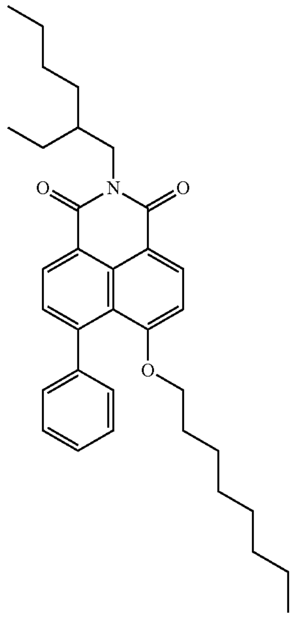
160
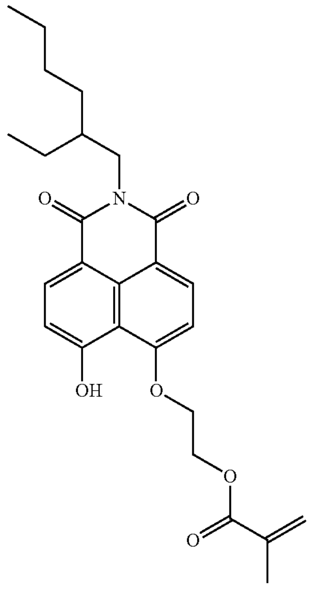
-continued
161
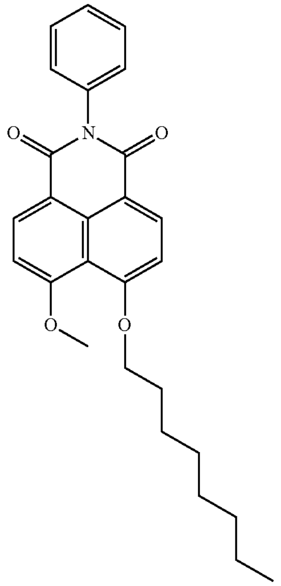
162
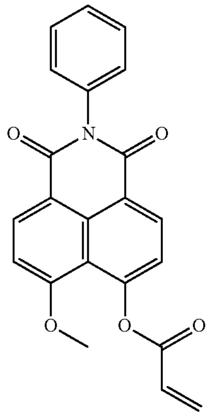
163
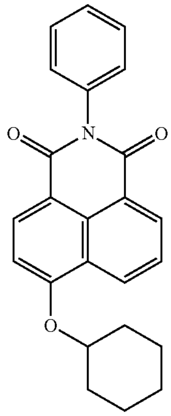

-continued
164
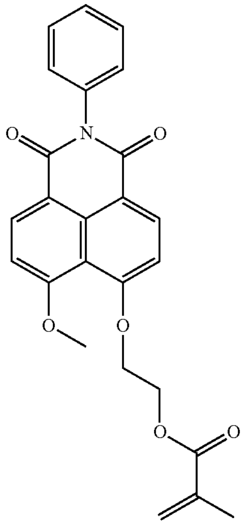
165
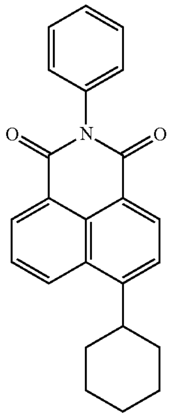
166
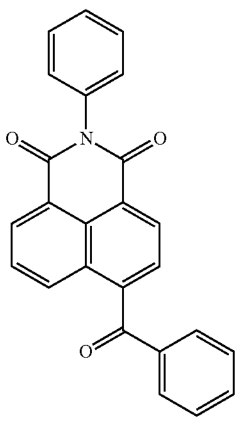
-continued
167
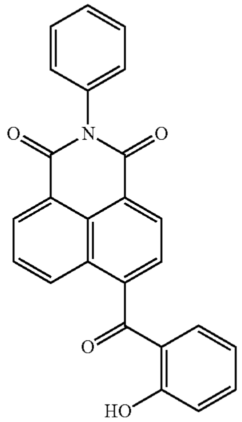
168
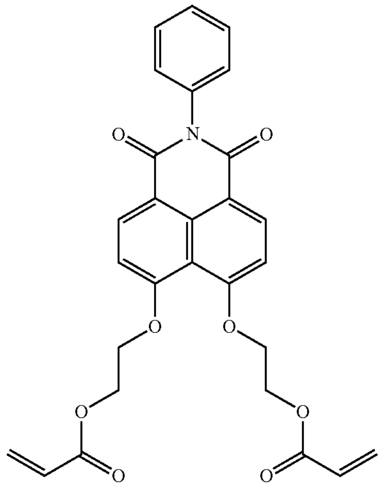
169
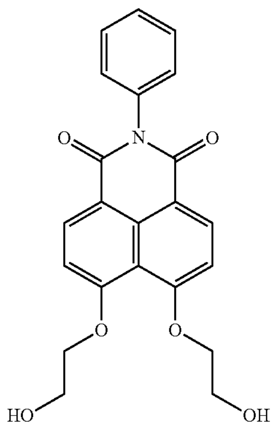

-continued
170
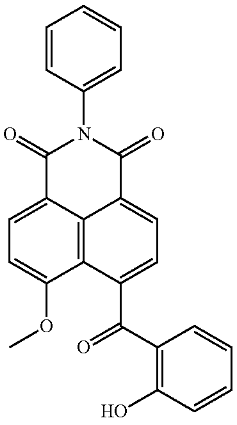
171
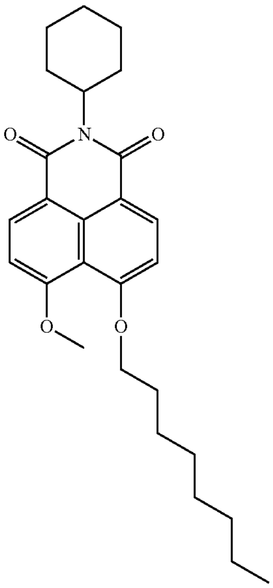
172
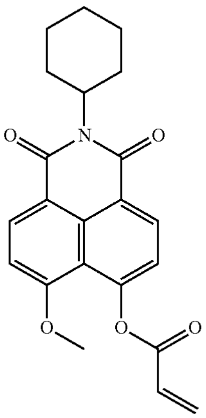
-continued
173
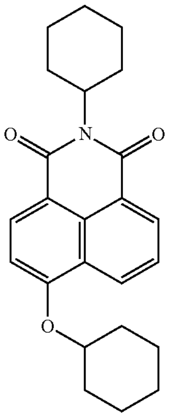
174
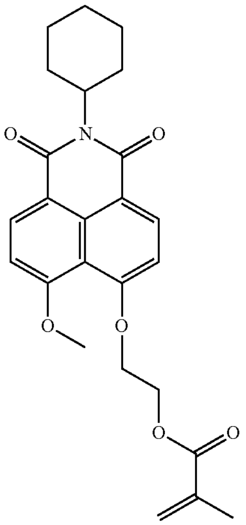
175
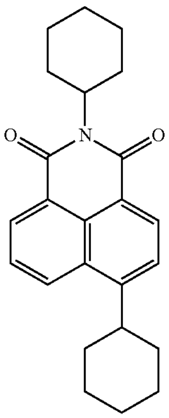

-continued
176
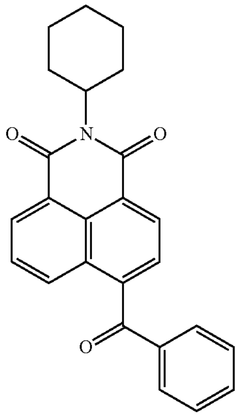
177
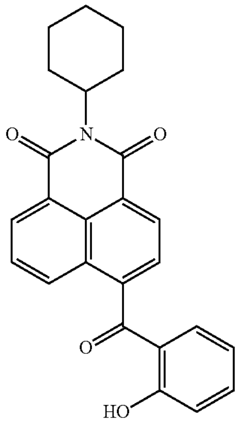
178
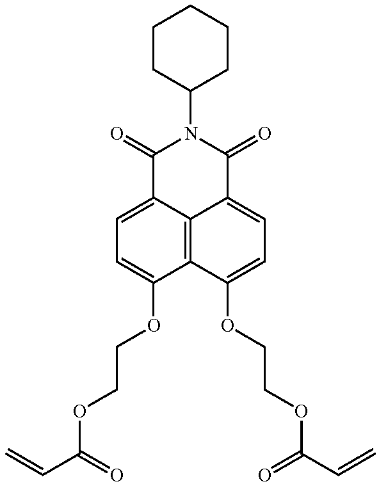
-continued
179
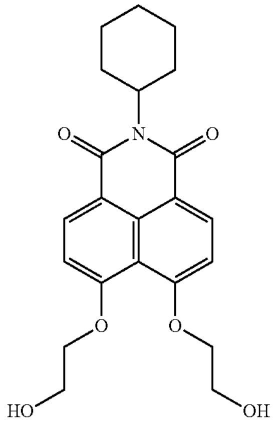
180
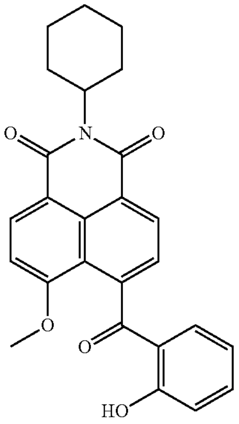
181
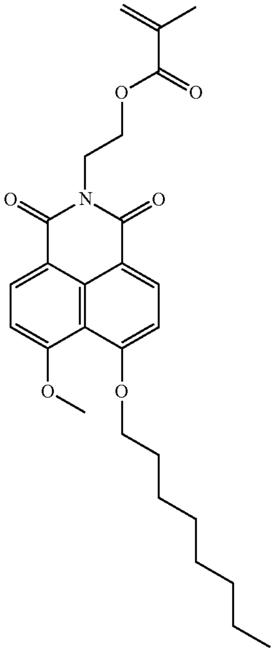

-continued
182
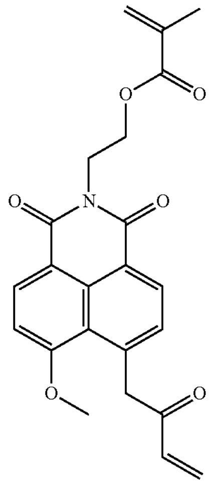
183
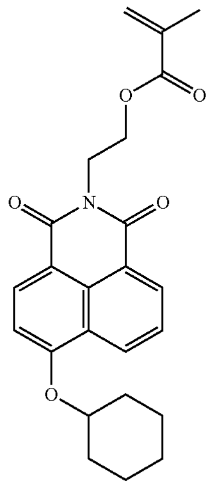
184
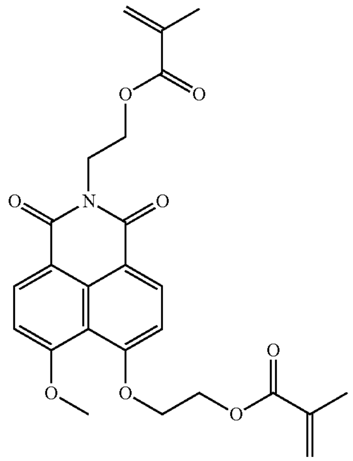
-continued
185
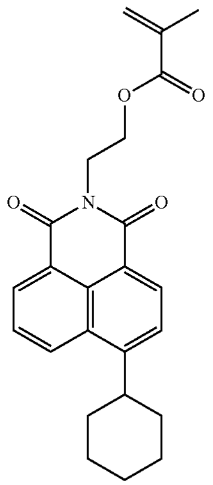
186
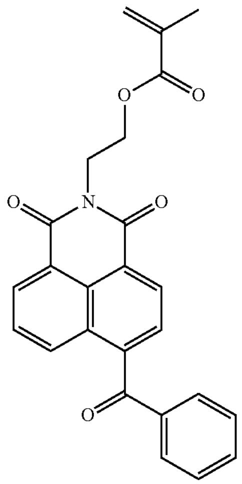
187
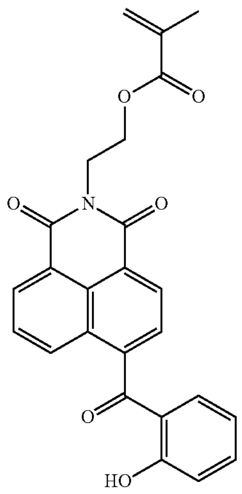

188
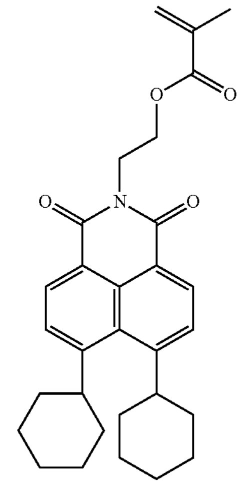
189
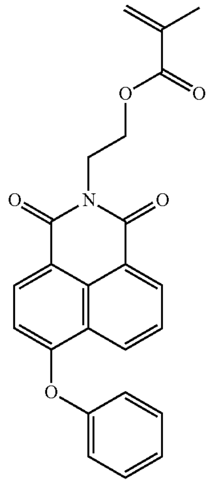
190
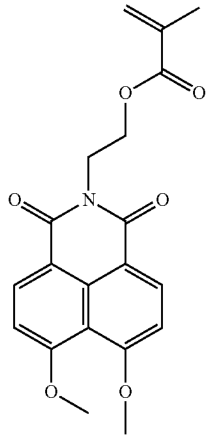
191
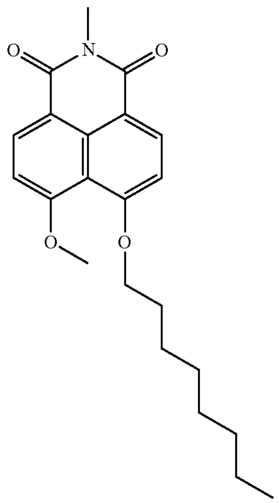
192
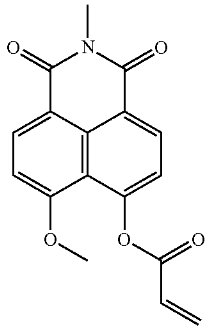
193
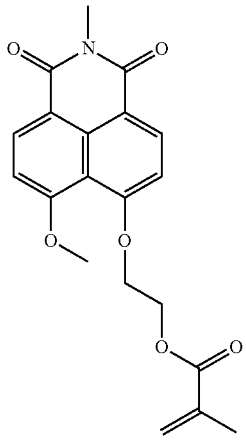

-continued
194
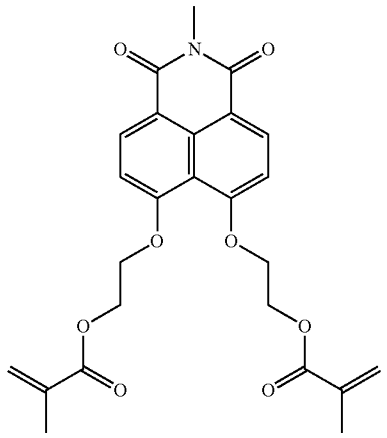
195
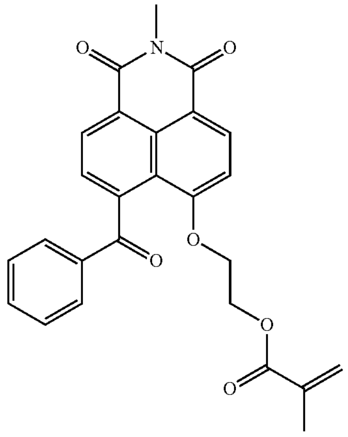
196
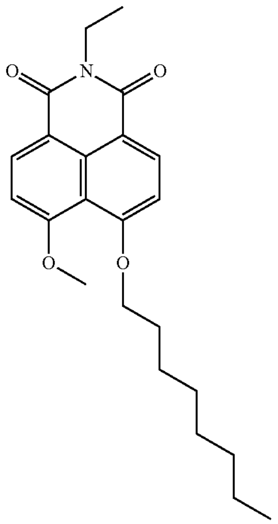
-continued
197
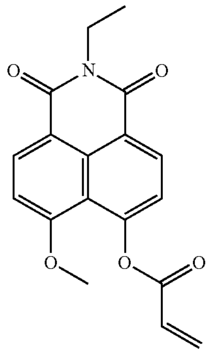
198
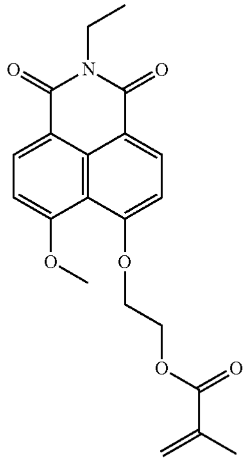
199
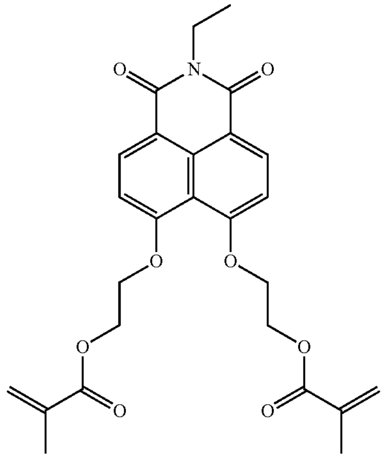

-continued

200

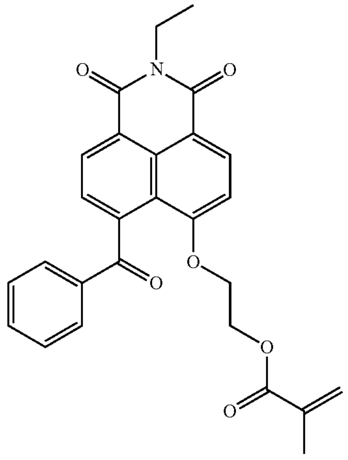

201

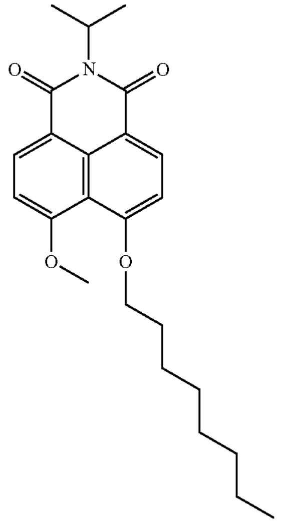

202

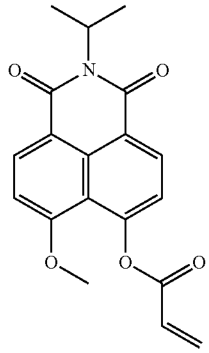

-continued

203

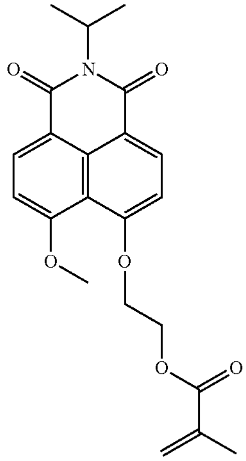

204

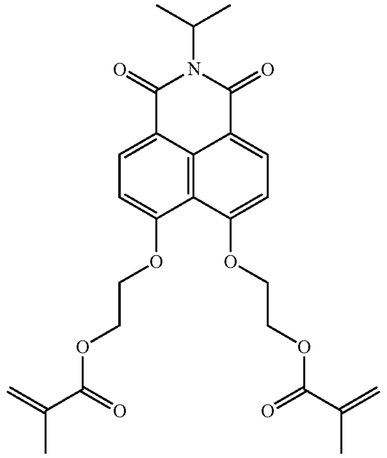

205

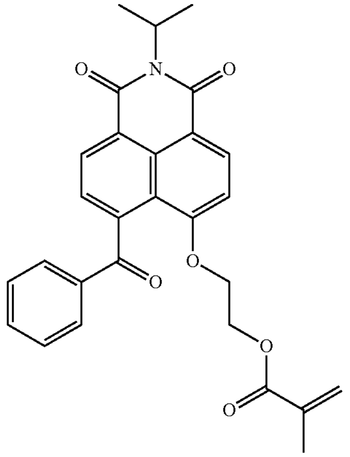

The condensed cyclic compound may absorb external ultraviolet (UV) rays to prevent or reduce the ultraviolet rays from transmitting therethrough. Therefore, the organic light-emitting devices 10, 20, and 30, in which the condensed cyclic compound is included in the first layer 210 and/or the second layer 220, may prevent or reduce the emission layer or the like including the organic material from being damaged by external ultraviolet rays. For example, the condensed cyclic compound may absorb UV light having a wavelength of about 400 nm to about 410 nm.

In one or more embodiments, the condensed cyclic compound has a transmittance of about 10% or less (for example, about 5% or less) with respect to light having a wavelength of about 400 nm to about 410 nm (for example, about 405 nm).

In one or more embodiments, the condensed cyclic compound has a transmittance of about 90% or more (for example, about 95%) with respect to light having a wavelength of about 430 nm.

In the condensed cyclic compound, π-π stacking is increased by strong π-π interactions, and the first layer or the second layer including the condensed cyclic compound subsequently has a high refractive index, thereby contributing to improvement in the luminescent efficiency of the organic light-emitting device, including the external luminescent efficiency.

Since the organic light-emitting device has a structure in which a plurality of layers including various materials are stacked, light generated in the organic layer may be extinguished while passing through a plurality of layers in the device due to total reflection, such that light is not transmitted to the outside of the organic light-emitting device. When the external luminescent efficiency (e.g., the external extraction efficiency) of the organic light-emitting device is low, the total luminescent efficiency of the organic light-emitting device may be deteriorated or limited even when light conversion efficiency in the organic layer is high. However, the first layer 210 and/or the second layer 220 including the condensed cyclic compound is capable of increasing the external extraction efficiency of the organic light-emitting device according to the principle of constructive interference when light generated in the organic layer including the emission layer travels into air through the first electrode and/or the second electrode, thereby greatly contributing to the improvement in the luminescent efficiency of the organic light-emitting device.

Therefore, the first layer 210 including the condensed cyclic compound and/or the second layer 220 including the condensed cyclic compound may be an ultraviolet-absorbing light-efficiency-enhancement layer (e.g. may absorb ultraviolet light and may simultaneously increase the external extraction efficiency of the organic light-emitting device using constructive interference).

At least one selected from the first layer 210 and the second layer 220 may further include at least one material selected from a carbocyclic compound, a heterocyclic compound, an amine-based compound, a porphyrin derivative, a phthalocyanine derivative, a naphthalocyanine derivative, an alkali metal complex, and an alkaline earth metal complex. The carbocyclic compound, the heterocyclic compound, and/or the amine-based compound may be optionally substituted with a substituent containing at least one element selected from oxygen (O), nitrogen (N), sulfur (S), selenium (Se), silicon (Si), fluorine (F), chlorine (Cl), bromine (Br), and iodine (I). In one or more embodiments, at least one selected from the first layer 210 and the second layer 220 may further include an amine-based compound.

In one or more embodiments, at least one selected from the first layer 210 and the second layer 220 may further include a compound selected from Compounds HT28 to HT33 and Compounds CP1 to CP5, but embodiments of the present disclosure are not limited thereto:

CP1

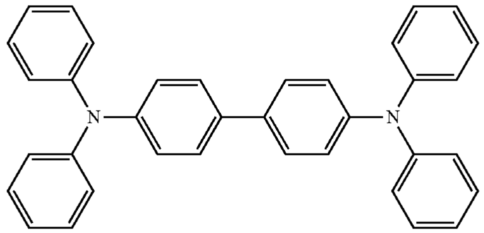

CP2

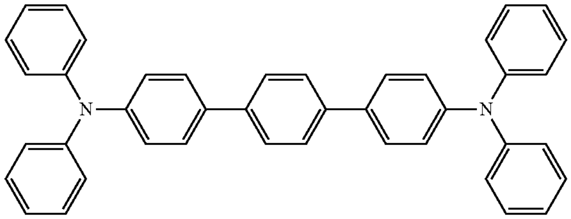

CP3

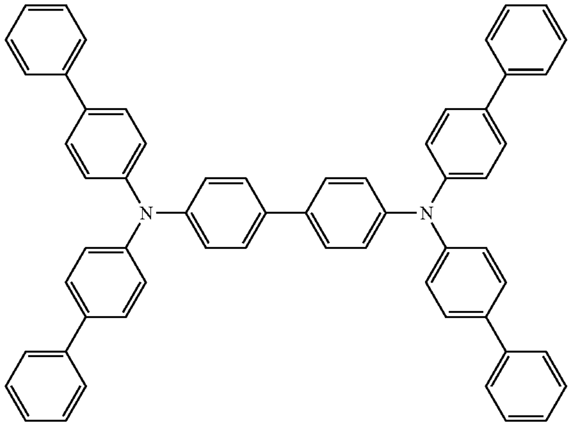

CP4

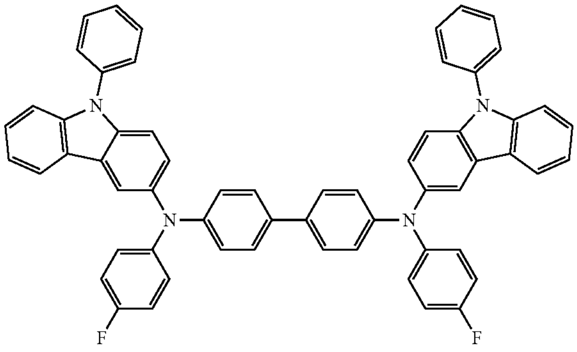

CP5

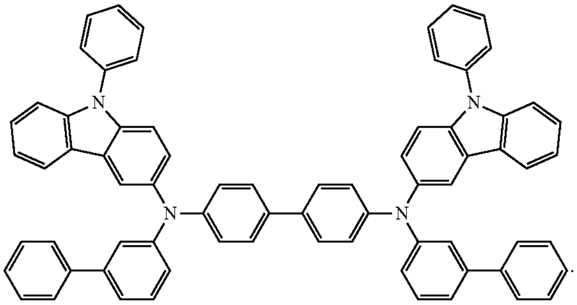

.

In one or more embodiments, the first electrode may be a transmissive electrode or a semi-transmissive electrode, and the organic light-emitting devices 10, 20, and 30 may each include the first layer 210. If necessary, one or more layers may be additionally provided between the first electrode and the first layer 210. In one or more embodiments, the first layer 210 may directly contact the first electrode. The first layer 210 may be an ultraviolet-absorbing light-efficiency-enhancement layer.

In one or more embodiments, the second electrode may be a transmissive electrode or a semi-transmissive electrode, and the organic light-emitting devices 10, 20, and 30 may each include the second layer 220. If necessary, one or more layers may be additionally provided between the second electrode and the second layer 220. In one or more embodiments, the second layer 220 may directly contact the second electrode. The second layer 220 may be an ultraviolet-absorbing light-efficiency-enhancement layer.

In one or more embodiments, the first electrode and the second electrode may each independently be a transmissive electrode or a semi-transmissive electrode, and the organic light-emitting devices 10, 20, and 30 may each include the first layer 210 and the second layer 220. If necessary, one or more layers may be additionally provided between the first electrode and the first layer 210 and/or between the second electrode and the second layer 220. In one or more embodiments, the first layer 210 may directly contact the first electrode, and/or the second layer 220 may directly contact the second electrode. The first layer 210 and the second layer 220 may each be an ultraviolet-absorbing light-efficiency-enhancement layer.

An organic light-emitting device according to an embodiment of the present disclosure may be patterned to correspond to R, G, and B pixels that constitute an organic layer. Accordingly, the organic layer may include a red emission organic layer, a green emission organic layer, and a blue emission organic layer.

The first layer 210 and/or the second layer 220 that includes the condensed cyclic compound represented by Formula 1 may be formed as a common (e.g., shared) layer with respect to the R, G and B pixels. When the first layer 210 and/or the second layer 220 are formed as a common layer with respect to R, G and B pixels, a thickness of the first layer 210 and/or the second layer 220 may be about 500 Å to about 800 Å, for example, about 600 Å to about 700 Å. When the thickness of the light-efficiency improvement layer is within these ranges, excellent light efficiency improvement effects may be obtained.

In one or more embodiments, the first layer (and/or the second layer) may be composed of at least one selected from a first layer (and/or second layer)-R, a first layer (and/or second layer)-G, and a first layer (and/or second layer)-B. For example, the first layer and/or the second layer may be patterned to correspond to the R, G and B pixels.

The thicknesses of the first layer (and/or second layer)-R, the first layer (and/or second layer)-G, and the first layer (and/or second layer)-B may be identical to or different from each other.

According to another aspect of embodiments of the present disclosure, an electronic apparatus includes: the organic light-emitting device and a thin film transistor, wherein the first electrode and the organic light-emitting device may electrically contact at least one of a source electrode and a drain electrode of the thin film transistor.

The term "$C_1$-$C_{60}$ alkyl group" as used herein refers to a linear or branched saturated aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an iso-amyl group, and a hexyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and non-limiting examples thereof may include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and non-limiting examples thereof may include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —O-$A_{101}$ (wherein $A_{101}$ is a $C_1$-$C_{60}$ alkyl group), and non-limiting examples thereof may include a methoxy group, an ethoxy group, and an isopropyloxy group.

The term "$C_3$-$C_{10}$ cycloalkyl group" as used herein refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent monocyclic group having at least one heteroatom selected from N, O, Si, P, and S as a ring-forming atom and 1 to 10 carbon atoms, and non-limiting examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof may include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, Si, P, and S as a ring-forming atom, 1 to 10 carbon atoms, and at least one double bond in its ring. Non-limiting examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a carbocyclic aromatic system that has at least one heteroatom selected from N, O, Si, P, and S as a ring-forming atom, in addition to 1 to 1 carbon atoms. The term "$C_1$-$C_{60}$ heteroarylene group" as used herein refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —O-$A_{102}$ (wherein $A_{102}$ is a $C_6$-$C_{60}$ aryl group), and the term "$C_6$-$C_{60}$ arylthio group" as used herein indicates —S-$A_{103}$ (wherein $A_{103}$ is a $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms as ring-forming atoms, and no aromaticity in its entire molecular structure. A non-limiting example of the monovalent non-aromatic condensed polycyclic group may include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom selected from N, O, Si, P, and S, other than carbon atoms, as a ring-forming atom, and no aromaticity in its entire molecular structure. A non-limiting example of the monovalent non-aromatic condensed heteropolycyclic group may include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{60}$ carbocyclic group" as used herein refers to a monocyclic or polycyclic group having 5 to 60 carbon atoms in which a ring-forming atom is a carbon atom only. The $C_5$-$C_{60}$ carbocyclic group may be an aromatic carbocyclic group or a non-aromatic carbocyclic group. The $C_5$-$C_{50}$ carbocyclic group may be a ring (such as benzene), a monovalent group (such as a phenyl group), or a divalent group (such as a phenylene group). In one or more embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having substantially the same structure as the $C_5$-$C_{60}$ carbocyclic group, except that at least one heteroatom selected from N, O, Si, P, and S is used in addition to carbon as a ring-forming atom (the number of carbon atoms may be 1 to 60).

At least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from the group consisting of:

deuterium (-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), and $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

The term "Ph" as used herein represents a phenyl group, the term "Me" as used herein represents a methyl group, the term "Et" as used herein represents an ethyl group, the terms "ter-Bu" and "$Bu^t$," as used herein, represent a tert-butyl group, and the term "OMe" as used herein represents a methoxy group.

The term "biphenyl group" as used herein refers to a "phenyl group substituted with a phenyl group". For example, a "biphenyl group" is a "substituted phenyl group" having a "phenyl group" as a substituent.

The term "terphenyl group" as used herein refers to a "phenyl group substituted with a biphenyl group". For example, a "terphenyl group" is a "phenyl group" having, as a substituent, a "phenyl group substituted with a phenyl group."

* and *' used herein, unless defined otherwise, each refer to a binding site to a neighboring atom in a corresponding formula.

Hereinafter, a compound according to embodiments of the present disclosure and an organic light-emitting device according to embodiments of the present disclosure will be described in detail with reference to Synthesis Examples and Examples. The expression "B was used instead of A" used in describing Synthesis Examples indicates that an identical number of molar equivalents of A was used in place of molar equivalents of B.

EXAMPLES

Synthesis Example 1: Synthesis of Compound 1

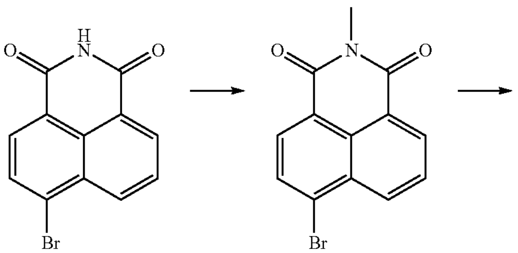

A 1-1

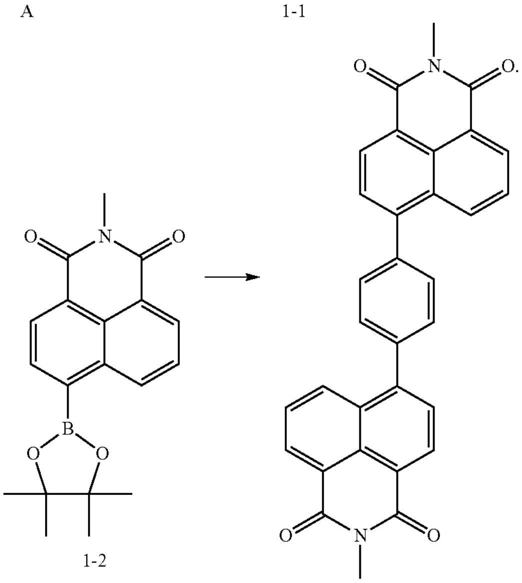

1-2 1

Synthesis of Intermediate 1-1

5 g of Compound A (6-bromo-1H-benzo[de]isoquinoline-1,3(2H)-dione) was dissolved in dimethylformamide (DMF), and 5 g of $K_2CO_3$ and 3 g of iodomethane were added thereto. The mixture was stirred at a temperature of 50° C. for 24 hours, and the reaction was terminated by addition of water. The reaction was extracted three times using ethyl acetate, dried over anhydrous magnesium sulfate, and filtered under reduced pressure. Then, the residue obtained therefrom was separated and purified by column chromatography to obtain 4.6 g (88%) of Intermediate 1-1. The obtained compound was confirmed by LC-MS. $C_{19}H_{15}Br$: M+324.2.

Synthesis of Intermediate 1-2

4.6 g of Intermediate 1-1 was diluted in toluene, and 5 g of KOAc, 4.6 g of bis(pinacolato)diboron, and 0.5 g of $Pd(dppf)_2Cl_2$ were added thereto and stirred under reflux. After 17 hours, the mixture was cooled to room temperature, and the reaction was terminated by addition of water. The reaction was extracted three times using ethyl acetate, dried over anhydrous magnesium sulfate, and filtered under reduced pressure. Then, the residue obtained therefrom was separated and purified by column chromatography to obtain 4.3 g (81%) of Intermediate 1-2. The obtained compound was confirmed by LC-MS. $C_{19}H_{15}Br$: M+324.2.

Synthesis of Compound 1

4.3 g of Intermediate 1-2, 2 g of 1,4-dibromobenzene, 8 g of $Cs_2CO_3$, and 0.8 g of $Pd(PPh_3)_4$ were diluted in toluene and stirred under reflux. After 20 hours, the mixture was cooled to room temperature, and the reaction was terminated by addition of water. The reaction was extracted three times using ethyl acetate, dried over anhydrous magnesium sulfate, and filtered under reduced pressure. Then, the residue obtained therefrom was separated and purified by column chromatography to obtain 2.8 g (76%) of Compound 1. The obtained compound was confirmed by $^1H$ NMR and LC-MS.

Synthesis Example 2: Synthesis of Compound 7

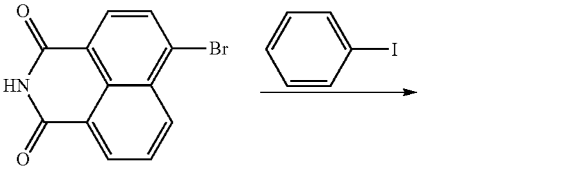

A

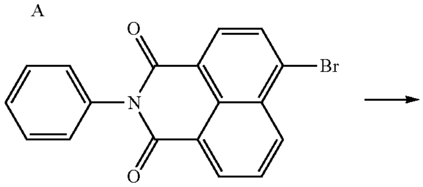

7-1

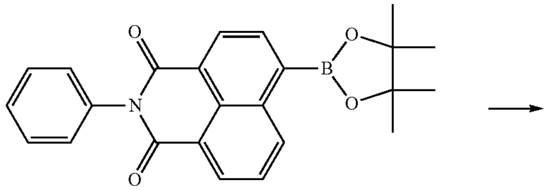

7-2

-continued

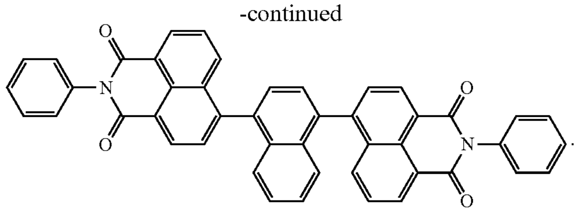

7

Synthesis of Intermediate 7-1

2.8 g of Compound A, 2.1 g of iodobenzene, 5.4 g of KOtBu, 0.2 g of $P(tBu)_3$, and 0.4 g of $Pd_2(dba)_3$ were diluted in toluene and stirred under reflux. After 20 hours, the mixture was cooled to room temperature, and the reaction was terminated by addition of water. The reaction was extracted three times using ethyl acetate, dried over anhydrous magnesium sulfate, and filtered under reduced pressure. Then, the residue obtained therefrom was separated and purified by column chromatography to obtain 2.9 g (80%) of Intermediate 7-1. The obtained compound was confirmed by LC-MS. $C_{18}H_{10}BrNO_2$: M+351.0.

Synthesis of Intermediate 7-2

2.8 g (84%) of Intermediate 7-2 was synthesized in substantially the same manner as in the Synthesis of Intermediate 1-2, except that 2.9 g of Intermediate 7-1 was used. The obtained compound was confirmed by LC-MS. $C_{24}H_{22}BNO_4$: M+399.2.

Synthesis of Compound 7

2.1 g (45%) of Compound 7 was synthesized in substantially the same manner as in the Synthesis of Intermediate 7-1, except that 2.8 g of Intermediate 7-2 and 1 g of 1,4-dibromonaphthalene were used. The obtained compound was confirmed by $^1H$ NMR and LC-MS.

Synthesis Example 3: Synthesis of Compound 16

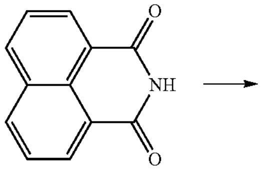

16-1

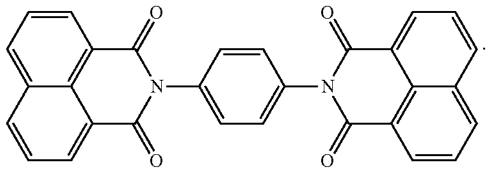

16

2.99 g (63%) of Compound 16 was synthesized in substantially the same manner as in the Synthesis of Intermediate 7-1, except that Compound 16-1 and 1,4-dibromobenzene were used. The obtained compound was confirmed by $^1H$ NMR and LC-MS.

Synthesis Example 4: Synthesis of Compound 28

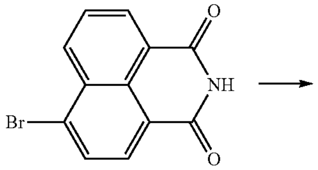

A

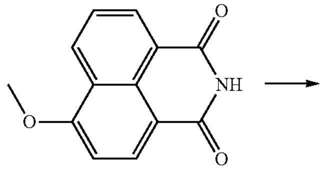

28-1

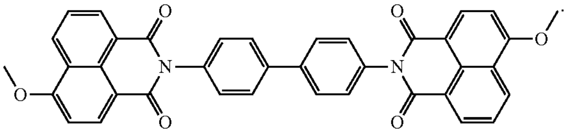

28

Synthesis of Intermediate 28-1

2 g of Compound A was diluted in DMSO and 2 g of NaOMe was added dropwise thereto. The reaction vessel was stirred at a temperature of 60° C. and slowly cooled to room temperature after 6 hours. The reaction was terminated by addition of water, and the residue obtained therefrom was filtered under reduced pressure to obtain 1.3 g (79%) of Intermediate 28-1. The obtained compound was confirmed by LC-MS. $C_{13}H_9NO_3$: M+227.1.

Synthesis of Compound 28

2 g (58%) of Compound 28 was synthesized in substantially the same manner as in the Synthesis of Intermediate 7-1, except that 1.3 g of Intermediate 28-1 and 0.89 g of 4,4'-dibromo-1,1'-biphenyl were used. The obtained compound was confirmed by $^1H$ NMR and LC-MS.

Synthesis Example 5: Synthesis of Compound 51

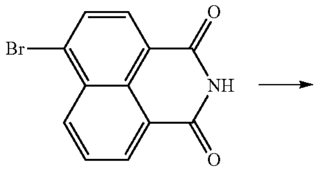

A

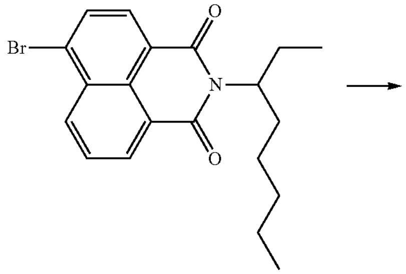

51-1

-continued

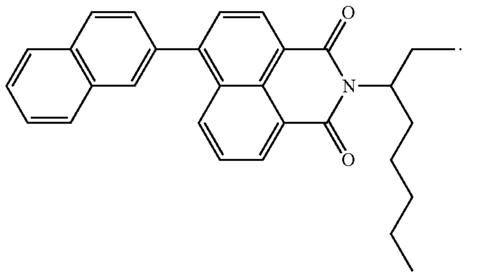

51

Synthesis of Intermediate 51-1

1.8 g (86%) of Intermediate 51-1 was synthesized in substantially the same manner as in the Synthesis of Intermediate 1-1, except that 1.5 g of Compound A and 1.3 g of 3-bromooctane were used. The obtained compound was confirmed by LC-MS. $C_{20}H_{22}BrNO_2$: M+387.1.

Synthesis of Compound 51

1.6 g (80%) of Compound 51 was synthesized in substantially the same manner as in the Synthesis of Compound 1, except that 1.8 g of Intermediate 51-1 and 1 g of naphthalen-2-yl boronic acid were used. The obtained compound was confirmed by $^1$H NMR and LC-MS.

Synthesis Example 6: (Synthesis of Compound 60)

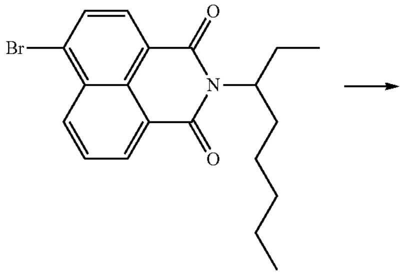

51-1

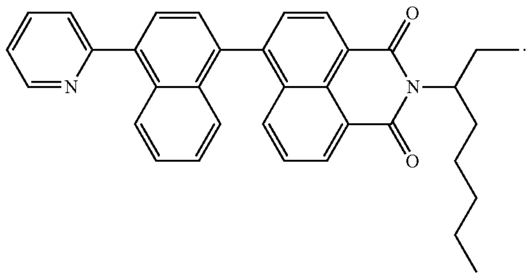

60

1.1 g (42%) of Compound 60 was synthesized in substantially the same manner as in the Synthesis of Compound 1, except that 2 g of Intermediate 51-1 and 1.7 g of (4-(pyridin-2-yl)naphthalen-1-yl)boronic acid were used. The obtained compound was confirmed by $^1$H NMR and LC-MS.

Synthesis Example 7: Synthesis of Compound 109

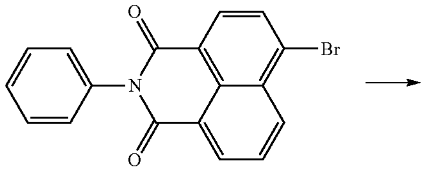

7-1

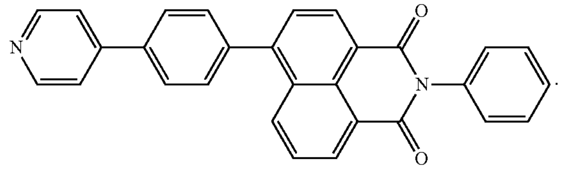

109

1.4 g (49%) of Compound 60 was synthesized in substantially the same manner as in the Synthesis of Compound 1, except that 2.3 g of Intermediate 51-1 and 1.7 g of (4-(pyridin-4-yl)phenyl)boronic acid were used. The obtained compound was confirmed by $^1$H NMR and LC-MS.

Synthesis Example 8: Synthesis of Compound 121

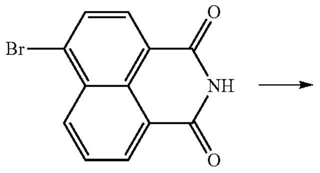

A

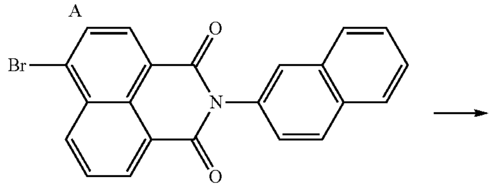

121-1

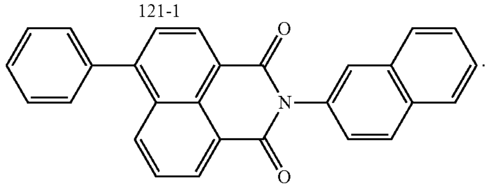

121

Synthesis of Intermediate 121-1

1.6 g (73%) of Intermediate 121-1 was synthesized in substantially the same manner as in the Synthesis of Intermediate 7-1, except that 1.5 g of Compound A and 1.5 g of 2-iodonaphthalene were used. The obtained compound was confirmed by LC-MS. $C_{22}H_{12}BrNO_2$: M+401.0.

Synthesis of Compound 121

1.2 g (78%) of Compound 121 was synthesized in substantially the same manner as in the Synthesis of Compound 1, except that 1.6 g of Intermediate 121-1 and 1.3 g of phenylboronic acid. The obtained compound was confirmed by $^1$H NMR and LC-MS.

Synthesis Example 9: Synthesis of Compound 138

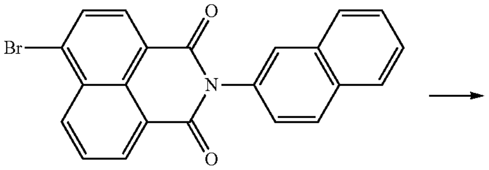

121-1

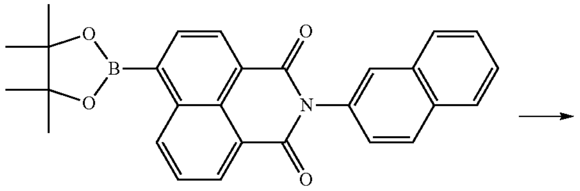

138-1

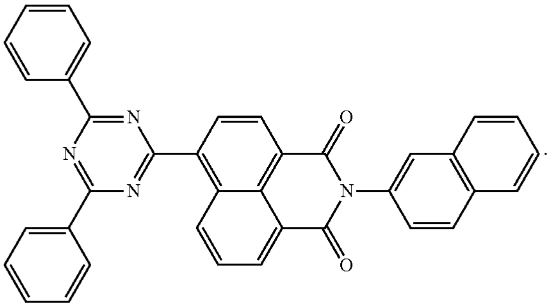

138

Synthesis of Intermediate 138-1

1.9 g (87%) of Intermediate 138-1 was synthesized in substantially the same manner as in the Synthesis of Intermediate 7-2, except that 2 g of Intermediate 121-1 was used. The obtained compound was confirmed by LC-MS. $C_{28}H_{24}BNO_4$: M+449.2.

Synthesis of Compound 138

1.5 g (62%) of Compound 138 was synthesized in substantially the same manner as in the Synthesis of Compound 1, except that 1.9 g of Intermediate 138-1 and 1.3 g of 2-chloro-4,6-diphenyl-1,3,5-triazine were used. The compound was confirmed by $^1$H NMR and LC-MS.

Synthesis Example 10: Synthesis of Compound 152

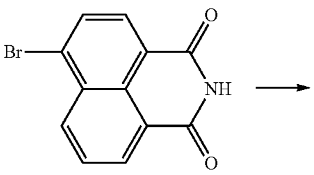

A

-continued

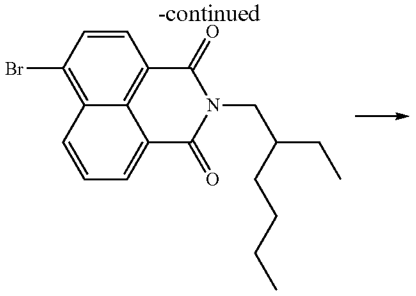

152-1

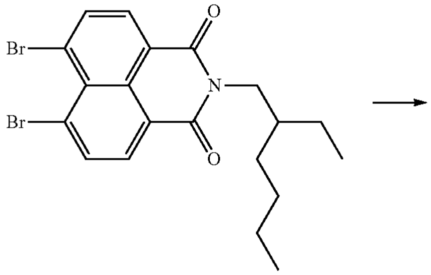

152-2

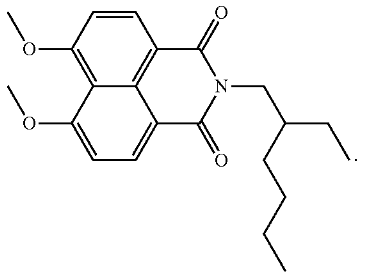

152

Synthesis of Intermediate 152-1

1.8 g (86%) of Intermediate 152-1 was synthesized in substantially the same manner as in the Synthesis of Intermediate 1-1, except that 1.5 g of Compound A and 1.3 g of 3-(bromomethyl)heptane were used. The obtained compound was confirmed by LC-MS. $C_{20}H_{22}BrNO_2$: M+387.1.

Synthesis of Intermediate 152-2

1.8 g of Intermediate 152-1 was diluted in methylene chloride (MC) and 900 mg of N-bromosuccinimide (NBS) was added dropwise thereto. The mixture was stirred for 15 hours, and the reaction was terminated by addition of water. The reaction was extracted three times using ethyl acetate, dried over anhydrous magnesium sulfate, and filtered under reduced pressure. Then, the residue obtained therefrom was separated and purified by column chromatography to obtain 2 g (93%) of Intermediate 152-2. The obtained compound was confirmed by LC-MS. $C_{20}H_{21}Br_2NO_2$: M+465.2.

Synthesis of Compound 152

1.4 g (88%) of Compound 152 was synthesized in substantially the same manner as in the Synthesis of Intermediate 28-1, except that 2 g of Intermediate 152-2 was used. The obtained compound was confirmed by $^1$H NMR and LC-MS.

TABLE 1

| | | LC-MS | |
|---|---|---|---|
| Compound | $^1$H NMR ($CDCl_3$, 400 MHz) | found | Calc |
| 1 | 8.59(d, 2H), 8.22(d, 2H), 8.12(d, 2H), 7.85(m, 2H), 7.75(m, 4H), 7.70(m, 2H), 3.48(s, 6H) | 469.2 | 496.1 |
| 7 | 8.43-8.40(m, 2H), 8.22(m, 2H), 8.11(dd, 2H), 8.05(br, 2H), 7.71-7.40(m, 16H), 7.00(m, 2H) | 670.7 | 670.7 |

TABLE 1-continued

| Compound | $^1$H NMR ($CDCl_3$, 400 MHz) | LC-MS found | LC-MS Calc |
|---|---|---|---|
| 16 | 8.41(dd, 4H) 8.24(dd, 4H), 8.74-7.69(m, 8H) | 468.6 | 468.5 |
| 28 | 8.55-8.42(m, 6H) 7.63-7.55(m, 6H), 7.23-7.18(m, 4H), 6.83(d, 2H), 4.02(s, 6H) | 604.6 | 604.6 |
| 51 | 8.51(d, 1H), 8.18-8.08(m, 2H), 7.99-7.88(m, 3H), 7.69-7.52(m, 4H), 7.32(d, 1H), 5.01(m, 1H), 2.20(2H), 1.97-1.89(m, 2H), 1.71-1.52(m, 2H), 1.36-1.24(m, 2H), 1.04(m, 2H), 0.93-0.83(m, 6H) | 435.2 | 435.2 |
| 60 | 8.72(d, 1H), 8.47(d, 1H), 8.18-8.08(m, 2H), 7.82-7.67(m, 5H), 7.46-7.44(m, 1H), 7.38(m, 1H), 7.25-7.23(m, 2H), 7.06-7.02 (d, 1H), 5.01(m, 1H), 2.20(2H), 1.97-1.89(m, 2H), 1.71-1.52 (m, 2H), 1.36-1.24(m, 2H), 1.04(m, 2H), 0.93-0.83(m, 6H) | 512.7 | 512.7 |
| 109 | 8.73-8.70(m, 2H), 8.48(dd, 1H), 8.16 (td, 2H), 7.81-7.63(m, 6H), 7.52-7.40(m, 7H) | 426.5 | 426.5 |
| 121 | 8.53(d, 1H), 8.33(m, 1H), 8.24(d, 1H), 8.22-8.12(m, 4H), 7.88-7.65(m, 5H), 7.53-7.28(m, 6H) | 399.4 | 399.4 |
| 138 | 8.86-8.80(m, 4H), 8.72(d, 1H), 8.52(d, 1H), 8.46(dd, 1H), 8.45-8.40(m, 1H), 8.33(m, 1H), 7.92(m, 1H), 7.86(m, 1H), 7.80(m, 1H), 7.63-7.58(m, 5H), 7.51-7.46(m, 2H), 7.42-7.36(m, 4H), 7.33-7.30(m, 1H) | 554.2 | 554.2 |
| 152 | 8.69(d, 2H), 6.95(d, 2H), 4.03(s, 6H), 3.68(m, 2H), 2.11(m, 1H), 1.45-1.20(m, 8H), 0.87(t, 6H) | 465.0 | 465.0 |

Example 1

A Corning 15 Ω/cm$^2$ (1,200 Å) ITO glass substrate was cut to a size of 50 mm×50 mm×0.7 mm, sonicated with isopropyl alcohol and pure water each for 5 minutes, and then cleaned by exposure to ultraviolet rays and ozone for 30 minutes to prepare an anode. Then, the resultant ITO glass substrate was provided to a vacuum deposition apparatus.

2-TNATA was vacuum-deposited on the ITO glass substrate to form a hole transport layer having a thickness of 1,000 Å.

9,10-di-naphthalene-2-yl-anthracene (ADN), which is a blue fluorescent host, and N,N,N',N'-tetraphenyl-pyrene-1,6-diamine, which is a blue fluorescent dopant, were co-deposited on the hole transport layer at a weight ratio of 98:2 to form an emission layer having a thickness of 300 Å.

Then, $Alq_3$ was deposited on the emission layer to form an electron transport layer having a thickness of 300 Å, LiF (which is an alkali metal halide), was deposited on the electron transport layer to form an electron injection layer having a thickness of 10 Å, and Al was vacuum-deposited on the electron injection layer to form a transmissive electrode having a thickness of 100 Å, thereby forming a LiF/Al electrode (e.g., as a cathode).

Compound 1 was deposited on the LiF/Al electrode to form a second layer having a thickness of 800 Å, thereby completing the manufacture of an organic light-emitting device.

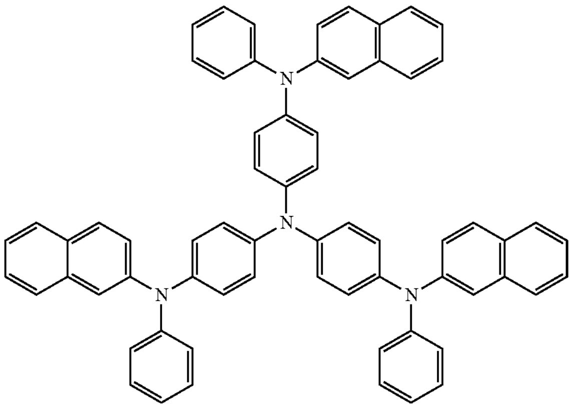

2-TNATA

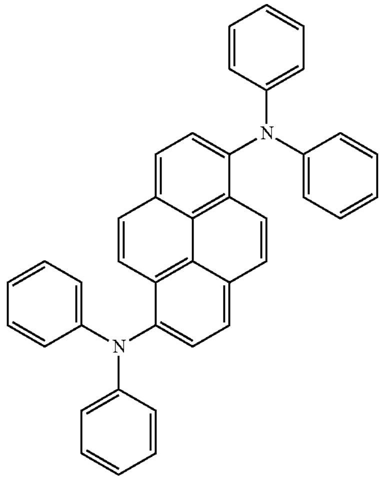

N,N,N′,N′-tetraphenyl-pyrene-1,6-diamine

-continued

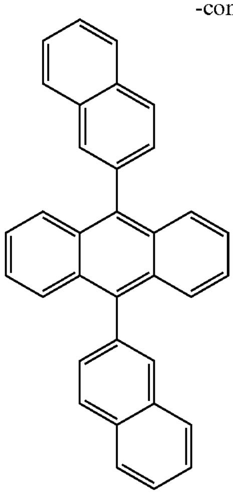

ADN

A01

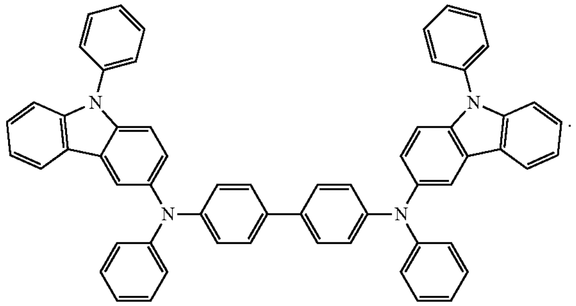

Examples 2 to 10 and Comparative Example 1

Organic light-emitting devices according to Examples 2 to 10 and Comparative Example 1 were manufactured in substantially the same manner as in Example 1, except that Compounds shown in Table 2 were each used in forming a second layer.

Evaluation Example 1

The luminance (at 10 mA/cm$^2$), efficiency, and half-lifespan of the organic light-emitting devices manufactured according to Examples 1 to 10 and Comparative Example 1 were measured by using a source measure unit (Keithley SMU 236, Cleveland, OH) and a luminance meter (Photo Research PR650, Syracuse, NY) and results thereof are shown in Table 2. Also, the transmittance was measured at a concentration of $10^{-5}$ M in a toluene solvent using a UV-Vis photospectrometer (Shimadzu UV-1800, Kyoto, Japan), and results thereof are shown in Table 2.

TABLE 2

| | Second layer | Driving voltage (V) | Current density (mA/cm$^2$) | Luminance (cd/m$^2$) | Efficiency (cd/A) | Half lifespan (hr @100 mA/cm$^2$) | Transmittance (@ 430 nm) | Transmittance (@ 405 nm) |
|---|---|---|---|---|---|---|---|---|
| Comparative Example 1 | A01 | 5.90 | 50 | 2160 | 4.32 | 250 | 100% | 100% |
| Example 1 | Compound 1 | 5.91 | 50 | 2360 | 4.72 | 260 | 100% | 2.3% |
| Example 2 | Compound 7 | 5.90 | 50 | 2345 | 4.69 | 270 | 100% | 2.9% |
| Example 3 | Compound 16 | 5.91 | 50 | 2365 | 4.73 | 265 | 100% | 2.4% |
| Example 4 | Compound 28 | 5.89 | 50 | 2350 | 4.70 | 262 | 100% | 1.5% |
| Example 5 | Compound 51 | 5.90 | 50 | 2350 | 4.70 | 262 | 100% | 3.7% |
| Example 6 | Compound 60 | 5.91 | 50 | 2325 | 4.65 | 263 | 100% | 2.8% |
| Example 7 | Compound 109 | 5.89 | 50 | 2340 | 4.68 | 258 | 100% | 1.7% |
| Example 8 | Compound 121 | 5.90 | 50 | 2160 | 4.62 | 262 | 100% | 2.8% |
| Example 9 | Compound 139 | 5.92 | 50 | 2365 | 4.73 | 273 | 100% | 1.2% |
| Example 10 | Compound 152 | 5.90 | 50 | 2405 | 4.81 | 277 | 100% | 2.1% |

Referring to Table 2, it is confirmed that the organic light-emitting devices of Examples 1 to 10 have high luminance, high efficiency, and a long lifespan, as compared with the organic light-emitting device of Comparative Example 1. Also, it is confirmed that the organic light-emitting devices of Examples 1 to 10 exhibit low transmittance of light having a wavelength of 405 nm, as compared with the organic light-emitting device of Comparative Example 1. Accordingly, the organic light-emitting devices of Examples 1 to 10 are capable of reducing UV transmission and material degradation caused by external ultraviolet rays, as compared with the organic light-emitting device of Comparative Example 1.

According to one or more embodiments of the present disclosure, the organic light-emitting device is capable of reducing a material degradation caused by ultraviolet rays while having a high light extraction rate.

It should be understood that embodiments described herein should be considered in a descriptive sense only and not for purposes of limitation. Descriptions of features or aspects within each embodiment should typically be considered as available for other similar features or aspects in other embodiments.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that one or more changes in form and details may be made therein without departing from the spirit and scope as defined by the following claims and equivalents thereof.

What is claimed is:

1. An organic light-emitting device comprising:

a first electrode;

a second electrode facing the first electrode;

an organic layer between the first electrode and the second electrode and comprising an emission layer;

at least one of a first layer or a second layer, wherein the first layer is positioned on a side of the first electrode opposite the organic layer and the second layer is positioned on a side of the second electrode opposite the organic layer, and a substrate directly on the at least one of the first layer or the second layer, wherein the first layer and the second layer are each about 500 Å to about 800 Å in thickness, wherein the first layer and the second layer each consist of a condensed cyclic compound represented by Formula 1 and optionally an amine-based compound:

Formula 1

$$[R_1\text{-}(L_1)_{a1}]_{b1}\text{-}(Ar_1)_{c1}\text{-}[(L_2)_{a2}\text{-}R_2]_{b2},$$

Formula 2-1

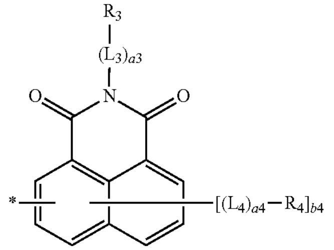

Formula 2-2

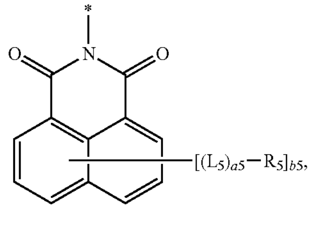

-continued

Formula 2-3

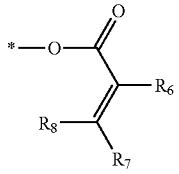

Formula 2-4

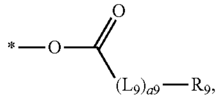

and wherein, in Formulae 1 and 2-1 to 2-4, $Ar_1$ is selected from a benzene group, a naphthalene group, an anthracene group, a phenanthrene group, a pyrene group, a chrysene group, a triphenylene group, an indene group, a benzofluorene group, a pyridine group, a pyrimidine group, a pyridazine group, a pyrazine group, a pyrrole group, an imidazole group, a quinoline group, an isoquinoline group, a quinoxaline group, a quinazoline group, a triazine group, an indeno pyrazine group, an indeno pyridine group, a phenanthroline group, and a phenanthridine group, c1 is 0 or 1, $L_1$ to $L_5$ and $L_9$ are each independently selected from *—N($R_{11}$)—*', *—B($R_{11}$)—*', *—P($R_{11}$)—*', *—Si($R_{11}$)($R_{12}$)—*', *—S—*', *—Se—*', *—O—*', *—C(═O)—*', *—S(═O)—*', *—S(═O)$_2$—*', *—C($R_{11}$)═*', *—C(═S)—*', a substituted or unsubstituted $C_1$-$C_{60}$ alkylene group, a substituted or unsubstituted $C_2$-$C_{60}$ alkenylene group, a substituted or unsubstituted $C_2$-$C_{60}$ alkynylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, wherein $L_1$ and $L_2$ are each not *—S—*', a2 to a5 and a9 are each independently an integer from 0 to 10, a1 is an integer from 0 to 2, $R_1$ is a group represented by Formula 2-1 or a group represented by Formula 2-2, $R_2$ to $R_5$ are each independently selected from a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(═O)($Q_1$), —S(═O)$_2$ ($Q_1$), and —P(═O)($Q_1$)($Q_2$), $R_6$ to $R_9$, $R_{11}$, and $R_{12}$ are each independently selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_4$)($Q_5$)($Q_6$), —N($Q_4$)($Q_5$), —B($Q_4$)($Q_5$), —C(═O)($Q_4$), —S(═O)$_2$ ($Q_4$), and —P(═O)($Q_4$)($Q_5$), b1 is an integer from 1 to 10, wherein, when b1 is two or more, two or more *-$(L_1)_{a1}$-$R_1$(s) are identical to or different from each other, b2 is an integer from 1 to 10, wherein, when b2 is two or more, two or more *-$(L_2)_{a2}$-$R_2$(s) are identical to or different from each other, b4 is an integer from 0 to 5, wherein, when b4 is two or more, two or more *-$(L_4)_{a4}$-$R_4$(s) are identical to or different from each other, b5 is an integer from 0 to 6, wherein, when b5 is two or more, two or more *-$(L_5)_{a5}$-$R_5$(s) are identical to or different from each other, when all of $[R_5\text{-}(L_5)_{a5}]_{b5}$ in Formula 1 is hydrogen, $Ar_1$ is not a benzene group, at least one substituent of the substituted $C_1$-$C_{60}$ alkylene group, the substituted $C_2$-$C_{60}$ alkenylene group, the substituted $C_2$-$C_{60}$ alkynylene group, the substituted $C_1$-$C_{60}$ alkyl group, the substituted $C_2$-$C_{60}$ alkenyl group, and the substituted $C_2$-$C_{60}$ alkynyl group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkoxy group, and a $C_3$-$C_{60}$ cycloalkoxy group;

a $C_1$-$C_{60}$ alkoxy group, and a $C_3$-$C_{60}$ cycloalkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$), at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkoxy group, the substituted $C_3$-$C_{60}$ cycloalkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is selected from the group consisting of:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_3$-$C_{60}$ cycloalkoxy group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, and a $C_3$-$C_{60}$ cycloalkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, and —$P(=O)(Q_{21})(Q_{22})$; and —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, and —$P(=O)(Q_{31})(Q_{32})$, $Q_1$ to $Q_6$, $Q_{11}$ to $Q_{13}$, $Q_{21}$ to $Q_{23}$, and $Q_{31}$ to $Q_{33}$ are each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group substituted with a $C_6$-$C_{60}$ aryl group, a terphenyl group, a $C_1$-$C_{60}$ heteroaryl group, a $C_1$-$C_{60}$ heteroaryl group substituted with a $C_1$-$C_{60}$ alkyl group, a $C_1$-$C_{60}$ heteroaryl group substituted with a $C_6$-$C_{60}$ aryl group, and a monovalent non-aromatic condensed polycyclic group, a monovalent non-aromatic condensed heteropolycyclic group, and

* and *' each indicate a binding site to a neighboring atom.

2. The organic light-emitting device of claim 1, wherein $Ar_1$ is selected from a benzene group, a naphthalene group, an anthracene group, a phenanthrene group, a pyrene group, a chrysene group, a triphenylene group, an indene group, a benzofluorene group, a pyridine group, a pyrimidine group, a pyridazine group, a pyrrole group, an imidazole group, a quinoline group, an isoquinoline group, a quinoxaline group, a quinazoline group, a triazine group, an indeno pyrazine group, an indeno pyridine group, a phenanthroline group, and a phenanthridine group.

3. The organic light-emitting device of claim 1, wherein:

$L_1$ to $L_5$ and $L_9$ are each independently selected from the group consisting of:

*—S—*', *—O—*', *—C(=O)—*', *—S(=O)—*', *—$S(=O)_2$—*', a $C_1$-$C_{20}$ alkylene group, a $C_2$-$C_{20}$ alkenylene group, a $C_2$-$C_{20}$ alkynylene group, a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group; and a $C_1$-$C_{20}$ alkylene group, a $C_2$-$C_{20}$ alkenylene group, a $C_2$-$C_{20}$ alkynylene group, a phenylene group, a pentalenylene group, an indenylene group, a naphthylene group, an azulenylene group, an indacenylene group, an acenaphthylene group, a fluorenylene group, a spiro-bifluorenylene group, a spiro-benzofluorene-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a perylenylene group, a pentaphenylene group, a pyrrolylene group, a thiophenylene group, a furanylene group, a silolylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an indolylene group, an isoindolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, a benzofuranylene group, a benzothiophenylene group, a benzosilolylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a dibenzosilolylene group, a carbazolylene group, a benzocarbazolylene group, a dibenzocarbazolylene group, a thiadiazolylene group, an imidazopyridinylene group, an imidazopyrimidinylene group, an oxazolopyridinylene group, a thiazolopyridinylene group, a benzonaphthyridinylene group, an azafluorenylene group, an azaspiro-bifluorenylene group, an azacarbazolylene group, an azadibenzofuranylene group, an azadibenzothiophenylene group, and an azadibenzosilolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, a terphenyl group, and —Si($Q_{31}$)($Q_{32}$)($Q_{33}$), $Q_{31}$ to $Q_{33}$ are each independently selected from the group consisting of:

a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group; and a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, each substituted with at least one selected from a $C_1$-$C_{10}$ alkyl group, a $C_1$-$C_{10}$ alkoxy group, a $C_3$-$C_{10}$ cycloalkoxy group, a phenyl group, a biphenyl group, a terphenyl group, a naphthyl group, a pyridinyl group, a pyrimidinyl group, a pyrazinyl group, a quinolinyl group, an isoquinolinyl group, a quinoxalinyl group, and a quinazolinyl group, and

* and *' each indicate a binding site to a neighboring atom.

4. The organic light-emitting device of claim 1, wherein:

$L_1$ to $L_5$ and $L_9$ are each independently selected from *—S—*', *—O—*', *—C(=O)—*', *—S(=O)—*', *—S(=O)$_2$—*', *—[C($Z_1$)($Z_2$)]$_{n1}$-*', and groups represented by Formulae 3-1 to 3-75:

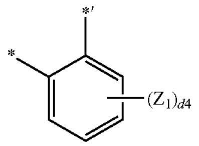

Formula 3-1

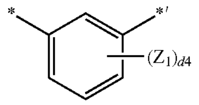

Formula 3-2

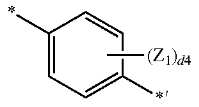

Formula 3-3

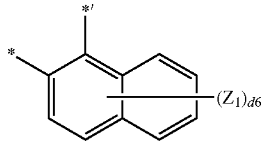

Formula 3-4

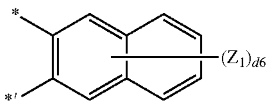

Formula 3-5

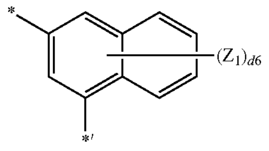

Formula 3-6

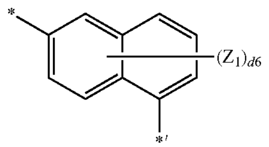

Formula 3-7

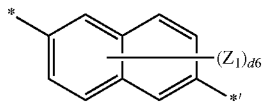

Formula 3-8

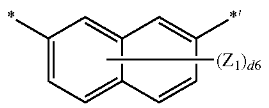

Formula 3-9

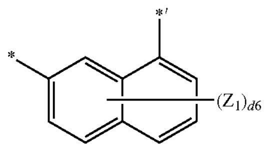

Formula 3-10

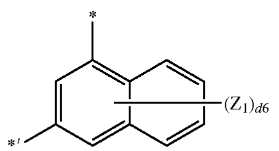

Formula 3-11

-continued
Formula 3-12
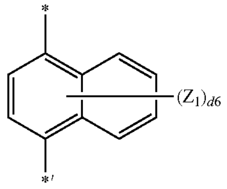
Formula 3-13
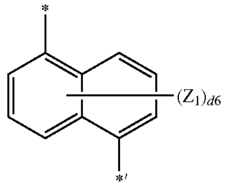
Formula 3-14
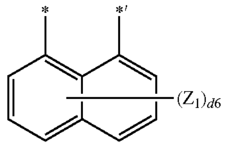
Formula 3-15
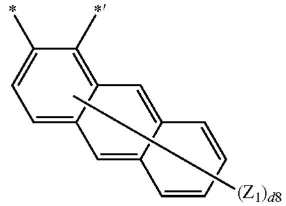
Formula 3-16
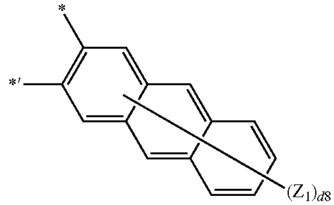
Formula 3-17
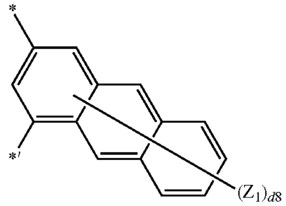
Formula 3-18
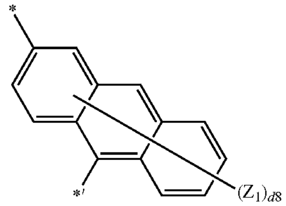
-continued
Formula 3-19
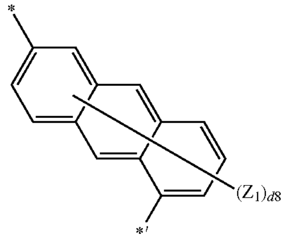
Formula 3-20
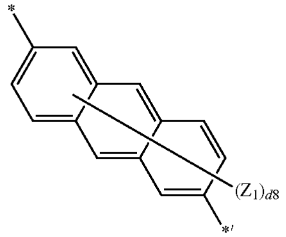
Formula 3-21
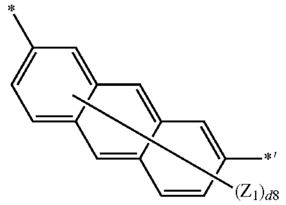
Formula 3-22
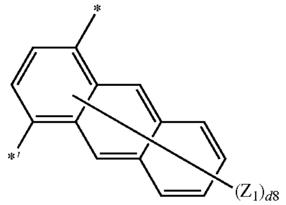
Formula 3-23
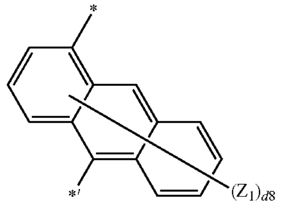
Formula 3-24
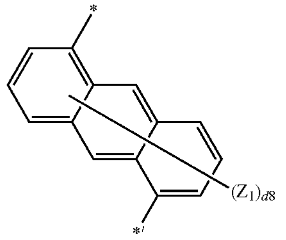
Formula 3-25
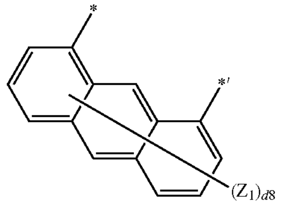

-continued
Formula 3-26
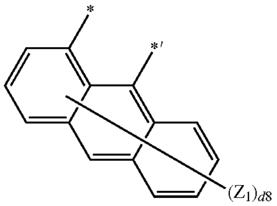
Formula 3-27
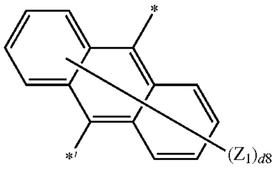
Formula 3-28
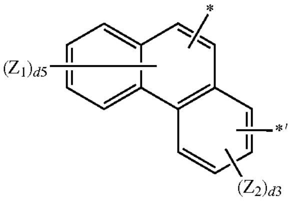
Formula 3-29
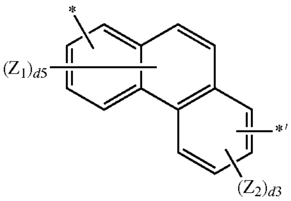
Formula 3-30
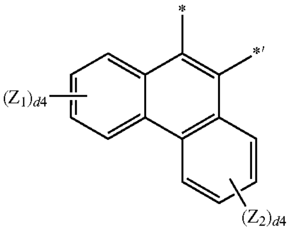
Formula 3-31
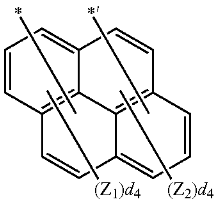
Formula 3-32
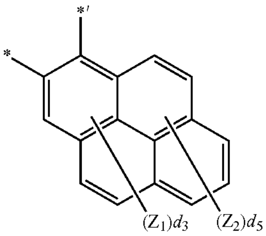
-continued
Formula 3-33
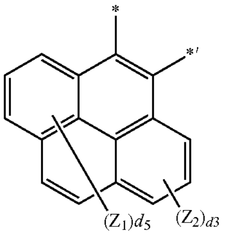
Formula 3-34
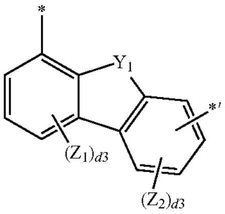
Formula 3-35
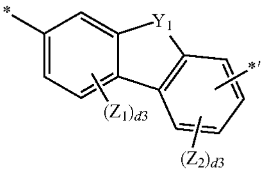
Formula 3-36
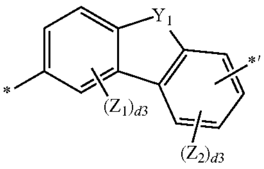
Formula 3-37
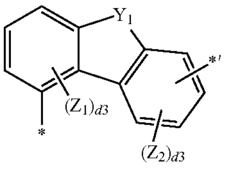
Formula 3-38
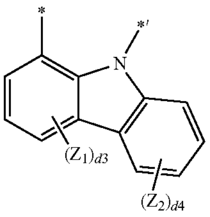
Formula 3-39
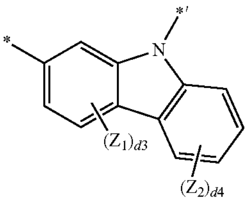

-continued
Formula 3-40
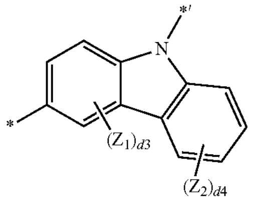
Formula 3-41
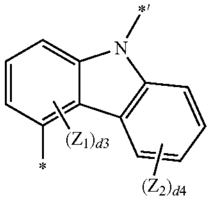
Formula 3-42
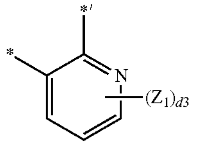
Formula 3-43
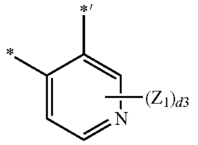
Formula 3-44
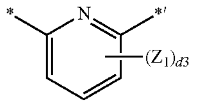
Formula 3-45
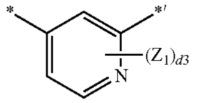
Formula 3-46
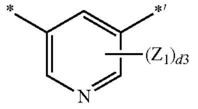
Formula 3-47
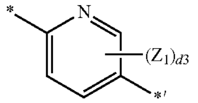
Formula 3-48
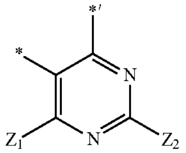
Formula 3-49
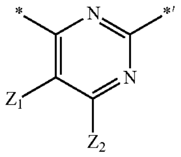
-continued
Formula 3-50
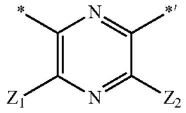
Formula 3-51
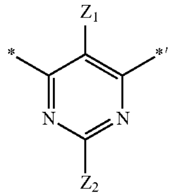
Formula -52
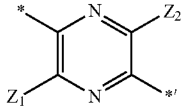
Formula 3-53
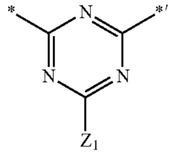
Formula 3-54
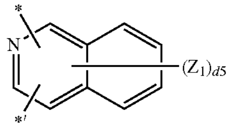
Formula 3-55
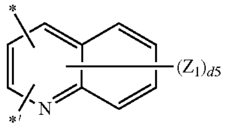
Formula 3-56
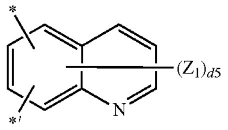
Formula 3-57
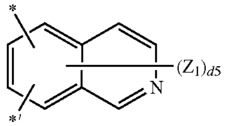
Formula 3-58
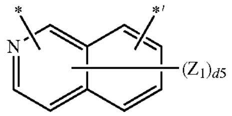
Formula 3-59
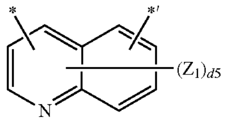
Formula 3-60
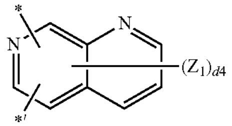

-continued

Formula 3-61

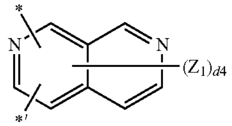

Formula 3-62

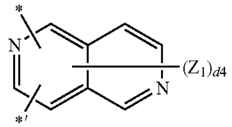

Formula 3-63

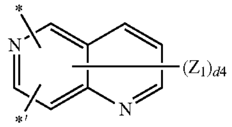

Formula 3-64

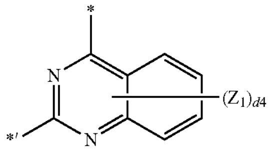

Formula 3-65

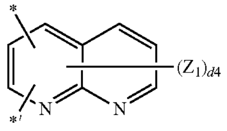

Formula 3-66

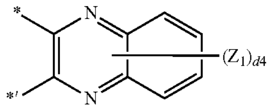

Formula 3-67

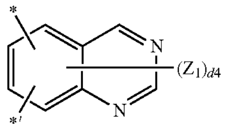

Formula 3-68

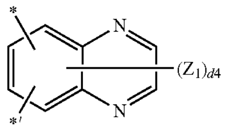

Formula 3-69

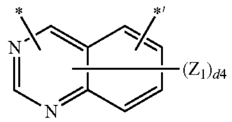

Formula 3-70

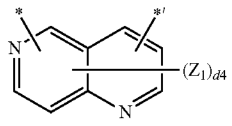

Formula 3-71

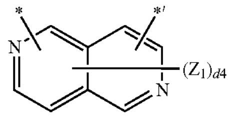

-continued

Formula 3-72

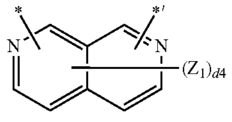

Formula 3-73

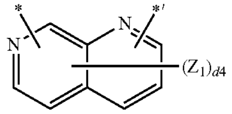

Formula 3-74

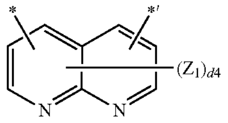

Formula 3-75

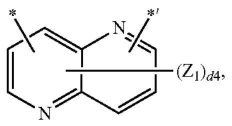

wherein, in Formulae 3-1 to 3-75, $Y_1$ is O, S, $C(Z_3)(Z_4)$, $N(Z_3)$, or $Si(Z_3)(Z_4)$, $Z_1$ to $Z_4$ are each independently selected from hydrogen, deuterium, —F, —$CF_3$, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzo-fluorenyl group, a phenanthrenyl group, an anthracenyl group, a triphenylenyl group, a pyrenyl group, a chrysenyl group, a pyridinyl group, a pyrazinyl group, a pyrimidinyl group, a pyridazinyl group, a triazinyl group, and —$Si(Q_{31})(Q_{32})(Q_{33})$, $Q_{31}$ to $Q_{33}$ are each independently selected from a $C_1$-$C_{10}$ alkyl group, a $C_1$-$C_{10}$ alkoxy group, a $C_3$-$C_{20}$ cycloalkoxy group, a phenyl group, a biphenyl group, a terphenyl group, and a naphthyl group, d3 is an integer from 1 to 3, d4 is an integer from 1 to 4, d5 is an integer from 1 to 5, d6 is an integer from 1 to 6, d8 is an integer from 1 to 8, n1 is an integer from 1 to 20, and

* and *' each indicate a binding site to a neighboring atom.

5. The organic light-emitting device of claim 1, wherein:

$Ar_1$ is selected from groups represented by Formulae 4-1 to 4-27, 4-47 to 4-56, 4-58 and 4-59, and $L_1$ to $L_5$ and $L_9$ are each independently selected from *—O—*', *—C(=O)—*', *—$CH_2$—*', *—$(CH_2)_2$—*', *—$(CH_2)_3$—*', *—$(CH_2)_4$—*', *—$(CH_2)_5$—*', and groups represented by Formulae 4-1 to 4-58 and 4-60:

Formula 4-1

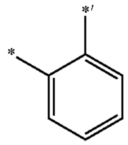

-continued
Formula 4-2
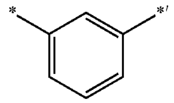
Formula 4-3
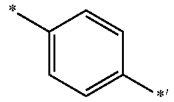
Formula 4-4
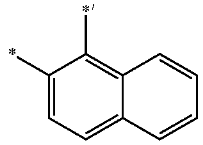
Formula 4-5
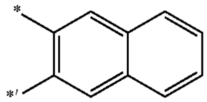
Formula 4-6
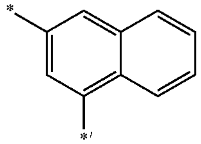
Formula 4-7
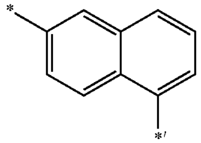
Formula 4-8
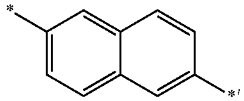
Formula 4-9
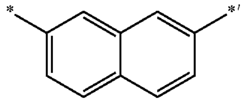
Formula 4-10
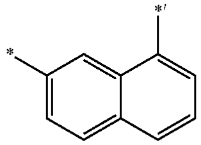
Formula 4-11
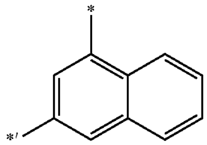
Formula 4-12
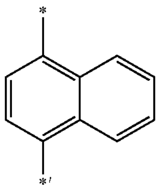
-continued
Formula 4-13
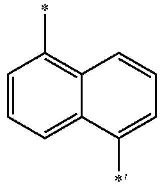
Formula 4-14
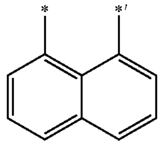
Formula 4-15
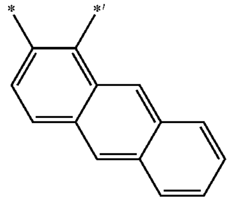
Formula 4-16
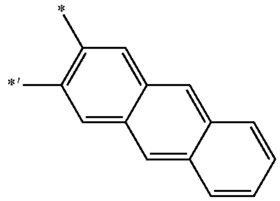
Formula 4-17
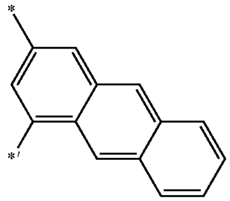
Formula 4-18
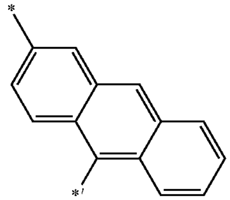
Formula 4-19
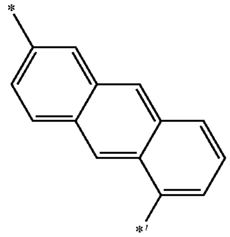

-continued
Formula 4-20
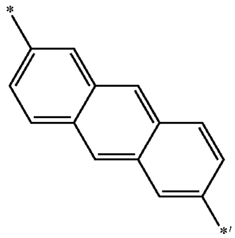
Formula 4-21
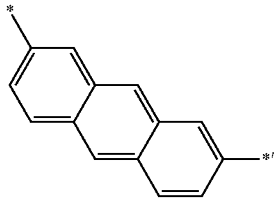
Formula 4-22
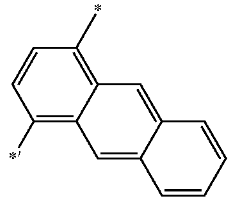
Formula 4-23
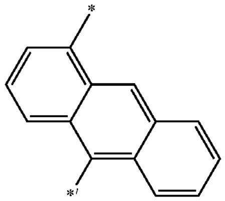
Formula 4-24
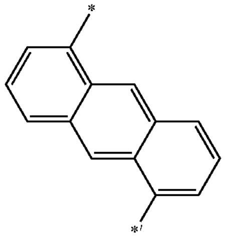
Formula 4-25
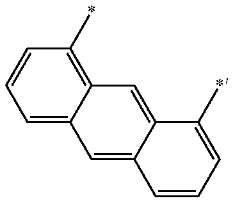
Formula 4-26
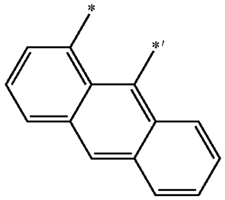
-continued
Formula 4-27
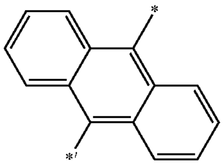
Formula 4-28
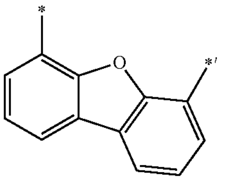
Formula 4-29
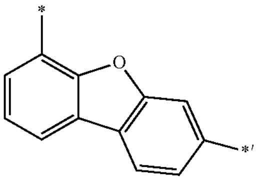
Formula 4-30
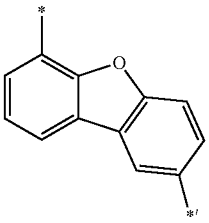
Formula 4-31
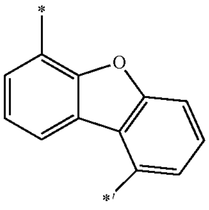
Formula 4-32
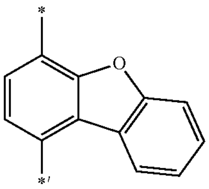
Formula 4-33
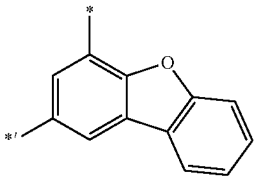
Formula 4-34
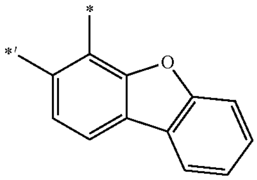

-continued
Formula 4-35
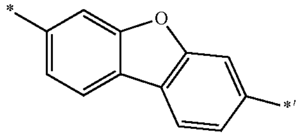
Formula 4-36
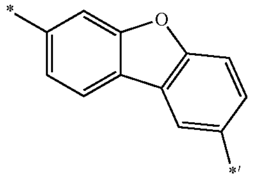
Formula 4-37
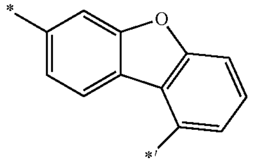
Formula 4-38
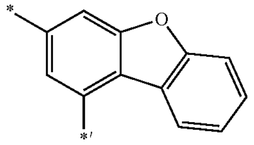
Formula 4-39
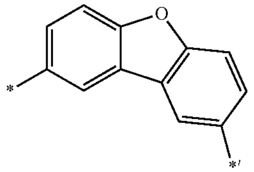
Formula 4-40
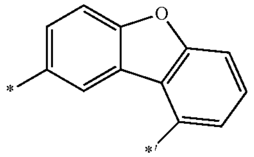
Formula 4-41
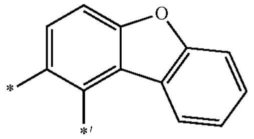
Formula 4-42
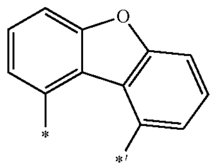
Formula 4-43
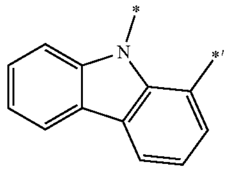
-continued
Formula 4-44
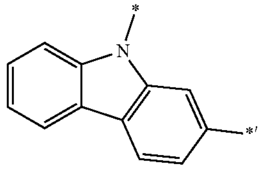
Formula 4-45
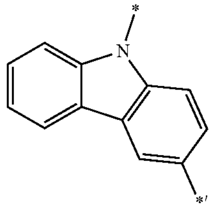
Formula 4-46
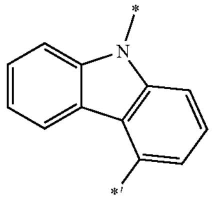
Formula 4-47
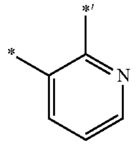
Formula 4-48
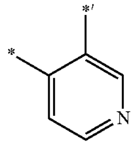
Formula 4-49
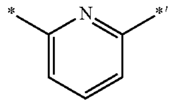
Formula 4-50
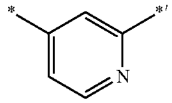
Formula 4-51
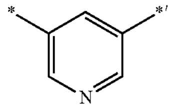
Formula 4-52
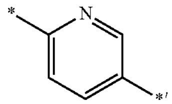
Formula 4-53
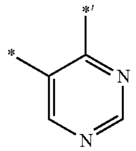

-continued

Formula 4-54

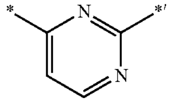

Formula 4-56

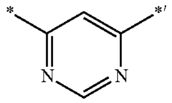

Formula 4-57

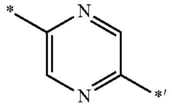

Formula 4-58

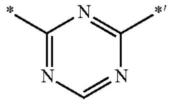

Formula 4-59

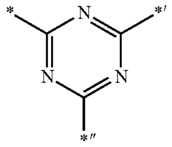

Formula 4-60

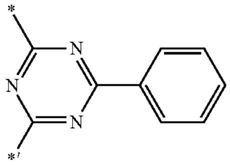

Formula 4-55

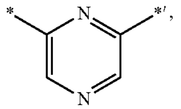

wherein *, *', and *" in Formulae 4-1 to 4-60 each indicate a binding site to a neighboring atom.

6. The organic light-emitting device of claim 1, wherein: the group represented by Formula 2-1 is a group represented by Formula 2-1A:

Formula 2-1A

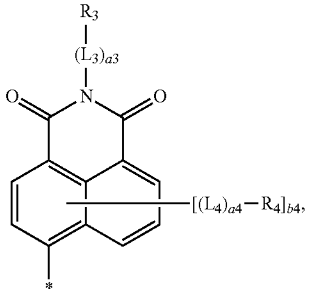

wherein, in Formula 2-1A, $L_3$, $L_4$, a3, a4, $R_3$, $R_4$, and b4 are the same as described in claim 1, and * indicates a binding site to a neighboring atom.

7. The organic light-emitting device of claim 1, wherein: $R_2$ to $R_5$ are each independently selected from the group consisting of:

a group represented by Formula 2-3, a group represented by Formula 2-4, hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_1$)($Q_2$)($Q_3$); and a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_1$ to $Q_3$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

8. The organic light-emitting device of claim 1, wherein: $R_6$ to $R_9$, $R_{11}$, and $R_{12}$ are each independently selected from the group consisting of:

hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_4$)($Q_5$)($Q_6$); and a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, and a triazinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_3$-$C_{10}$ cycloalkyl group, a $C_1$-$C_{20}$ alkoxy group, a $C_3$-$C_{20}$ cycloalkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a carbazolyl group, a benzocarbazolyl group, a dibenzocarbazolyl group, a furanyl group, a benzofuranyl group, a dibenzofuranyl group, a thiophenyl group, a benzothiophenyl group, a dibenzothiophenyl group, a pyridinyl group, a pyrazinyl group, a pyrimidinyl group, a pyridazinyl group, a triazinyl group, and —Si($Q_{31}$)($Q_{32}$)($Q_{33}$), and $Q_4$ to $Q_6$ and $Q_{31}$ to $Q_{33}$ are each independently selected from a $C_1$-$C_{10}$ alkyl group, a $C_1$-$C_{10}$ alkoxy group, a phenyl group, a biphenyl group, a terphenyl group, and a naphthyl group.

9. The organic light-emitting device of claim 1, wherein: the condensed cyclic compound is represented by one of Formulae 1A to 1D, and 1I to 1P:

Formula 1A

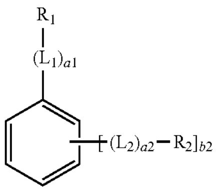

Formula 1B

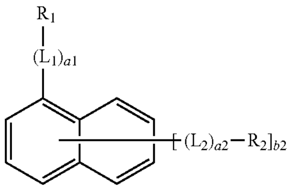

Formula 1c

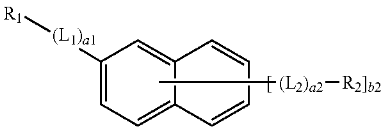

-continued

Formula 1D

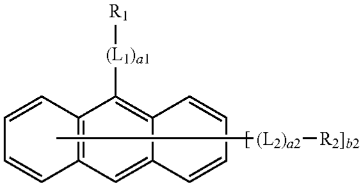

Formula 1I

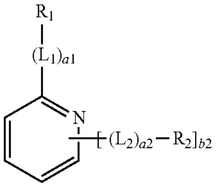

Formula 1J

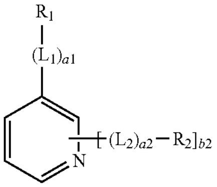

Formula 1K

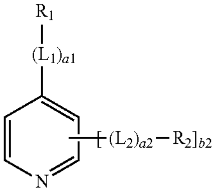

Formula 1L

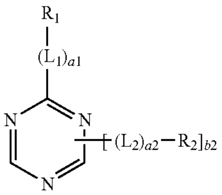

Formula 1M

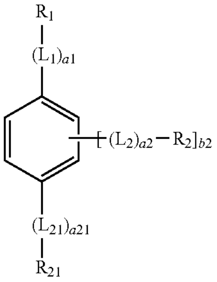

Formula 1N

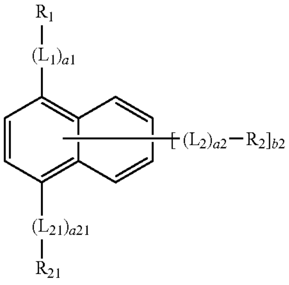

-continued

Formula 1O

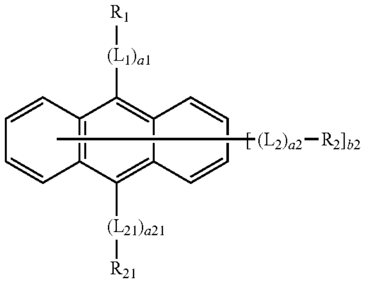

Formula 1P

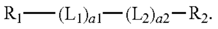

and wherein, in Formulae 1A to 1D, and 1I to 1P, $L_1$, $L_2$, a1, a2, $R_1$, $R_2$, and b2 are the same as described in claim 1, and $L_{21}$, a21, and $R_{21}$ are respectively the same as described in connection with $L_1$, a1, and $R_1$.

10. The organic light-emitting device of claim 9, wherein, in Formulae 1M to 1O, $R_1$ and $R_{21}$ are each a group represented by Formula 2-1; or $R_1$ and $R_{21}$ are each a group represented by Formula 2-2.

11. The organic light-emitting device of claim 1, wherein the condensed cyclic compound is one of Compounds 1 to 15 and 17 to 205:

1

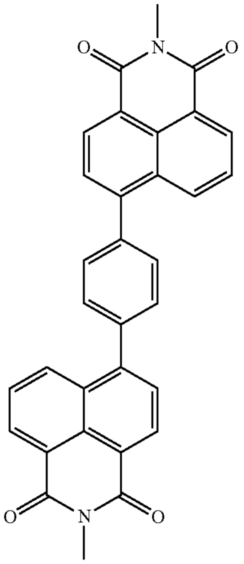

-continued

2

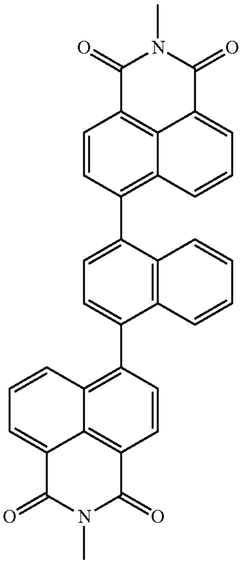

3

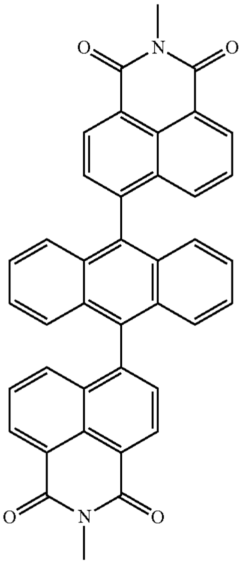

-continued
4
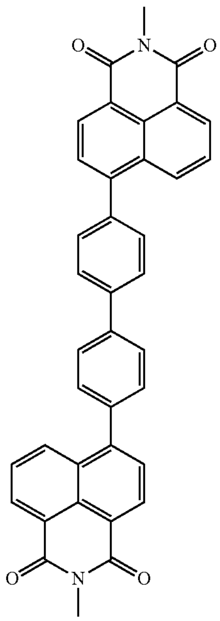
5
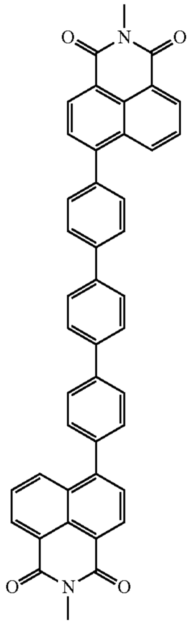
-continued
6
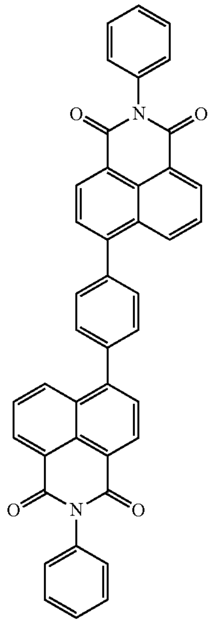
7
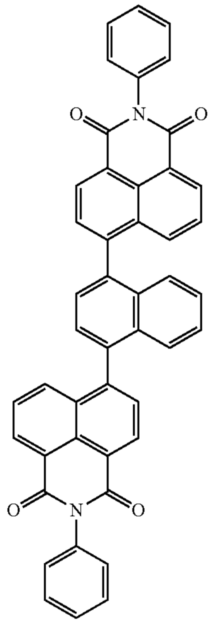

-continued
8
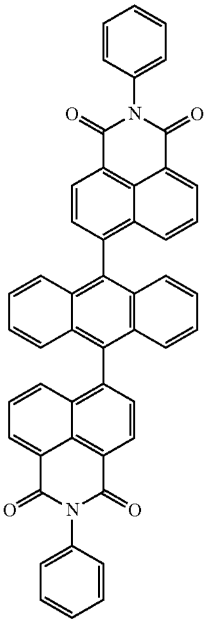
9
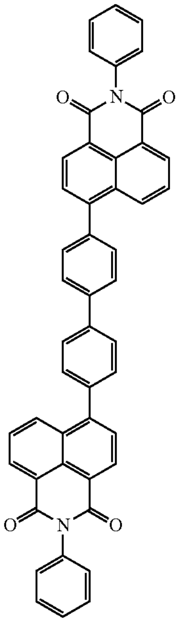
-continued
10
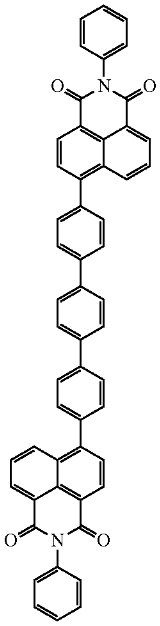
11
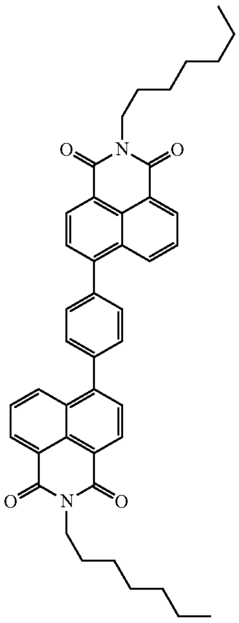

-continued
12
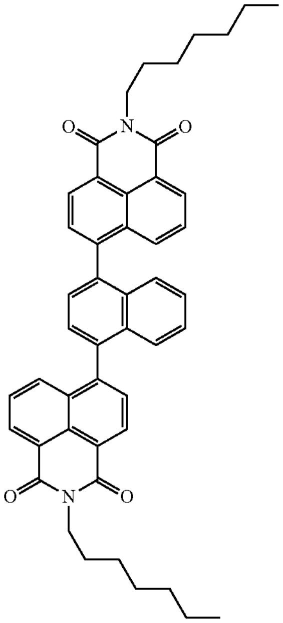
13
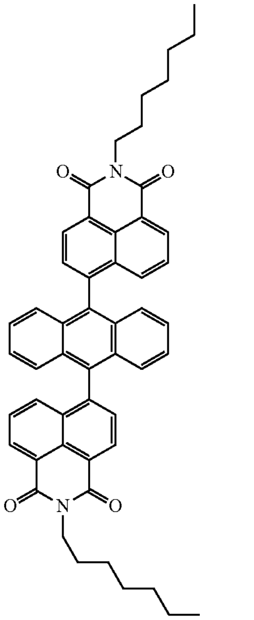
-continued
14
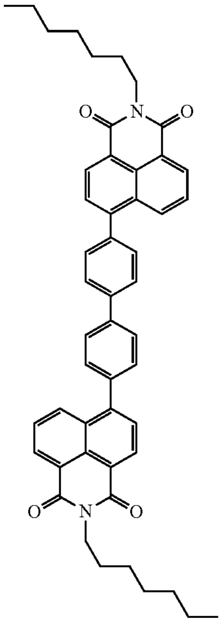
15
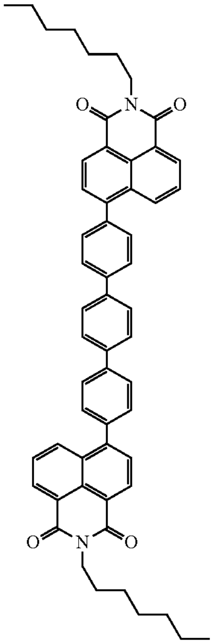

-continued
17
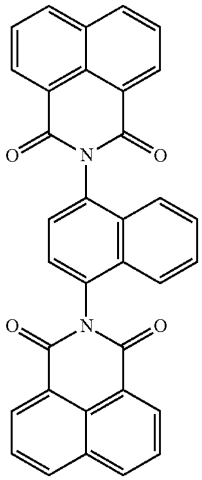
18
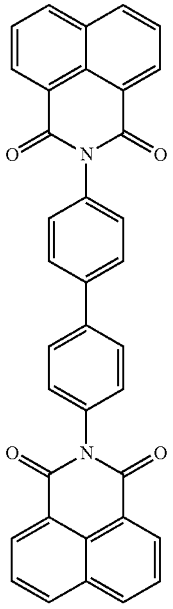
-continued
19
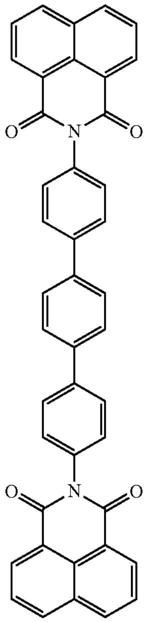
20
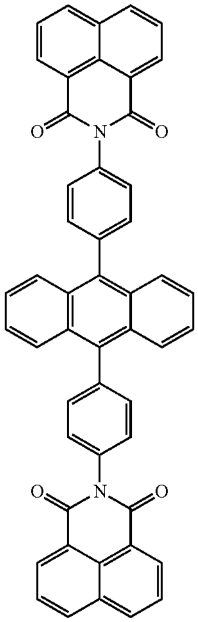

-continued
21
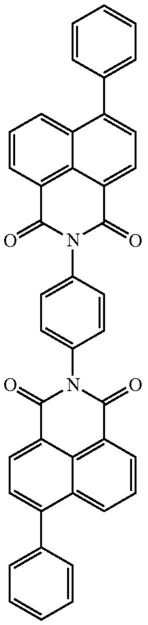
22
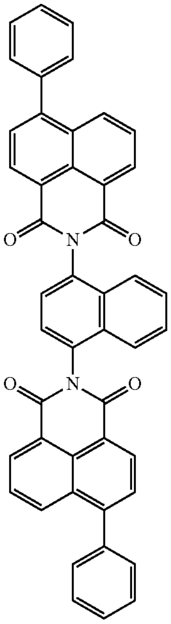
-continued
23
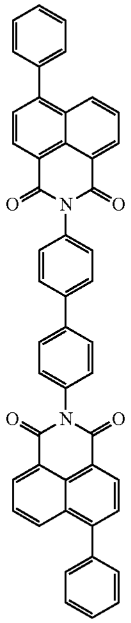
24
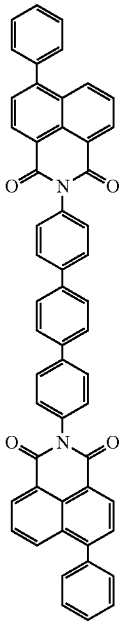

-continued
25
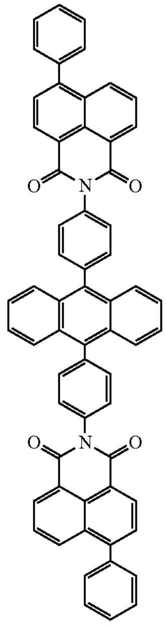
26
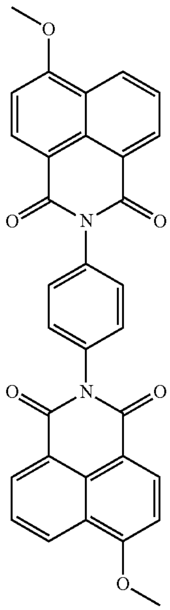
-continued
27
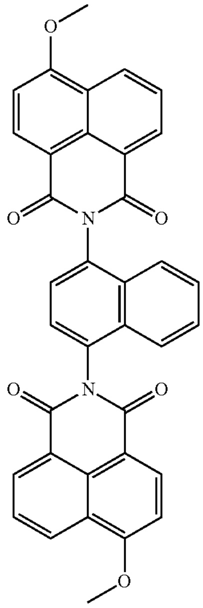
28
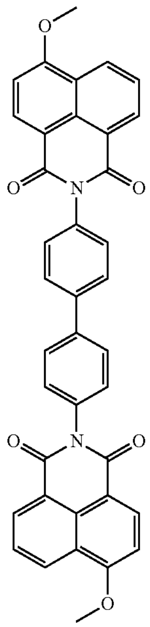

-continued
29
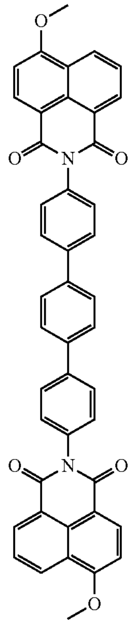
30
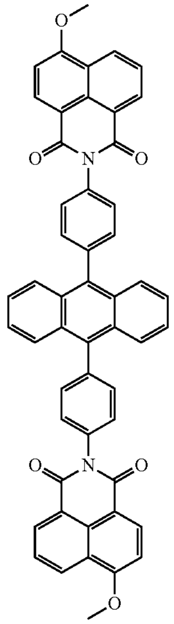
-continued
31
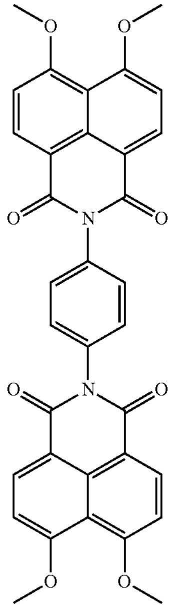
32
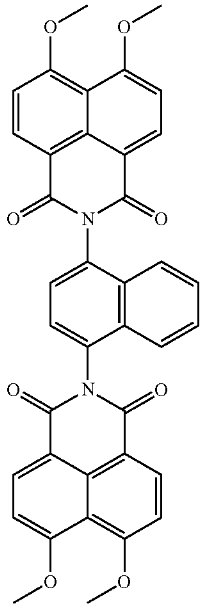

-continued
33
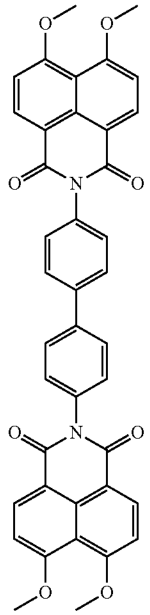
35
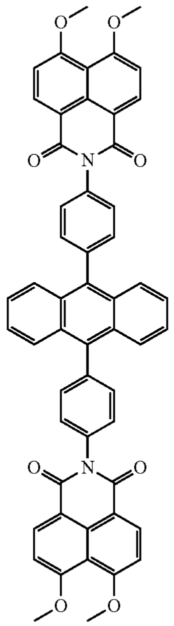
34
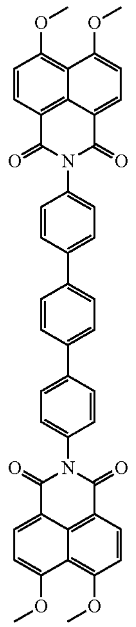
36
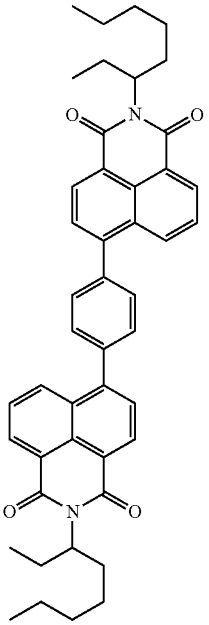

-continued
37
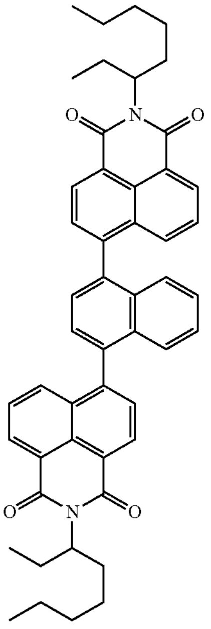
38
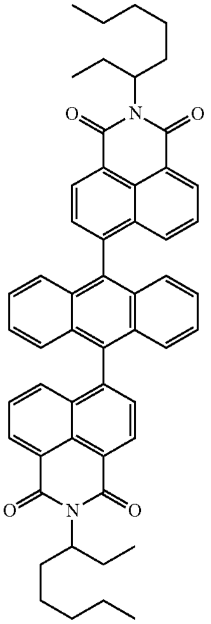
-continued
39
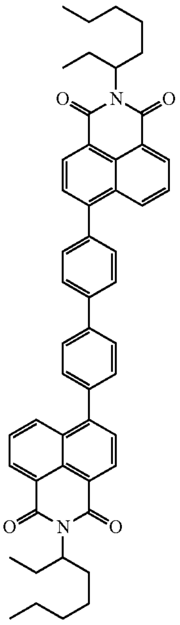
40
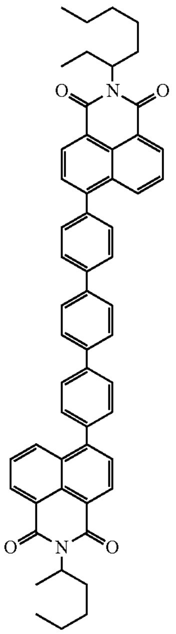

-continued
41
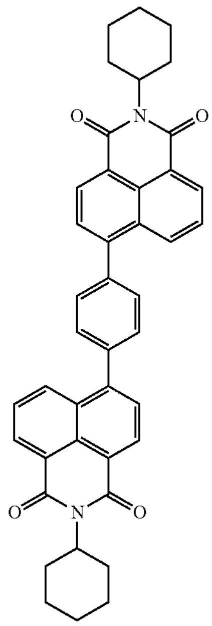
42
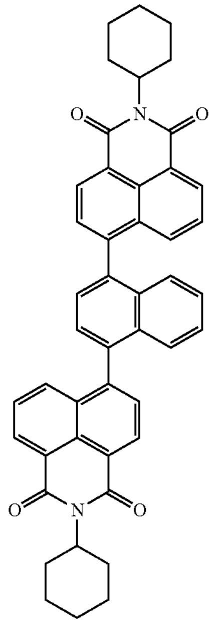
-continued
43
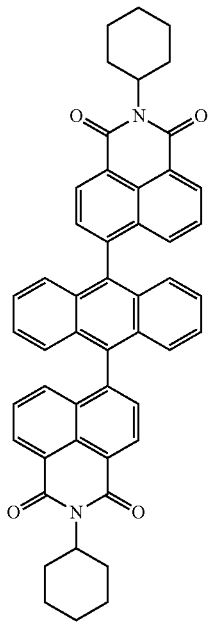
44
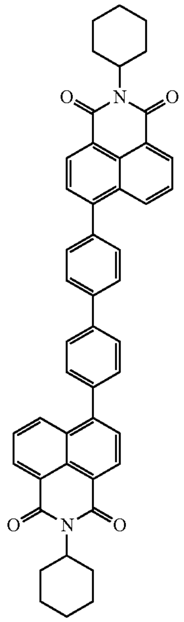

-continued
45
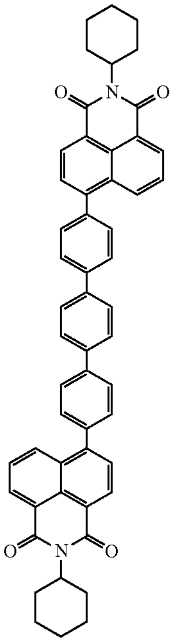
46
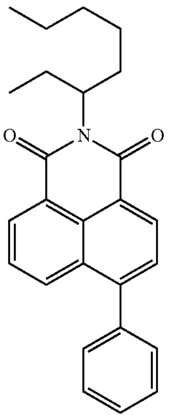
47
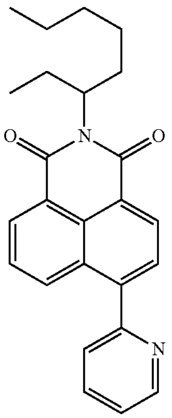
-continued
48
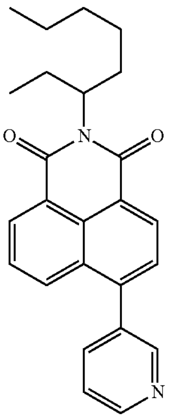
49
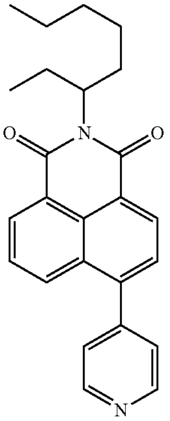
50
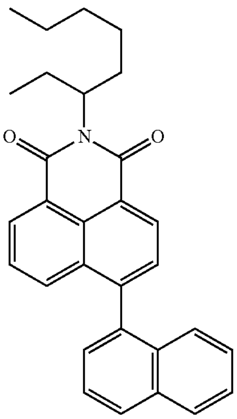

-continued
51
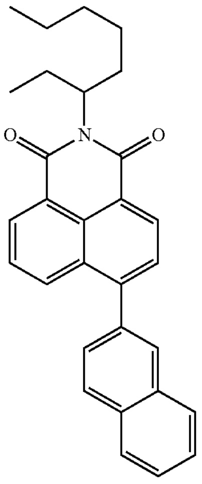
52
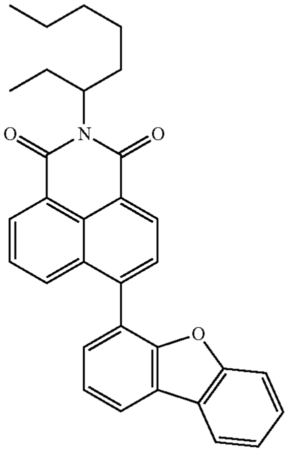
53
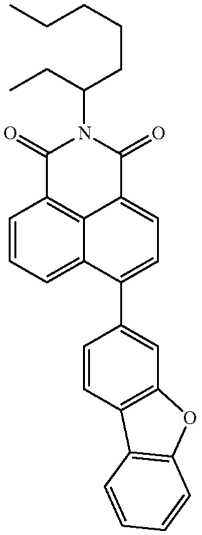
-continued
54
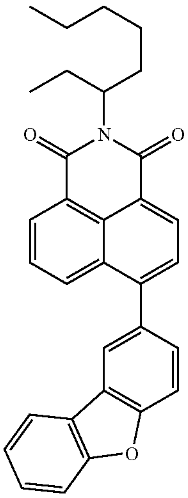
55
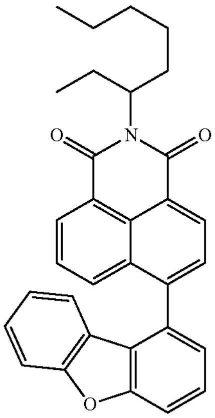
56
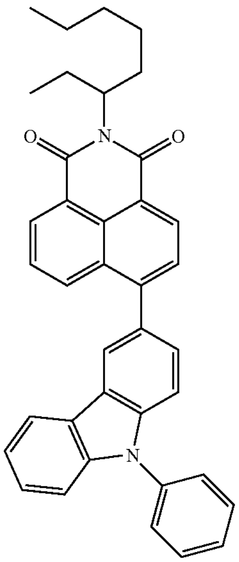

-continued
57
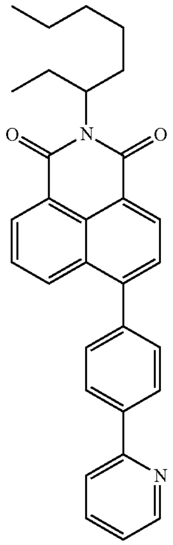
58
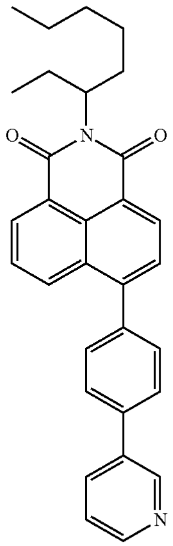
59
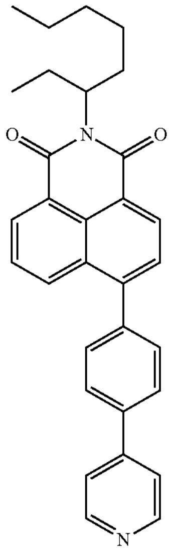
-continued
60
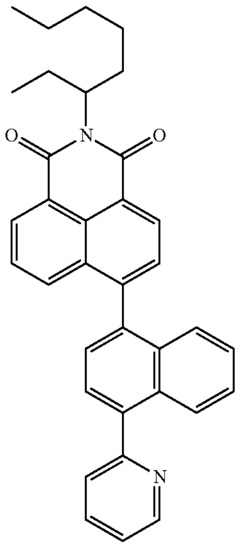
61
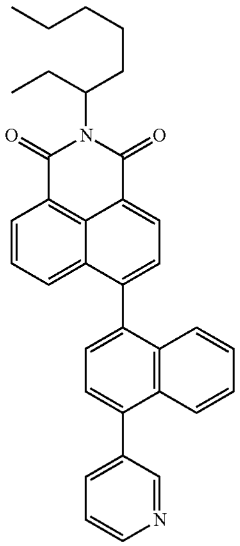
62
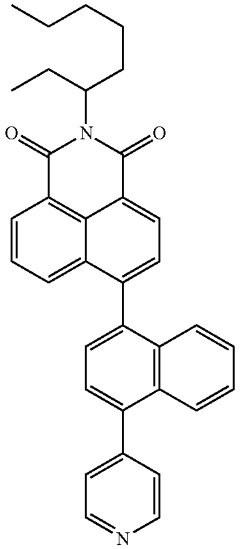

-continued
63
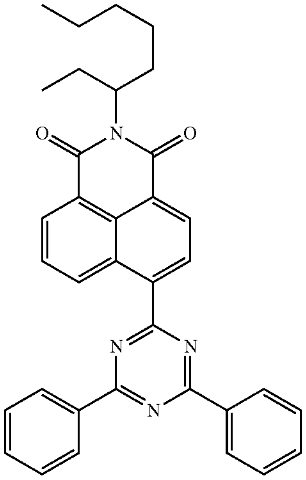
64
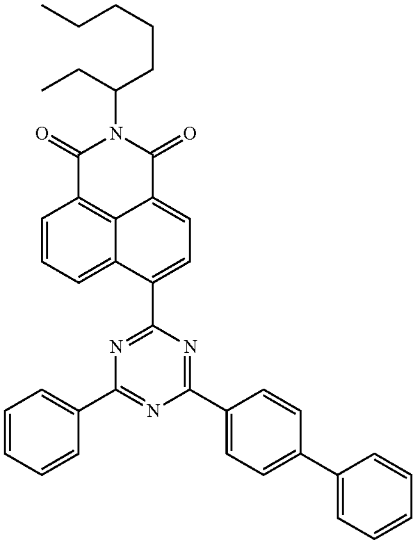
65
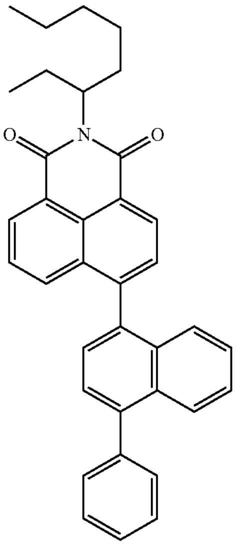
-continued
66
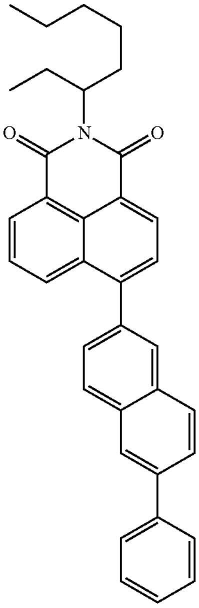
67
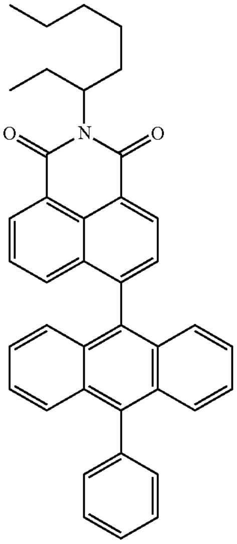
68
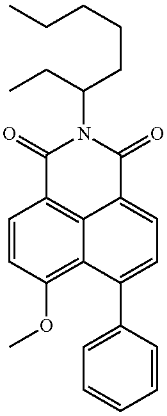

-continued
69
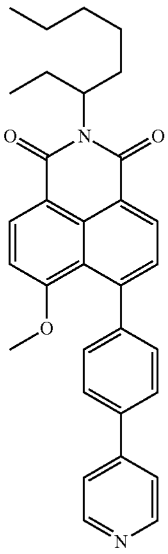
70
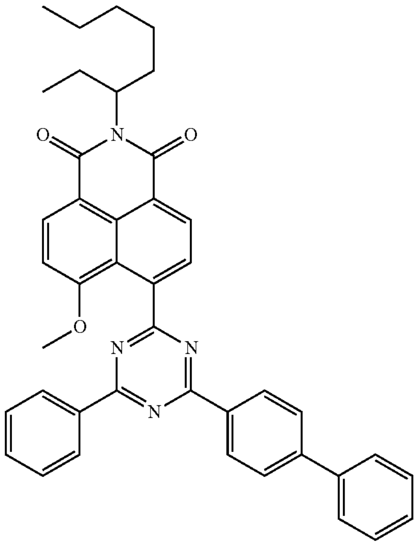
71
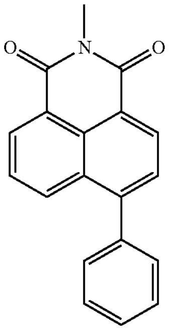
-continued
72
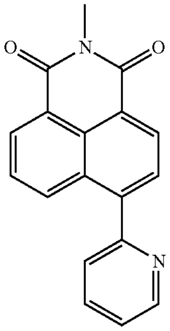
73
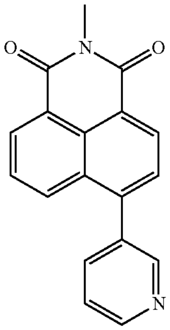
74
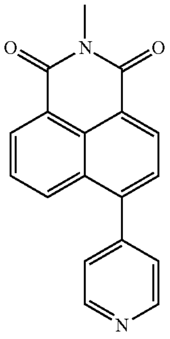
75
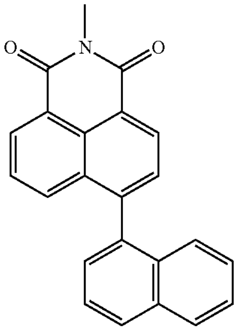

-continued
76
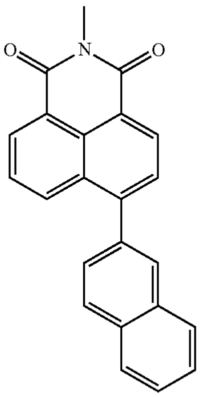
77
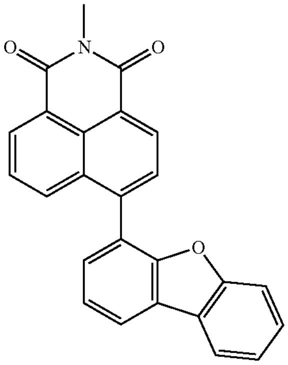
78
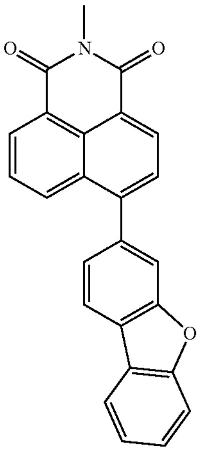
79
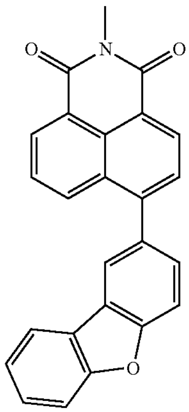
-continued
80
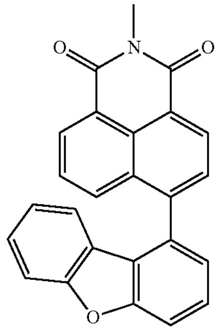
81
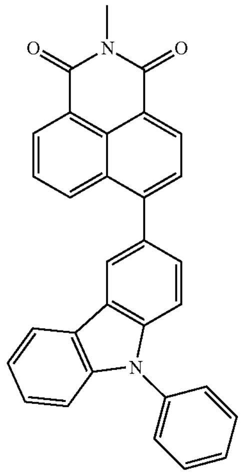
82
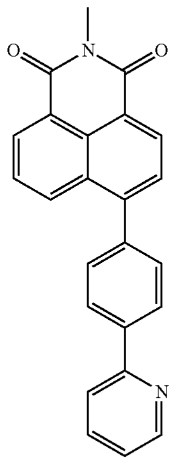

-continued
83
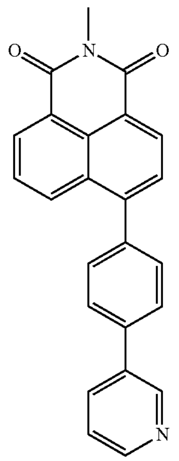
84
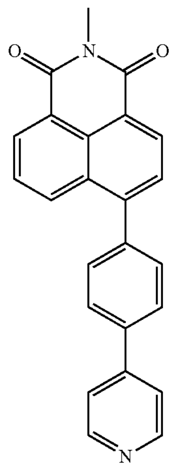
85
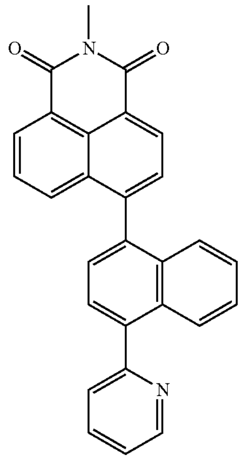
-continued
86
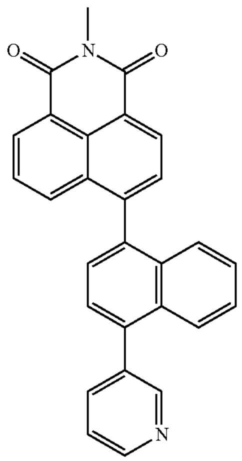
87
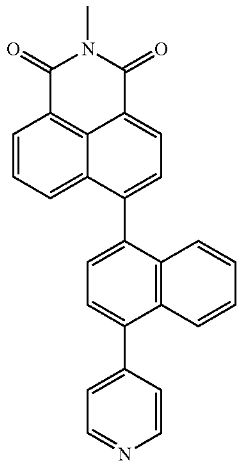
88
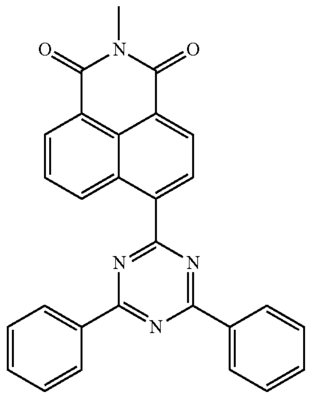

-continued
89
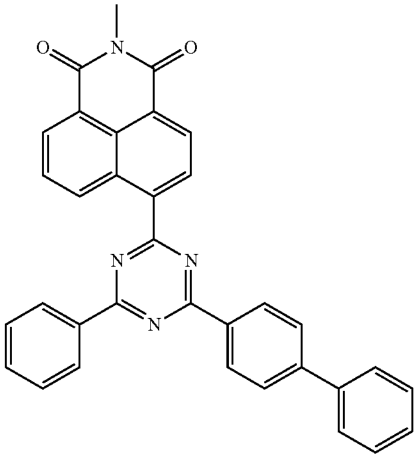
90
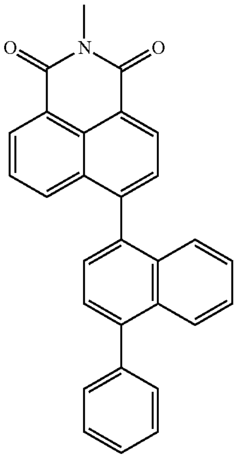
91
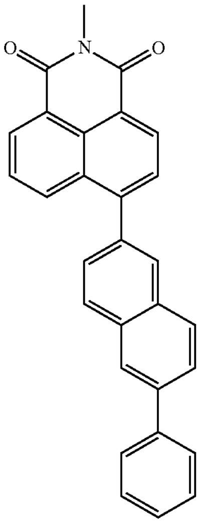
-continued
92
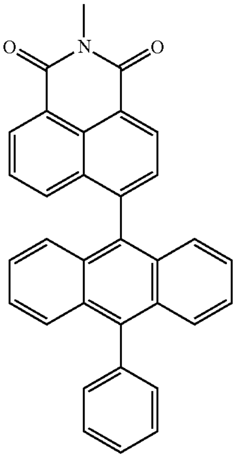
93
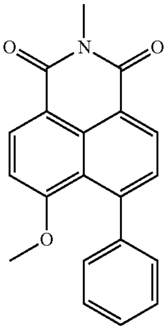
94
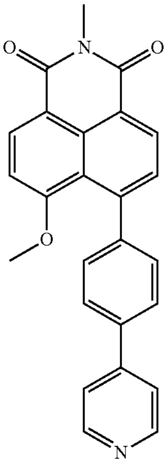

-continued
95
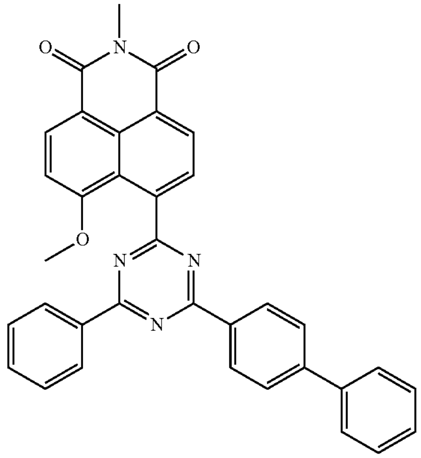
96
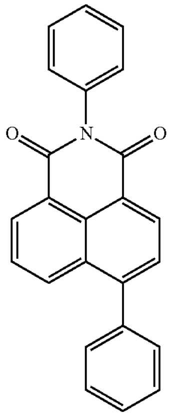
97
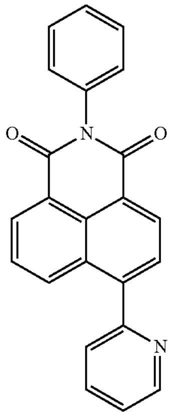
-continued
98
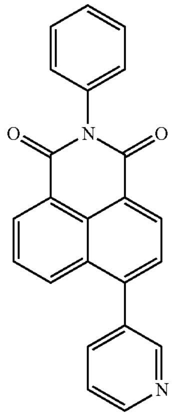
99
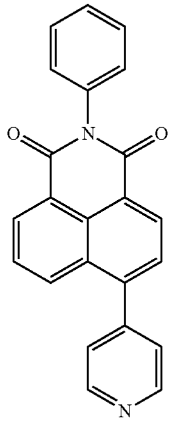
100
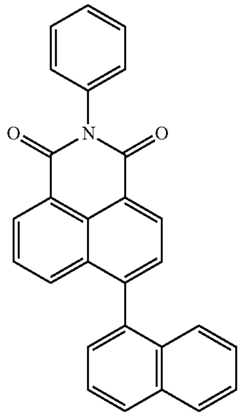

-continued
101
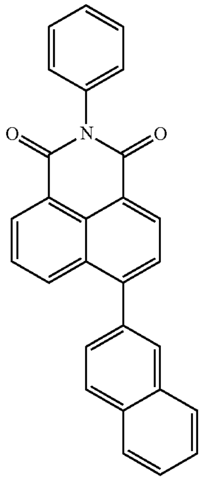
102
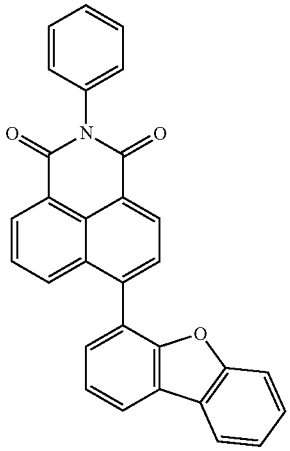
103
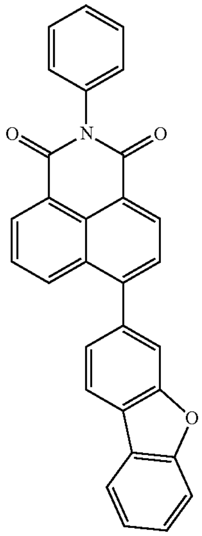
-continued
104
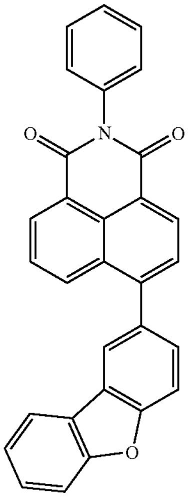
105
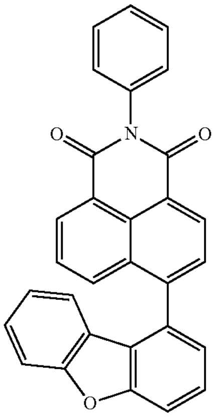
106
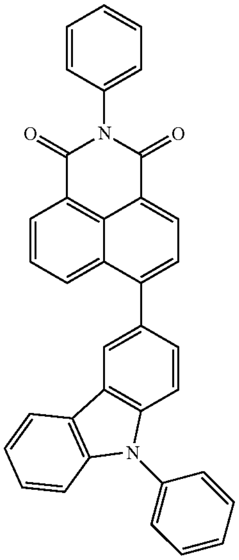

-continued
107
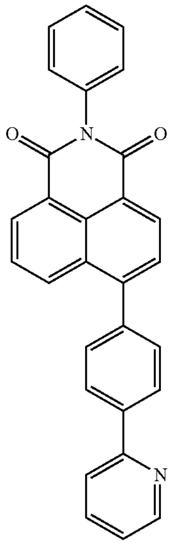
108
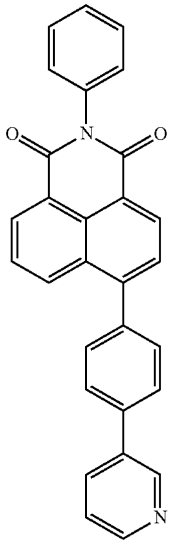
109
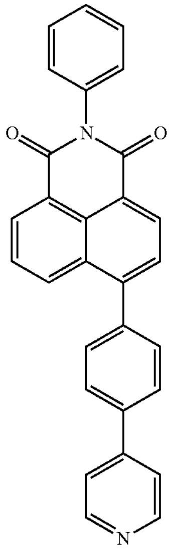
-continued
110
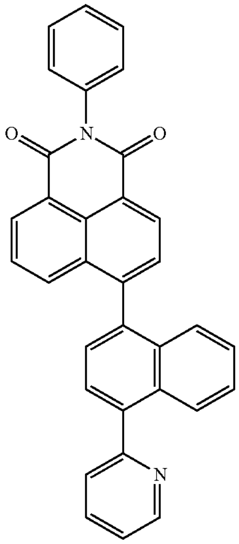
111
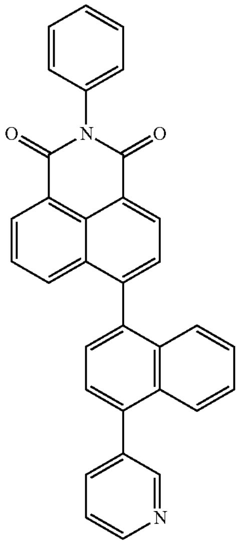
112
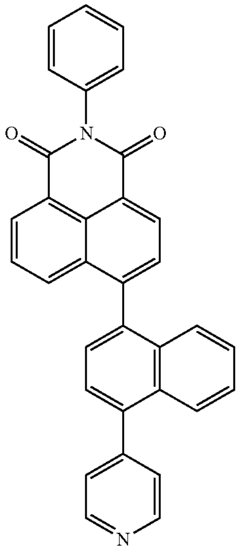

-continued
113
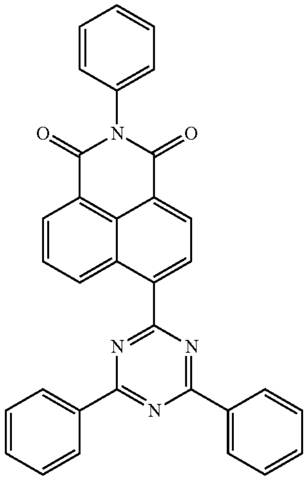
114
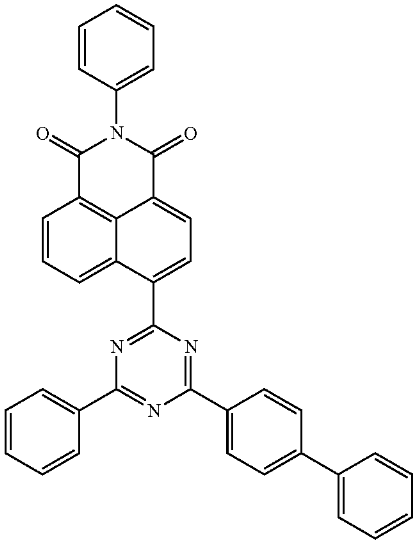
115
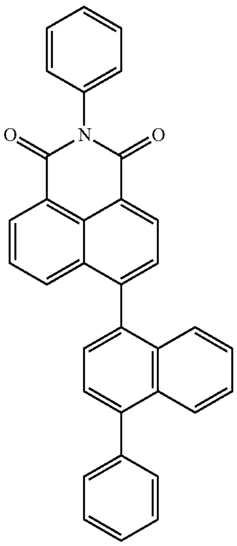
-continued
116
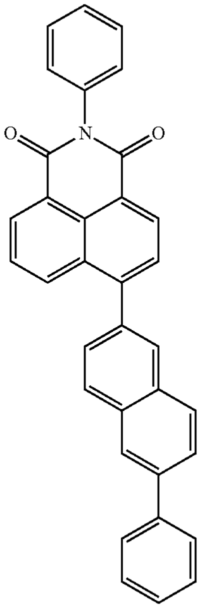
117
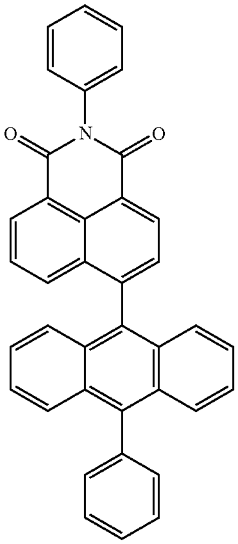
118
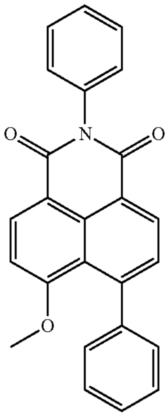

119
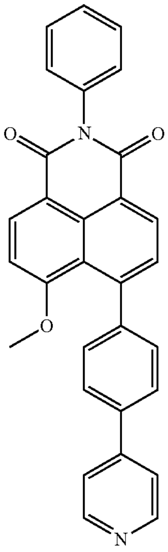
120
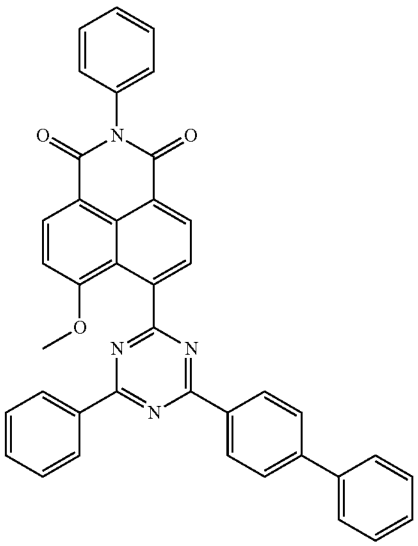
121
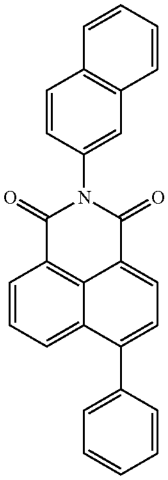
122
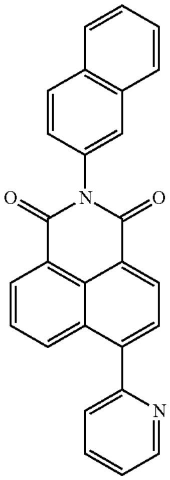
123
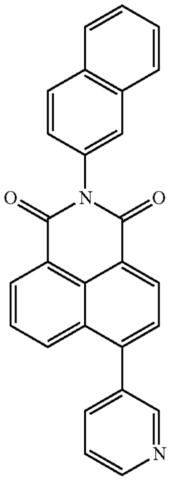
124
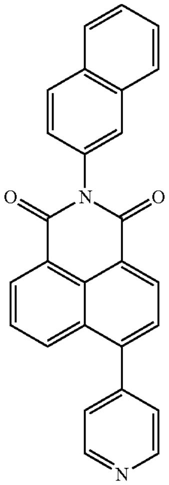

-continued
125
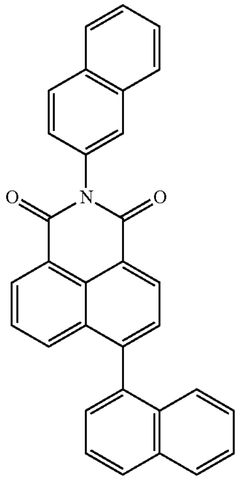
126
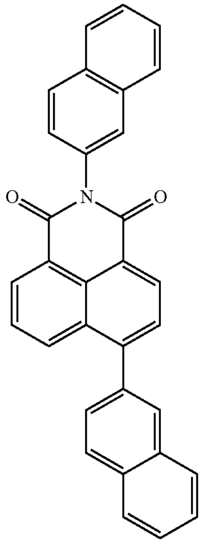
127
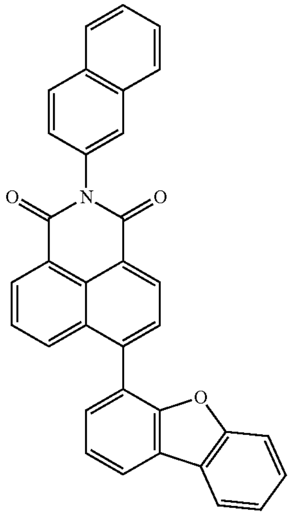
-continued
128
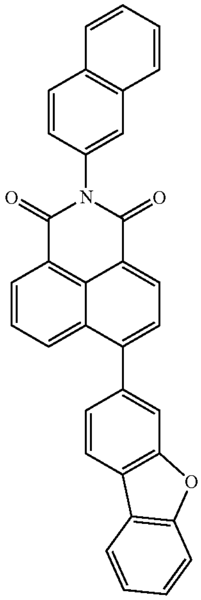
129
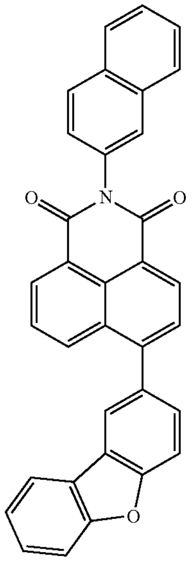
130
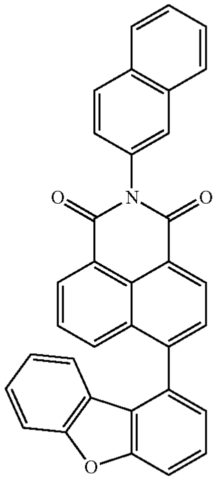

-continued
131
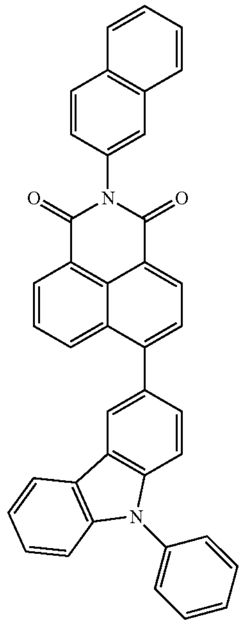
132
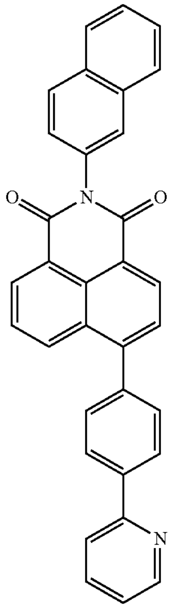
-continued
133
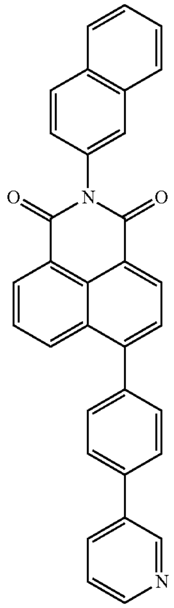
134
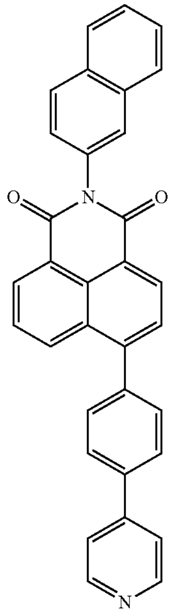

-continued
135
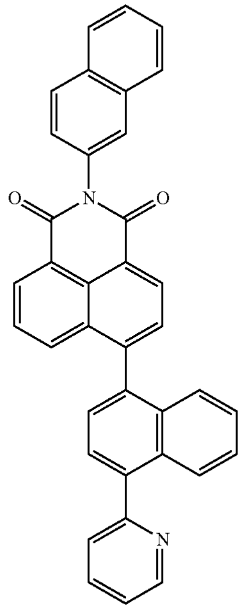
136
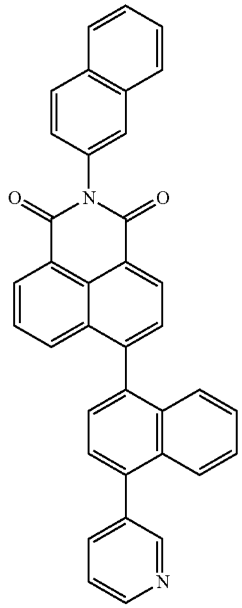
-continued
137
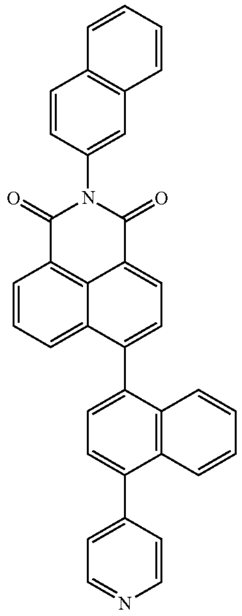
138
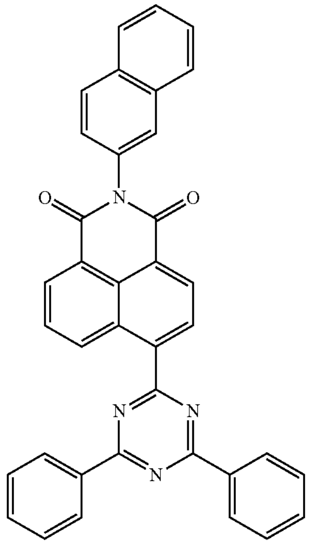

-continued
139
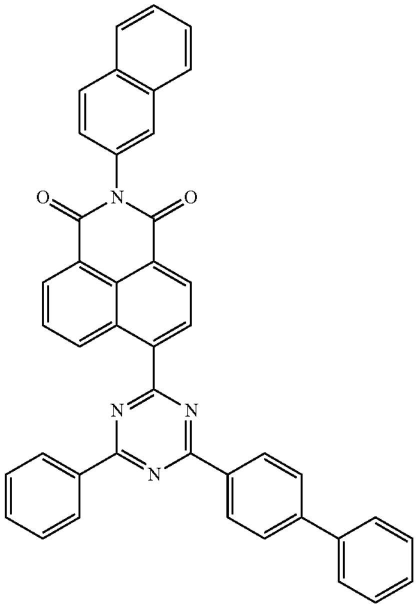
140
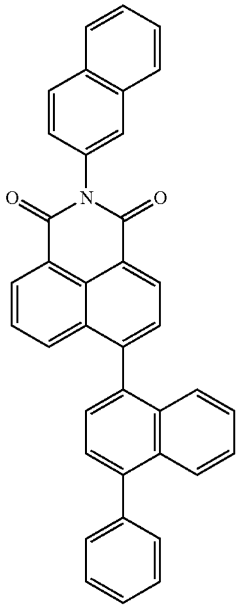
-continued
141
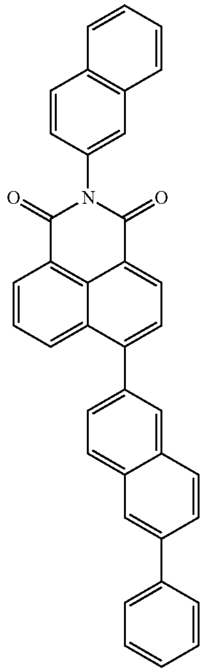
142
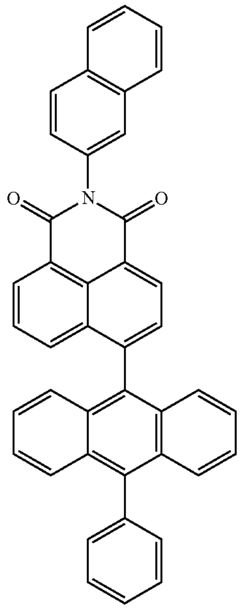

-continued
143
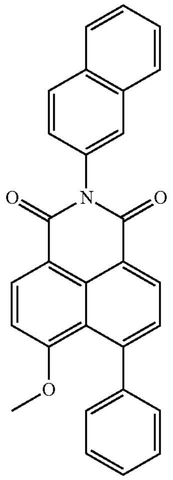
144
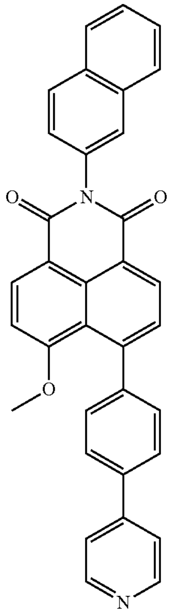
-continued
145
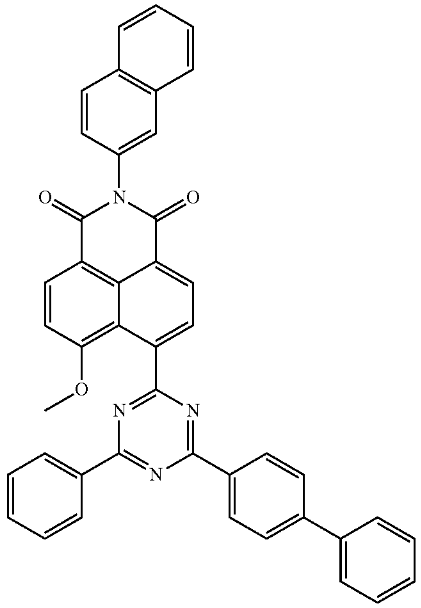
146
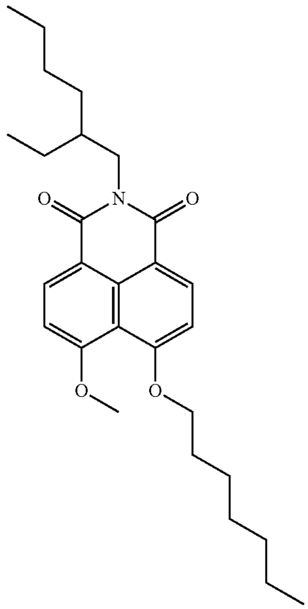

-continued
147
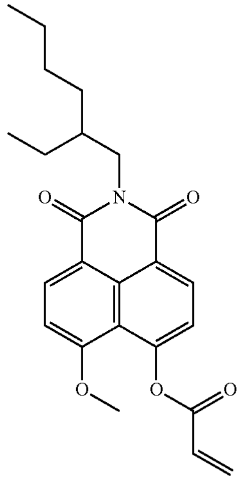
148
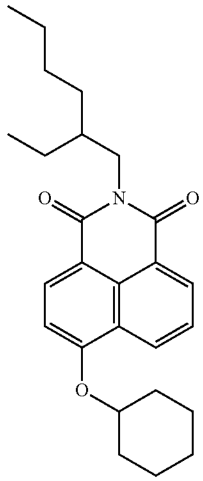
149
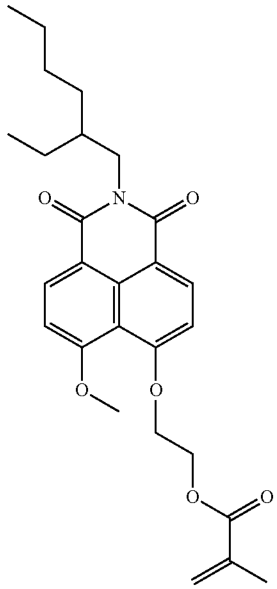
-continued
150
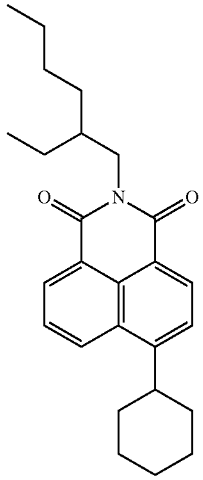
151
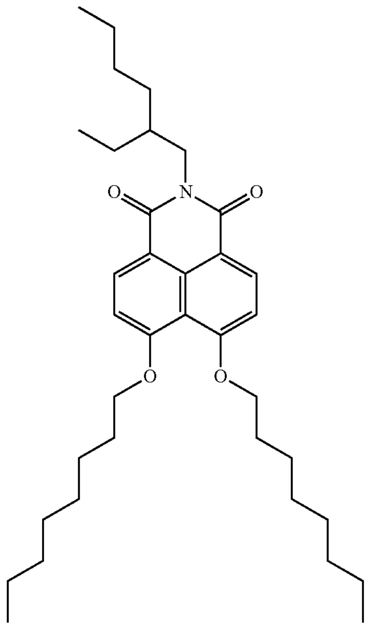
152
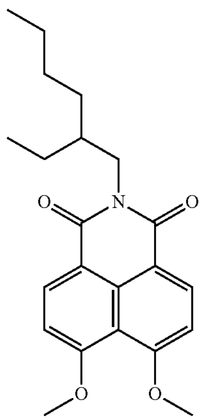

-continued
153
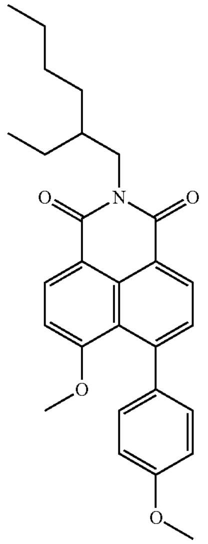
154
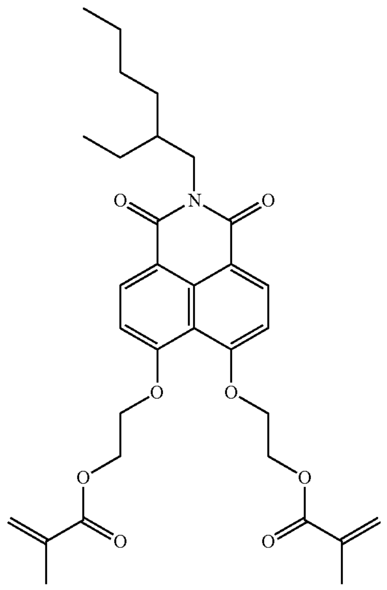
155
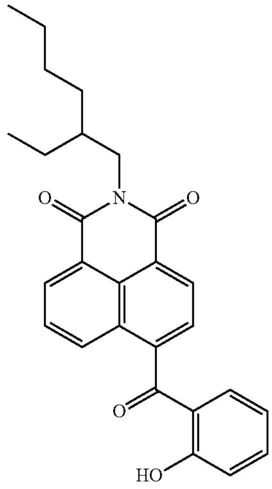
-continued
156
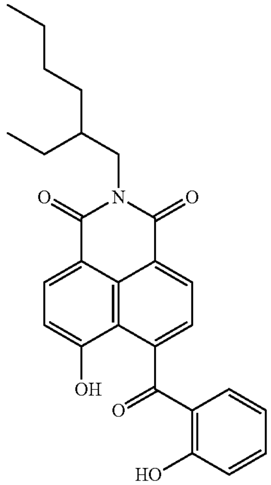
157
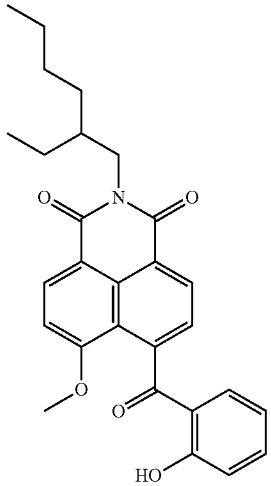
158
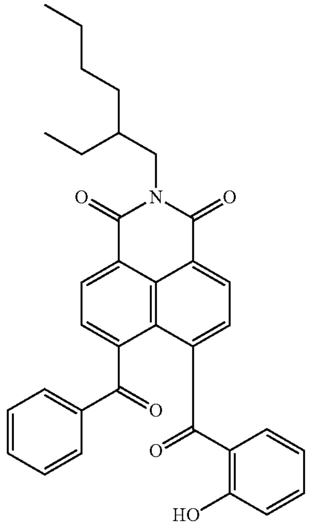

-continued
159
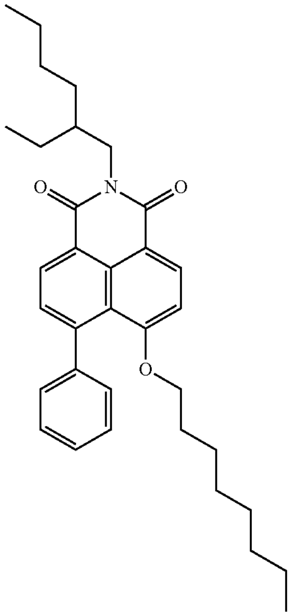
160
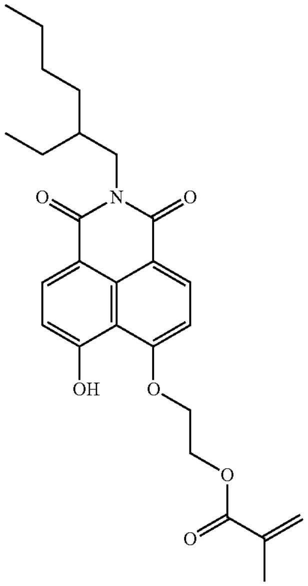
-continued
161
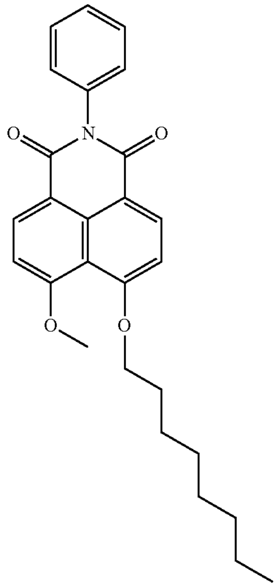
162
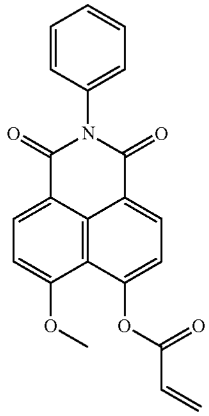
163
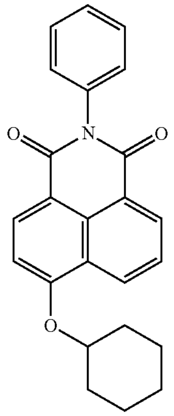

164
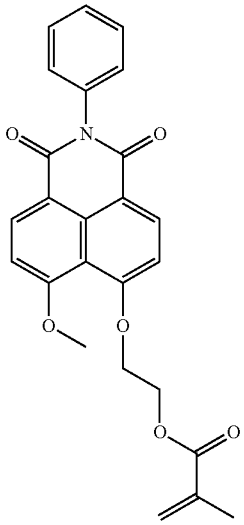
165
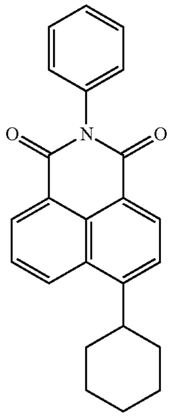
166
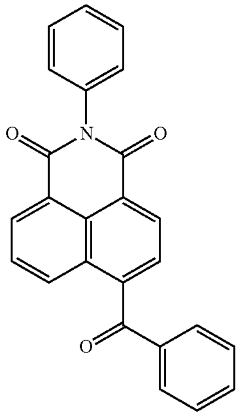
167
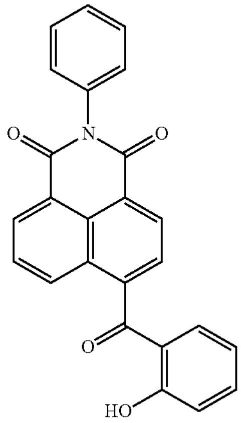
168
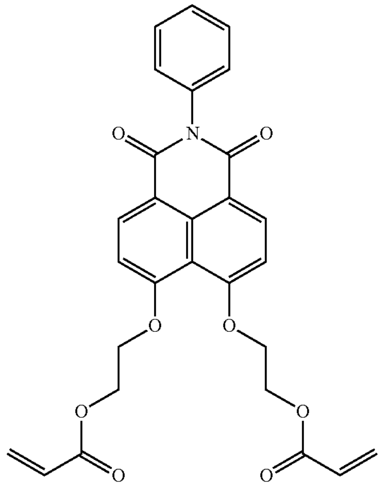
169
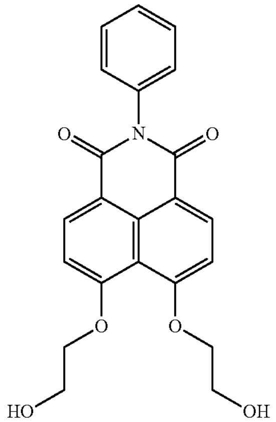

-continued
170
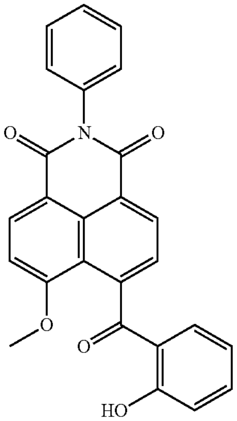
171
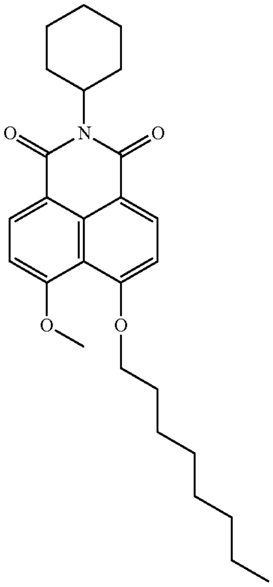
172
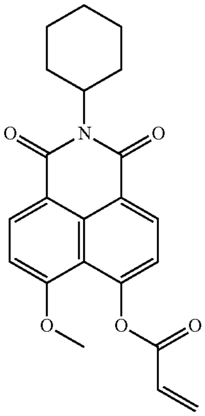
-continued
173
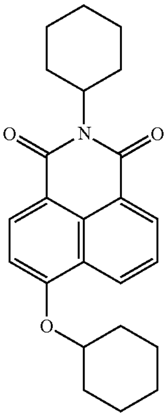
174
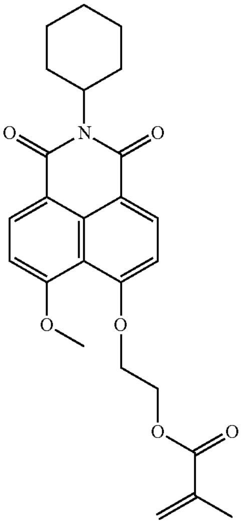
175
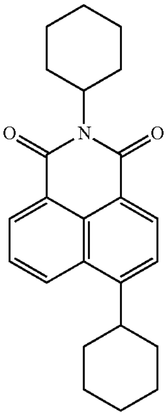

-continued
176
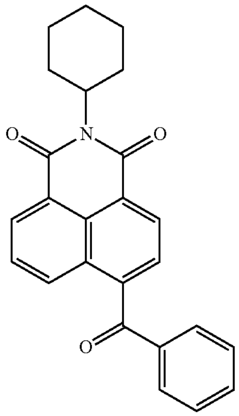
177
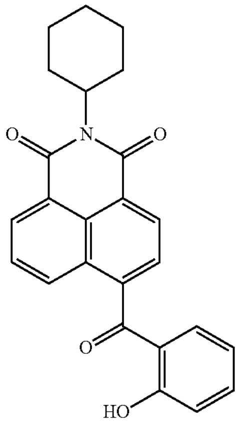
178
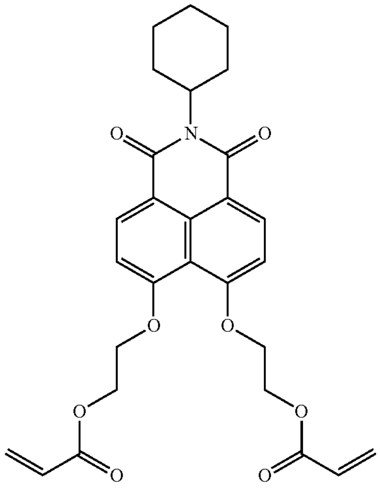
-continued
179
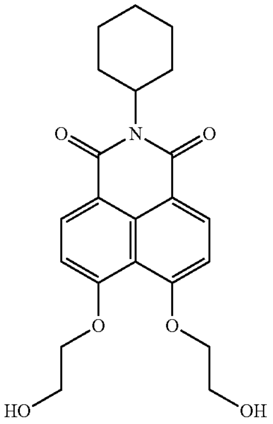
180
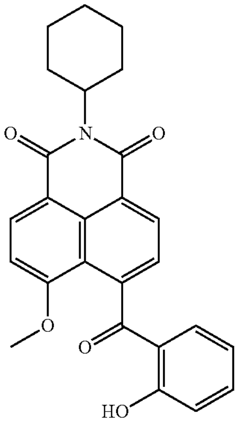
181
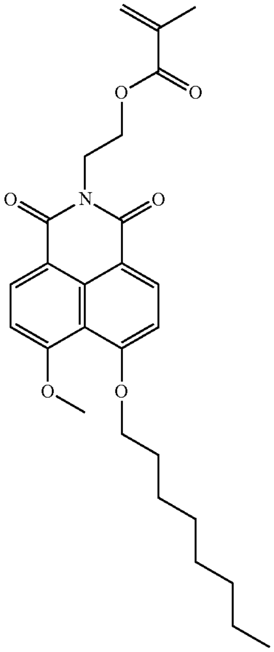

-continued
182
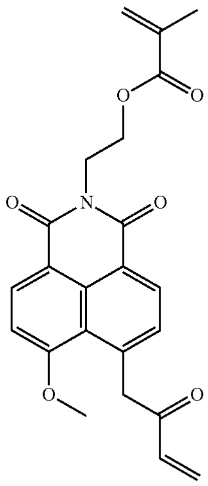
183
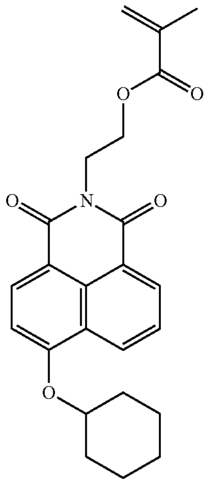
184
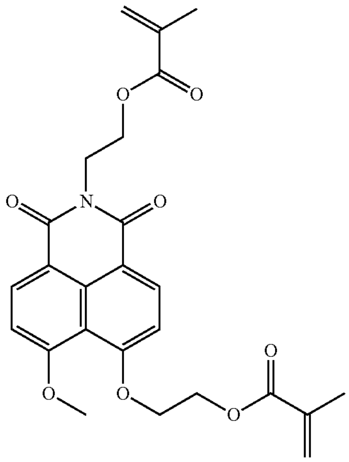
-continued
185
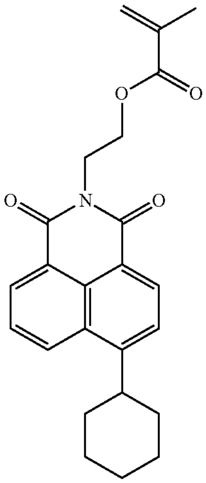
186
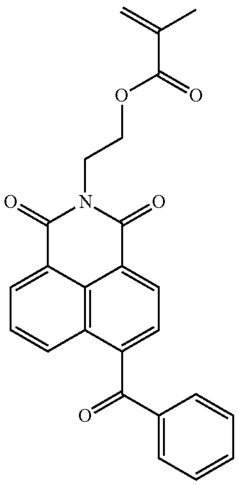
187
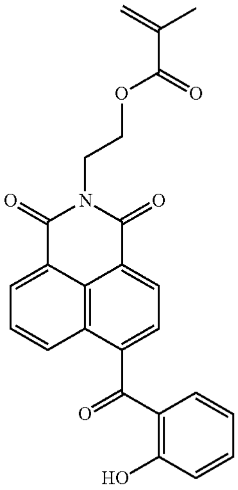

-continued
188
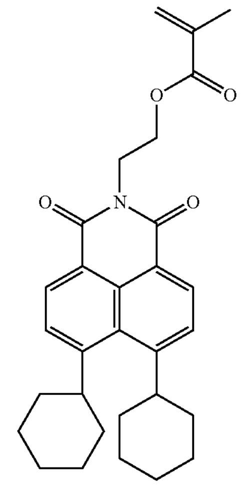
189
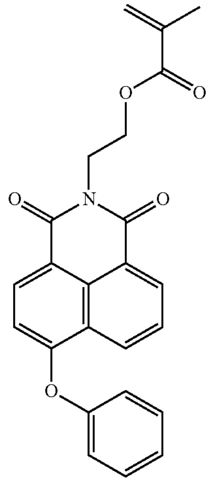
190
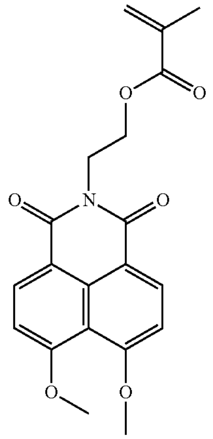
-continued
191
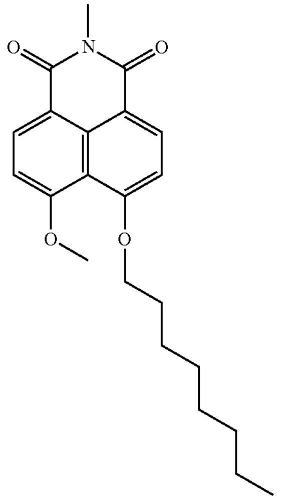
192
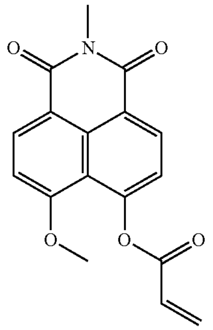
193
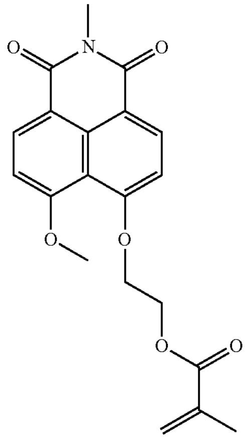

-continued
194
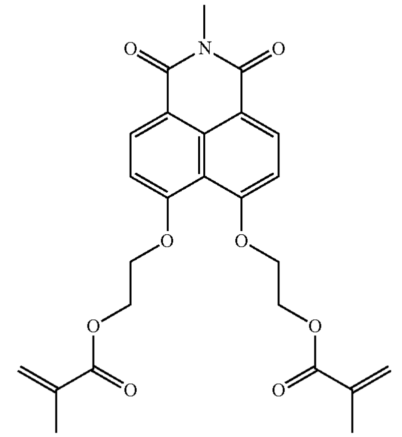
195
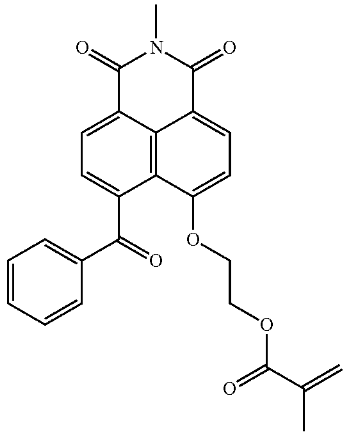
196
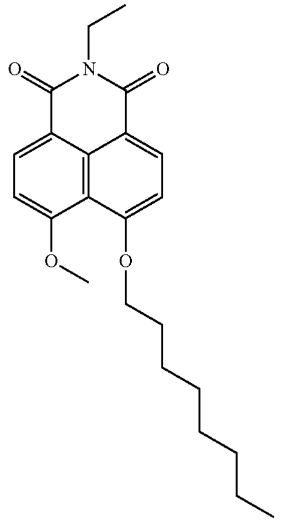
-continued
197
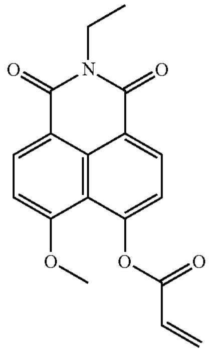
198
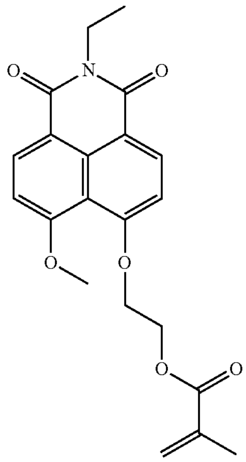
199
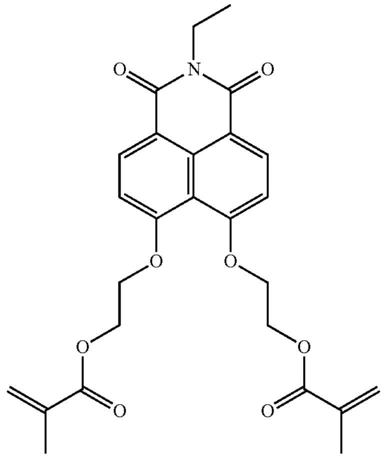

-continued

200

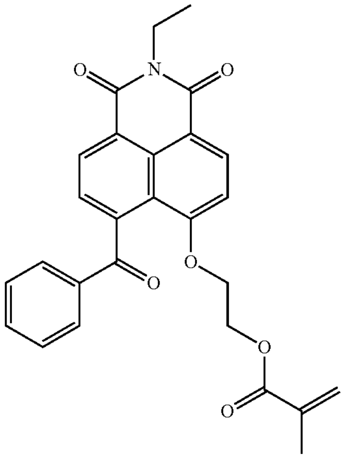

201

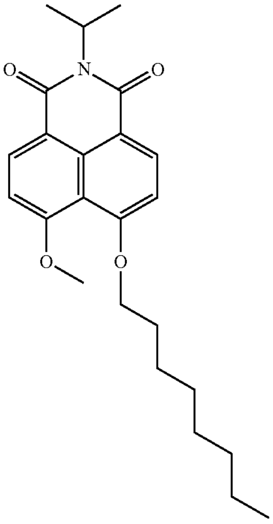

202

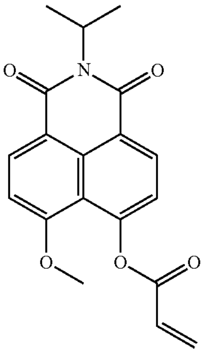

-continued

203

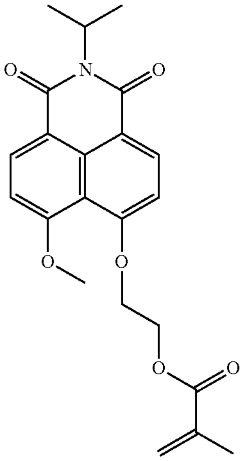

204

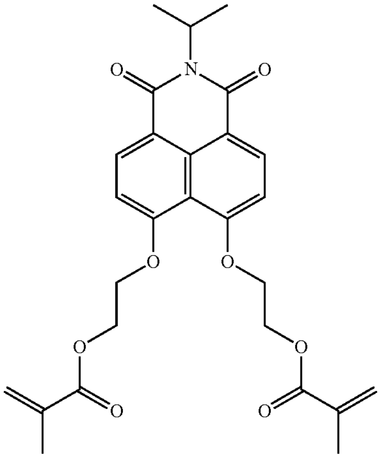

205

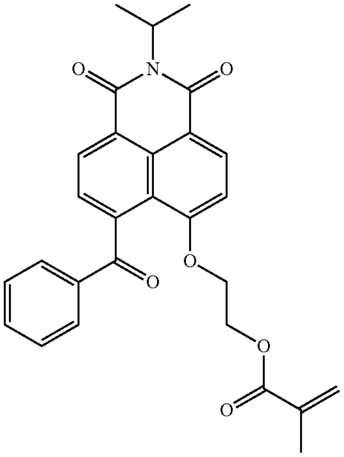

.

12. The organic light-emitting device of claim 1, wherein the condensed cyclic compound is to absorb light having a wavelength of about 400 nm to about 410 nm.

13. The organic light-emitting device of claim 1, wherein:

the first electrode is a transmissive electrode or a semi-transmissive electrode, and the organic light-emitting device comprises the first layer.

14. The organic light-emitting device of claim 13, wherein the first layer is an ultraviolet-absorbing light-efficiency-enhancement layer.

15. The organic light-emitting device of claim 1, wherein the second layer directly contacts the second electrode.

16. The organic light-emitting device of claim 1, wherein the second layer is an ultraviolet-absorbing light-efficiency-enhancement layer.

17. The organic light-emitting device of claim 1, wherein:

the first electrode and the second electrode are each independently a transmissive electrode or a semi-transmissive electrode, and the organic light-emitting device comprises the first layer and the second layer.

18. An electronic apparatus comprising:

the organic light-emitting device of claim 1; and a thin film transistor, wherein the first electrode of the organic light-emitting device electrically contacts one of a source electrode and a drain electrode of the thin film transistor.

* * * * *